(12) United States Patent
Widjaja et al.

(10) Patent No.: US 9,450,090 B2
(45) Date of Patent: *Sep. 20, 2016

(54) SEMICONDUCTOR MEMORY DEVICE HAVING AN ELECTRICALLY FLOATING BODY TRANSISTOR

(71) Applicant: Zeno Semiconductor, Inc., San Jose, CA (US)

(72) Inventors: Yuniarto Widjaja, San Jose, CA (US); Zvi Or-Bach, San Jose, CA (US)

(73) Assignee: Zeno Semiconductor, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/930,049

(22) Filed: Nov. 2, 2015

(65) Prior Publication Data

US 2016/0056287 A1    Feb. 25, 2016

Related U.S. Application Data

(63) Continuation of application No. 14/330,083, filed on Jul. 14, 2014, now Pat. No. 9,208,840, which is a continuation of application No. 14/018,947, filed on Sep. 5, 2013, now Pat. No. 8,817,548, which is a continuation of application No. 12/897,516, filed on Oct. 4, 2010, now Pat. No. 8,547,756.

(51) Int. Cl.
*G11C 7/00* (2006.01)
*H01L 29/78* (2006.01)
(Continued)

(52) U.S. Cl.
CPC .......... *H01L 29/7841* (2013.01); *G11C 7/22* (2013.01); *G11C 11/404* (2013.01); *G11C 11/4074* (2013.01); *G11C 11/4094* (2013.01); *H01L 27/10802* (2013.01); *H01L 29/772* (2013.01); *G11C 11/04* (2013.01); *G11C 2211/4016* (2013.01)

(58) Field of Classification Search
CPC ............. G11C 7/22; G11C 7/06; G11C 8/16; G11C 11/4096; G11C 11/409; G11C 2207/2209
USPC .............................. 365/189.011, 189.04, 177
See application file for complete search history.

(56) References Cited

U.S. PATENT DOCUMENTS 4,300,212 A    11/1981  Simko
4,959,812 A     9/1990  Momodomi et al.
(Continued)

OTHER PUBLICATIONS

Chatterjee, et al., "Taper isolated dynamic gain RAM cell," Electron Devices Meeting, 1978 International, vol. 24, IEEE, 1978, pp. 698-699.

(Continued)

*Primary Examiner* — Huan Hoang
(74) *Attorney, Agent, or Firm* — Venable LLP; Steven J. Schwarz; Trent B. Ostler

(57) ABSTRACT

An IC may include an array of memory cells formed in a semiconductor, including memory cells arranged in rows and columns, each memory cell may include a floating body region defining at least a portion of a surface of the memory cell, the floating body region having a first conductivity type; a buried region located within the memory cell and located adjacent to the floating body region, wherein the buried region has a second conductivity type, wherein the floating body region is bounded on a first side by a first insulating region having a first thickness and on a second side by a second insulating region having a second thickness, and a gate region above the floating body region and the second insulating region and is insulated from the floating body region by an insulating layer; and control circuitry configured to provide electrical signals to said buried region.

20 Claims, 147 Drawing Sheets

(51) Int. Cl.
  *G11C 11/404* (2006.01)
  *H01L 27/108* (2006.01)
  *H01L 29/772* (2006.01)
  *G11C 7/22* (2006.01)
  *G11C 11/4074* (2006.01)
  *G11C 11/4094* (2006.01)
  *G11C 11/04* (2006.01)

(56) References Cited

U.S. PATENT DOCUMENTS

| | | |
|---|---|---|
| 5,216,269 A | 6/1993 | Middelhoek et al. |
| 5,519,831 A | 5/1996 | Holzhammer |
| 5,581,504 A | 12/1996 | Chang |
| 5,767,549 A | 6/1998 | Chen et al. |
| 5,967,549 A | 10/1999 | Allen et al. |
| 5,999,444 A | 12/1999 | Fujiwara et al. |
| 6,005,818 A | 12/1999 | Ferrant |
| 6,141,248 A | 10/2000 | Forbes et al. |
| 6,163,048 A | 12/2000 | Hirose et al. |
| 6,166,407 A | 12/2000 | Ohta |
| 6,341,087 B1 | 1/2002 | Kunikiyo |
| 6,356,485 B1 | 3/2002 | Proebsting |
| 6,376,876 B1 | 4/2002 | Shin et al. |
| 6,380,636 B1 | 4/2002 | Tatsukawa et al. |
| 6,542,411 B2 | 4/2003 | Tanikawa et al. |
| 6,614,684 B1 | 9/2003 | Shukuri et al. |
| 6,661,042 B2 | 12/2003 | Hsu |
| 6,724,657 B2 | 4/2004 | Shukuri |
| 6,791,882 B2 | 9/2004 | Seki et al. |
| 6,801,452 B2 | 10/2004 | Miwa et al. |
| 6,885,581 B2 | 4/2005 | Nemati et al. |
| 6,925,006 B2 | 8/2005 | Fazan et al. |
| 6,954,377 B2 | 10/2005 | Choi et al. |
| 6,969,662 B2 | 11/2005 | Fazan et al. |
| 7,085,156 B2 | 8/2006 | Ferrant et al. |
| 7,118,986 B2 | 10/2006 | Steigerwalt et al. |
| 7,149,109 B2 | 12/2006 | Forbes |
| 7,170,807 B2 | 1/2007 | Fazan et al. |
| 7,224,019 B2 | 5/2007 | Hieda et al. |
| 7,259,420 B2 | 8/2007 | Anderson et al. |
| 7,259,992 B2 | 8/2007 | Shirota |
| 7,285,820 B2 | 10/2007 | Park et al. |
| 7,301,803 B2 | 11/2007 | Okhonin et al. |
| 7,329,580 B2 | 2/2008 | Choi et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Mathew et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,662,761 B2 | 2/2010 | Subramanian et al. |
| 7,701,763 B2 | 4/2010 | Roohparvar |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,924,630 B2 | 4/2011 | Carman |
| 7,927,962 B2 | 4/2011 | Yoo |
| 7,933,140 B2 | 4/2011 | Wang et al. |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,194,471 B2 | 6/2012 | Widjaja et al. |
| 8,208,302 B2 | 6/2012 | Widjaja et al. |
| 8,243,499 B2 | 8/2012 | Widjaja |
| 8,264,876 B2* | 9/2012 | Widjaja ............ G11C 11/404 365/177 |
| 8,294,193 B2 | 10/2012 | Widjaja |
| 8,547,756 B2 | 10/2013 | Widjaja et al. |
| 8,582,359 B2 | 11/2013 | Widjaja |
| 8,817,548 B2 | 8/2014 | Widjaja et al. |
| 8,923,052 B2 | 12/2014 | Widjaja |
| 9,208,840 B2* | 12/2015 | Widjaja ............ G11C 11/404 |
| 2002/0018366 A1 | 2/2002 | von Schwerin et al. |
| 2002/0048193 A1 | 4/2002 | Tanikawa et al. |
| 2003/0168680 A1 | 9/2003 | Hsu |
| 2004/0160825 A1 | 8/2004 | Bhattacharyya |
| 2005/0024968 A1 | 2/2005 | Lee et al. |
| 2005/0032313 A1 | 2/2005 | Forbes |
| 2005/0124120 A1 | 6/2005 | Du et al. |
| 2006/0044915 A1 | 3/2006 | Park et al. |
| 2006/0046408 A1 | 3/2006 | Ohsawa |
| 2006/0125010 A1 | 6/2006 | Bhattacharyya |
| 2006/0157679 A1 | 7/2006 | Scheueriein |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0090443 A1 | 4/2007 | Choi et al. |
| 2007/0164352 A1 | 7/2007 | Padilla et al. |
| 2007/0210338 A1 | 9/2007 | Orlowski |
| 2007/0215954 A1 | 9/2007 | Mouli |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0123418 A1 | 5/2008 | Widjaja |
| 2008/0158995 A1 | 7/2008 | Harari et al. |
| 2008/0224202 A1 | 9/2008 | Young et al. |
| 2008/0265305 A1 | 10/2008 | He et al. |
| 2008/0303079 A1 | 12/2008 | Cho et al. |
| 2009/0020754 A1 | 1/2009 | Suryagandh et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173983 A1 | 7/2009 | Kusunoki et al. |
| 2009/0173985 A1 | 7/2009 | Lee et al. |
| 2009/0190402 A1 | 7/2009 | Hsu et al. |
| 2009/0230447 A1 | 9/2009 | Hwang |
| 2009/0242996 A1 | 10/2009 | van Bentum et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0135086 A1 | 6/2010 | Wu |
| 2010/0202202 A1 | 8/2010 | Roohparvar |
| 2010/0246277 A1 | 9/2010 | Widjaja et al. |
| 2010/0246284 A1 | 9/2010 | Widjaja et al. |
| 2011/0032756 A1 | 2/2011 | Widjaja |
| 2011/0042736 A1 | 2/2011 | Widjaja |
| 2011/0044110 A1 | 2/2011 | Widjaja |
| 2011/0228591 A1 | 9/2011 | Widjaja |
| 2011/0267903 A1 | 11/2011 | Huo et al. |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2013/0015517 A1 | 1/2013 | Widjaja et al. |

OTHER PUBLICATIONS

Chatterjee, et al., "A survey of high-density dynamic RAM cell concepts," Electron Devices, IEEE Transactions on 26.6, 1979), pp. 827-839.

(56) References Cited

OTHER PUBLICATIONS

Chatterjee, et al., Circuit Optimization of the Paper Isolated Dynamic Gain RAM Cell for VLSI Memories, pp. 22-23, 1979.
Erb, D., "Stratified charge memory," Solid-State Circuits Conference, Digest of Technical Papers, 1978 IEEE International, vol. 21, IEEE, 1978, pp. 24-25.
Lanyon, et al., "Bandgap Narrowing in Moderately to Heavily Doped Silicon," No. 7, vol. ED-26, 1979, pp. 1014-1018.
Leiss, et al., "dRAM Design Using the Taper-Isolated Dynamic RAM Cell," Solid State Circuits, IEEE Journal of 17.2 (1982), pp. 337-344.
Terada, et al., "A New VLSI Memory Cell Using Capacitance Coupling (CC Cell)," Microelectronics Research Laboratories, 1984 IEEE, pp. 1319-1324.
Sakui, et al., "A New Static Memory Cell Based on Reverse Base Current (RBC) Effect of Bipolar Transistor," ULSI Research Center, Toshiba Corporation, Kawasaki, Japan, 1988 IEEE, pp. 44-47.
Sakui, et al., "A New Static Memory Cell Based on the Reverse Base Current Effect of Bipolar Transistors," IEEE Transactions on Electron Devices, vol. 36, No. 6, Jun. 1989, pp. 1215-1217.
Tack, et al., "The Multistable Charge-Controlled Memory Effect in SOI MOS Transistors at Low Temperatures," IEEE Transactions on Electron Devices, vol. 37, No. 5, May 1990, pp. 1373-1382.
Reisch, Michael, "On Bistable Behavior and Open-Base Breakdown of Bipolar Transistors in the Avalance Regime—Modeling and Applications," IEEE Transactions on Electron Devices, vol. 39, No. 6, Jun. 1992, pp. 1398-1409.
Robert F. Pierret, Semiconductor Device Fundamentals, ISBN: 0-201-54393-1, 1996, by Addison-Wesley Publishing Company, Inc. PNPN Devices 463-476.
Okhonin et al., A SOI Capacitor-less 1T-DRAM Concept, 2001, pp. 153-154.
Okhonin, et al., "A Capacitor-Less 1T-Dram Cell," IEEE Electron Device Letters, vol. 23, No. 2, Feb. 2002, pp. 85-87.
Okhonin, et al., Principles of Transient Charge Pumping on Partially Depleted SOI MOSFET's, IEEE Electron Device Letters, vol. 23, No. 5, May 2002, pp. 279-281.
Frontiers of Silicon-on-insulator, vol. 93, No. 9, pp. 4955-4978, May 2003.
Yoshida et al., "A Design of a Capacitor-less 1T-DRAM Cell Using Gate-Induced Drain Leakage (GIDL) Current for Low-power and High-speed Embedded Memory," International Electron Devices Meeting, 2003, pp. 913-918.
Headland, Hot Electron Injection, Feb. 19, 2004.
Ranica et al., "Scaled 1T-Bulk devices built with CMOS 90nm technology for low-cost eDRAM applications," ST Microelectronics, Crolles, France, pp. 1-2, 2005.
Han et al., Programming/Erasing Characteristics of 45 nm NOR-Type Flash Memory Based on SOI FinFET Structure, vol. 47, Nov. 2005, pp. S564-S567.
Campardo G. et al., VLSI Design of Non-Volatile Memories, 2005.
Ohsawa et al., "An 18.5ns 128Mb SOI DRAM with a Floating Body Cell," IEEE International Solid-State Circuits Conference, 2005, pp. 458-459, 609.
Ranica, et al., "A One Transistor Cell on Bulk Substrate (1T-Bulk) for Low-Cost and HIgh Density eDRAM," 2004 Symposium on VLSI Technology Digest of Technical Papers, pp. 128-129, Jun. 14-16, 2005.
Villaret, et al., "Further Insight Into the Physics and Modeling of Floating-Body Capacitorlless DRAMs," IEEE Transactions on Electron Devices, vol. 52, No. 11, Nov. 2005, pp. 2447-2454.
Lin et al., "A New 1T DRAM Cell with Enhanced Floating Body Effect," IEEE International Workshop on Memory Technology, Design, and Testing, 2006, pp. 23-27.
Lin, et al., A new 1T DRAM Cell with enhanced Floating Body Effect, 2006, pp. 1-5.
Oh et al., "A 4-bit Double SONOS Memory (DSM) with 4 Storage Nodes per Cell for Ultimate Multi-Bit Operation," Tech Digest, Symposium on VLSI Technology, 2006, pp. 58-59.

Sze, et al., "Physics of Semiconductor Devices," Copyright 2007 by John Wiley & Sons, Inc. Hoboken, New Jersey.
Pellizzer et al., A 90nm Phase Change Memory Technology for Stand-Alone Non-Volatile Memory Applications, pp. 1-1, 2006.
Ban et al., "A Scaled Floating Body Cell (FBC) Memory with High-K+Metal Gate on Thin-Silicon and Thin-BOXfor 16-nm Technology Node and Beyond," Symposium on VLSI Technology, 2008, pp. 92-93.
Bawedin, et al., "Floating-Body SOI Memory: Concepts, Physics, and Challenges," ECS Transactions 19.4 (2009), pp. 243-256.
Lu, et al., "A Simplified Superior Floating-Body/Gate DRAM Cell," IEEE Elec. Dev. Letters, vol. 30, No. 3, Mar. 2009, pp. 282-284.
Ohsawa, et al., "Autonomous Refresh of Floating-Body Cell due to Current Anomaly of Impact Ionization," IEEE Transactions on Electron Devices, vol. 56, No. 10, Oct. 2009, pp. 2302-2311.
Ban et al., "Integration of Back-Gate doping for 15-nm node floating body cell (FBC) memory," VLSI Technology (VLSIT), 2010 Symposium on IEEE, 2010, pp. 159-160.
Chiu et al., A simple process of thin-film transistor using the trench-oxide layer for improving 1T-DRAM performance, Next-Generation Electronics (ISNE), 2010 International Symposium on IEEE, 2010, pp. 254-257.
Chiu, et al., "Characteristics of a new trench-oxide thin-film transistor and its 1T-DRAM applications," Solid-State and Integrated Circuit Technology (ICSICT), 2010 10th IEEE International Conference on IEEE, 2010, pp. 1106-1108.
Chun, et al., "A 1.1 V, 667MHz randon cycle, asymmetric 2T gain cell embedded DRAM with a 99.9 percentile retention time of 110 μsec," VLSI Circuits (VLSIC), 2010 IEEE Symposium on IEEE, 2010, pp. 191-192.
Collaert, et al., "A low-voltage biasing scheme for aggressively scaled bulk FinFET 1T-DRAM featuring 10s retention at 85 C," VLSI Technology (VLSIT), 2010 Symposium on IEEE, 2010, pp. 161-162.
Guisi, et al., "Bipolar mode operation and scalability of double-gate capacitorless 1T-DRAM cells," Electron Devices, IEEE Transactions on, vol. 57, No. 8, 2010, pp. 1743-1750.
Gupta, et al., "32nm high-density high-speed T-RAM embedded memory technology," Electron Devices Meeting (IEDM), 2010 IEEE International, 2010, pp. 12-.
Gupta, et al., "32nm high-density high-speed T-RAM embedded memory technology," Electron Devices Meeting (IEDM), 2010 IEEE International, 2010, pp. 12.1.1.-12.1.4.
Han et al., "Biristor-Bistable resistor based on a silicon nanowire," Electron Device Letters, IEEE 31.8 (2010), 797-799.
Han et al., "Bistable resistor (biristor)-gateless silicon nanowire memory," VLSI Technology (VLSIT), 2010 Symposium on IEEE, 2010, pp. 171-172.
Hubert et al., "Experimental comparison of programming mechanisms in 1T-DRAM cells with variable channel length," Solid State Device Research Conference 9ESSDERC), 2010 Proceedings of the European, Sep. 14-16, 2010, pp. 150-153.
Kim et al., "Silicon on replacement insulator (SRI) floating body cell (FBC) memory," VLSI Technology (VLSIT), 2010 Symposium on IEEE, 2010, pp. 165-166.
Kim, et al., "Investigation of I1 DRAM cell with non-overlap structure and recessed channel," Silicon Nanoelectronics Workshop (SNW), IEEE, 2010, pp. 1-2.
Kim, et al., "Vertical double gate Z-RAM technology with remarkable low voltage operation for DRAM application," VLSI Technology (VLSIT), 2010 Symposium on, 2010, pp. 163-164.
Moon et al., "Fin-width dependence of BJT-based IT-DRAM implemented on FinFET," Electron Device Letters, vol. 31, No. 9, 2010, pp. 909-911.
Moon, et al., "Ultimately scaled 20nm unified-RAM," Electron Devices Meeting (IEDM), 2010 IEEE International, 2010, pp. 12.2.1.-12.2.4.
Pulicani, et al., "Simulation of Intrinsic Bipolar Transistor Mechanisms for future capacitor-less eDRAM on bulk substrate," 2010 IEEE, ICECS 2010, pp. 966-969.
Moon, et al., "An optically assisted program method for capacitor-less 1T-DRAM," Electron Devices, IEEE Transactions on, vol. 57, No. 7, 2010, pp. 1714-1718.

(56) References Cited

OTHER PUBLICATIONS

Rodriguez, et al., "A-RAM: Novel capacitor-less DRAM memory," Stanford University, downloaded on Feb. 2, 2010, at 05:09 from IEEE Xplore, pp. 1-2.
Rodriquez, et al., "A-RAM Memory Cell: Concept and Operation," IEEE Electron Device Letters, vol. 31, No. 9, Sep. 2010, pp. 972-974.
Zhang, et al., (Total Ionizing Dose Effects on FinFET-Based Capacitor-Less 1T-DRAMs, IEEE Transactions on Nuclear Science, vol. 57, No. 6, Dec. 2010, pp. 3298-3304.
Aoulaiche, et al., "Hot hole induced damage in 1T-FBRAM on bulk FinFET," Reliability Physics Symposium (IRPS), 2011 IEEE International, IEEE, 2011, pp. 99-104.
Collaert, et al., "Substrate bias dependency of sense margin and retention in bulk FINFET 1T-DRAM cells," Solid-State Electronics 65, 2011, pp. 205-210.
Galeti, et al., "BJT effect analysis in p- and n-SOI MuGFETs with high-k gat dielectrics and TiN metal gate electrode for a 1T-DRAM application," SOI Conference (SOI), 2011 IEEE International, IEEE, 2011, pp. 1-2.
Hwang, et al., "Offset buried metal gate vertical floating body memory technology with excellent retention time for DRAM application," VLSI Technology (VLSIT), 2011 Symposium on IEEE, 2011, pp. 172-173.
Lee, et al., "A Novel Capacitorless 1T DRAM Cell for Data Retention Time Improvement," Nanotechnology, IEEE Transactions on, vol. 10, No. 3, 2011, pp. 462-466.
Kim, et al., "Optical charge-pumping: A universal trap characterization technique for nanoscale floating body devices," VLSI Technology (VLSIT), 2011 Symposium on IEEE, 2011, pp. 190-191.
Moon, et al., "Multi-functional universal device using a band-engineered vertical structure," Electron Devices Meeting (IEDM), 2011 IEEE International, 2011, pp. 24.6.1.-24.6.4.
Rodriguez, et al., "Novel Capacitorless 1T-DRAM Cell for 22-nm Node Compatible With Bulk and SOI Substrates," IEEE Transactions on Electron Devices, vol. 58, No. 8, Aug. 2011, pp. 2371-2377.
Shin, et al., "A Novel Double HBT-Based Capacitorless 1T DRAM Cell With Si/SiGe Heterojunctions," IEEE Electron Device Letters, vol. 32, No. 7, Jul. 2011, pp. 850-852.
Almeida et al., "Comparison between low and high read bias in FB-RAM on UTBOX FDSOI devices," Ultimate Integration on Silicon (ULIS), 2012 13th International Conference on, Mar. 6, 2012, pp. 61-64.
Andrade et al, "The Impact of Back Bias on the Floating Body Effect in UTBOX SOI Devices for 1T-FBRAM Memory Applications," Devices, Circuits and Systems (ICCDCS), 2012 8th INternational Caribbean Conference on. IEEE, 2012. pp. 1-4.
Aoulaiche, et al., "Junction Field Effect on the Retention Time for One-Transistor Floating-Body RAM," Electron Devices, IEEE Transactions on, vol. 59, No. 8, 2012, pp. 2167-2172.
Avci, et al., "Floating-Body Diode—A Novel DRAM Device," Electron Device Letters, IEEE, vol. 33, No. 2, 2012, pp. 161-163.
Cao et al., "A Novel 1T-1D DRAM Cell for Embedded Application," Electron Devices, IEEE Transactions on, vol. 59, No. 5, 2012, pp. 1304-1310.
Cho, et al., "Variation Study and Implications for BJT-Based Thin-Body Capacitorless DRAM," Electron Device Letters, IEEE, Vo., 33, No. 3, 2012, pp. 312-314.
Cho, et al., "Variation-aware study of BJT-based capacitorless DRAM cell scaling limit," Silicon Nanolelectronics Workshop (SNW), 2012 IEEE, IEEE, 2012, pp. 1-2.
Chun, et al., "667 MHz Logic-Compatible Embedded DRAM Featuring an Asymmetric 2T Gain Cell for High Speed On-Die Caches," Solid-State Circuits, IEEE Journal of, vol. 47, No. 2, 2012, pp. 547-559.
Gamiz et al., "3D Trigate 1T-DRAM Memory Cell for 2x nm Nodes," Memory Workshop (IMW), 2012 4th IEEE International, IEEE, 2012, pp. 1-4.
Gamiz, et al., A 20nm low-power triple-gate multibody 1T-DRAM cell, VLSI Technology, Systems, and Applications (VLSI-TSA), 2012 International Symposium on IEEE, 2012, pp. 1-2.
Lui, et al., "A three-dimensional DRAM using floating body cell in FDSOI devices," Design and Diagnostics of Electronic Circuits and Systems (DDECS), 2012 IEEE 15th International Symposium on, IEEE, 2012, pp. 159-162.
Mahatme, et al., "Total ionizing dose effects on ultra thin buried oxide floating body memories," Reliability Physics Symposium (IRPS), 2012 IEEE International, 2012, pp. 1-5.
Nicoletti, et al., "The Dependence of Retention Time on Gate Length in UTBOX FBRAM With Different Source/Drain Junction Engineering," IEEE Electron Device Letters, vol. 33, No. 7, Jul. 2012, pp. 940-942.
Ohsawa, et al., "A Novel Capacitor-less DRAM Cell Floating Body Cell," Pan Stanford Publishing, 2012 by Taylor & Francis Group, LLC.
Ohsawa, et al., "Memory Design Using a One-Transistor Gain Cell on SOI," IEEE Journal of Solid-State Circuits, vol. 37, No. 11, Nov. 2012, pp. 1510-1522.
Romanjek, et al., "Compact (Wg/Lg=80/85nm) FDSOI 1T-DRAM programmed by Meta Stable Dip," CEA-Leti, MINATEC Campus, France 2012 IEEE, pp. 199-202.
Rothemund, et al., "The importance of being modular," Nature, vol. 485, May 31, 2012, pp. 584-585.
Shim, et al., "A BJT-Based Heterostructure 1T-DRAM for Low-Voltage Operation," IEEE Electron Device Letters, vol. 33, No. 1, Jan. 2012, pp. 14-16.
Shin, et al., "Vertical-Gate Si/SiGe Double-HBT-Based Capacitorless 1T DRAM Cell for Extended Retention Time at Low Latch Voltage," IEEE Electron Device Letters, vol. 33, No. 2, Feb. 2012, pp. 134-136.
Ventrice, et al., "Analytical model of deeply-scaled thyristors for memory applications," R&D Technology Development, Micron Inc., Agrate Brianza, Italy, pp. 1-4, Apr. 20, 2012.
Wu, et al., "Experimental Demonstration of the High-Performance Floating Body/Gate DRAM Cell for Embedded Memories," IEEE Electron Device Letters, vol. 33, No. 6, Jun. 2012, pp. 743-745.

* cited by examiner

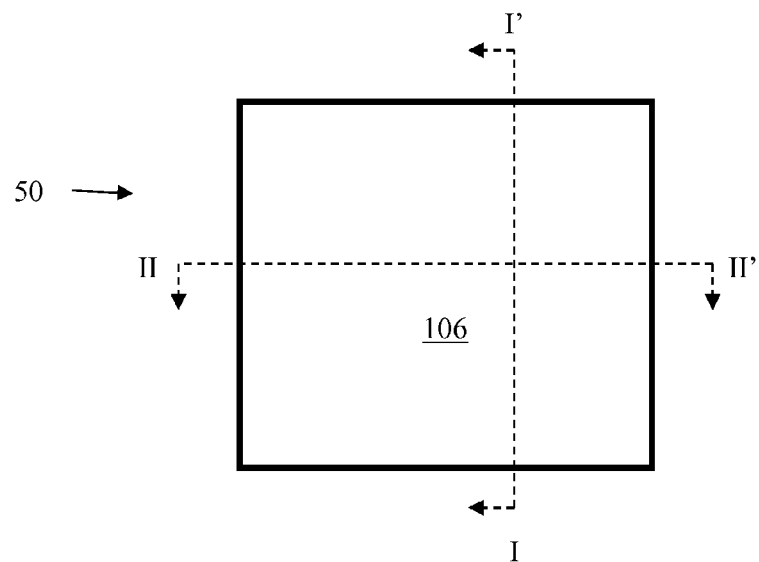
FIG. 2A
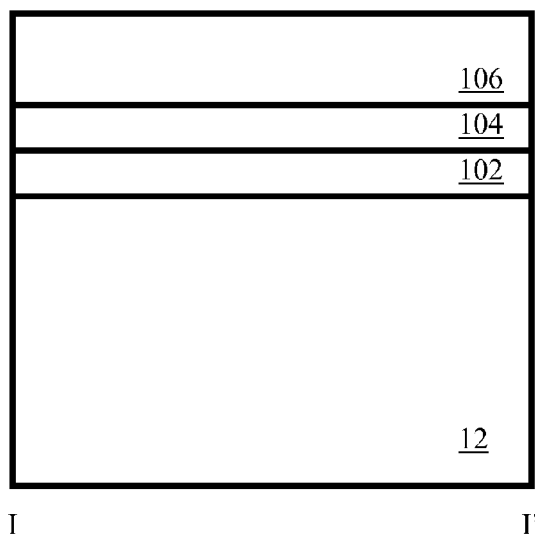 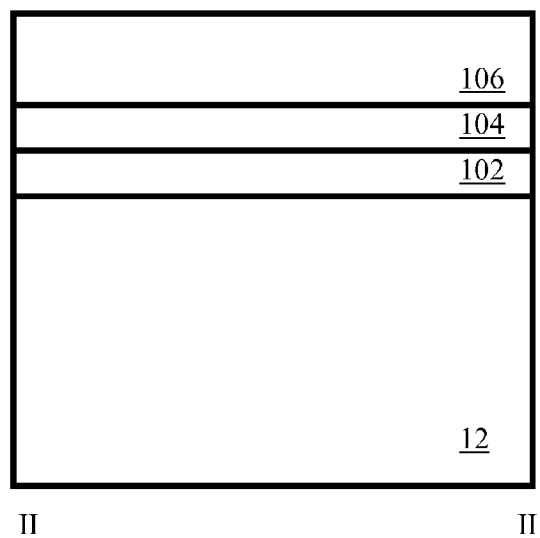
FIG. 2B
FIG. 2C

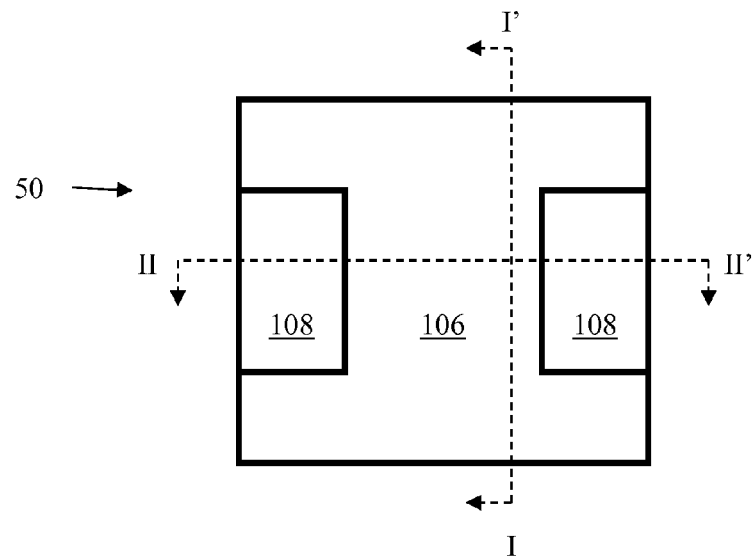
FIG. 2D
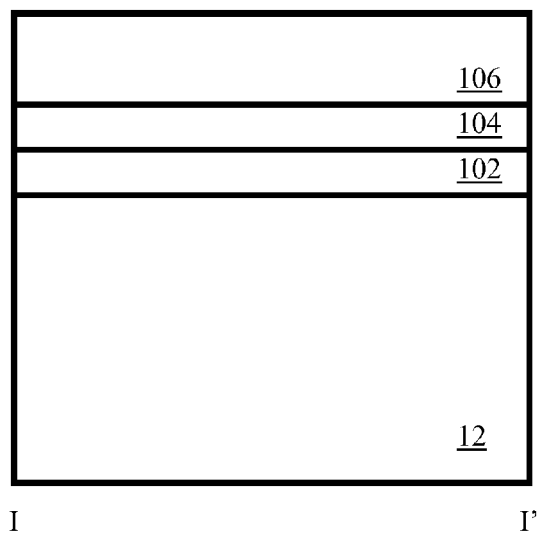 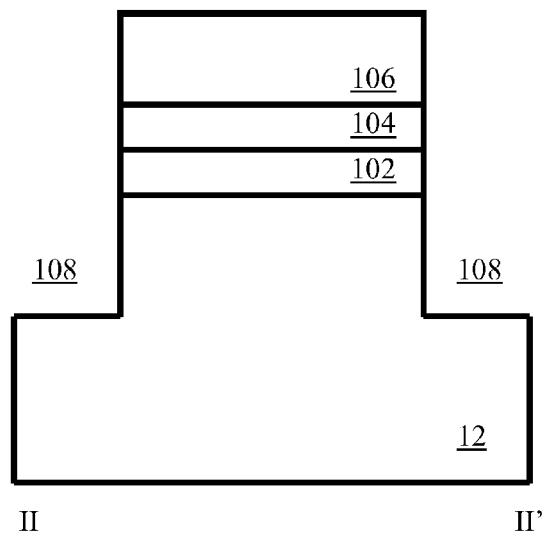
FIG. 2E    FIG. 2F

Floating Body 24 is positively charged and V(BL 16) = 0.0V

FB is neutrally charged: and V(BL 16) = V(FB 24) = 0V

On if FB is (+), with net
current flowing out of
FB 24
Off if FB is neutral

On if FB is (+); forward
bias current is balanced
by higher bipolar base
current
Off if FB is neutral Slightly on if FB is (+)
Off if FB is neutral On if FB is (+), with net
current flowing out of
FB 24
Off if FB is neutral On if FB is (+); forward bias current is balanced by higher bipolar base current
Off if FB is neutral Slightly on if FB is (+)
Off if FB is neutral On if FB is (+); forward bias current is balanced by higher bipolar base current
Off if FB is neutral On if FB is (+); forward
bias current is balanced
by higher bipolar base
current
Off if FB is neutral

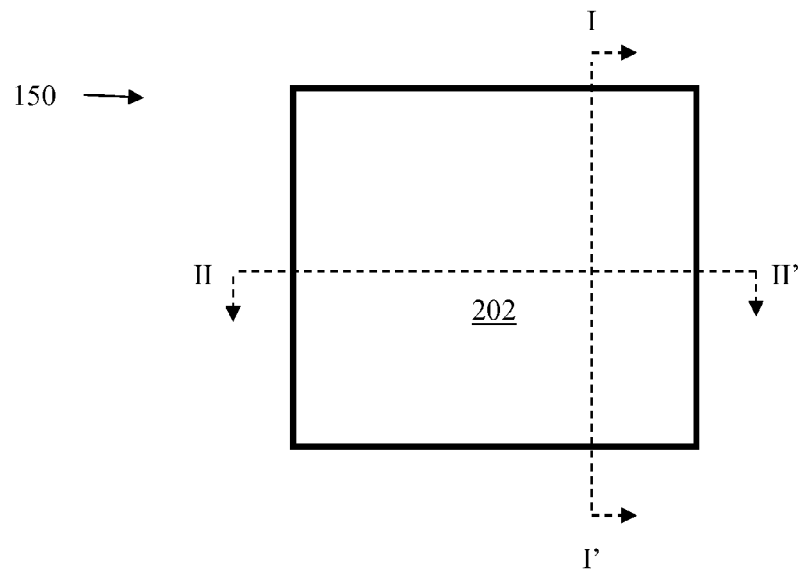
FIG. 39A
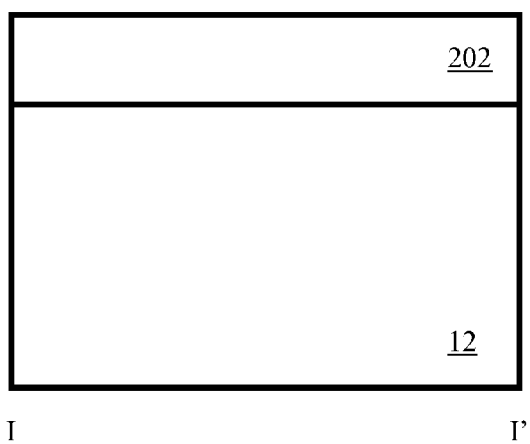 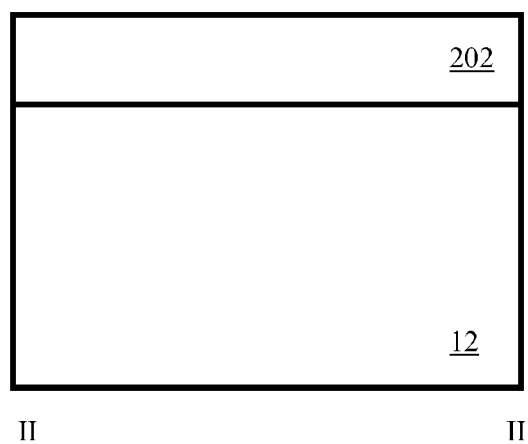
FIG. 39B          FIG. 39C

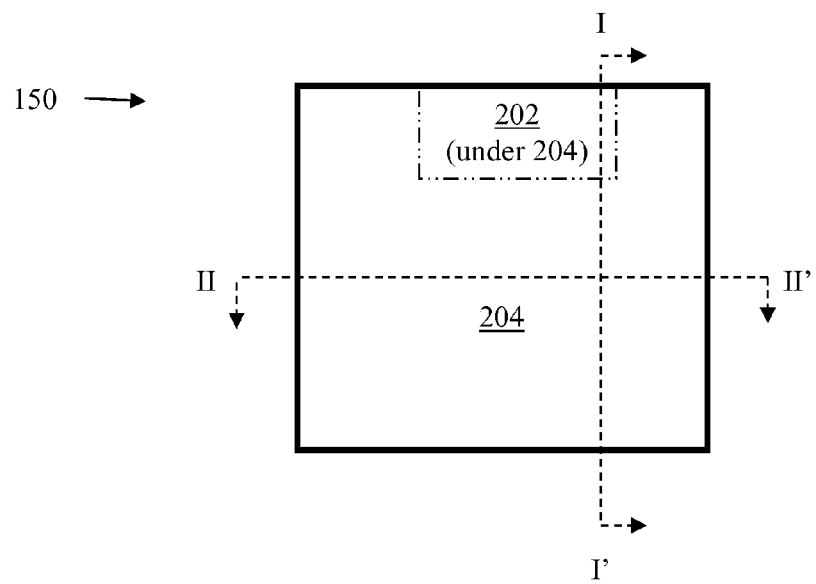
FIG. 39D
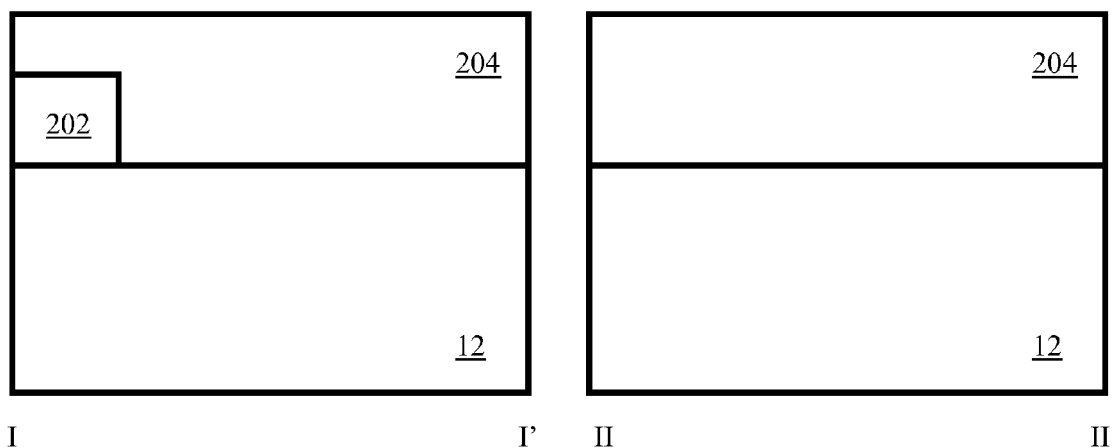
FIG. 39E                    FIG. 39F

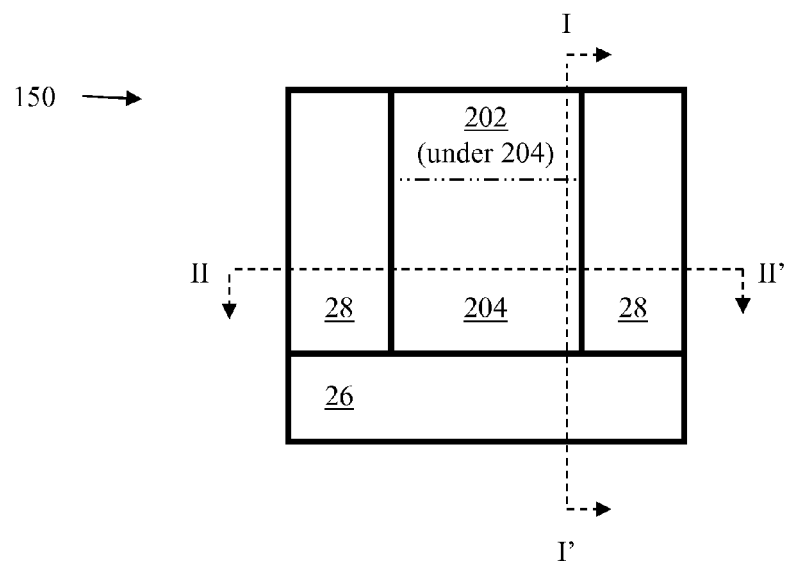
FIG. 39J
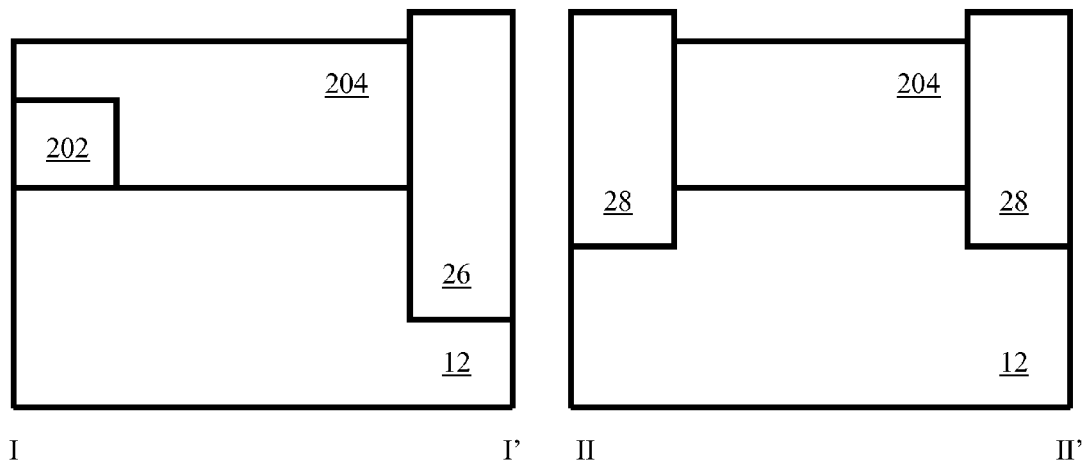
FIG. 39KFIG. 39L

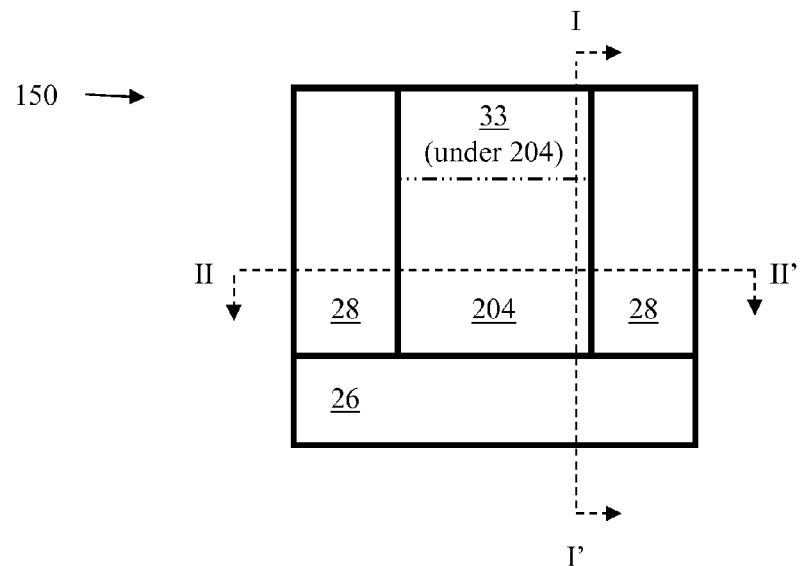
FIG. 39S
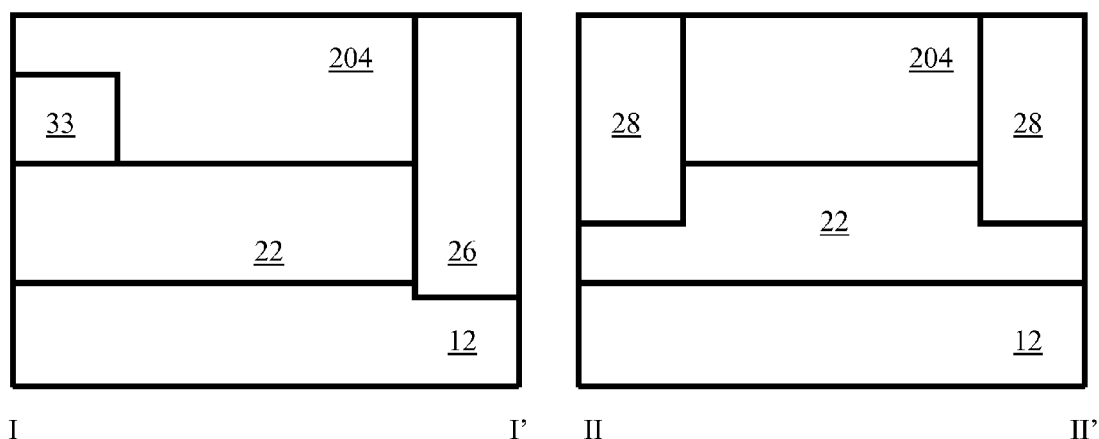
FIG. 39TFIG. 39U

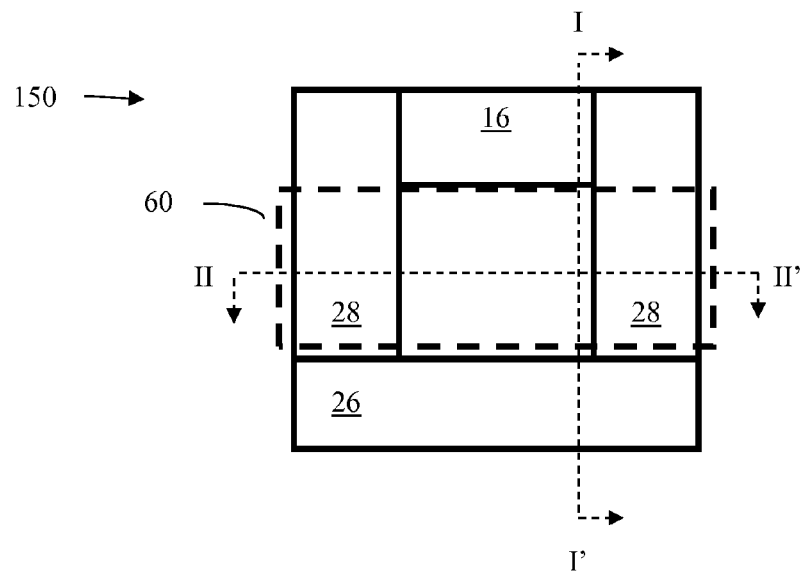
FIG. 39Y
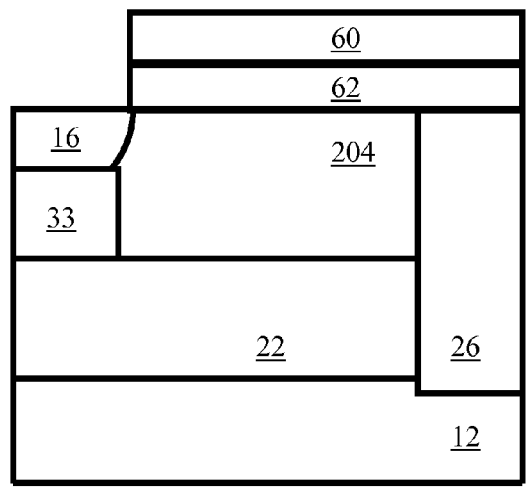 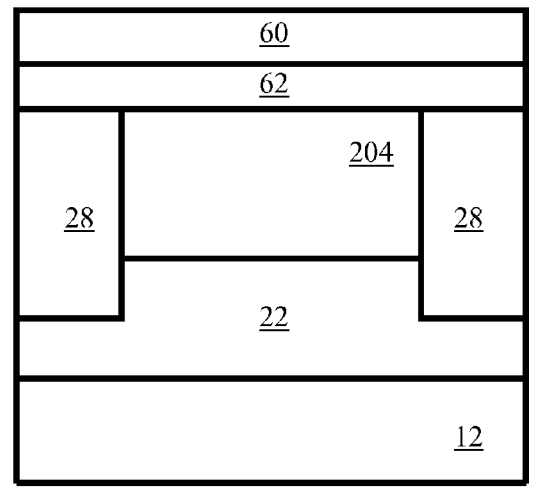
FIG. 39Z         FIG. 39AA

SEMICONDUCTOR MEMORY DEVICE HAVING AN ELECTRICALLY FLOATING BODY TRANSISTOR

CROSS-REFERENCE TO RELATED APPLICATIONS

This application is a continuation of U.S. patent application Ser. No. 14/330,083, filed Jul. 14, 2014, which is a continuation of U.S. patent application Ser. No. 14/018,947, filed Sep. 5, 2013, which is a continuation of U.S. patent application Ser. No. 12/897,516, filed Oct. 4, 2010. This application is also commonly assigned with U.S. patent application entitled "COMPACT SEMICONDUCTOR MEMORY DEVICE HAVING REDUCED NUMBER OF CONTACTS, METHODS OF OPERATING AND METHODS OF MAKING," Ser. No. 12/897,528, filed on Oct. 4, 2010. The entire contents of all the foregoing applications are incorporated herein in its entirety by reference.

TECHNICAL FIELD

The present invention relates to semiconductor memory technology. More specifically, the present invention relates to a semiconductor memory device having an electrically floating body transistor.

BACKGROUND OF THE INVENTION

Semiconductor memory devices are used extensively to store data. Static and Dynamic Random Access Memory (SRAM and DRAM) are widely used in many applications. SRAM typically consists of six transistors and hence has a large cell size. However, unlike DRAM, it does not require periodic refresh operation to maintain its memory state. Conventional DRAM cells consist of one-transistor and one-capacitor (1T/1C) structure. As the 1T/1C memory cell features are scaled, difficulties arise due to the necessity of maintaining the capacitance value.

DRAM based on the electrically floating body effect has been proposed (see for example "A Capacitor-less 1T-DRAM Cell", S. Okhonin et al., pp. 85-87, IEEE Electron Device Letters, vol. 23, no. 2, February 2002 ("Okhonin-1"), which is incorporated by reference herein in its entirely and "Memory Design Using One-Transistor Gain Cell on SOI", T. Ohsawa et al., pp. 152-153, Tech. Digest, 2002 IEEE International Solid-State Circuits Conference, February 2002) ("Ohsawa-1"), which is incorporated by reference herein in its entirely. Such a memory eliminates the capacitor used in conventional 1T/1C memory cell, and thus is easier to scale to smaller feature size. In addition, such memory allows for a smaller cell size compared to the conventional 1T/1C memory cell. Both Okhonin-1 and Ohsawa-1 describe DRAM memory cell comprising a single standard metal-oxide-semiconductor field effect transistor (MOSFET) having a gate terminal, two source/drain terminals, and a floating body fabricated using silicon-on-insulator (SOI) complimentary metal-oxide-semiconductor (CMOS) technology. Oshawa-1 further describes a current mirror sense amplifier which compares the current of a sensed cell to the average of two reference cells, one written to logic-0 and the other written to logic-1.

In a floating body memory, the different memory states are represented by different levels of charge in the floating body. In Okhonin-1 and Ohsawa-1, a single bit (two voltage levels) in a standard MOSFET is contemplated. Others have described using more than two voltage levels stored in the floating body of a standard MOSFET allowing for more than a single binary bit of storage in a memory cell like, for example, "The Multistable Charge-Controlled Memory Effect in SOI Transistors at Low Temperatures", Tack et al., pp. 1373-1382, IEEE Transactions on Electron Devices, vol. 37, May 1990 ("Tack") which is incorporated by reference herein in its entirely, and U.S. Pat. No. 7,542,345 "Multi-bit memory cell having electrically floating body transistor, and method of programming and reading same" to Okhonin, et al ("Okhonin-2"). Tack describes obtaining more than two states in the floating body of a standard MOSFET built in SOI by manipulating the "back gate"—a conductive layer below the bottom oxide (BOX) of the silicon tub the MOSFET occupies. Okhonin-2 discloses attaining more than two voltage states in the floating body utilizing the intrinsic bipolar junction transistor (BJT) formed between the two source/drain regions of the standard MOSFET to generate read and write currents.

In memory design in general, sensing and amplifying the state of a memory cell is an important aspect of the design. This is true as well of floating body DRAM memories. Different aspects and approaches to performing a read operation are known in the art like, for example, the ones disclosed in "A Design of a Capacitor-less 1T-DRAM Cell Using Gate-Induced Drain Leakage (GIDL) Current for Low-power and High-speed Embedded Memory", Yoshida et al., pp. 913-918, International Electron Devices Meeting, 2003 ("Yoshida") which is incorporated by reference herein in its entirely; in U.S. Pat. No. 7,301,803 "Bipolar reading technique for a memory cell having an electrically floating body transistor" ("Okhonin-3") which is incorporated by reference herein in its entirely; and in "An 18.5 ns 128 Mb SOI DRAM with a Floating Body Cell", Ohsawa et al., pp. 458-459, 609, IEEE International Solid-State Circuits Conference, 2005 ("Ohsawa-2") which is incorporated by reference herein in its entirely. Both Yoshida and Okhonin-3 disclose a method of generating a read current from a standard MOSFET floating body memory cell manufactured in SOI-CMOS processes. Okhonin-3 describes using the intrinsic BJT transistor inherent in the standard MOSFET structure to generate the read current. Ohsawa-2 discloses a detailed sensing scheme for use with standard MOSFET floating body memory cells implemented in both SOI and standard bulk silicon.

Writing a logic-0 to a floating body DRAM cell known in the art is straight forward. Either the source line or the bit line is pulled low enough to forward bias the junction with the floating body removing the hole charge, if any. Writing a logic-1 typically may be accomplished using either a band-to-band tunneling method (also known as Gate Induced Drain Leakage or GIDL) or an impact ionization method In floating body DRAM cells, writing a logic-0 is straightforward (simply forward biasing either the source or drain junction of the standard MOSFET will evacuate all of the majority carriers in the floating body writing a logic-0) while different techniques have been explored for writing a logic-1. A method of writing a logic-1 through a gate induced band-to-band tunneling mechanism, as described for example in Yoshida. The general approach in Yoshida is to apply an appropriately negative voltage to the word line (gate) terminal of the memory cell while applying an appropriately positive voltage to the bit line terminal (drain) and grounding the source line terminal (source) of the selected memory cell. The negative voltage on WL terminal and the positive voltage on BL terminal creates a strong electric field between the drain region of the MOSFET transistor and the floating body region in the proximity of the gate (hence the "gate induced" portion of GIDL) in the selected memory cell. This bends the energy bands sharply upward near the gate and drain junction overlap region, causing electrons to tunnel from the valence band to the conduction band, leaving holes in the valence band. The electrons which tunnel across the energy band become the drain leakage current (hence the "drain leakage" portion of GIDL), while the holes are injected into floating body region 24 and become the hole charge that creates the logic-1 state. This process is well known in the art and is illustrated in Yoshida (specifically FIGS. 2 and 6 on page 3 and FIG. 9 on page 4).

A method of writing a logic-1 through impact ionization is described, for example, in "A New 1T DRAM Cell with Enhanced Floating Body Effect", Lin and Chang, pp. 23-27, IEEE International Workshop on Memory Technology, Design, and Testing, 2006, ("Lin") which is incorporated in its entirety by reference herein. The general approach in Lin is to bias both the gate and bit line (drain) terminals of the memory cell to be written at a positive voltage while grounding the source line (source). Raising the gate to a positive voltage has the effect of raising the voltage potential of the floating body region due to capacitive coupling across the gate insulating layer. This in conjunction with the positive voltage on the drain terminal causes the intrinsic n-p-n bipolar transistor (drain (n=collector) to floating body (p=base) to source (n=emitter)) to turn on regardless of whether or not a logic-1 or logic-0 is stored in the memory cell. In particular, the voltage across the reversed biased p-n junction between the floating body (base) and the drain (collector) will cause a small current to flow across the junction. Some of the current will be in the form of hot carriers accelerated by the electric field across the junction. These hot carriers will collide with atoms in the semiconductor lattice which will generate hole-electron pairs in the vicinity of the junction. The electrons will be swept into the drain (collector) by the electric field and become bit line (collector) current, while the holes will be swept into the floating body region, becoming the hole charge that creates the logic-1 state.

Much of the work to date has been done on SOI, which is generally more expensive than a bulk silicon process. Some effort has been made to reduce costs of manufacturing floating body DRAMs by starting with bulk silicon. An example of a process to selectively form buried isolation region is described in "Silicon on Replacement Insulator (SRI) Floating Body Cell (FBC) Memory", S. Kim et al., pp. 165-166, Tech Digest, Symposium on VLSI Technology, 2010, ("S_Kim") which is incorporated in its entirety by reference herein. In S_Kim bulk silicon transistors are formed. Then the floating bodies are isolated by creating a silicon-on-replacement-insulator (SRI) structure. The layer of material under the floating body cells is selectively etched away and replaced with insulator creating an SOI type of effect. An alternate processing approach to selectively creating a gap and then filling it with an insulator is described in "A 4-bit Double SONOS Memory (DSM) with 4 Storage Nodes per Cell for Ultimate Multi-Bit Operation", Oh et al., pp. 58-59, Tech Digest, Symposium on VLSI Technology, 2006 ("Oh") which is incorporated in its entirety by reference herein.

Most work to date has involved standard lateral MOSFETs in which the source and drain are disposed at the surface of the semiconductor where they are coupled to the metal system above the semiconductor surface. A floating body DRAM cell using a vertical MOSFET has been described in "Vertical Double Gate Z-RAM technology with remarkable low voltage operation for DRAM application", J. Kim et al., pp. 163-164, Symposium of VLSI Technology, 2010, ("J_Kim") which is incorporated in its entirety by reference herein. In J_Kim, the floating body is bounded by a gate on two sides with a source region above and a buried drain region below. The drain is connected to a tap region, which allows a connection between a conductive plug at the surface to the buried drain region.

An alternate method of using a standard lateral MOSFET in a floating body DRAM cell is described in co-pending and commonly owned U.S. Patent Application Publication 2010/0034041 to Widjaja ("Widjaja"), which is incorporated in its entirety by reference herein. Widjaja describes a standard lateral MOSFET floating body DRAM cell realized in bulk silicon with a buried well and a substrate which forms a vertical silicon controlled rectifier (SCR) with a P1-N2-P3-N4 formed by the substrate, the buried well, the floating body, and the source (or drain) region of the MOSFET respectively. This structure behaves like two bipolar junction transistor (BJT) devices coupled together—one an n-p-n (N2-P3-N4) and one a p-n-p (P3-N2-P1)—which can be manipulated to control the charge on the floating body region (P3).

The construction and operation of standard MOSFET devices is well known in the art. An exemplary standard metal-oxide-semiconductor field effect transistor (MOSFET) device 100 is shown in FIG. 52A. MOSFET device 100 consists of a substrate region of a first conductivity type 82 (shown as p-type in the figure), and first and second regions 84 and 86 of a second conductivity type (shown as n-type) on the surface 88, along with a gate 90, separated from the semiconductor surface region by an insulating layer 92. Gate 90 is positioned in between the regions 84 and 86. Insulating layers 96 can be used to separate one transistor device from other devices on the silicon substrate 82.

As shown in FIG. 52B, a standard MOSFET device 100A may also consist of a well region 94A of a first conductivity type (shown as p-type in the figure) in a substrate region 82A of a second conductivity type (shown as n-type in the figure), with first and second regions 84A and 86A of a second conductivity type on the surface 88A. In addition, a gate 90A, separated from the surface region 88A by an insulating layer 92A, is also present in between the first and second regions 84A and 86A. Insulating layers 96A can be used to separate one transistor device from other devices in the well region 94A. MOSFET devices 100 and 100A are both constructed in bulk silicon CMOS technology.

As shown in FIG. 52C, a standard MOSFET device 100B is shown constructed out of silicon-on-insulator technology. MOSFET device 100B consists of a tub region of a first conductivity type 82B (shown as p-type in the figure), and first and second regions 84B and 86B of a second conductivity type (shown as n-type) on the surface 88B, along with a gate 90B, separated from the semiconductor surface region by an insulating layer 92B. Gate 90B is positioned in between the regions 84B and 86B. The tub region 82B is isolated from other devices on the sides by insulating layers 96B and on the bottom by insulating layer 83B. Optionally, there may be a conductive layer affixed to the bottom of insulating layer 83B (not shown) which may be used as a "back gate" by coupling through the insulating layer 83B to the tub region 82B.

The transistors 100, 100A, and 100B are all called n-channel transistors because when turned on by applying an appropriate voltage to the gates 90, 90A and 90B respectively, the p-material under the gates is inverted to behave like n-type conductivity type for as long as the gate voltage is applied. This allows conduction between the two n-type regions 84 and 86 in MOSFET 100, 84A and 86A in MOSFET 100A and 84B and 86B in MOSFET 100B. As is well known in the art, the conductivity types of all the regions may be reversed (i.e., the first conductivity type regions become n-type and the second conductivity type regions become p-type) to produce p-channel transistors. In general, n-channel transistors are be preferred for use in memory cells (of all types and technologies) because of the greater mobility of the majority carrier electrons (as opposed to the majority carrier holes in p-channel transistors) allowing more read current for the same sized transistor, but p-channel transistors may be used as a matter of design choice.

DETAILED DESCRIPTION OF THE INVENTION

Figure 1A:
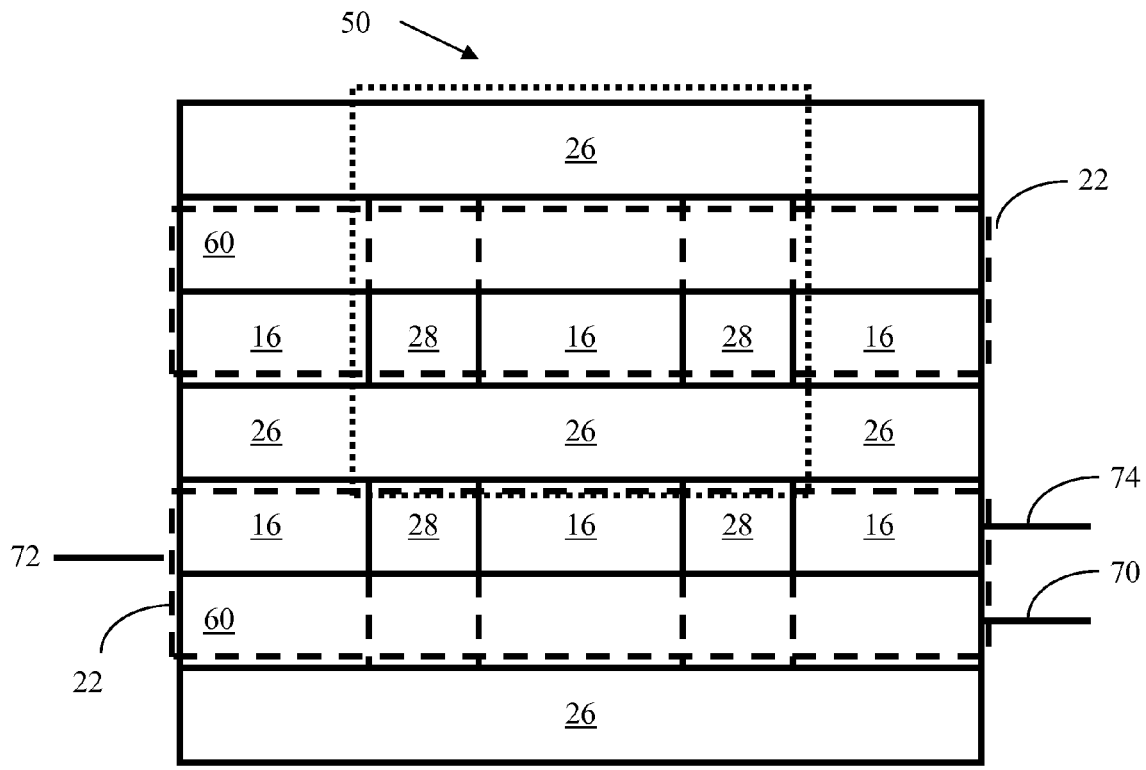
FIGS. 1A through 1E illustrate an array and details of a first exemplary memory cell according to the present invention.

The invention below describes a semiconductor memory device having an electrically floating body that utilizes a back bias region to further reduce the memory device size. One or more bits of binary information may be stored in a single memory cell. Methods of construction and of operation of the semiconductor device are also provided.

This disclosure uses the standard convention that p-type and n-type semiconductor "diffusion" layers or regions (regardless of how formed during manufacture) such as transistor source, drain or source/drain regions, floating bodies, buried layers, wells, and the semiconductor substrate as well as related insulating regions between the diffusion regions (like, for example, silicon dioxide whether disposed in shallow trenches or otherwise) are typically considered to be "beneath" or "below" the semiconductor surface—and the drawing figures are generally consistent with this convention by placing the diffusion regions at the bottom of the drawing figures. The convention also has various "interconnect" layers such as transistor gates (whether constructed of metal, p-type or n-type polysilicon or some other material), metal conductors in one or more layers, contacts between diffusion regions at the semiconductor surface and a metal layer, contacts between the transistor gates and a metal layer, vias between two metal layers, and the various insulators between them (including gate insulating layers between the gates and a diffusion at the semiconductor surface) are considered to be "above" the semiconductor surface—and the drawing figures are generally consistent with this convention placing these features, when present, near the top of the figures. One exception worth noting is that gates may in some embodiments be constructed in whole or in part beneath the semiconductor surface. Another exception is that some insulators may be partially disposed both above and below the surface. Other exceptions are possible. Persons of ordinary skill in the art will appreciate that the convention is used for ease of discussion with regards to the standard way of drawing and discussing semiconductor structures in the literature, and that a physical semiconductor in use in an application may be deployed at any angle or orientation without affecting its physical or electrical properties thereby.

The exemplary embodiments disclosed herein have at most one surface contact from the semiconductor region below the semiconductor surface to the interconnect region above the semiconductor surface within the boundary of the memory cell itself. This is in contrast to one-transistor (1T) floating body cell (FBC) DRAMs of the prior art which have two contacts—one for the source region and one for the drain region of the transistor. While some 1T FBC DRAM cells of the prior art can share the two contacts with adjacent cells resulting in an average of one contact per cell, some embodiments of the present invention can also share its contact with an adjacent cell averaging half a contact per cell.

The advantage of the present invention is in the elimination of one of the source/drain regions at the surface of the semiconductor region thereby eliminating the need to contact it at the surface. Compare, for example, FIG. 52B illustrating a prior art MOSFET with FIG. 1C illustrating a analogous cross section of one embodiment of the present invention. In any processing technology, the structure of FIG. 1C is inherently smaller than the structure of FIG. 52B. In some embodiments of the present invention, the gate terminal is removed as well further reducing the size of the memory cell. Compare, for example, the analogous cross sections of the structures in FIGS. 40C and 47C to the prior art MOSFET of FIG. 52B. This new class of memory cell is referred to as a "Half Transistor Memory Cell" as a convenient shorthand for identical, similar or analogous structures. A structure identical, similar or analogous to the structure of FIG. 1C is referred to as a "Gated Half Transistor Memory Cell." A structure identical, similar or analogous to the structures of FIGS. 40C and 47C is referred to as a "Gateless Half Transistor Memory Cell." The vertical arrangement of the diffusion regions beneath the semiconductor surface common to all half transistor memory cells—specifically a bit line region at the surface of the semiconductor (allowing coupling to a bit line disposed above the semiconductor surface), a floating body region (for storing majority charge carriers, the quantity of majority carriers determining the logical state of the data stored in memory cell), and a source line region (completely beneath the semiconductor surface within the boundary of the memory cell allowing coupling to a source line running beneath the semiconductor surface, typically running beneath and coupling to a plurality of memory cells), wherein the bit line region, the floating body, and the source line region form a vertical bipolar junction transistor that is used operatively and constructed deliberately by design for use in a floating body DRAM memory cell application—is referred to as a "Half Transistor."

Persons of ordinary skill in the art will appreciate that the following embodiments and methods are exemplary only for the purpose of illustrating the inventive principles of the invention. Many other embodiments are possible and such alternate embodiments and methods will readily suggest themselves to such skilled persons after reading this disclosure and examining the accompanying drawing. Thus the disclosed embodiments are exemplary only and the present invention is not to be limited in any way except by the appended claims.

Drawing figures in this specification, particularly diagrams illustrating semiconductor structures, are drawn to facilitate understanding through clarity of presentation and are not drawn to scale. In the semiconductor structures illustrated, there are two different conductivity types: p-type where the majority charge carriers are positively charged holes that typically migrate along the semiconductor valence band in the presence of an electric field, and n-type where the majority charge carriers are negatively charged electrons that typically migrate along the conduction band in the presence of an electric field. Dopants are typically introduced into an intrinsic semiconductor (where the quantity of holes and electrons are equal and the ability to conduct electric current is low: much better than in an insulator, but far worse than in a region doped to be conductive—hence the "semi-" in "semiconductor") to create one of the conductivity types.

When dopant atoms capable of accepting another electron (known and "acceptors") are introduced into the semiconductor lattice, the "hole" where an electron can be accepted becomes a positive charge carrier. When many such atoms are introduced, the conductivity type becomes p-type and the holes resulting from the electrons being "accepted" are the majority charge carriers. Similarly, when dopant atoms capable of donating another electron (known and "donors") are introduced into the semiconductor lattice, the donated electron becomes a negative charge carrier. When many such atoms are introduced, the conductivity type becomes n-type and the "donated" electrons are the majority charge carriers.

As is well known in the art, the quantities of dopant atoms used can vary widely over orders of magnitude of final concentration as a matter of design choice. However it is the nature of the majority carries and not their quantity that determines if the material is p-type or n-type. Sometimes in the art, heavily, medium, and lightly doped p-type material is designated p+, p and p− respectively while heavily, medium, and lightly doped n-type material is designated n+, n and n− respectively. Unfortunately, there are no precise definitions of when a "+" or a "−" is an appropriate qualifier, so to avoid overcomplicating the disclosure the simple designations p-type and n-type abbreviated "p" or "n" respectively are used without qualifiers throughout this disclosure. Persons of ordinary skill in the art will appreciate that there are many considerations that contribute to the choice of doping levels in any particular embodiment as a matter of design choice.

Numerous different exemplary embodiments are presented. In many of them there are common characteristics, features, modes of operation, etc. When like reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 1B:
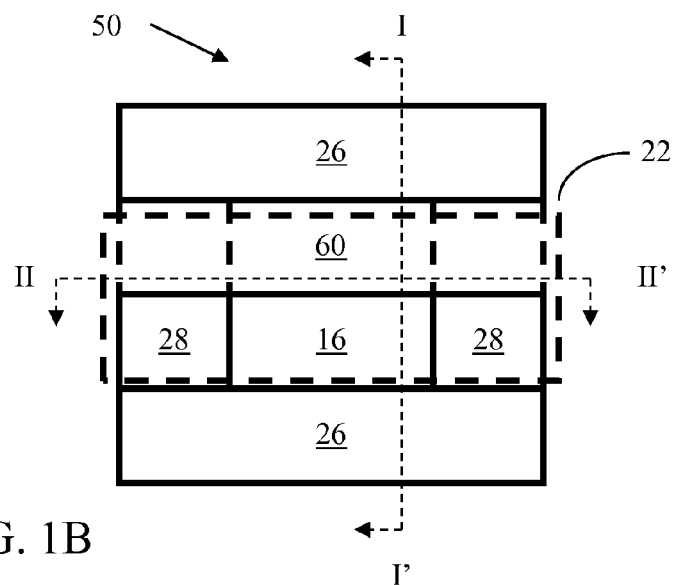
Figure 1C:
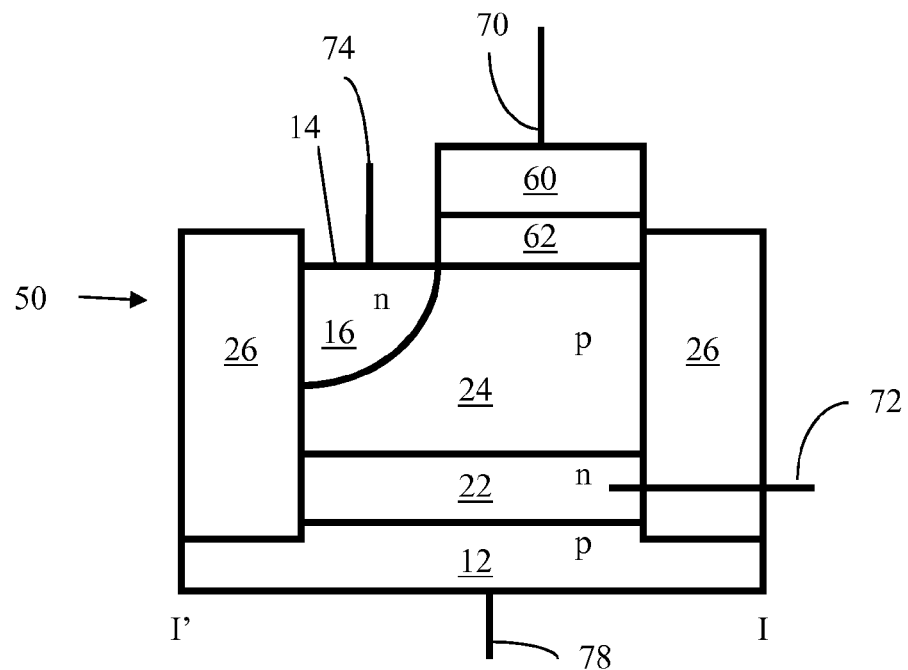
Figure 1D:
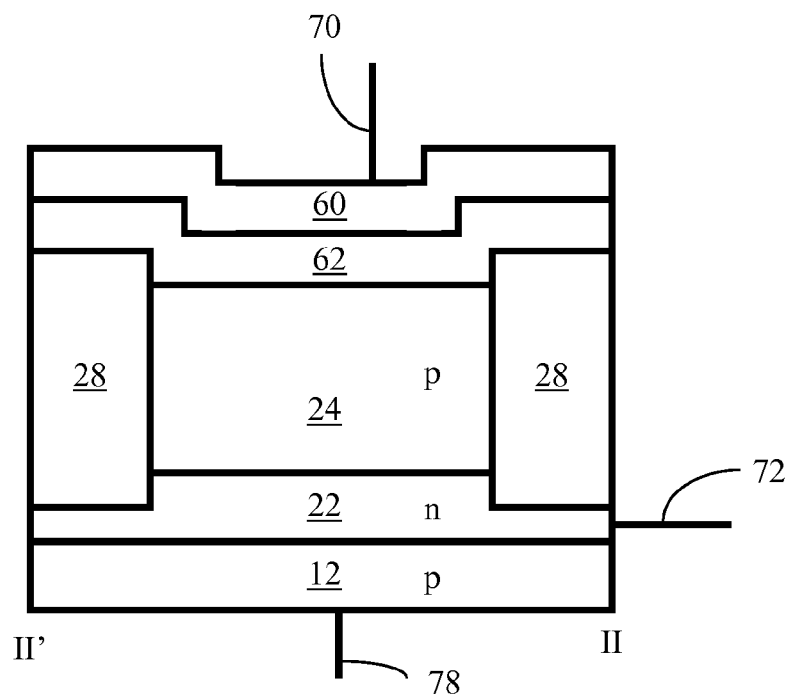
Figure 1E:
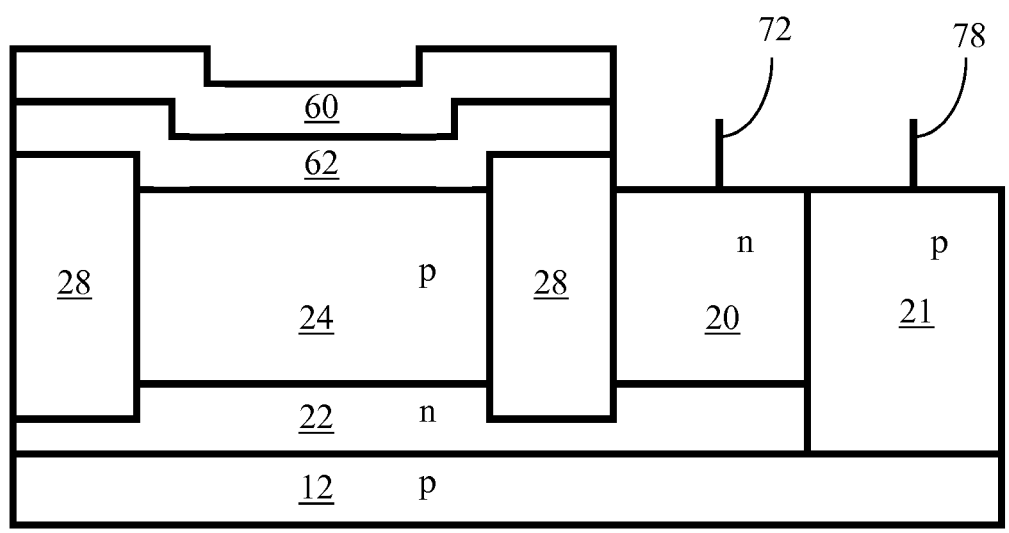

FIGS. 1A through 1E illustrate an embodiment of a gated half transistor FBC DRAM memory cell according to the present invention. FIG. 1A shows a top view of an embodiment of a partial memory array including memory cell 50 (shown by a dotted line) and FIG. 1B shows memory cell 50 in isolation. FIGS. 1C and 1D show the memory cell 50 cross sections along the I-I' line and II-II' cut lines, respectively, while FIG. 1E shows a method for electrically contacting the buried well and substrate layers beneath the cell.

Referring to FIGS. 1C and 1D together, the cell 50 includes a substrate 12 of a first conductivity type such as a p-type, for example. Substrate 12 is typically made of silicon, but may also comprise, for example, germanium, silicon germanium, gallium arsenide, carbon nanotubes, or other semiconductor materials. In some embodiments of the invention, substrate 12 can be the bulk material of the semiconductor wafer. In other embodiments, substrate 12 can be a well of the first conductivity type embedded in either a well of the second conductivity type or, alternatively, in the bulk of the semiconductor wafer of the second conductivity type, such as n-type, for example, (not shown in the figures) as a matter of design choice. To simplify the description, the substrate 12 will usually be drawn as the semiconductor bulk material as it is in FIGS. 1C and 1D.

A buried layer 22 of a second conductivity type such as n-type, for example, is provided in the substrate 12. Buried layer 22 may be formed by an ion implantation process on the material of substrate 12. Alternatively, buried layer 22 can also be grown epitaxially on top of substrate 12.

A floating body region 24 of the first conductivity type, such as p-type, for example, is bounded on top by bit line region 16 and insulating layer 62, on the sides by insulating layers 26 and 28, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments, as a matter of design choice.

Figure 4A:
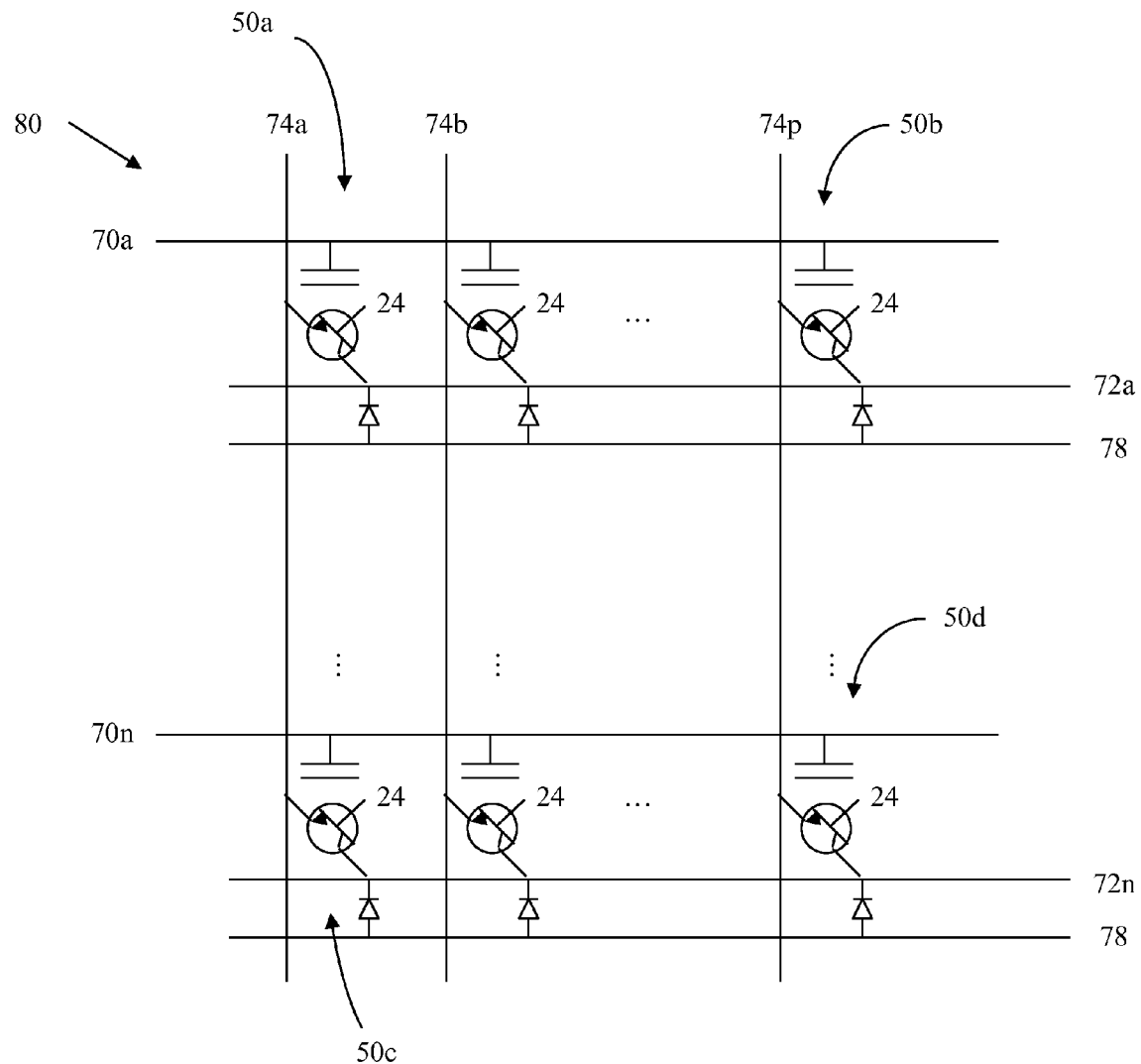
FIGS. 4A through 4D illustrate methods of maintaining the state of the data stored in an array of memory cells according to the present invention.
Figure 4B:
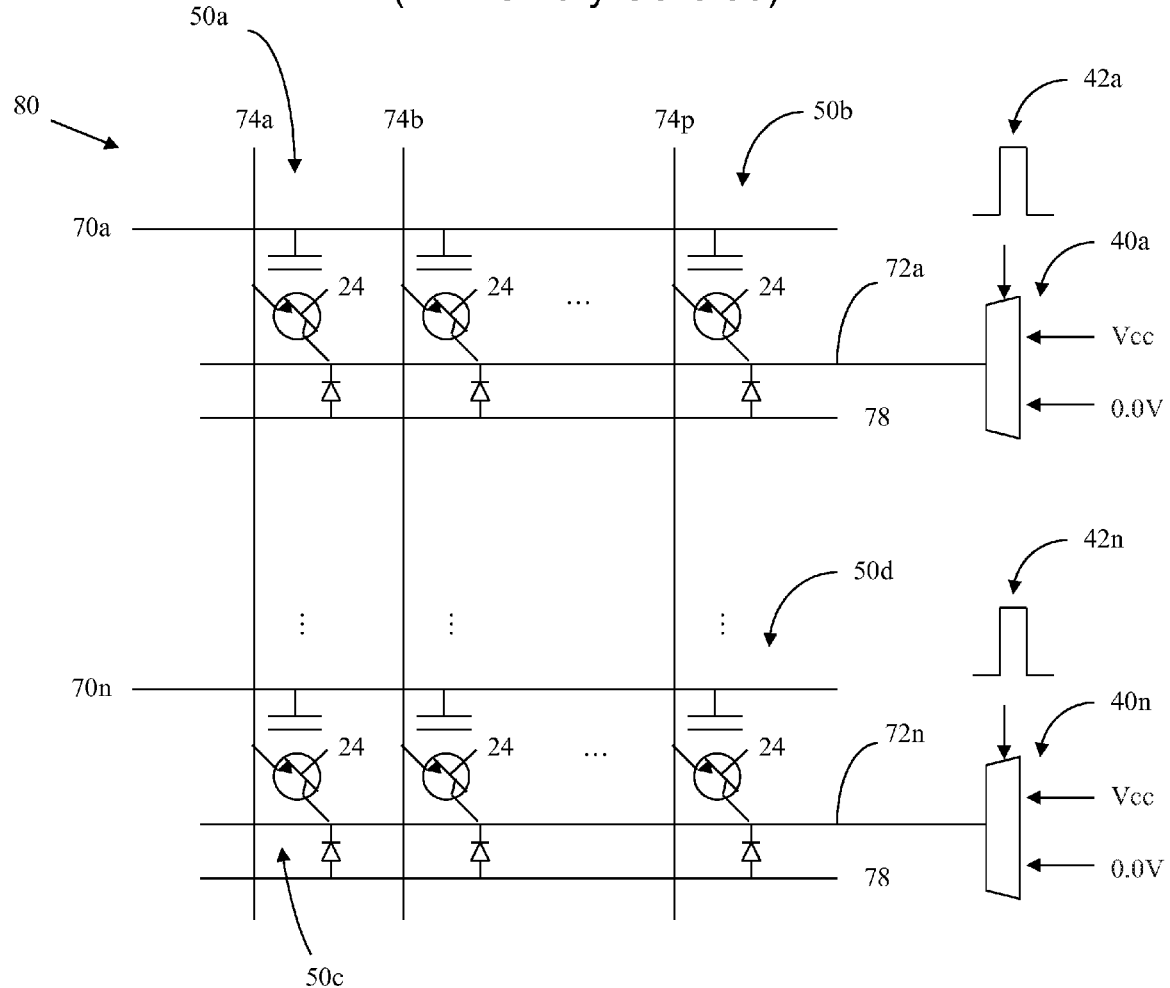
Figure 4C:
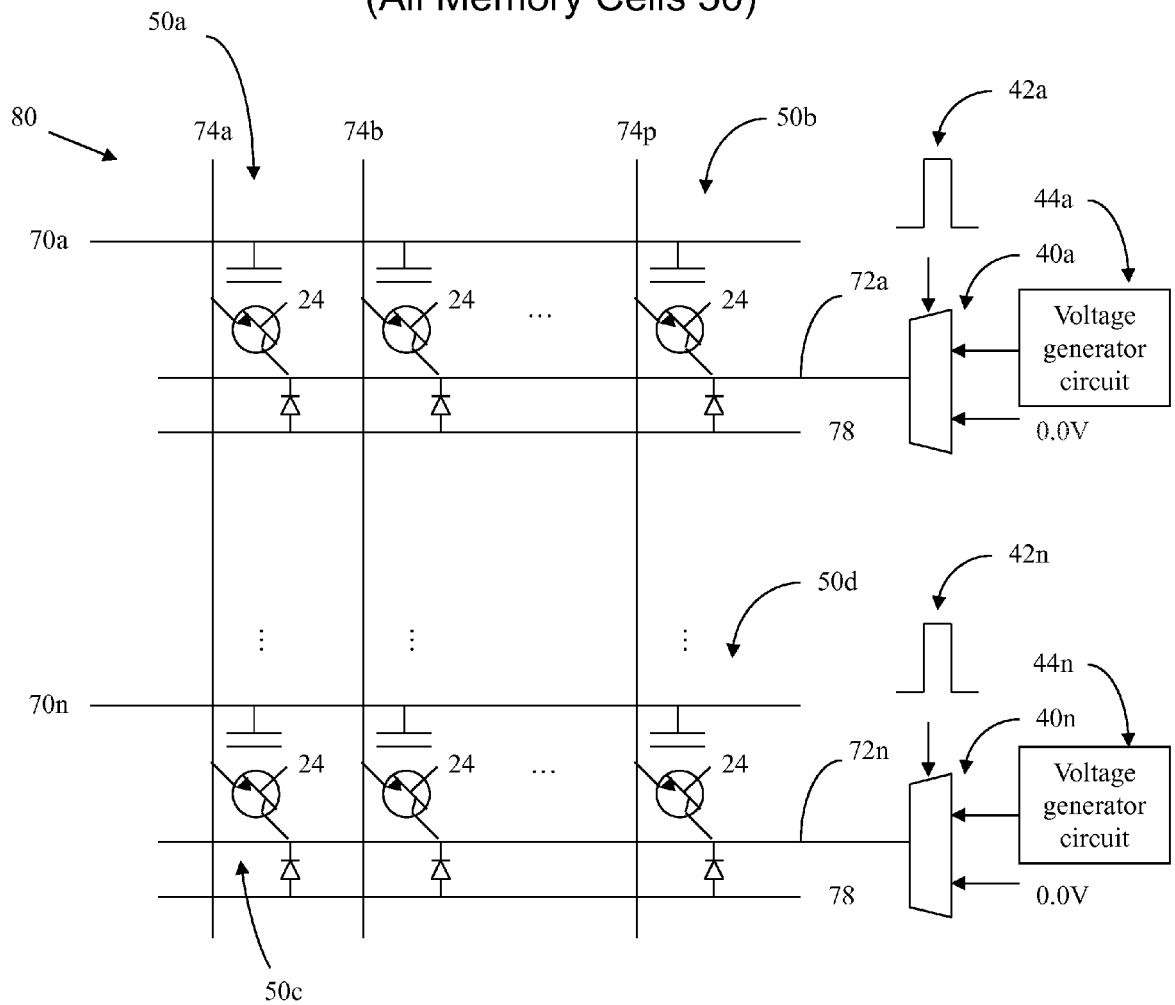

Insulating layers 26 and 28 (like, for example, shallow trench isolation (STI)), may be made of silicon oxide, for example, though other insulating materials may be used. Insulating layers 26 and 28 insulate cell 50 from neighboring cells 50 when multiple cells 50 are joined in an array 80 to make a memory device as illustrated in FIGS. 4A-4C. Insulating layer 26 insulates both body region 24 and buried region 22 of adjacent cells (see FIG. 1C), while insulating layer 28 insulates neighboring body region 24, but not the buried layer 22, allowing the buried layer 22 to be continuous (i.e. electrically conductive) in one direction (along the II-II' direction as shown in FIG. 1D). This connecting of adjacent memory cells together through buried layer 22 forming a source line beneath adjacent memory cells 50 allows the elimination of a contacted source/drain region or an adjacent contacted plug inside the memory cell required in memory cells of the prior art. As can be seen in FIGS. 1A and 1B, there is no contact to the buried layer 22 at the semiconductor surface inside the boundary of memory cell 50.

A bit line region 16 having a second conductivity type, such as n-type, for example, is provided in floating body region 24 and is exposed at surface 14. Bit line region 16 is formed by an implantation process formed on the material making up substrate 12, according to any implantation process known and typically used in the art. Alternatively, a solid state diffusion process could be used to form bit line region 16.

A gate 60 is positioned in between the bit line region 16 and insulating layer 26 and above the floating body region 24. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Cell 50 further includes word line (WL) terminal 70 electrically connected to gate 60, bit line (BL) terminal 74 electrically connected to bit line region 16, source line (SL) terminal 72 electrically connected to buried layer 22, and substrate terminal 78 electrically connected to substrate 12.

As shown in FIG. 1E, contact between SL terminal 72 and buried layer 22 can be made through region 20 having a second conductivity type, and which is electrically connected to buried well region 22, while contact between substrate terminal 78 and substrate region 12 can be made through region 21 having a first conductivity type, and which is electrically connected to substrate region 12.

Figure 52A:
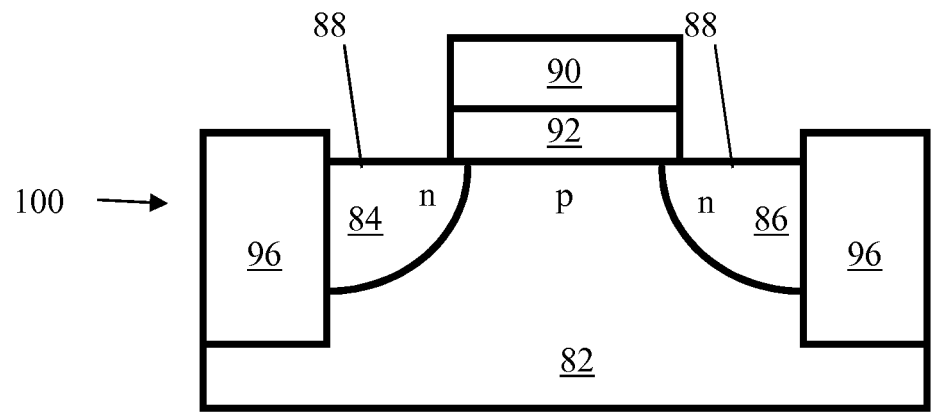
FIGS. 52A through 52C illustrate standard MOSFET transistors of the prior art.
Figure 52B:
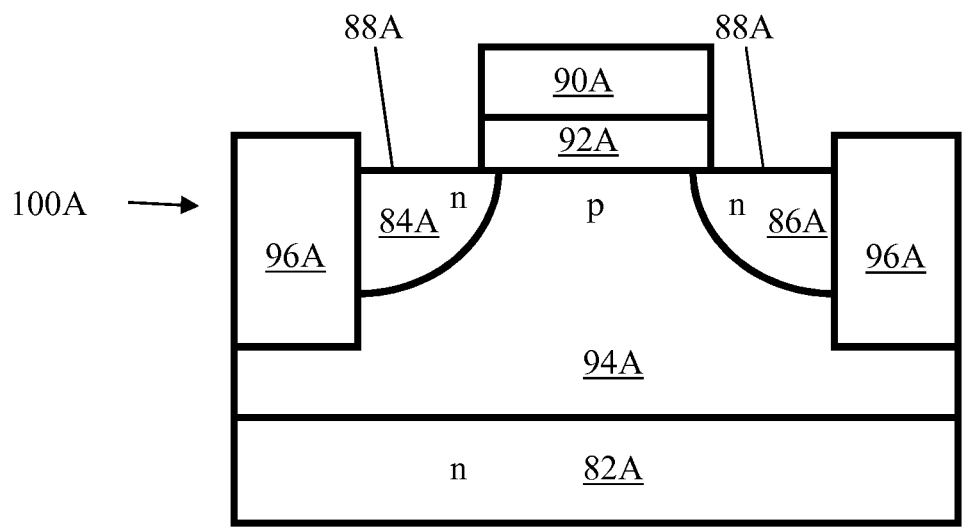

The SL terminal 72 connected to the buried layer region 22 serves as a back bias terminal, i.e. a terminal at the back side of a semiconductor transistor device, usually at the opposite side of the gate of the transistor coupled to the body or bulk of the device corresponding to region 82 in transistor 100 of FIG. 52A or region 94A in transistor 100A in FIG. 52B. In a floating body DRAM cell, a conductive coupling to the floating body would be counterproductive since it would cease to be a floating body with such a connection. In some embodiments, the p-n junction between the floating body 24 and the buried well 22 coupled to the source line terminal 72 is forward biased to be conductive by applying a negative voltage to the source line terminal 72. In some embodiments, the SL terminal is biased to a positive voltage potential to maintain the charge in the floating body region 24. In some embodiments, the source line terminal 72 is used in a manner similar to the source line in floating body DRAM cells of the prior art. Thus in various embodiments SL terminal 72 may be used in a manner similar to a back bias terminal, or it may be used like a source line, or it may be used for another purpose entirely. In some embodiments it may be used in two or more of these ways in different operations. Thus both the terms "source line terminal" and "back bias terminal" are used interchangeably in this specification and should be deemed equivalent.

Figure 52C:
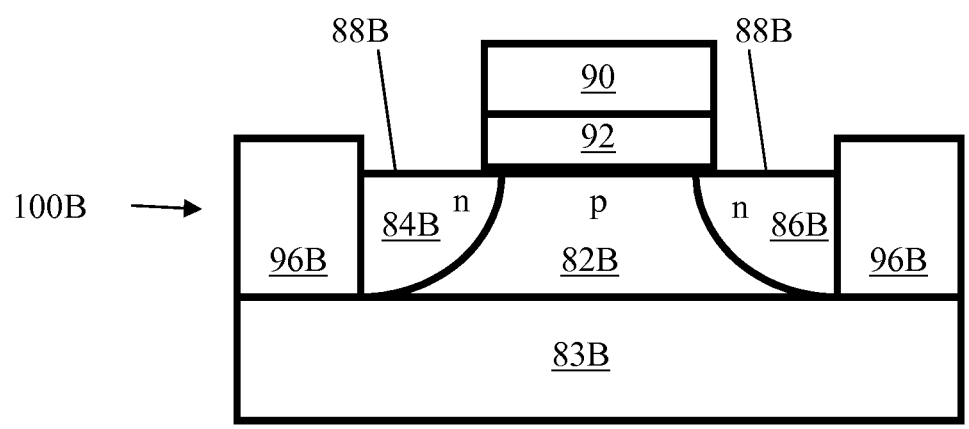

Comparing the structure of the memory device 50, for example, as shown in FIG. 1C to the structure of transistor devices 100, 100A and 100B in FIGS. 52A through 52C, it can be seen that the memory device of present invention constitutes a smaller structure relative to the MOSFET devices 100, 100A and 100B, where only one region of a second conductivity type is present at the surface of the silicon substrate. Thus, memory cell 50 of the present invention provides an advantage that it consists of only one region of second conductivity at the surface (i.e. bit line region 16 as opposed to regions 84 and 86 or regions 84A and 86A) and hence requires only one contact per memory cell 50 (i.e. to create a connection between bit line region 16 and terminal 74).

Persons of ordinary skill in the art will appreciate that in FIGS. 1A through 1E and that the first and second conductivity types can be reversed in memory cell 50 as a matter of design choice and that the labeling of regions of the first conductivity type as p-type and the second conductivity type as p-type is illustrative only and not limiting in any way. Thus the first and second conductivity types can be p-type and n-type respectively in some embodiments of memory cell 50 and be n-type and p-type respectively in other embodiments. Further, such skilled persons will realize that the relative doping levels of the various regions of either conductivity type will also vary as a matter of design choice, and that there is no significance to the absence of notation signifying higher or lower doping levels such as p+ or p− or n+ or n− in any of the diagrams.

Figure 2G:
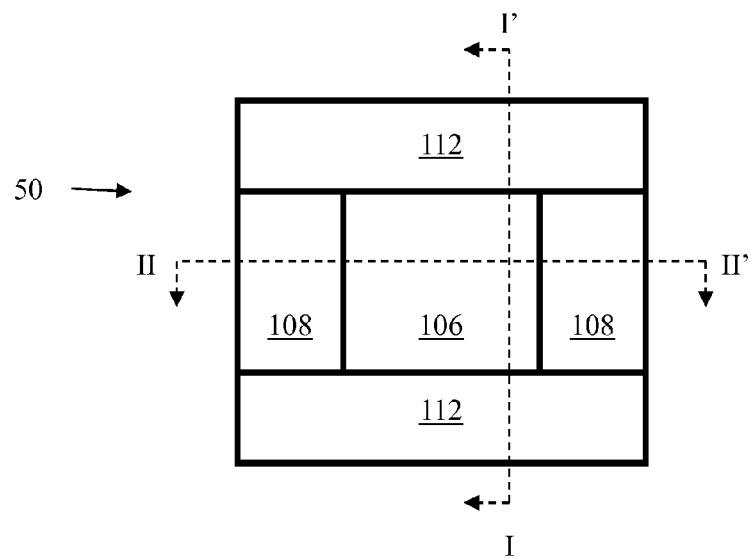
FIGS. 2A through 2U illustrate a method of manufacturing a memory cell according to the present invention.

A method of manufacturing memory cell 50 will be described with reference to FIGS. 2A through 2U. These 21 figures are arranged in groups of three related views, with the first figure of each group being a top view, the second figure of each group being a vertical cross section of the top view in the first figure of the group designated I-I', and the third figure of each group being a horizontal cross section of the top view in the first figure of the group designated II-II'. Thus FIGS. 2A, 2D, 2G, 2J, 2M, 2P and 2S are a series of top views of the memory cell 50 at various stages in the manufacturing process, FIGS. 2B, 2E, 2H, 2K, 2N, 2Q and 2T are their respective vertical cross sections labeled I-I', and FIGS. 2C, 2F, 2I, 2L, 2O, 2R and 2U are their respective horizontal cross sections labeled II-II'. Identical reference numbers from FIGS. 1A through 1G appearing in FIGS. 2A through 2U represent similar, identical or analogous structures as previously described in conjunction with the earlier drawing figures. Here "vertical" means running up and down the page in the top view diagram and "horizontal" means running left and right on the page in the top view diagram. In a physical embodiment of memory cell 50, both cross sections are vertical with respect to the surface of the semiconductor device.

Turning now to FIGS. 2A through 2C, the first steps of the process are seen. In an exemplary 130 nanometer (nm) process a thin silicon oxide layer 102 with a thickness of about 100 A may be grown on the surface of substrate 12. This may be followed by a deposition of about 200 A of polysilicon layer 104. This in turn may be followed by deposition of about 1200 A silicon nitride layer 106. Other process geometries like, for example, 250 nm, 180 nm, 90 nm, 65 nm, etc., may be used. Similarly, other numbers of, thicknesses of, and combinations of protective layers 102, 104 and 106 may be used as a matter of design choice.

As shown in FIGS. 2D through 2F, a pattern opening the areas to become trench 108 may be formed using a lithography process. Then the silicon oxide 102, polysilicon 104, silicon nitride 106 layers may be subsequently patterned using the lithography process and then may be etched, followed by a silicon etch process, creating trench 108.

Figures 2H, 2I:
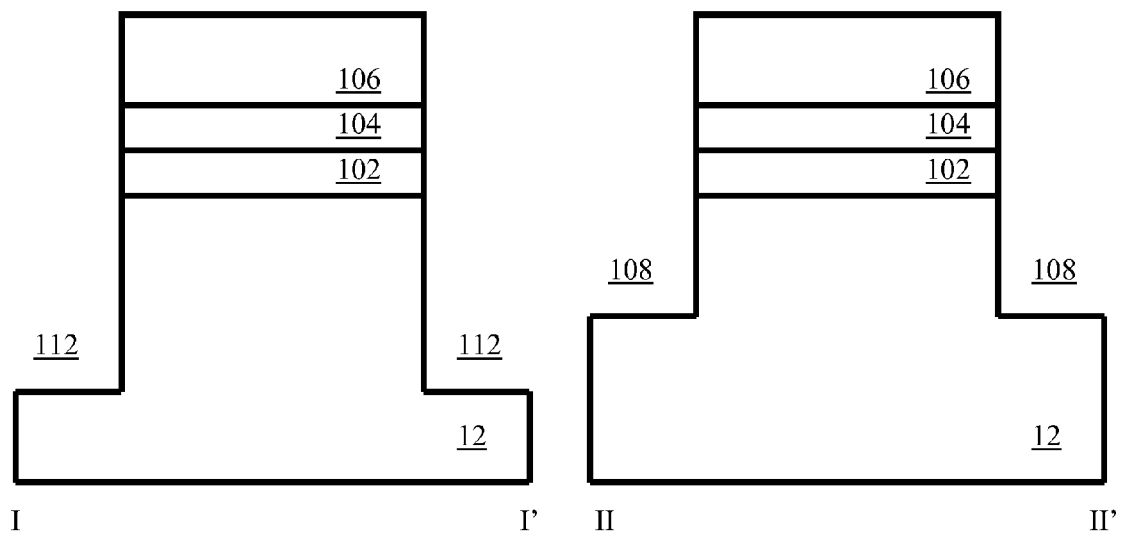

As shown in FIGS. 2G through 2I, a pattern opening the areas to become trenches 112 may be formed using a lithography process, which may be followed by etching of the silicon oxide 102, polysilicon 104, silicon nitride layers 106, and a silicon trench etch process, creating trench 112. The trench 112 is etched such that the trench depth is deeper than that of trench 108. In an exemplary 130 nm process, the trench 108 depth may be about 1000 A and the trench 112 depth may be about 2000 A. Other process geometries like, for example, 250 nm, 180 nm, 90 nm, 65 nm, etc., may be used. Similarly, other trench depths may be used as a matter of design choice.

Figure 2J:
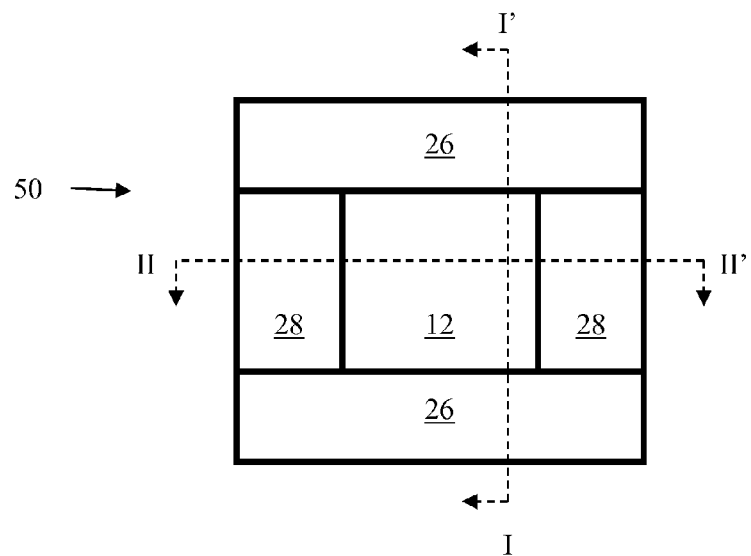
Figures 2K, 2L:
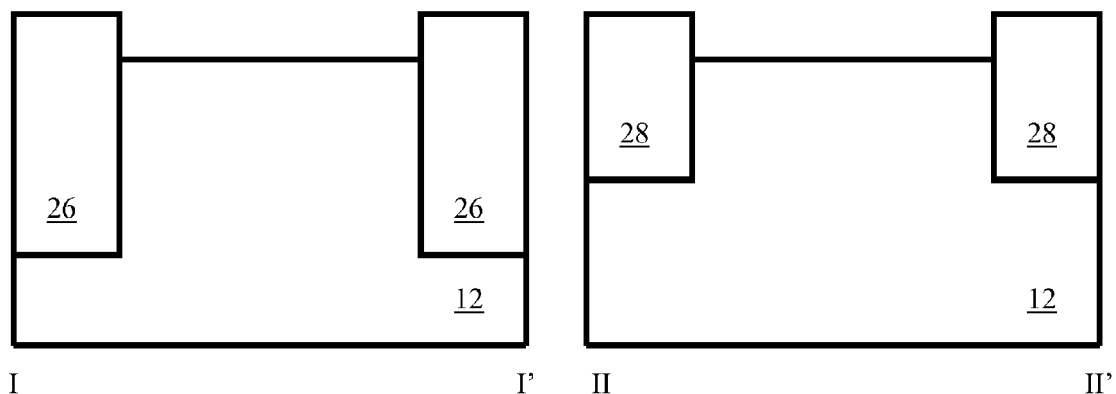

As shown in FIGS. 2J through 2L, this may be followed by a silicon oxidation step, which will grow silicon oxide films in trench 108 and trench 112 which will become insulating layers 26 and 28. In an exemplary 130 nm process, about 4000 A silicon oxide nay be grown. A chemical mechanical polishing step can then be performed to polish the resulting silicon oxide films so that the silicon oxide layer is flat relative to the silicon surface. A silicon dry etching step can then be performed so that the remaining silicon oxide layer height of insulating layers 26 and 28 may be about 300 A from the silicon surface. In other embodiments the top of insulating layers 26 and 28 may be flush with the silicon surface. The silicon nitride layer 106 and the polysilicon layer 104 may then be removed which may then be followed by a wet etch process to remove silicon oxide layer 102 (and a portion of the silicon oxide films formed in the area of former trench 108 and former trench 112). Other process geometries like, for example, 250 nm, 180 nm, 90 nm, 65 nm, etc., may be used. Similarly, other insulating layer materials, heights, and thicknesses as well as alternate sequences of processing steps may be used as a matter of design choice.

Figure 2M:
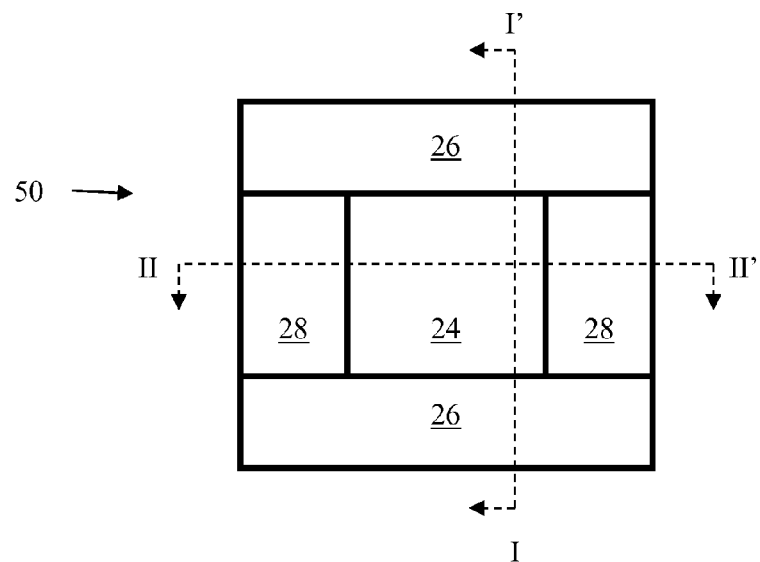
Figures 2N, 2O:
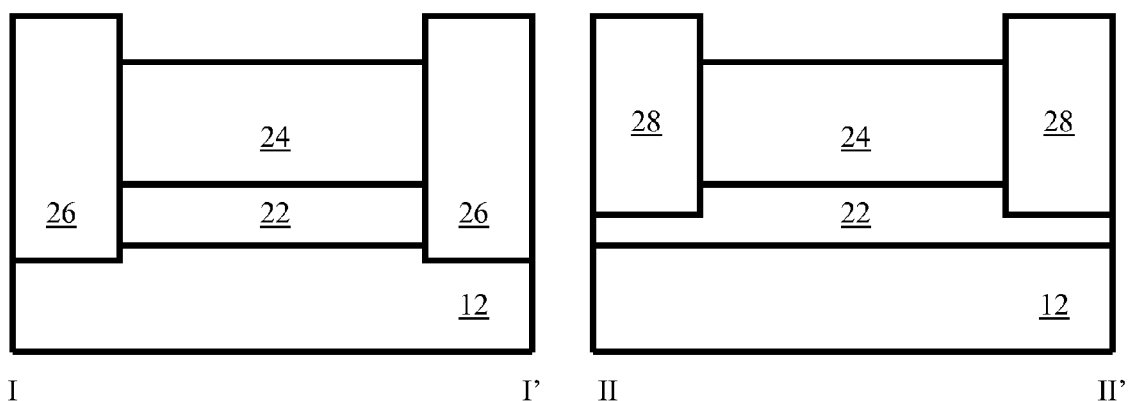

As shown in FIGS. 2M through 2O, an ion implantation step may then be performed to form the buried layer region 22 of a second conductivity (e.g. n-type conductivity). The ion implantation energy is optimized such that the buried layer region 22 is formed shallower than the bottom of the insulating layer 26 and deeper than the bottom of insulating layer 28. As a result, the insulating layer 26 isolates buried layer region 22 between adjacent cells while insulating layer 28 does not isolate buried layer region 22 between cells. This allows buried layer region 22 to be continuous in the direction of the II-II' cross section. Buried layer 22 isolates the eventual floating body region 24 of the first conductivity type (e.g., p-type) from the substrate 12.

Figure 2P:
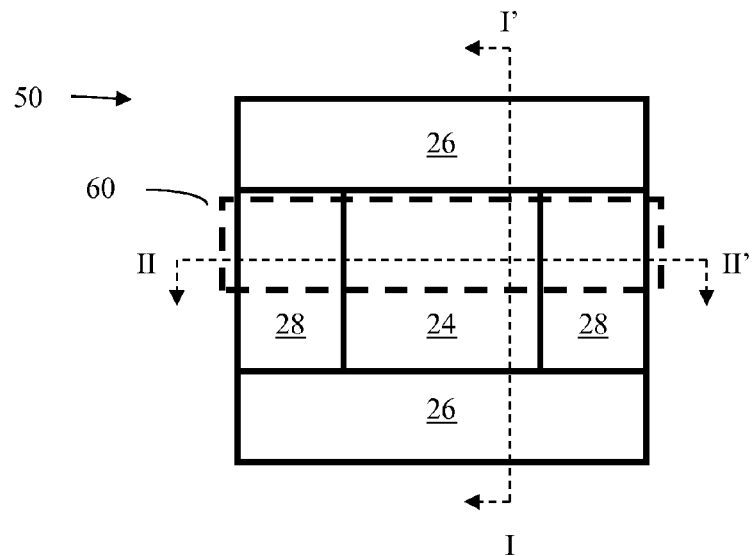
Figures 2Q, 2R:
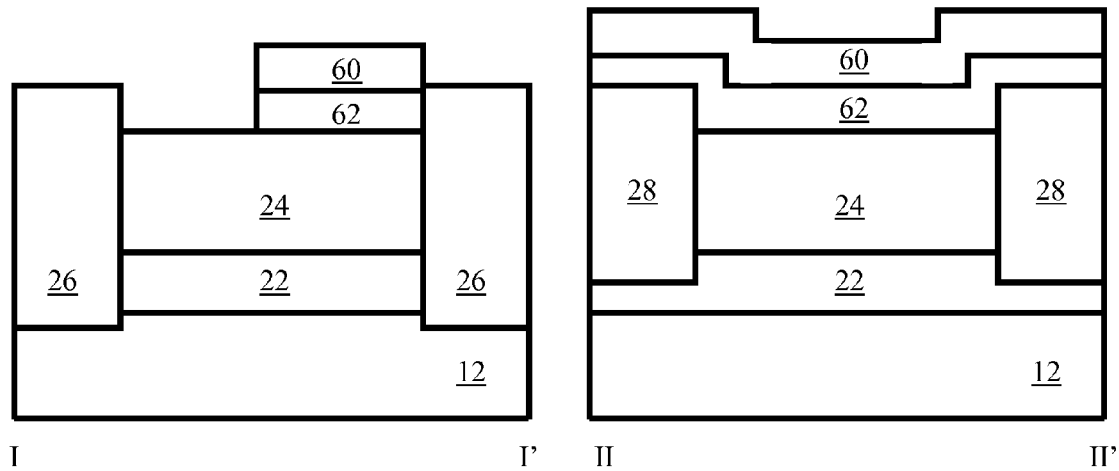

As shown in FIGS. 2P through 2R, a silicon oxide or high-dielectric material gate insulation layer 62 may then be formed on the silicon surface (e.g. about 100 A in an exemplary 130 nm process), which may then be followed by a polysilicon or metal gate 60 deposition (e.g. about 500 A in an exemplary 130 nm process). A lithography step may then be performed to pattern the layers 62 and 60, which may then be followed by etching of the polysilicon and silicon oxide layers. Other process geometries like, for example, 250 nm, 180 nm, 90 nm, 65 nm, etc., may be used. Similarly, other gate and gate insulation materials with different thicknesses may be used a matter of design choice.

Figure 2S:
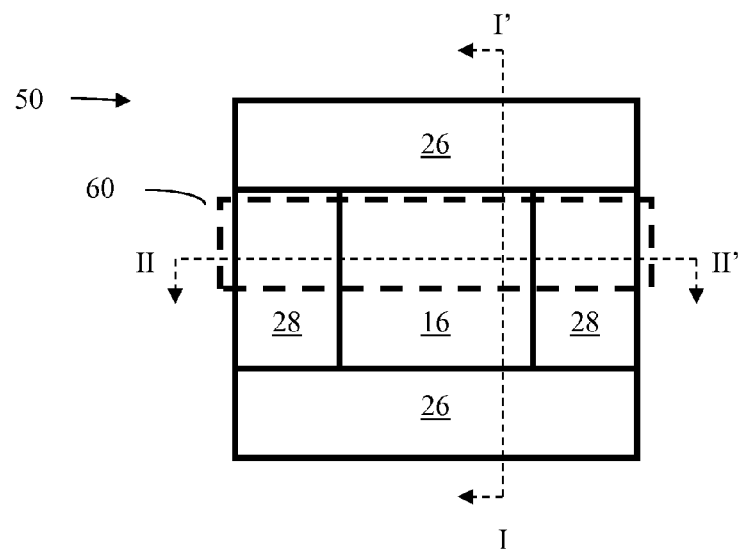
Figures 2T, 2U:
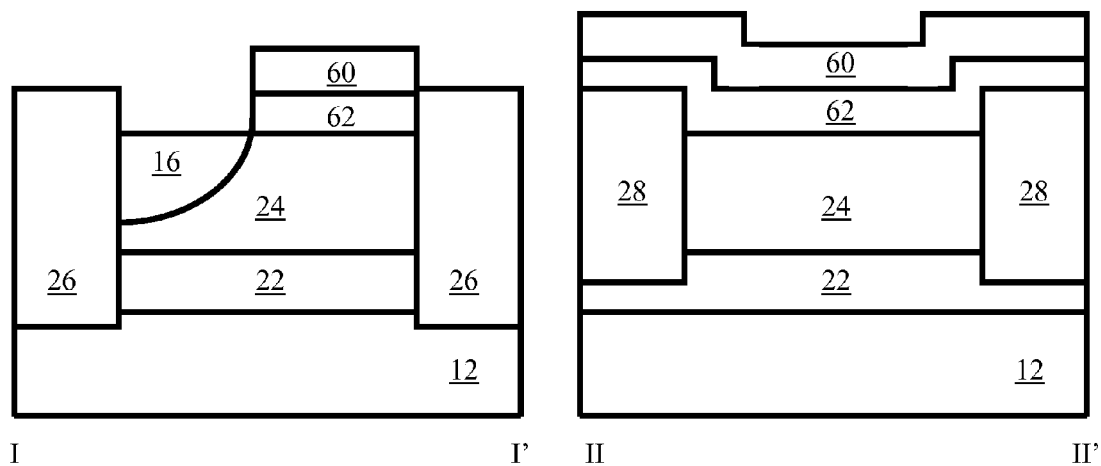

As shown in FIGS. 2S through 2U, another ion implantation step may then be performed to form the bit line region 16 of a second conductivity type (e.g. n-type conductivity). This may then be followed by backend process to form contact and metal layers (not shown in FIGS. 2A through 2U). The gate 60 and the insulating layers 26 and 28 serve as masking layer for the implantation process such that regions of second conductivity are not formed outside bit line region 16. In this and many subsequent figures, gate layer 60 and gate insulating layer 62 are shown flush with the edge of insulating layer 26. In some embodiments, gate layer 60 and gate insulating layer 62 may overlap insulating layer 16 to prevent any of the implant dopant for bit line region 16 from inadvertently implanting between gate layer 60 and gate insulating layer 62 and the adjacent insulating layer 26.

The states of memory cell 50 are represented by the charge in the floating body 24. If cell 50 is positively charged due to holes stored in the floating body region 24, then the memory cell will have a lower threshold voltage (the gate voltage where an ordinary MOSFET transistor is turned on—or in this case, the voltage at which an inversion layer is formed under gate insulating layer 62) compared to if cell 50 does not store holes in body region 24.

The positive charge stored in the floating body region 24 will decrease over time due to the diode leakage current of the p-n junctions formed between the floating body 24 and bit line region 16 and between the floating body 24 and the buried layer 22 and due to charge recombination. A unique capability of the invention is the ability to perform the holding operation in parallel to all memory cells of the array.

Figure 3A:
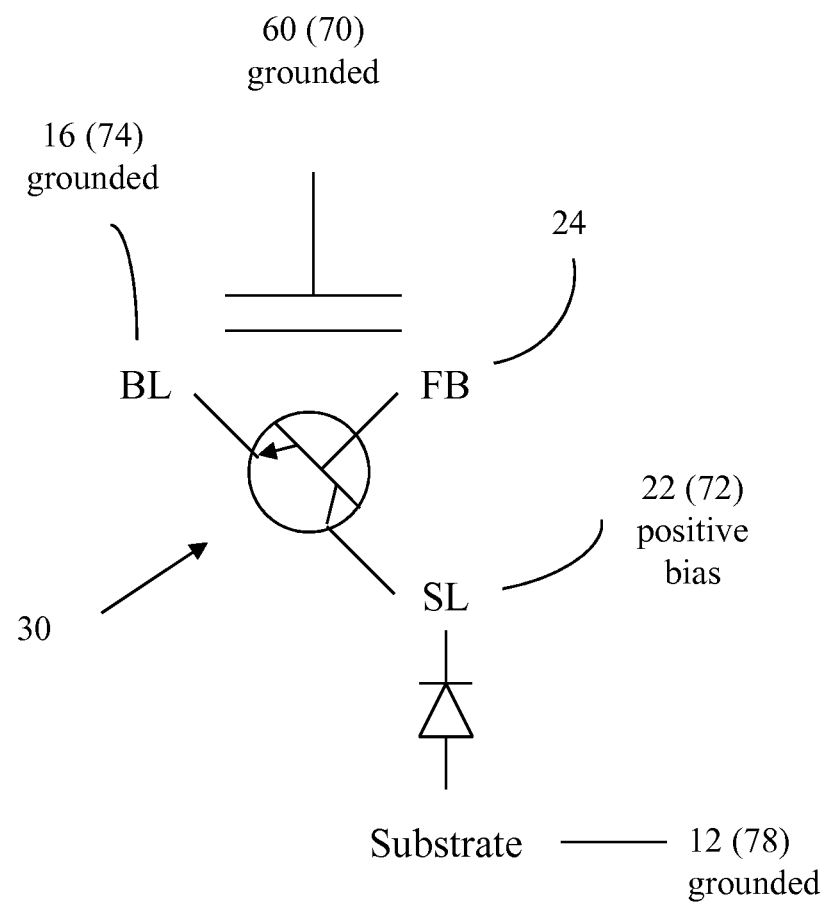
FIGS. 3A through 3C illustrate a method of maintaining the state of a memory cell according to the present invention.

As shown in FIG. 3A, the holding operation can be performed by applying a positive back bias to buried layer 22 through the SL terminal 72 while simultaneously grounding the bit line region 16 through the BL terminal 74 and grounding the substrate 12 through substrate terminal 78. The positive back bias applied to the buried layer region connected to the SL terminal will maintain the state of the memory cell 50 that it is connected to. The holding operation is relatively independent of the voltage applied to gate 60 through word line terminal 70. In some embodiments of the invention, the word line terminal may be grounded. Inherent in the memory cell 50 is n-p-n bipolar device 30 formed by buried well region 22 (the collector region), floating body 24 (the base region), and bit line region 16 (the emitter region).

If floating body 24 is positively charged, a state corresponding to logic-1, the bipolar transistor 30 formed by bit line region 16, floating body 24, and buried well region 22 will be turned on due to an impact ionization mechanism like that described with reference to Lin cited above. In particular, the voltage across the reversed biased p-n junction between the floating body 24 and the buried well region 22 will cause a small current to flow across the junction. Some of the current will be in the form of hot carriers accelerated by the electric field across the junction. These hot carriers will collide with atoms in the semiconductor lattice which will generate hole-electron pairs in the vicinity of the junction. The electrons will be swept into the buried layer region 22 by the electric field, while the holes will be swept into the floating body region 24.

The hole current flowing into the floating region 24 (usually referred to as the base current) will maintain the logic-1 state data. The efficiency of the holding operation can be enhanced by designing the bipolar device formed by buried well region 22, floating region 24, and bit line region 16 to be a low-gain bipolar device, where the bipolar gain is defined as the ratio of the collector current flowing out of SL terminal 72 to the base current flowing into the floating region 24.

Figure 3B:
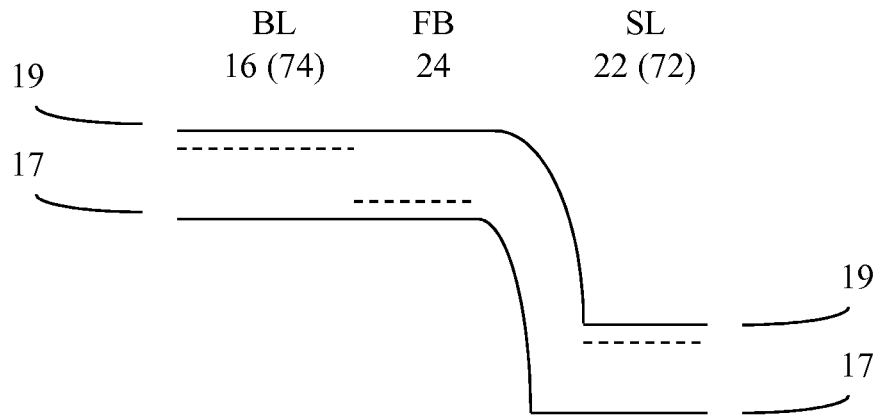

FIG. 3B shows the energy band diagram of the intrinsic n-p-n bipolar device 30 when the floating body region 24 is positively charged and a positive bias voltage is applied to the buried well region 22. The dashed lines indicate the Fermi levels in the various regions of the n-p-n transistor 30. The Fermi level is located in the band gap between the solid line 17 indicating the top of the valance band (the bottom of the band gap) and the solid line 19 indicating the bottom of the conduction band (the top of the band gap) as is well known in the art. The positive charge in the floating body region lowers the energy barrier of electron flow into the base region. Once injected into the floating body region 24, the electrons will be swept into the buried well region 22 (connected to SL terminal 72) due to the positive bias applied to the buried well region 22. As a result of the positive bias, the electrons are accelerated and create additional hot carriers (hot hole and hot electron pairs) through an impact ionization mechanism. The resulting hot electrons flow into the SL terminal 72 while the resulting hot holes will subsequently flow into the floating body region 24. This process restores the charge on floating body 24 and will maintain the charge stored in the floating body region 24 which will keep the n-p-n bipolar transistor 30 on for as long as a positive bias is applied to the buried well region 22 through SL terminal 72.

If floating body 24 is neutrally charged (the voltage on floating body 24 being equal to the voltage on grounded bit line region 16), a state corresponding to logic-0, no current will flow through the n-p-n transistor 30. The bipolar device 30 will remain off and no impact ionization occurs. Consequently memory cells in the logic-0 state will remain in the logic-0 state.

Figure 3C:
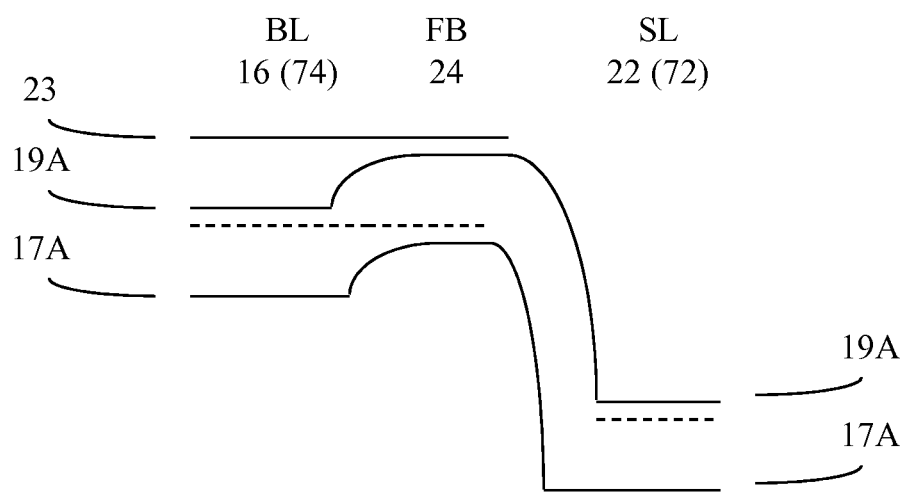

FIG. 3C shows the energy band diagram of the intrinsic n-p-n bipolar device 30 when the floating body region 24 is neutrally charged and a bias voltage is applied to the buried well region 22. In this state the energy level of the band gap bounded by solid lines 17A and 19A is different in the various regions of n-p-n bipolar device 30. Because the potential of the floating body region 24 and the bit line region 16 is equal, the Fermi levels are constant, resulting in an energy barrier between the bit line region 16 and the floating body region 24. Solid line 23 indicates, for reference purposes, the energy barrier between the bit line region 16 and the floating body region 24. The energy barrier prevents electron flow from the bit line region 16 (connected to BL terminal 74) to the floating body region 24. Thus the n-p-n bipolar device 30 will remain off.

The difference between an impact ionization write logic-1 operation as described with reference to Lin cited above and a holding operation is that during a holding operation the gate 60 is not biased at a higher voltage than normal during a holding operation. During a write logic-1 operation, the capacitive coupling from the gate 60 to the floating body region 24 forces the n-p-n bipolar device 30 on regardless of the data stored in the cell. By contrast, without the gate boost a holding operation only generates carriers through impact ionization when a memory cell stores a logic-1 and does not generate carries through impact ionization when a memory cell stores a logic-0.

In the embodiment discussed in FIGS. 3A through 3C, bipolar device 30 has been an n-p-n transistor. Persons of ordinary skill in the art will readily appreciate that by reversing the first and second connectivity types and inverting the relative values of the applied voltages memory cell 50 could comprise a bipolar device 30 which is a p-n-p transistor. Thus the choice of an n-p-n transistor is an illustrative example for simplicity of explanation in FIGS. 3A through 3C is not limiting in any way.

FIG. 4A shows an exemplary array 80 of memory cells 50 (four exemplary instances of memory cell 50 being labeled as 50a, 50b, 50c and 50d) arranged in rows and columns. In many, but not all, of the figures where exemplary array 80 appears, representative memory cell 50a will be representative of a "selected" memory cell 50 when the operation being described has one (or more in some embodiments) selected memory cells 50. In such figures, representative memory cell 50b will be representative of an unselected memory cell 50 sharing the same row as selected representative memory cell 50a, representative memory cell 50c will be representative of an unselected memory cell 50 sharing the same column as selected representative memory cell 50a, and representative memory cell 50d will be representative of a memory cell 50 sharing neither a row or a column with selected representative memory cell 50a.

Present in FIG. 4A are word lines 70a through 70n, source lines 72a through 72n, bit lines 74a through 74p, and substrate terminal 78. Each of the word lines 70a through 70n is associated with a single row of memory cells 50 and is coupled to the gate 60 of each memory cell 50 in that row. Similarly, each of the source lines 72a through 72n is associated with a single row of memory cells 50 and is coupled to the buried well region 22 of each memory cell 50 in that row. Each of the bit lines 74a through 74p is associated with a single column of memory cells 50 and is coupled to the bit line region 16 of each memory cell 50 in that column. In the holding operation described in FIGS. 4A through 4C, there is no individually selected memory cell. Rather cells are selected in rows by the source lines 72a through 72n and may be selected as individual rows, as multiple rows, or as all of the rows comprising array 80.

Substrate 12 is present at all locations under array 80. Persons of ordinary skill in the art will appreciate that one or more substrate terminals 78 will be present in one or more locations as a matter of design choice. Such skilled persons will also appreciate that while exemplary array 80 is shown as a single continuous array in FIG. 4A, that many other organizations and layouts are possible like, for example, word lines may be segmented or buffered, bit lines may be segmented or buffered, source lines may be segmented or buffered, the array 80 may be broken into two or more sub-arrays, control circuits such as word decoders, column decoders, segmentation devices, sense amplifiers, write amplifiers may be arrayed around exemplary array 80 or inserted between sub-arrays of array 80. Thus the exemplary embodiments, features, design options, etc., described are not limiting in any way.

Turning now to FIG. 4B, array 80 previously discussed is shown along with multiplexers 40a through 40n and voltage waveforms 42a through 42n. A periodic pulse of positive voltage can be applied to the back bias terminals of memory cells 50 through SL terminal 72 as opposed to applying a constant positive bias to reduce the power consumption of the memory cell 50. FIG. 4B further shows multiplexers 40a through 40n each coupled to one of the source lines 72a through 72n that determine the bias voltages applied to SL terminals 72a through 72n, which will be determined by different operating modes. The pulsing of the voltage on the SL terminals may be controlled, for example, by applying pulses of logic signals like waveforms 42a through 42n to the select input of multiplexers 40a through 40n thereby selecting, for example, ground (0.0 volts) or a power supply voltage such as $V_{CC}$. Many other techniques may be used to pulse the voltage applied to SL terminals 72a through 72n like, for example, applying the waveforms 42a through 42n at different times, or applying them simultaneously, or coupling the select inputs of multiplexers 42a through 42n together and applying a single pulsed waveform to all of the multiplexers 42a through 42n simultaneously (not shown in the figure). Many other options will readily suggest themselves to persons of ordinary skill in the art. Thus the described exemplary embodiments are not limiting in any way.

FIG. 4C shows another method to provide voltage pulses to SL terminals 72a through 72n of exemplary array 80 of memory cells 50. The positive input signals to multiplexers 40a through 40n may be generated by voltage generator circuits 44a through 44n coupled to one input of each of the multiplexers 40a through 40n. Alternatively, a single voltage generator circuit may be coupled to each of the multiplexers 40a through 40n reducing the amount of overhead circuitry required to refresh the memory cells 50 of array 80. Other embodiments are possible including, for example, applying the waveforms 42a through 42n at different times, or applying them simultaneously, or coupling the select inputs of multiplexers 42a through 42n together and applying a singe pulsed waveform to all of the multiplexers 42a through 42n simultaneously (not shown in the figure).

Figure 4D:
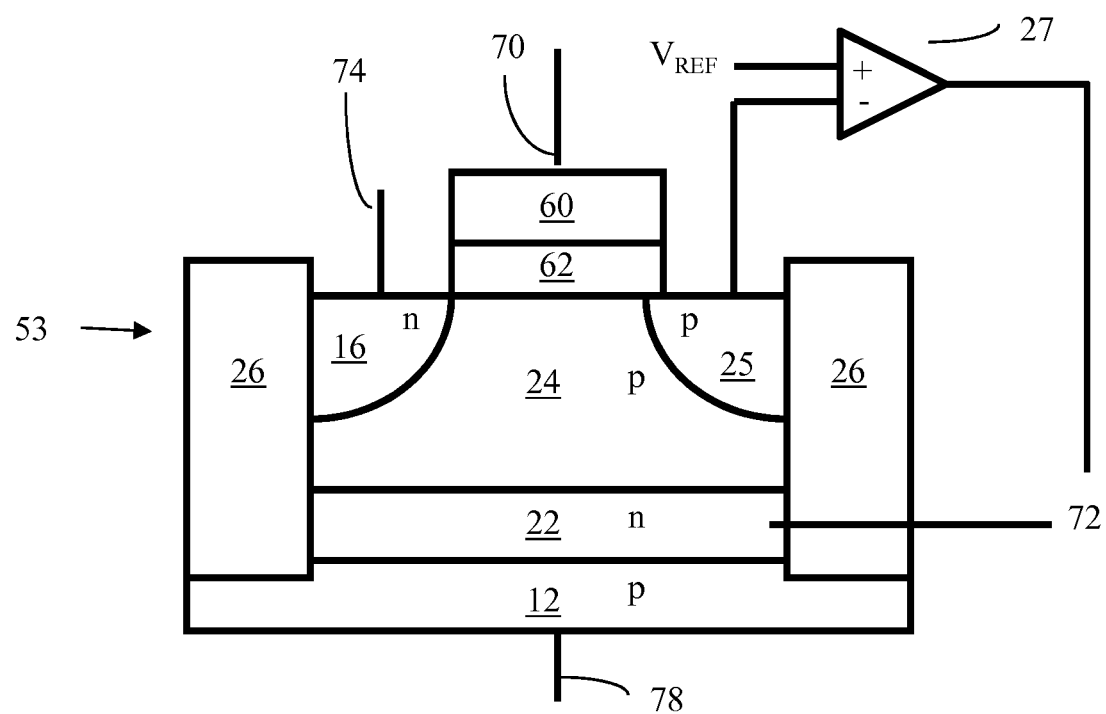
Figure 5:
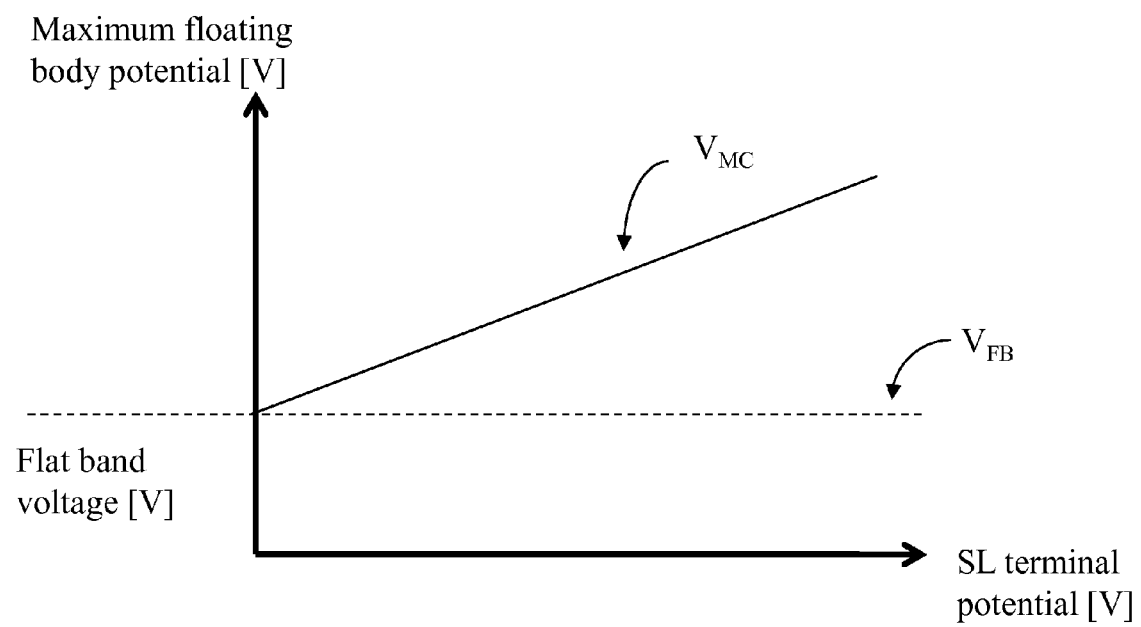
FIG. 5 is a graph of the floating body voltage in a memory cell according to the present invention.

FIG. 4D shows a reference generator circuit suitable for use as reference generator circuits 44a through 44n in FIG. 4C. The reference generator includes reference cell 53, which consists of a modified version of Gated half transistor memory cell 50 described above with region 25 of the first conductivity type (p-type conductivity). The p-type 25 region allows for a direct sensing of the floating body region 24 potential. Region 25 is drawn separately even though it has the same conductivity type as floating body region 24 because it may be doped differently to facilitate contacting it. The reference cell 53 for example can be configured to be in state logic-1 where the potential of the floating body region 24 is positive, for example at +0.5V. The potential sensed through the p-type region is then compared with a reference value $V_{REF}$, e.g. +0.5V, by operational amplifier 27. If the potential of the floating body region 24 is less than the reference value, the voltage applied to the back bias terminal 72 (which is connected to buried region 22 of the reference cell 53 and can also be connected to buried region 22 of the Gated half transistor memory cell 50) is increased by operational amplifier 27 until the potential of the floating body region 24 reaches the desired reference voltage. If the potential of the floating body 24 region is higher than that of the reference value, the voltage applied to back bias terminal 72 can be reduced by operational amplifier 27 until the potential of the floating body region 24 reaches the desired reference voltage. Reference voltage $V_{REF}$ may be generated in many different ways like, for example, using a band gap reference, a resistor string, a digital-to-analog converter, etc. Similarly alternate voltage generators of types known in the art may be used As shown in FIG. 5, the holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current from floating body 24 to bit line region 16 increases exponentially at floating body potential greater than $V_{FB}$. However, by applying a positive voltage to SL terminal 72, the bipolar action results in a hole current flowing into the floating body 24, compensating for the junction leakage current between floating body 24 and bit line region 16. As a result, the maximum charge $V_{MC}$ stored in floating body 24 can be increased by applying a positive bias to the SL terminal 72 as shown in the graph in FIG. 5. The increase in the maximum charge stored in the floating body 24 results in a larger memory window.

The holding/standby operation can also be used for multi-bit operation in memory cell 50. To increase the memory density without increasing the area occupied by the memory cell, a multi-level operation is typically used. This is done by dividing the overall memory window into more than two different levels. In one embodiment four levels representing two binary bits of data are used, though many other schemes like, for example, using eight levels to represent three binary bits of data are possible. In a floating body memory, the different memory states are represented by different charge in the floating body 24, as described, for example, in Tack and Oknonin-2 cited above. However, since the state with zero charge in the floating body 24 is the most stable state, the floating body 24 will over time lose its charge until it reaches the most stable state. In multi-level operation, the difference of charge representing different states is smaller than a single-level operation. As a result, a multi-level memory cell is more sensitive to charge loss.

Figure 6:
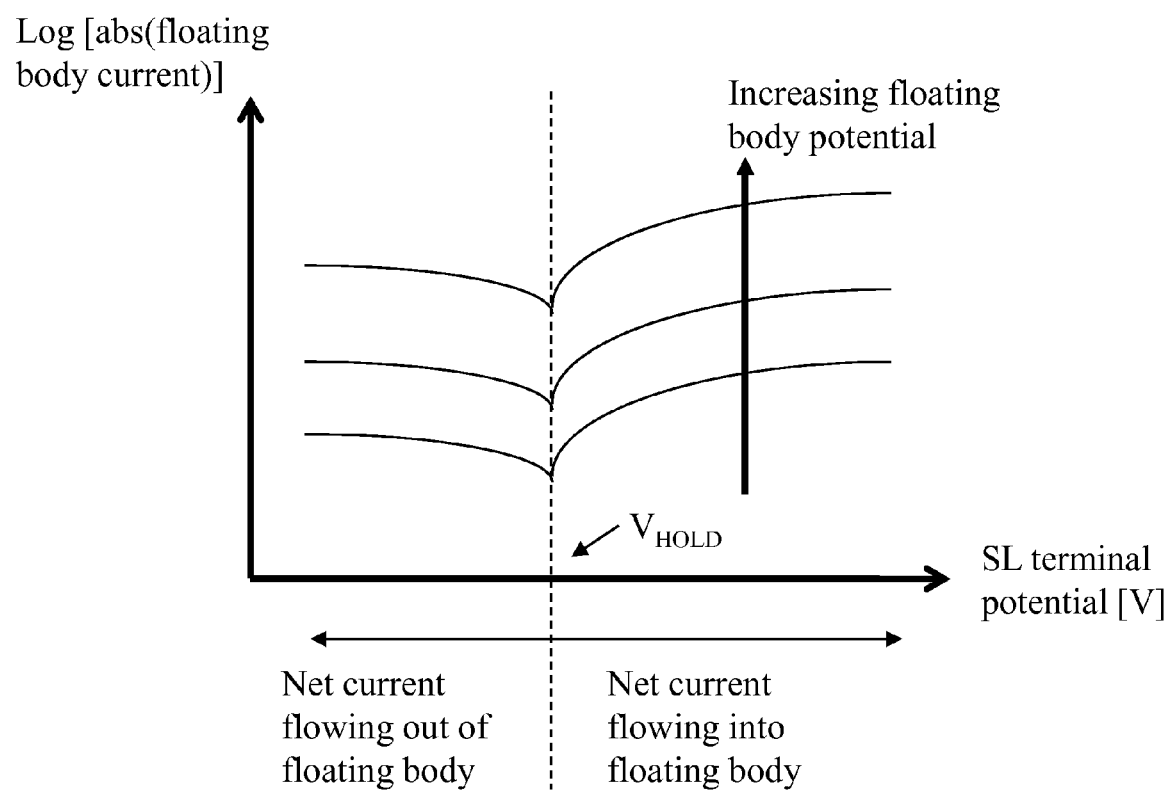
FIG. 6 is a graph of current-voltage curves of a memory cell according to the present invention.

FIG. 6 shows the floating body 24 net current for different floating body 24 potential as a function of the voltage applied to SL terminal 72 with BL, WL and substrate terminals 74, 70, and 78, grounded. When zero voltage is applied to SL terminal 72, no bipolar current is flowing into the floating body 24 and as a result, the stored charge will leak over time. When a positive voltage is applied to SL terminal 72, hole current will flow into floating body 24 and balance the junction leakage current to bit line region 16. The junction leakage current is determined by the potential difference between the floating body 24 and bit line region 16, while the bipolar current flowing into floating body 24 is determined by both the SL terminal 72 potential and the floating body 24 potential. As indicated in FIG. 6, for different floating body potentials, at a certain SL terminal 72 potential $V_{HOLD}$, the current flowing into floating body 24 is balanced by the junction leakage between floating body 24 and bit line region 16. The different floating body 24 potentials represent different charges used to represent different states of memory cell 50. This shows that different memory states can be maintained by using the holding/standby operation described here.

In one embodiment the bias condition for the holding operation for memory cell 50 is: 0 volts is applied to BL terminal 74, a positive voltage like, for example, +1.2 volts is applied to SL terminal 72, 0 volts is applied to WL terminal 70, and 0 volts is applied to the substrate terminal 78. In another embodiment, a negative voltage may be applied to WL terminal 70. In other embodiments, different voltages may be applied to the various terminals of memory cell 50 as a matter of design choice and the exemplary voltages described are not limiting in any way.

The read operation of the memory cell 50 and array 80 of memory cells will described in conjunction with FIGS. 7 and 8A through 8H. Any sensing scheme known in the art can be used with memory cell 50. Examples include, for example, the sensing schemes disclosed in Ohsawa-1 and Ohsawa-2 cited above.

The amount of charge stored in the floating body 24 can be sensed by monitoring the cell current of the memory cell 50. If memory cell 50 is in a logic-1 state having holes in the body region 24, then the memory cell will have a higher cell current (e.g. current flowing from the BL terminal 74 to SL terminal 72), compared to if cell 50 is in a logic-0 state having no holes in floating body region 24. A sensing circuit typically connected to BL terminal 74 can then be used to determine the data state of the memory cell.

A read operation may be performed by applying the following bias condition to memory cell 50: a positive voltage is applied to the selected BL terminal 74, and an even more positive voltage is applied to the selected WL terminal 70, zero voltage is applied to the selected SL terminal 72, and zero voltage is applied to the substrate terminal 78. This has the effect of operating bipolar device 30 as a backward n-p-n transistor in a manner analogous to that described for operating bipolar device 30 for a hold operation as described in conjunction with FIGS. 3A through 3C. The positive voltage applied to the WL terminal 70 boosts the voltage on the floating body region 24 by means of capacitive coupling from the gate 60 to the floating body region 24 through gate insulating layer 62. This has the effect of increasing the current in bipolar device 30 when it is on significantly more than it increases the current when it is off, thus making it easier to sense the data stored in the memory cell 50. The optimal bias voltage to apply to WL terminal 70 will vary from embodiment to embodiment and process to process. The actual voltage applied in any given embodiment is a matter of design choice.

Figure 7:
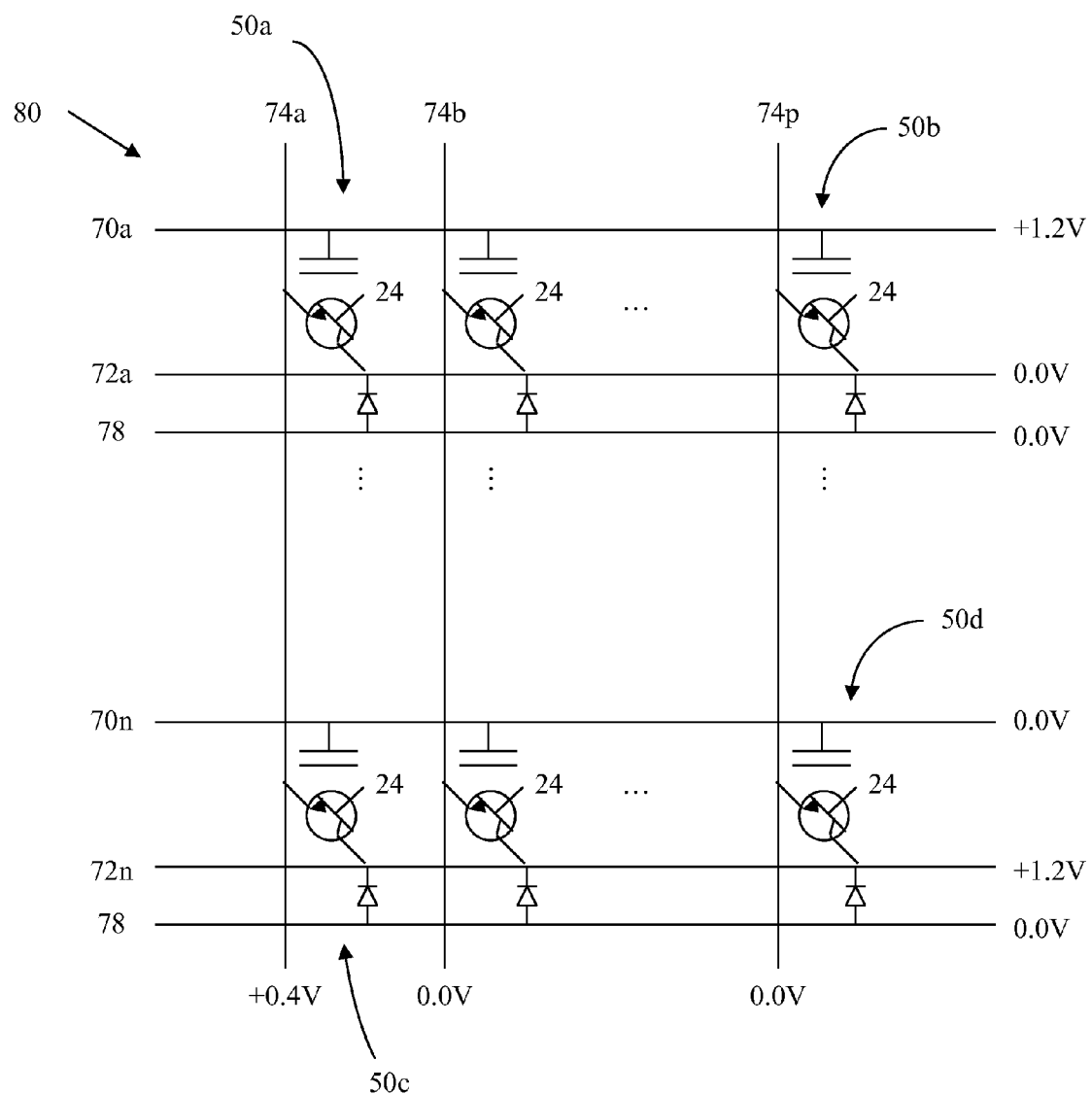
FIG. 7 illustrates a read operation performed on an array of memory cells according to the present invention.

FIG. 7 shows array 80 of memory cells 50 during a read operation in one exemplary embodiment of the present invention. Reading a memory cell 50 in array 80 is more complicated than reading a single cell as described above, since cells are coupled together along rows by word lines 70a through 70n and source lines 72a through 72n and coupled together along columns by bit lines 74a through 74p. In one exemplary embodiment, about 0.0 volts is applied to the selected SL terminal 72a, about +0.4 volts is applied to the selected bit line terminal 74a, about +1.2 volts is applied to the selected word line terminal 70a, and about 0.0 volts is applied to substrate terminal 78. All the unselected bit line terminals 74b (not shown) through 74p have 0.0 volts applied, the unselected word line terminals 70b (not shown) through 70n have 0.0 volts applied, and the unselected SL terminals 72b (not shown) have +1.2 volts applied. FIG. 7 shows the bias conditions for the selected representative memory cell 50a and three unselected representative memory cells 50b, 50c, and 50d in memory array 80, each of which has a unique bias condition. Persons of ordinary skill in the art will appreciate that other embodiments of the invention may employ other combinations of applied bias voltages as a matter of design choice. Such skilled persons will also realize that the first and second conductivity types may be reversed and the relative bias voltages may be inverted in other embodiments.

Figure 8A:
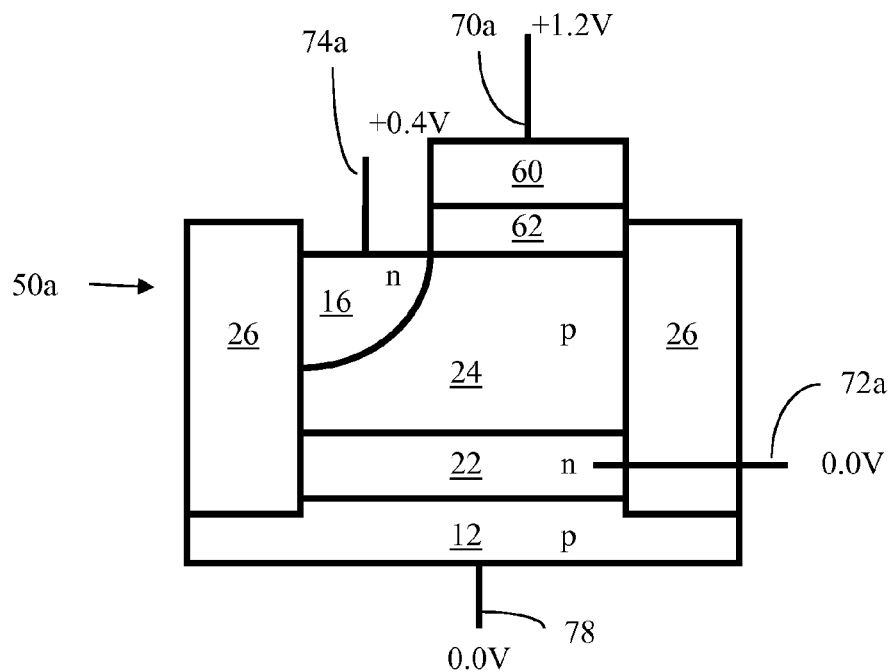
FIGS. 8A through 8H illustrate the operation of four representative memory cells of the array of FIG. 7.
Figure 8B:
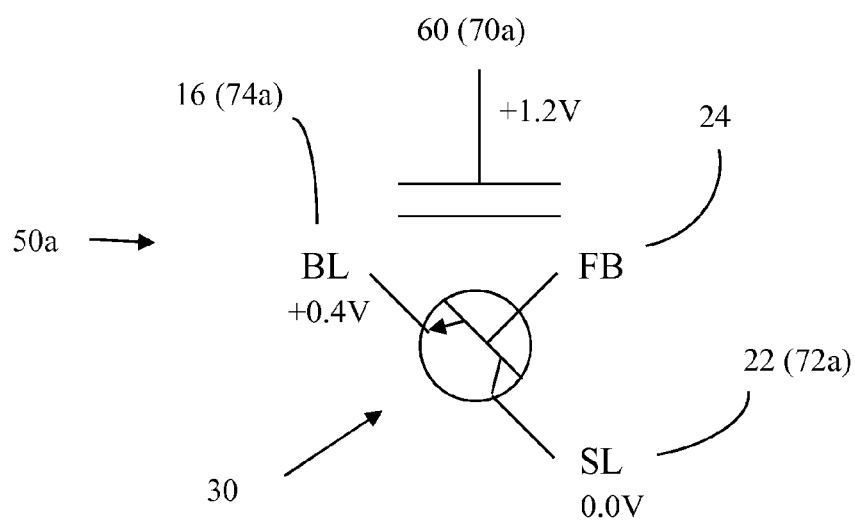

FIG. 8A also shows the bias condition of the selected representative memory cell 50a in cross section while FIG. 8B shows the equivalent circuit diagram illustrating the intrinsic n-p-n bipolar device 30 under the read bias conditions described above.

Figure 8C:
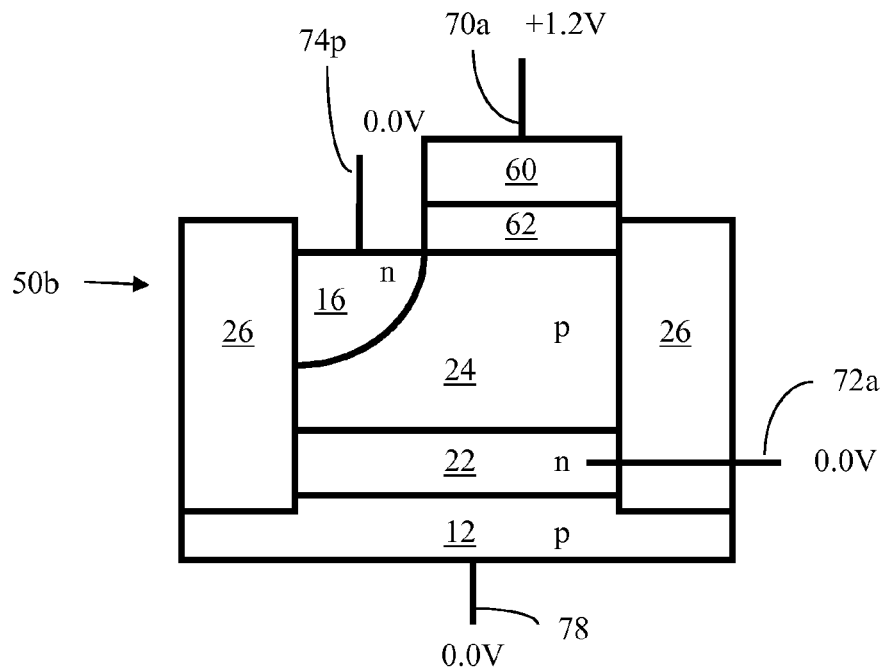
Figure 8D:
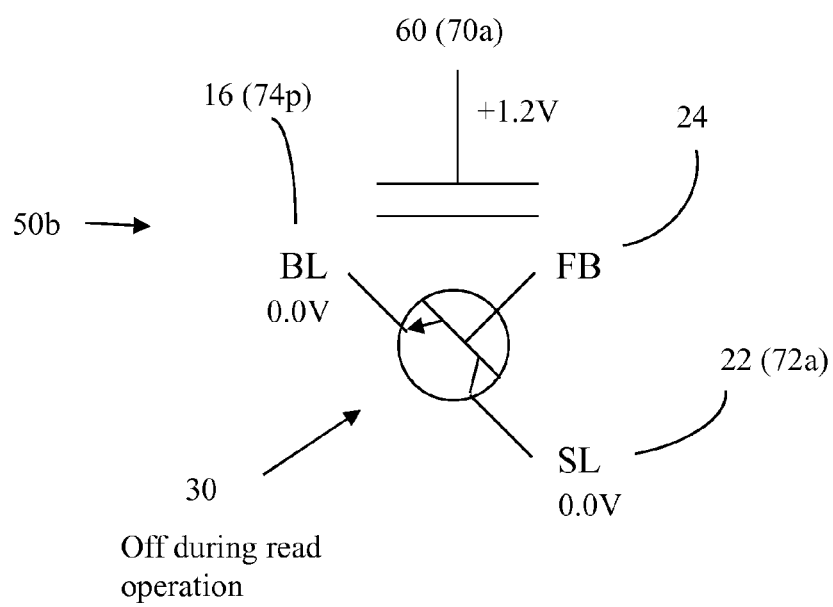
Figure 8E:
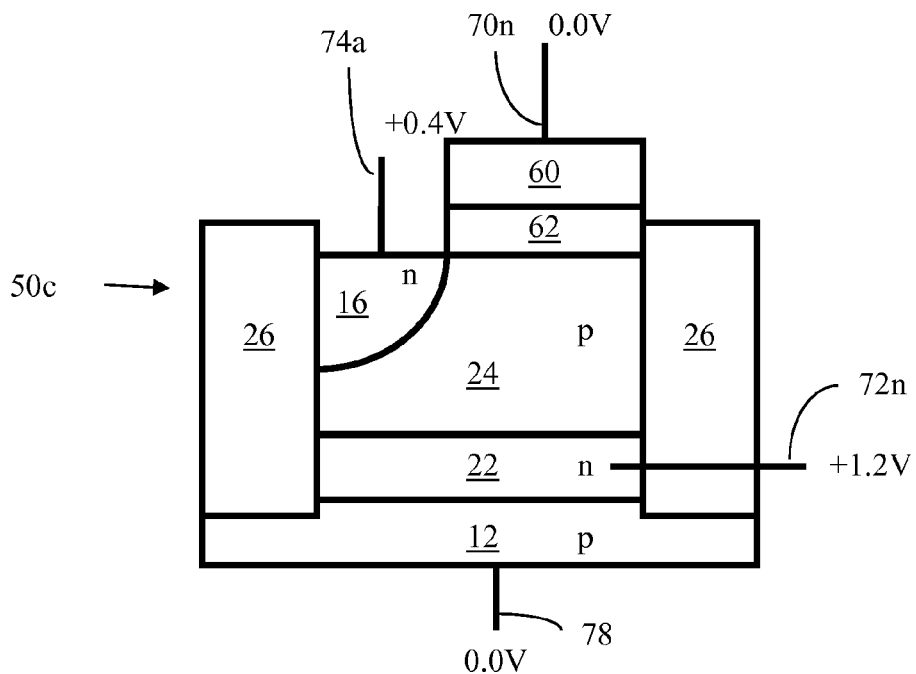
Figure 8F:
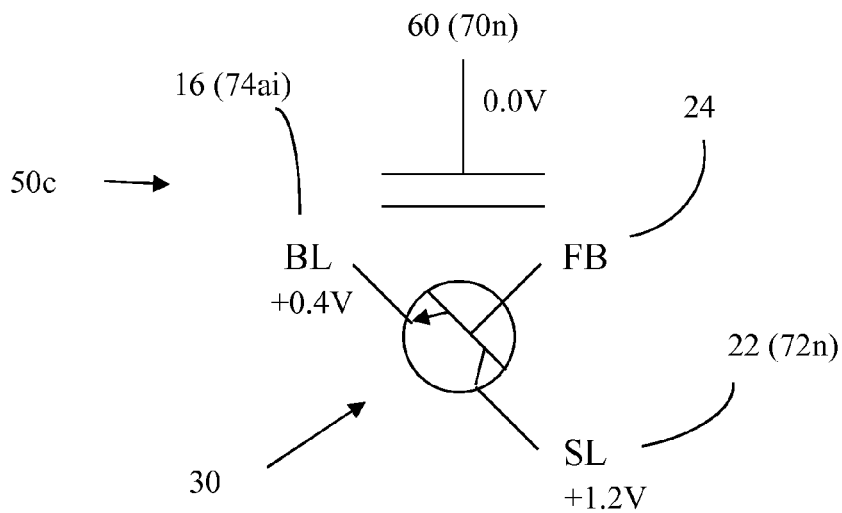
Figure 8G:
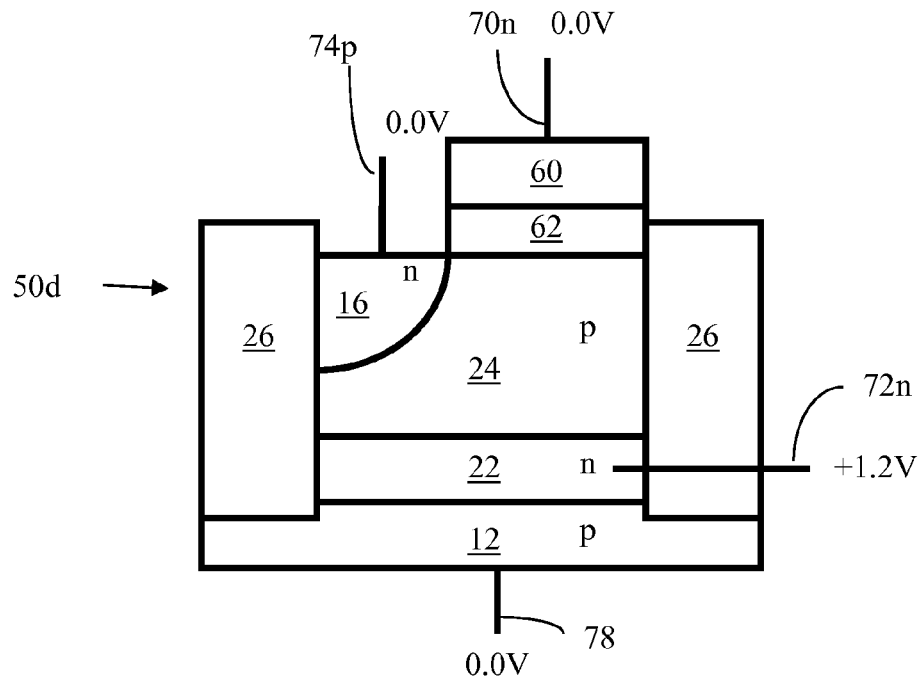
Figure 8H:
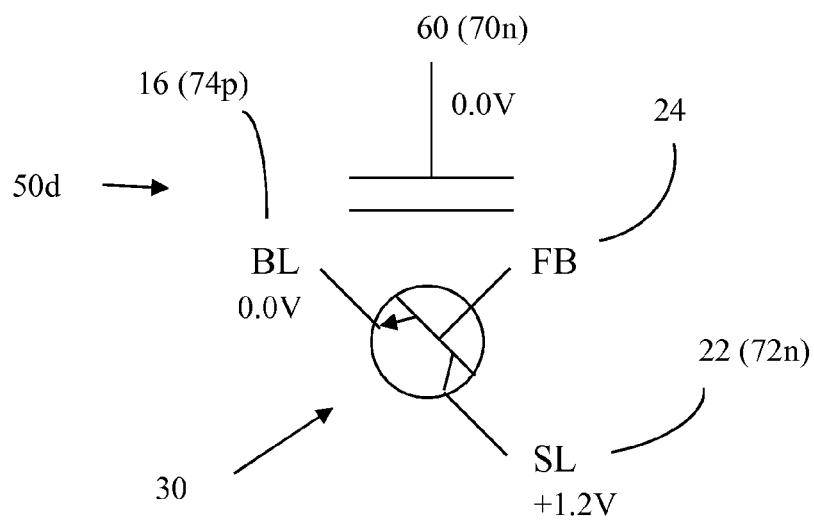

The three cases for unselected memory cells 50 during read operations are shown in FIGS. 8C, 8E, and 8G, while illustrations of the equivalent circuit diagrams are shown in FIGS. 8D, 8F, and 8H respectively. The bias conditions for memory cells 50 sharing the same row (e.g. representative memory cell 50b) and those sharing the same column (e.g., representative memory cell 50c) as the selected representative memory cell 50a are shown in FIGS. 8C-8D and FIGS. 8E-8F, respectively, while the bias condition for memory cells 50 not sharing the same row nor the same column as the selected representative memory cell 50a (e.g., representative memory cell 50d) is shown in FIG. 8G-8H.

As shown in FIGS. 8C and 8D, for representative memory cell 50b sharing the same row as the selected representative memory cell 50a, the SL terminal 72a is now grounded and consequently these cells will not be at the holding mode. However, because a read operation is accomplished much faster (on the order of nanoseconds) compared to the lifetime of the hole charge in the floating body 24 (on the order of milliseconds), it should cause little disruptions to the charge stored in the floating body.

As shown in FIGS. 8E and 8F, representative memory cell 50c sharing the same column as the selected memory cell 50a, a positive voltage is applied to the BL terminal 74a. Less base current will flow into the floating body 24 due to the smaller potential difference between SL terminal 72n and BL terminal 74a (i.e. the emitter and collector terminals of the n-p-n bipolar device 30). However, because read operation is accomplished much faster (on the order of nanoseconds) compared to the lifetime of the charge in the floating body 24 (on the order of milliseconds), it should cause little disruptions to the charge stored in the floating body.

As shown in FIGS. 8G and 8H, representative memory cell 50d sharing neither the same row nor the same column as the selected representative memory cell 50a, the SL terminal 72n will remain positively charged and the BL terminal 74p will remain grounded. As can be seen, these cells will be in the holding mode, where memory cells in the logic-1 state will maintain the charge in floating body 24 because the intrinsic bipolar device 30 will generate hole current to replenish the charge in floating body 24 and memory cells in the logic-0 state will remain in neutral state.

The read operation of the memory cell 50 and array 80 of memory cells have been described in conjunction with FIGS. 7 through 8H. Persons of ordinary skill in the art will realize that the drawing figures are not drawn to scale, that the various voltages described are illustrative only and will vary from embodiment to embodiment, that embodiments discussed have been illustrative only, and that many more embodiments employing the inventive principles of the invention are possible. For example, the two conductivity types may be reversed and the relative voltages of the various signals may be inverted, the memory array 80 may be built as a single array or broken into sub-arrays, the accompanying control circuits may be implemented in different ways, different relative or absolute voltage values may be applied to memory cell 50 or array 80, etc. Thus the exemplary embodiments, features, bias levels, etc., described are not limiting in any way.

Figure 9A:
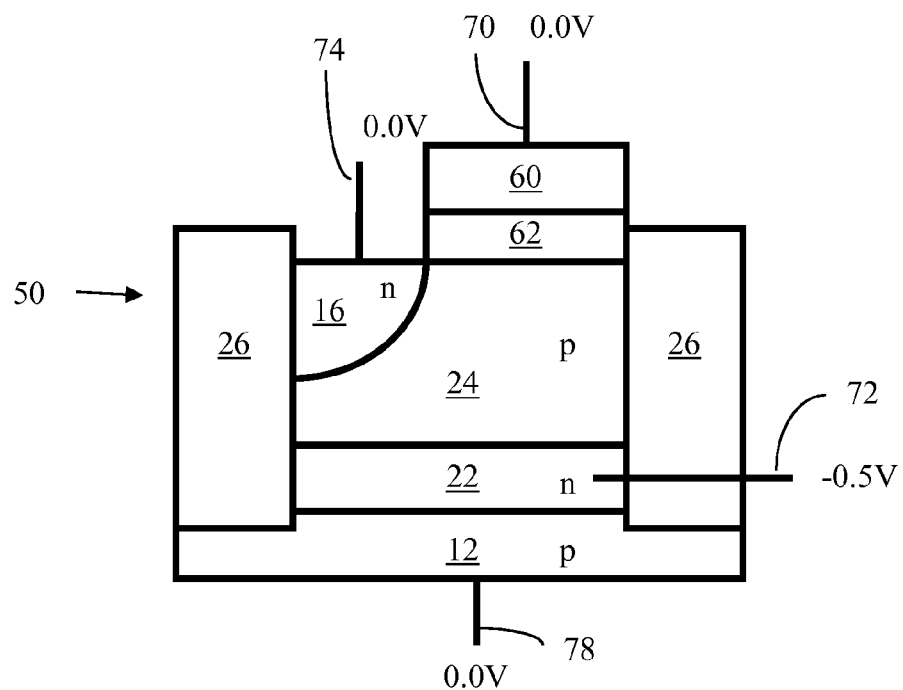
FIGS. 9A and 9B illustrates the operation of selected memory cells according to the present invention during a first type of write logic-0 operation.

A first type of write logic-0 operation of an individual memory cell 50 is now described with reference to FIGS. 9A and 9B. In FIG. 9A, a negative voltage bias is applied to the back bias terminal (i.e. SL terminal 72), a zero voltage bias is applied to WL terminal 70, a zero voltage bias is applied to BL terminal 72 and substrate terminal 78. Under these conditions, the p-n junction between floating body 24 and buried well 22 of the selected cell 50 is forward-biased, evacuating any holes from the floating body 24. In one particular non-limiting embodiment, about −0.5 volts is applied to source line terminal 72, about 0.0 volts is applied to word line terminal 70, and about 0.0 volts is applied to bit line terminal 74 and substrate terminal 78. These voltage levels are exemplary only may vary from embodiment to embodiment as a matter of design choice. Thus the exemplary embodiments, features, bias levels, etc., described are not limiting in any way.

Figure 9B:
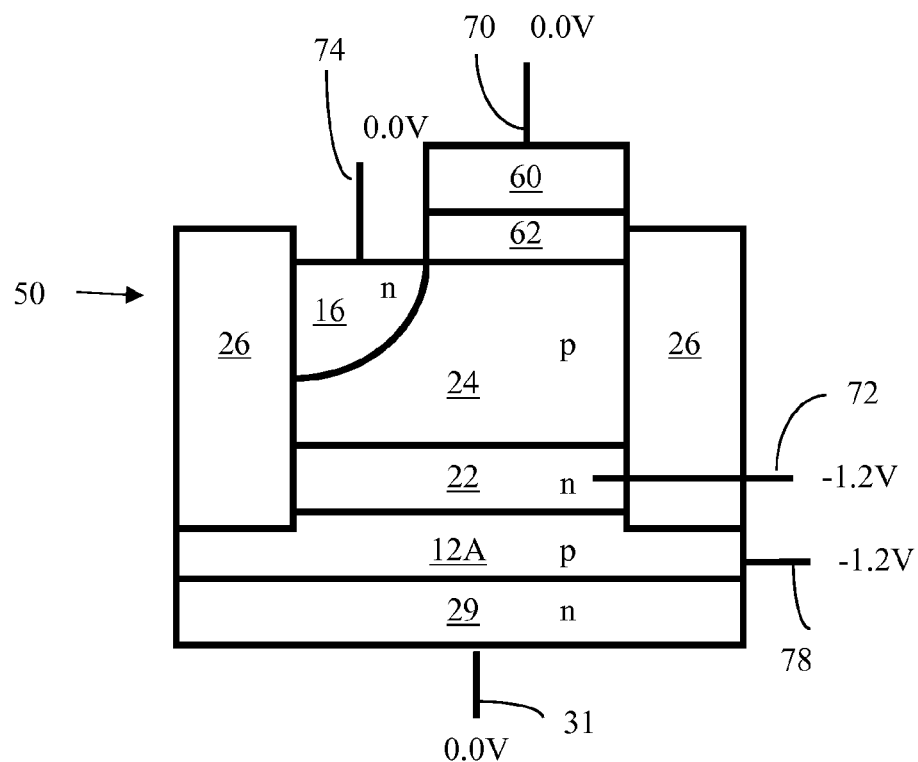

In FIG. 9B, an alternative embodiment of memory cell 50 is shown where substrate 12 is replaced by region 12A of the first conductivity type (p-type in the figure) which is a well inside substrate 29 of the second conductivity type (n-type in the figure). This arrangement overcomes an undesirable side effect of the embodiment of FIG. 9A where lowering the buried well region 22 voltage on buried well terminal 72 to approximately −0.5V to forward bias the p-n junction between buried well 22 and floating body 24 also forward biases the p-n junction between buried well 22 and substrate 12 resulting in unwanted substrate current. The embodiment of FIG. 9B allows the well 12A to be lowered by applying the same voltage to well terminal 78 as buried layer terminal 72 thus preventing the p-n diode between those regions to forward bias. The substrate 29 is preferably biased to 0.0V through substrate terminal 31 as shown in FIG. 9B. These voltage levels are exemplary only may vary from embodiment to embodiment as a matter of design choice, Thus the exemplary embodiments, features, bias levels, etc., described are not limiting in any way.

Figure 10:
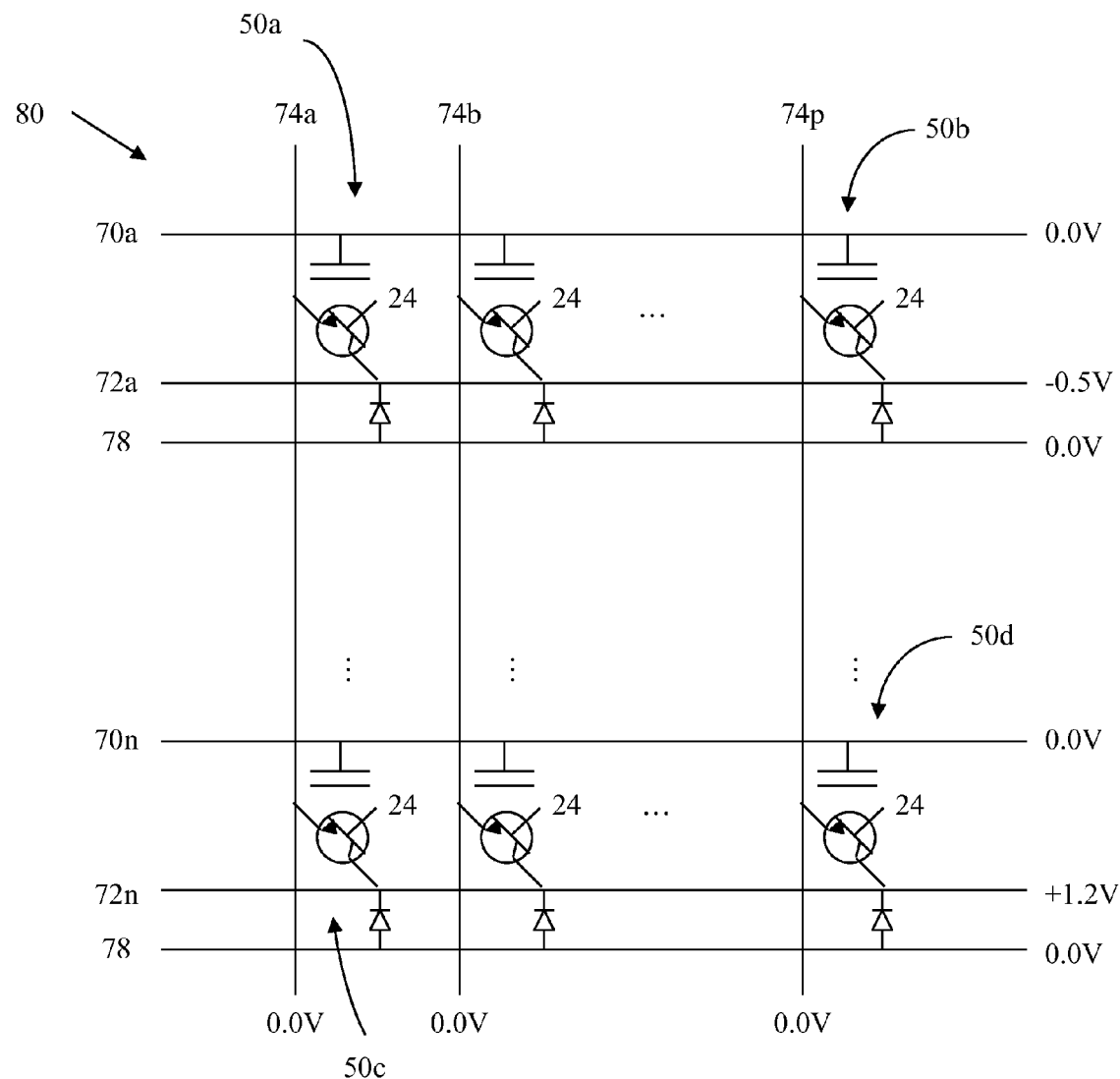
FIG. 10 illustrates an array of memory cells according to the present invention during the first type of write logic-0 operation of FIG. 9.

FIG. 10 shows an example of bias conditions for the selected and unselected memory cells 50 during the first type of write logic-0 operation (as described in FIG. 9A) in memory array 80. For the selected representative memory cells 50a and 50b, the negative bias applied to SL terminal 72a causes large potential difference between floating body 24 and buried well region 22. Because the buried well 22 is shared among multiple memory cells 50, logic-0 will be written into all memory cells 50 including memory cells 50a and 50b sharing the same SL terminal 72a simultaneously.

Figure 11A:
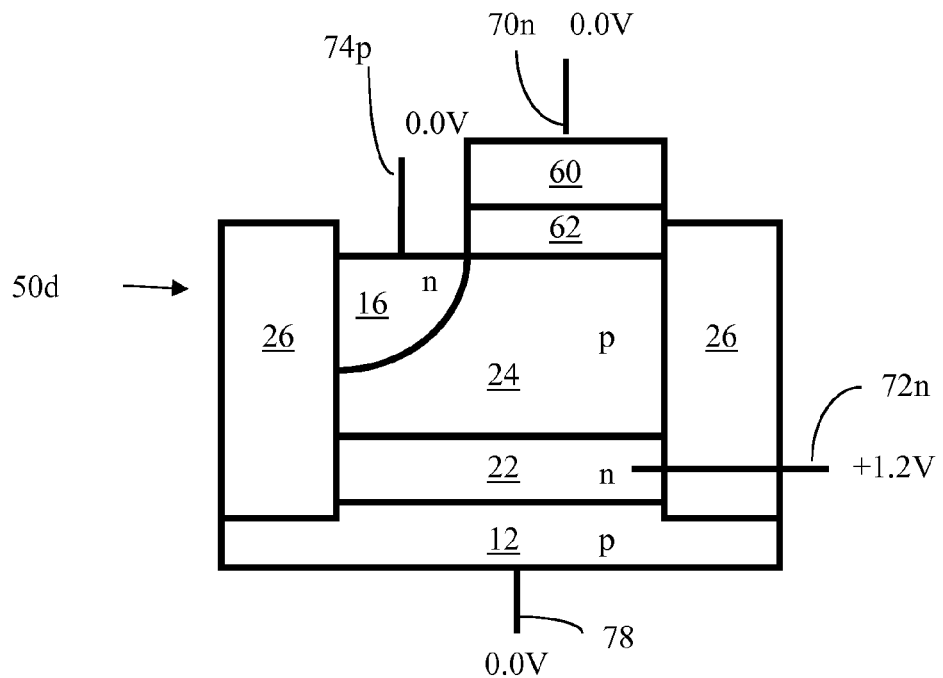
FIGS. 11A and 11B illustrate the operation of unselected memory cells according to the present invention of the array of FIG. 10 during a first type of write logic-0 operation.
Figure 11B:
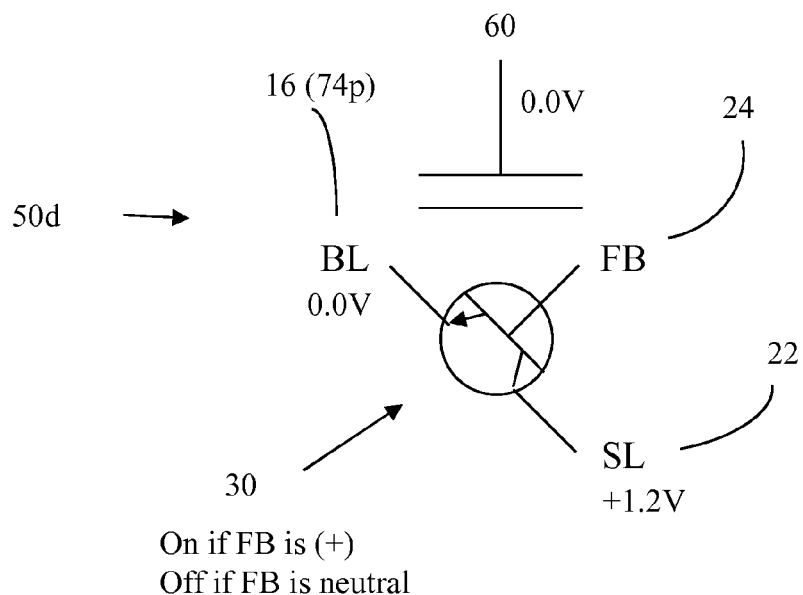

FIGS. 11A through 11B illustrate an example of bias conditions and an equivalent circuit diagram illustrating the intrinsic n-p-n bipolar devices 30 of unselected memory cells 50 like representative memory cells 50c and 50d in array 80 during the first type of logic-0 write operations. In particular representative memory cell 50d will be discussed for clarity of presentation though the principles apply to all unselected memory cells 50. Since the logic-0 write operation only involves a negative voltage to the selected SL terminal 72a, the memory cells 50 coupled to the unselected SL terminals 72b (not shown in FIG. 10) through 72n are placed in a holding operation by placing a positive bias condition on SL terminals 72b through 72n. As can be seen in FIGS. 11A and 11B, the unselected memory cells will be in a holding operation, with the BL terminal at about 0.0 volts, WL terminal at zero voltage, and the unselected SL terminal positively biased.

Figure 12:
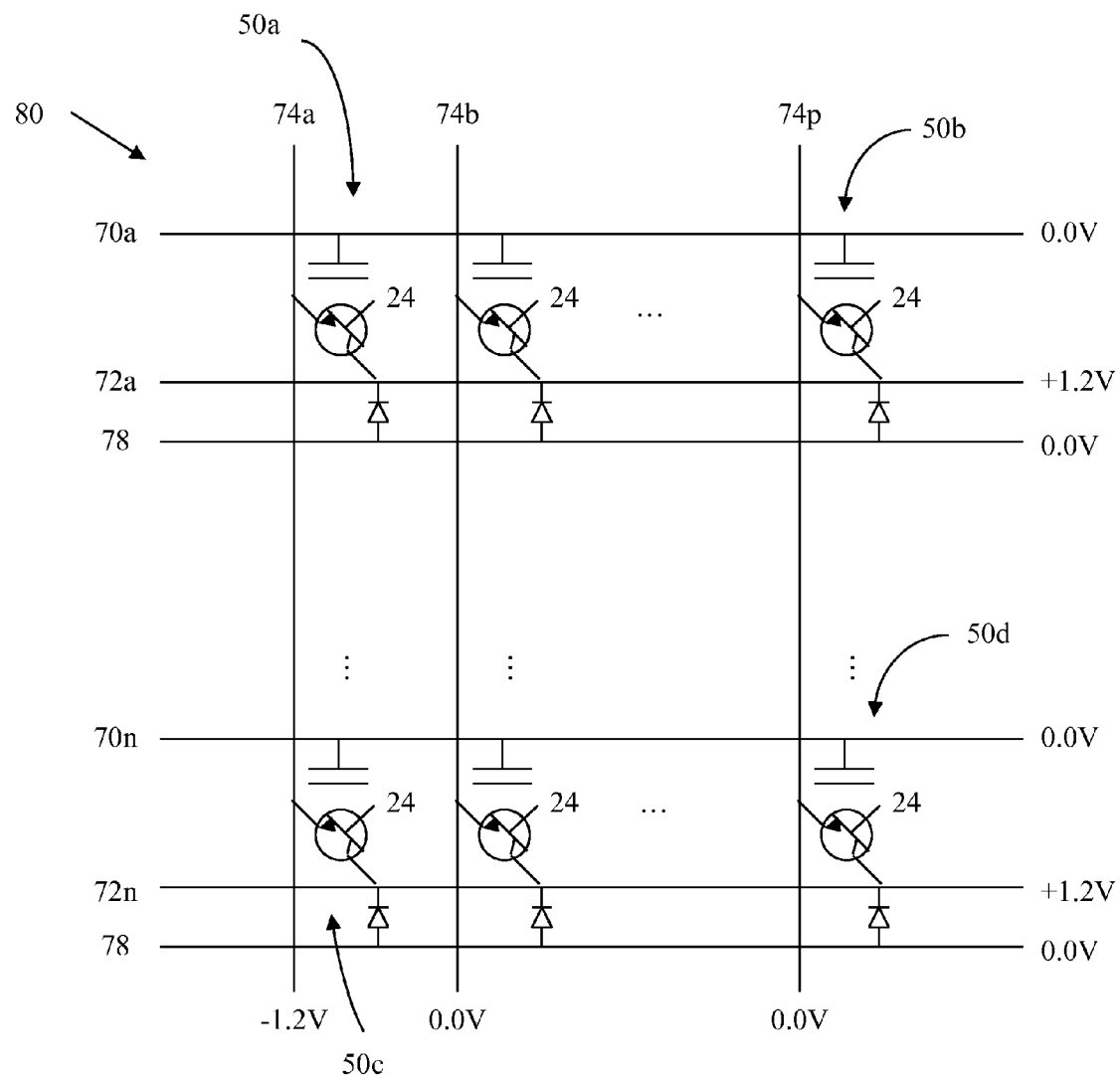
FIG. 12 illustrates an array of memory cells according to the present invention during a second type of write logic-0 operation.

As shown in FIG. 12, a second type of write logic-0 operation can also be performed by applying a negative bias to the BL terminal 74 as opposed to the SL terminal 72. In FIG. 12, the selected memory cells 50 include representative memory cells 50a and 50c and all the memory cells 50 that share the selected bit line 74a. The SL terminal 72 will be positively biased, while zero voltage is applied to the substrate terminal 78, and zero voltage is applied to the WL terminal 70. Under these conditions, all memory cells sharing the same BL terminal 74 will be written to the logic-0 state.

The first and second types of write logic-0 operations referred to above each has a drawback that all memory cells 50 sharing either the same SL terminal 72 (the first type— row write logic-0) or the same BL terminal 74 will (the second type—column write logic-0) be written to simultaneously and as a result, does not allow writing logic-0 to individual memory cells 50. To write arbitrary binary data to different memory cells 50, a write logic-0 operation is first performed on all the memory cells to be written followed by one or more write logic-1 operations on the bits that must be written to logic-1.

A third type of write logic-0 operation that allows for individual bit writing can be performed on memory cell 50 by applying a positive voltage to WL terminal 70, a negative voltage to BL terminal 74, zero or positive voltage to SL terminal 72, and zero voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between 24 and bit line region 16 is forward-biased, evacuating any holes from the floating body 24.

To reduce undesired write logic-0 disturb to other memory cells 50 in the memory array 80, the applied potential can be optimized as follows: if the floating body 24 potential of state logic-1 is referred to as $V_{FB1}$, then the voltage applied to the WL terminal 70 is configured to increase the floating body 24 potential by $V_{FB1}/2$ while $-V_{FB1}/2$ is applied to BL terminal 74. Additionally, either ground or a slightly positive voltage may also be applied to the BL terminals 74 of unselected memory cells 50 that do not share the same BL terminal 74 as the selected memory cell 50, while a negative voltage may also be applied to the WL terminals 70 of unselected memory cells 50 that do not share the same WL terminal 70 as the selected memory cell 50.

Figure 13:
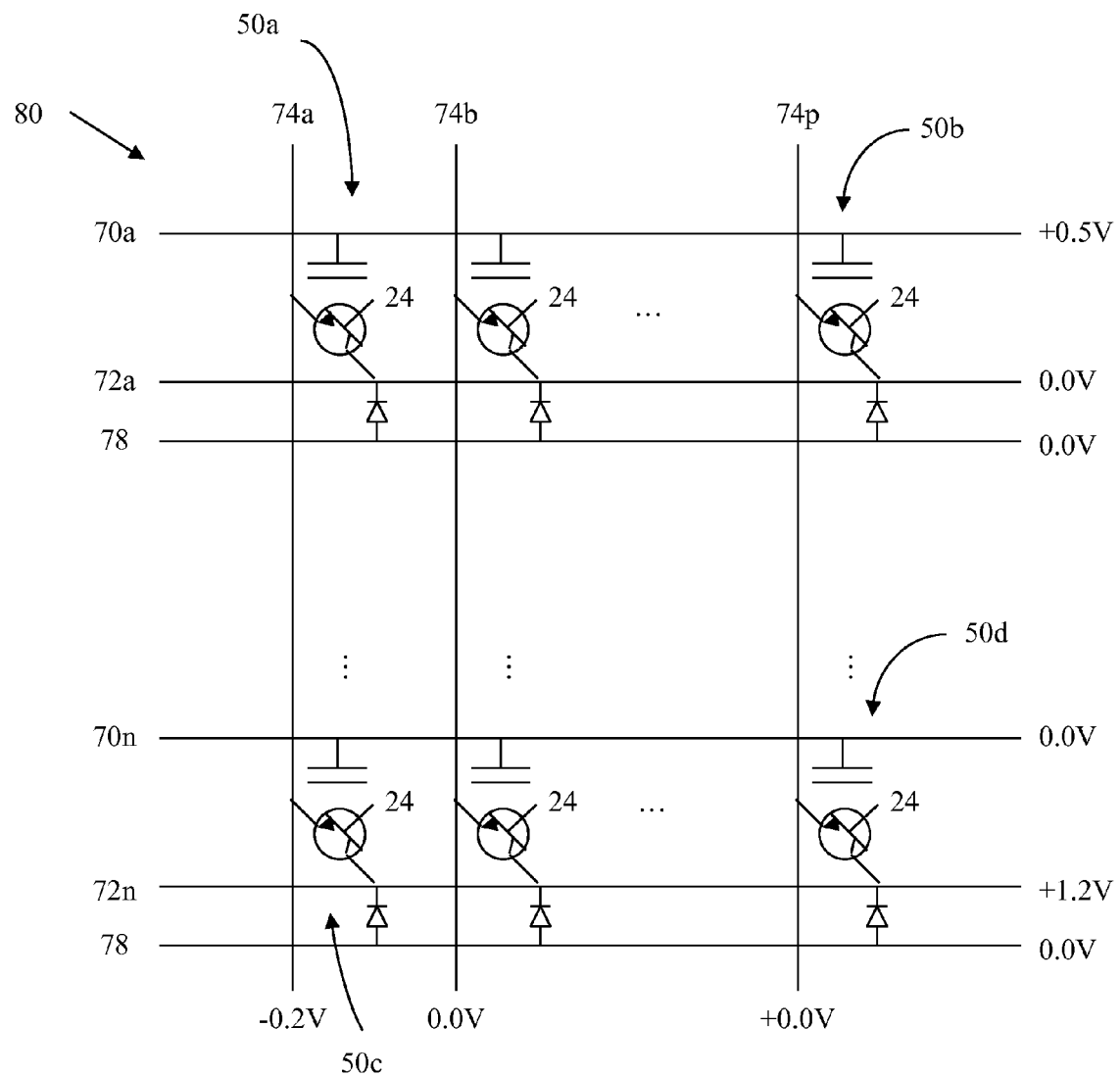
FIG. 13 illustrates an array of memory cells according to the present invention during a third type of write logic-0 operation.

As illustrated in FIG. 13, the following bias conditions are applied to the selected representative memory cell 50a in exemplary memory array 80 to perform an individual write logic-0 operation exclusively in representative memory cell 50a: a potential of about 0.0 volts to SL terminal 72a, a potential of about −0.2 volts to BL terminal 74a, a potential of about +0.5 volts is applied to word line terminal 70a, and about 0.0 volts is applied to substrate terminal 78. In the rest of array 80 about +1.2 volts is applied to unselected SL terminals 72 (including SL terminal 72n), about 0.0 volts (or possibly a slightly positive voltage) is applied to unselected BL terminals 74 (including BL terminal 74p), and about 0.0 volts is applied to unselected WL terminal 70 (including WL terminal 70n). Persons of ordinary skill in the art will appreciate that the voltage levels in FIG. 13 are illustrative only and that different embodiments will have different voltage levels as a matter of design choice.

Figure 14A:
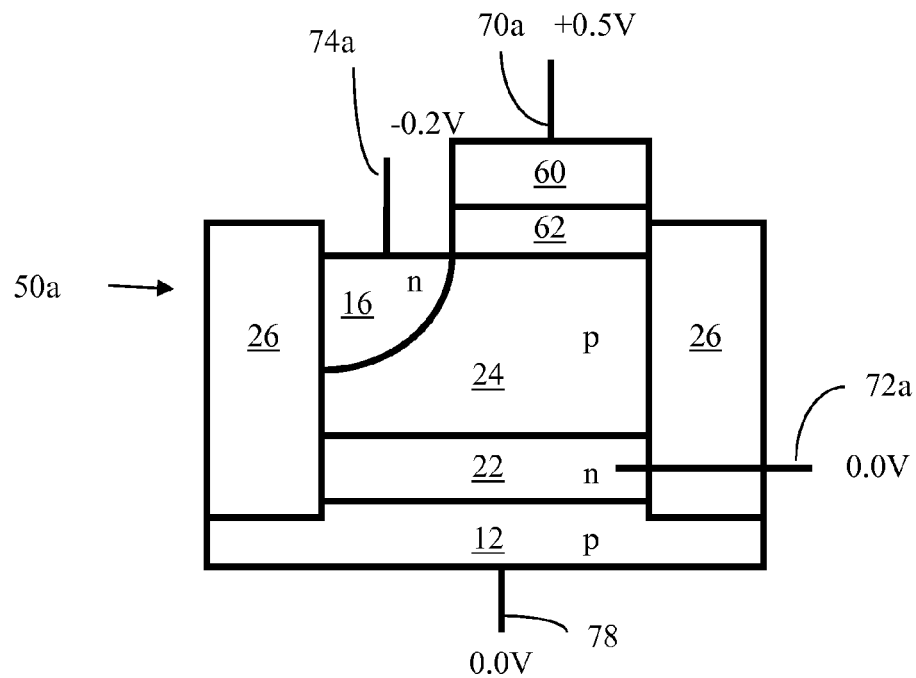
FIGS. 14A through 14H illustrate the operation of four representative memory cells of the array of FIG. 13 during the third type of logic operation.
Figure 14B:
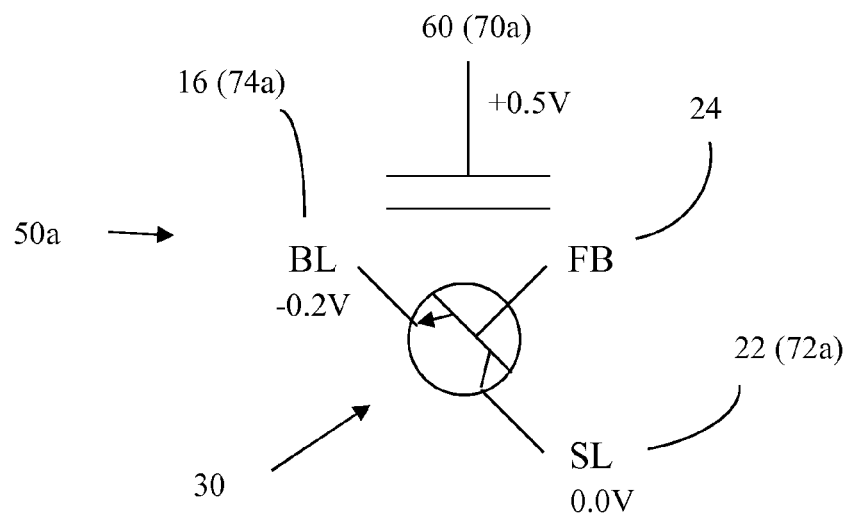

The bias conditions shown in FIG. 13 of the selected representative memory cell 50a in memory array 80 to perform the individual bit write logic-0 operation are further illustrated in FIGS. 14A and 14B. As discussed above, the potential difference between floating body 24 and bit line region 16 connected to BL terminal 74a is now increased due to the capacitive coupling from raising WL terminal 70a from ground to +0.5V, resulting in a higher forward bias current than the base hole current generated by the n-p-n bipolar device 30 formed by buried well region 22 connected to SL terminal 72a, floating body 24, and bit line region 16. The result is that holes will be evacuated from floating body 24.

Figure 14C:
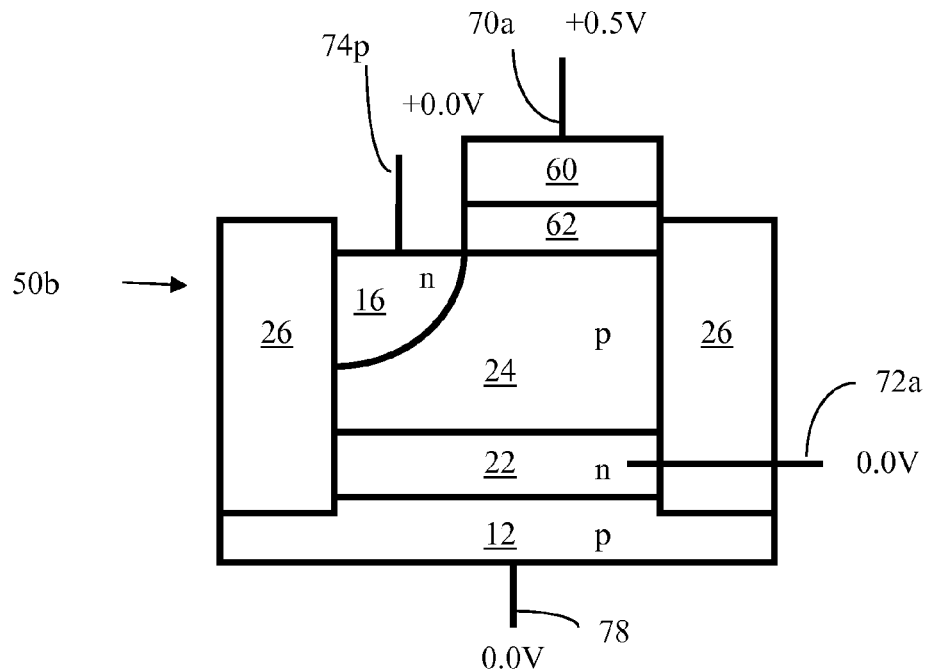
Figure 14D:
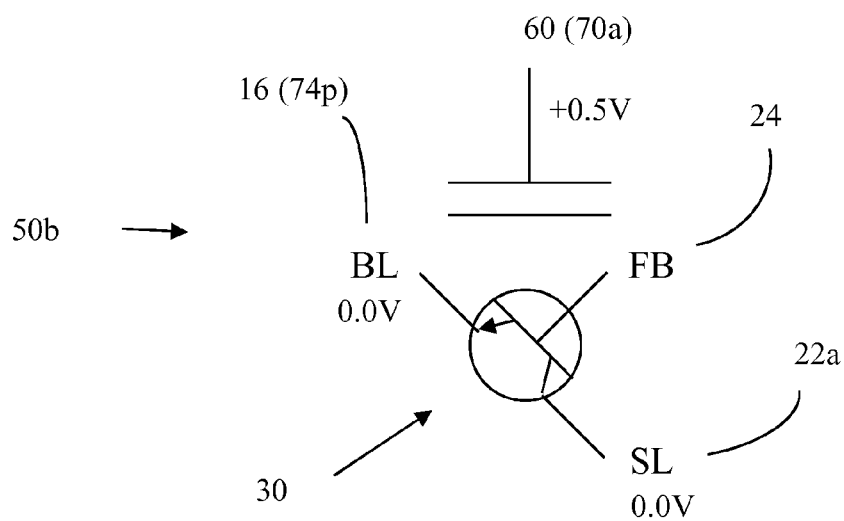
Figure 14E:
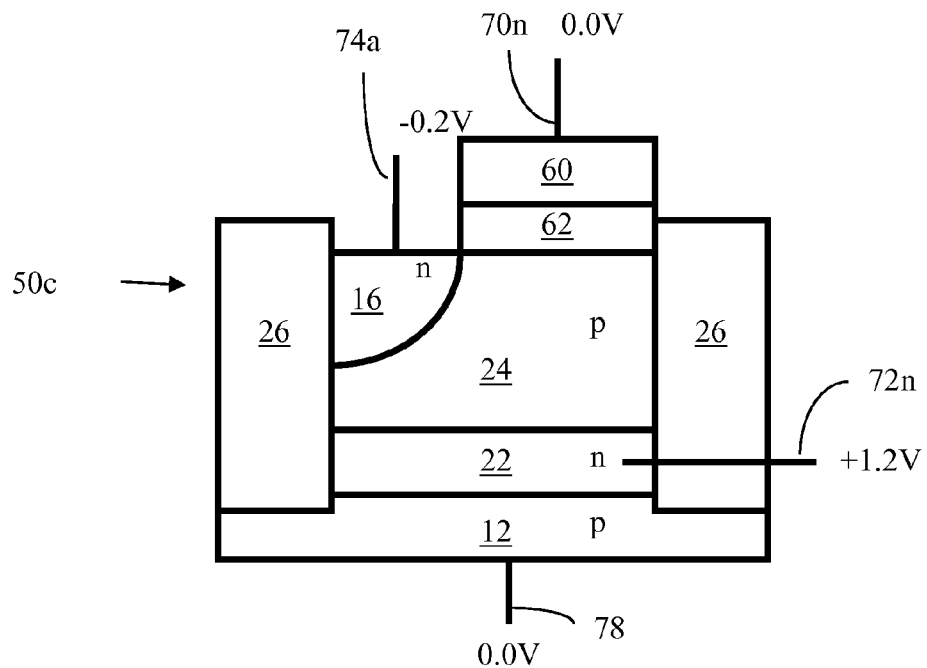
Figure 14F:
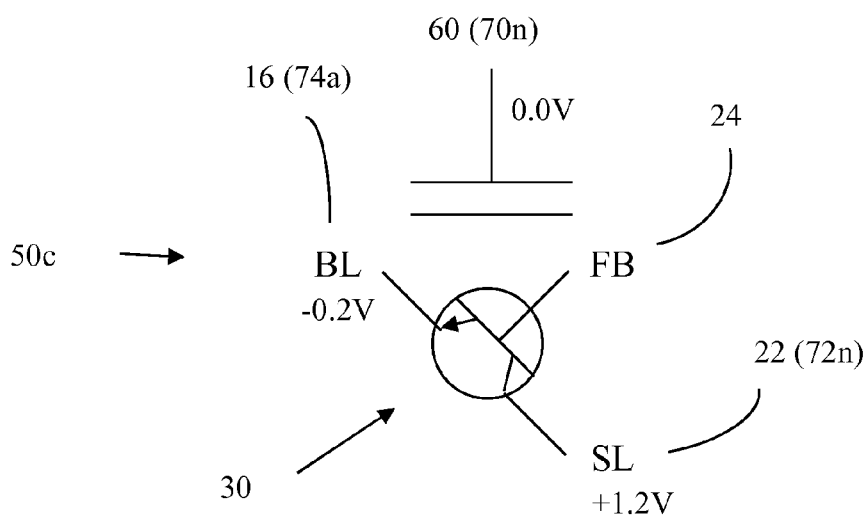
Figure 14G:
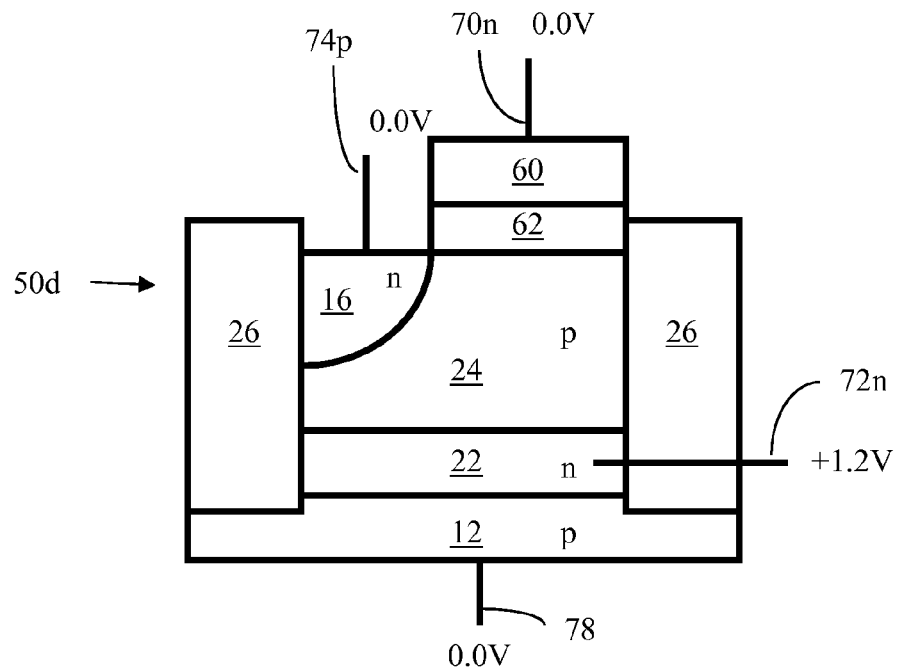
Figure 14H:
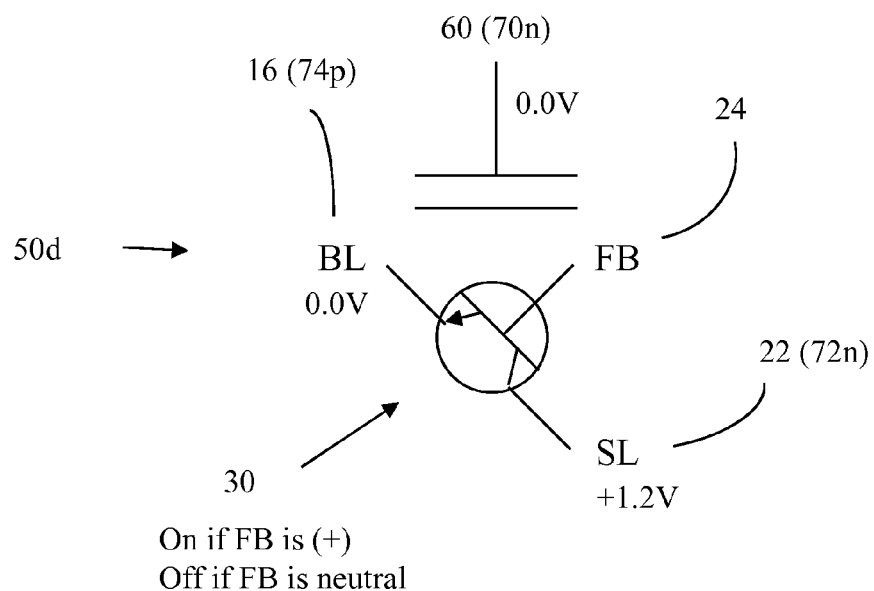

The unselected memory cells 50 in memory array 80 under the bias conditions of FIG. 13 during the individual bit write logic-0 operation are shown in FIGS. 14C through 14H. The bias conditions for memory cells sharing the same row (e.g. representative memory cell 50b) as the selected representative memory cell 50a are illustrated in FIGS. 14C and 14D, and the bias conditions for memory cells sharing the same column (e.g. representative memory cell 50c) as the selected representative memory cell 50a are shown in FIGS. 14E and 14F, and the bias conditions for memory cells sharing neither the same row nor the same column (e.g. representative memory cell 50d) as the selected representative memory cell 50a are shown in FIGS. 14G and 14H.

As shown in FIGS. 14C and 14D, the floating body 24 potential of memory cell 50b sharing the same row as the selected representative memory cell 50a will increase due to capacitive coupling from WL terminal 70 by $\Delta V_{FB}$. For memory cells in state logic-0, the increase in the floating body 24 potential is not sustainable as the forward bias current of the p-n diodes formed by floating body 24 and junction 16 will evacuate holes from floating body 24. As a result, the floating body 24 potential will return to the initial state logic-0 equilibrium potential. For memory cells in state logic-1, the floating body 24 potential will initially also increase by $\Delta V_{FB}$, which will result in holes being evacuated from floating body 24. After the positive bias on the WL terminal 70 is removed, the floating body 24 potential will decrease by $\Delta V_{FB}$. If the initial floating body 24 potential of state logic-1 is referred to as $V_{FB1}$, the floating body 24 potential after the write logic-0 operation will become $V_{FB1} - \Delta V_{FB}$. Therefore, the WL potential needs to be optimized such that the decrease in floating body potential of memory cells 50 in state logic-1 is not too large during the time when the positive voltage is applied to (and subsequently removed from) WL terminal 70a. For example, the maximum floating body potential increase due to the coupling from the WL potential cannot exceed $V_{FB1}/2$. Thus in some embodiments it may be advantageous to have a slightly positive voltage on unselected BL terminal 74p. This means that bipolar device 30 can only evacuate holes in reverse operation (e.g., only the p-n junction between the floating body 24 and buried well 22 will be on enough to evacuate holes from the floating body region 24) which may minimize the reduction of holes in floating body region 24 in the logic-1 state.

As shown in FIGS. 14E and 14F, for representative memory cell 50c sharing the same column as the selected representative memory cell 50a, a negative voltage is applied to the BL terminal 74a, resulting in an increase in the potential difference between floating body 24 and bit line region 16 connected to the BL terminal 74a. As a result, the p-n diode formed between floating body 24 and bit line region 16 will be forward biased. For memory cells in the logic-0 state, the increase in the floating body 24 potential will not change the initial state from logic-0 as there is initially no hole stored in the floating body 24. For memory cells in the logic-1 state, the net effect is that the floating body 24 potential after write logic-0 operation will be reduced. Therefore, the BL potential also needs to be optimized such that the decrease in floating body potential of memory cells 50 in state logic-1 is not too large during the time when the negative voltage is applied to BL terminal 74*a*. For example, the $-V_{FB1}/2$ is applied to the BL terminal 74*a*.

As shown in FIGS. 14G and 14H, memory cell 50*d* sharing neither the same row nor the same column as the selected representative memory cell 50*a*, these cells will be in a holding mode as positive voltage is applied to the SL terminal 72*n*, zero voltage is applied to the BL terminal 74*p*, and zero or negative voltage is applied to WL terminal 70*n*, and zero voltage is applied to substrate terminal 78.

Three different methods for performing a write logic-0 operation on memory cell 50 have been disclosed. Many other embodiments and component organizations are possible like, for example, reversing the first and second conductivity types while inverting the relative voltage biases applied. An exemplary array 80 has been used for illustrative purposes, but many other possibilities are possible like, for example, applying different bias voltages to the various array line terminals, employing multiple arrays, performing multiple single bit write logic-0 operations to multiple selected bits in one or more arrays or by use of decoding circuits, interdigitating bits so as to conveniently write logic-0s to a data word followed by writing logic-1s to selected ones of those bits, etc. Such embodiments will readily suggest themselves to persons of ordinary skill in the art familiar with the teachings and illustrations herein. Thus the exemplary embodiments, features, bias levels, etc., described are not limiting in any way.

A write logic-1 operation may be performed on memory cell 50 through impact ionization as described, for example, with reference to Lin cited above, or through a band-to-band tunneling mechanism (also known as Gate Induced Drain Leakage or GIDL), as described, for example with reference to Yoshida cited above. An example of a write logic-1 operation using the GIDL method is described in conjunction with FIGS. 15 and 15A through 15H while an example of a write logic-1 operation using the impact ionization method is described in conjunction with FIGS. 16 and 16A through 16H.

Figure 15:
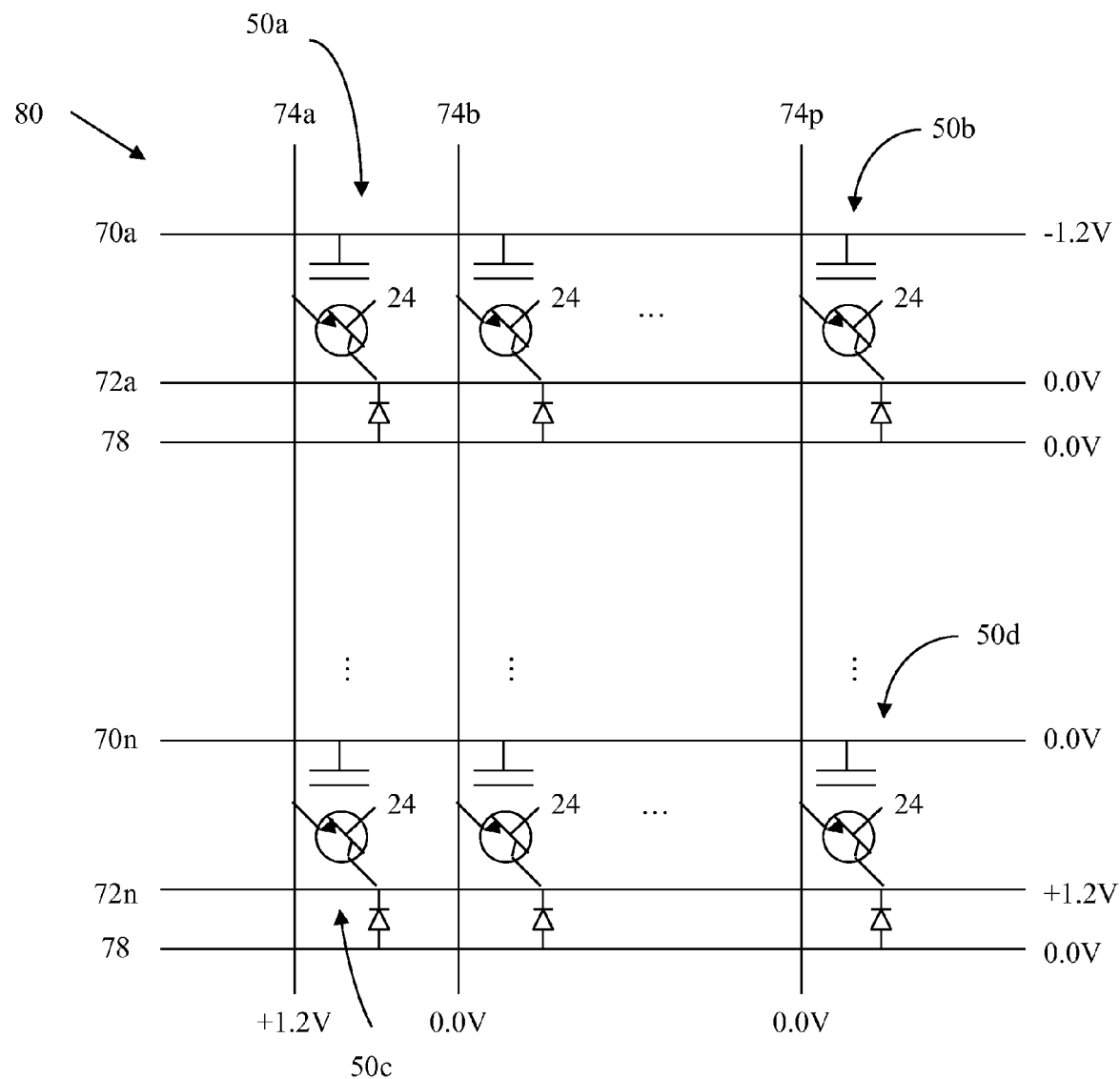
FIG. 15 illustrates an array of memory cells according to the present invention during a first type of write logic-1 operation.

In FIG. 15 an example of the bias conditions of the array 80 including selected representative memory cell 50*a* during a band-to-band tunneling write logic-1 operation is shown. The negative bias applied to the WL terminal 70*a* and the positive bias applied to the BL terminal 74*a* results in hole injection to the floating body 24 of the selected representative memory cell 50*a*. The SL terminal 72*a* and the substrate terminal 78 are grounded during the write logic-1 operation.

The negative voltage on WL terminal 70 couples the voltage potential of the floating body region 24 in representative memory cell 50*a* downward. This combined with the positive voltage on BL terminal 74*a* creates a strong electric field between the bit line region 16 and the floating body region 24 in the proximity of gate 60 (hence the "gate induced" portion of GIDL) in selected representative memory cell 50*a*. This bends the energy bands sharply upward near the gate and drain junction overlap region, causing electrons to tunnel from the valence band to the conduction band, leaving holes in the valence band. The electrons which tunnel across the energy band become the drain leakage current (hence the "drain leakage" portion of GIDL), while the holes are injected into floating body region 24 and become the hole charge that creates the logic-1 state. This process is well known in the art and is illustrated in Yoshida (specifically FIGS. 2 and 6 on page 3 and FIG. 9 on page 4) cited above.

Figure 15A:
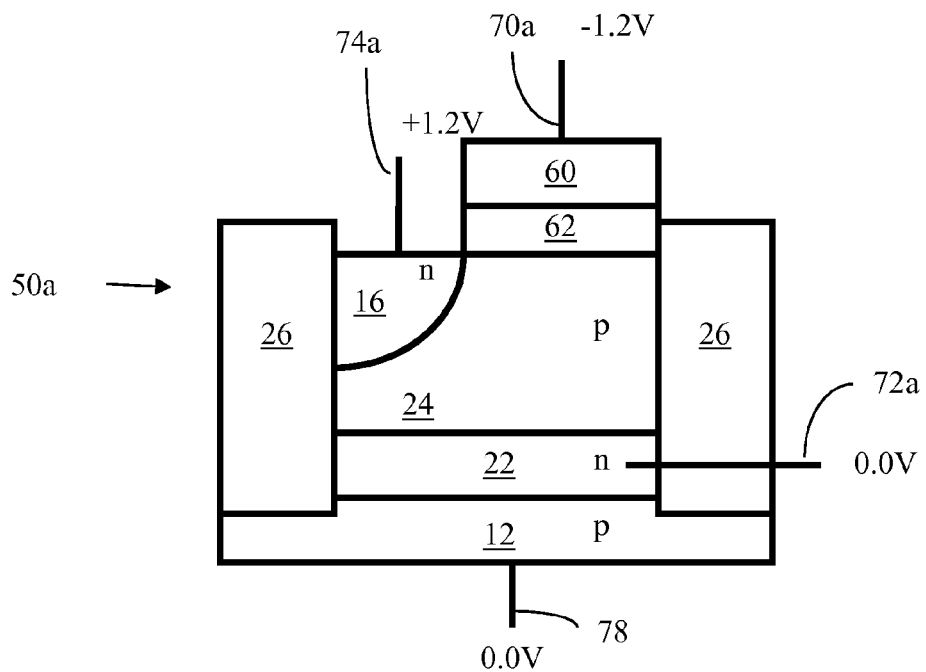
FIGS. 15A through 15H illustrate the operation of four representative memory cells of the array of FIG. 15 during the first type of write logic-1 operation.
Figure 15B:
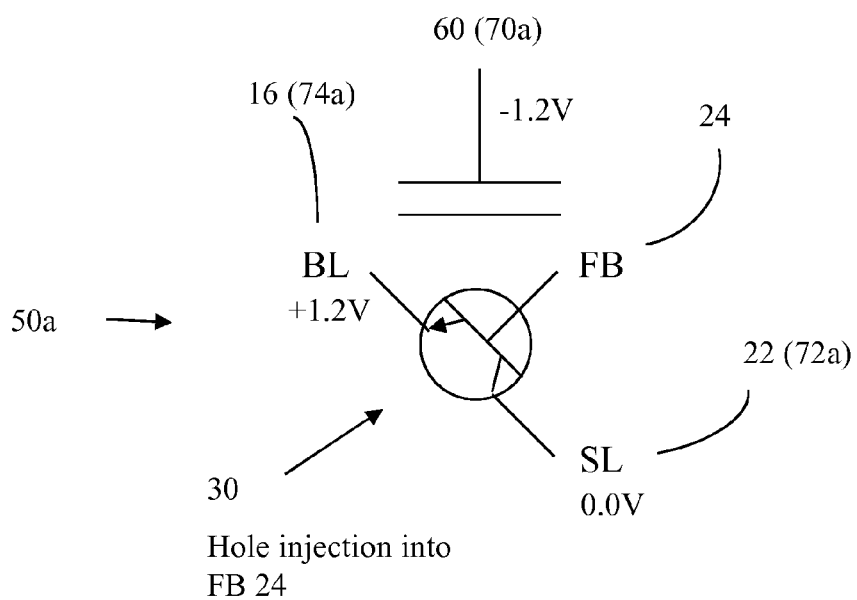

As shown in FIGS. 15A through 15B, the following bias conditions may be applied to the selected representative memory cell 50*a*: a potential of about 0.0 volts is applied to SL terminal 72*a*, a potential of about +1.2 volts is applied to BL terminal 74*a*, a potential of about −1.2 volts is applied to WL terminal 70*a*, and about 0.0 volts is applied to substrate terminal 78.

Elsewhere in array 80 the following bias conditions are applied to the terminals for unselected memory cells 50 including representative memory cells 50*b*, 50*c* and 50*d*: about +1.2 volts is applied to SL terminal 72*n*, about 0.0 volts is applied to BL terminal 74*p*, a potential of about 0.0 volts is applied to WL terminal 70*n*, and about 0.0 volts is applied to substrate terminal 78. FIG. 15 shows the bias condition for the selected and unselected memory cells in memory array 80. However, these voltage levels may vary from embodiment to embodiment of the present invention and are exemplary only and are in no way limiting.

Figure 15C:
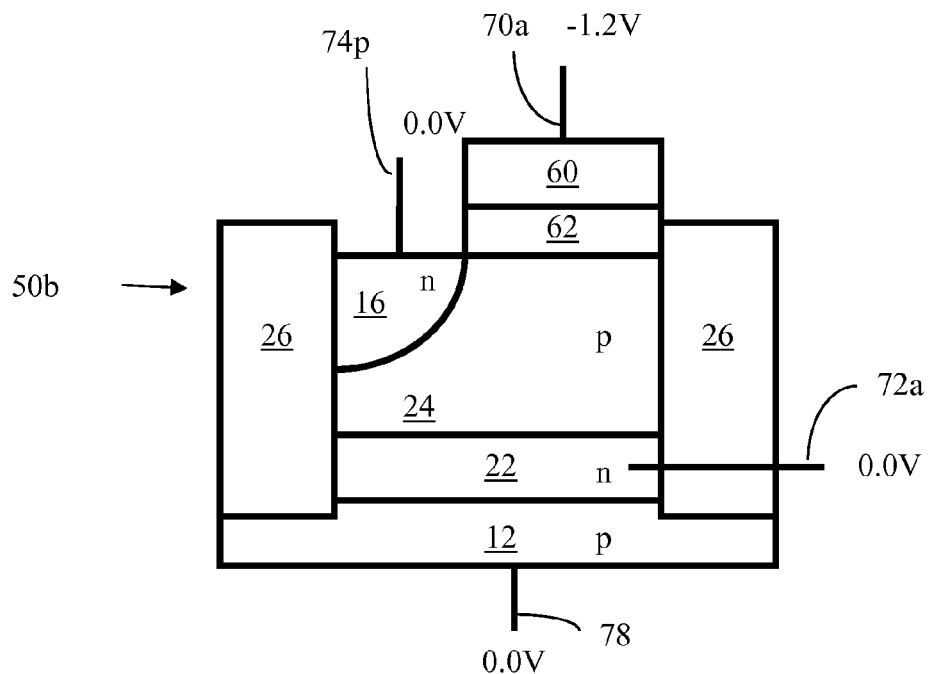
Figure 15D:
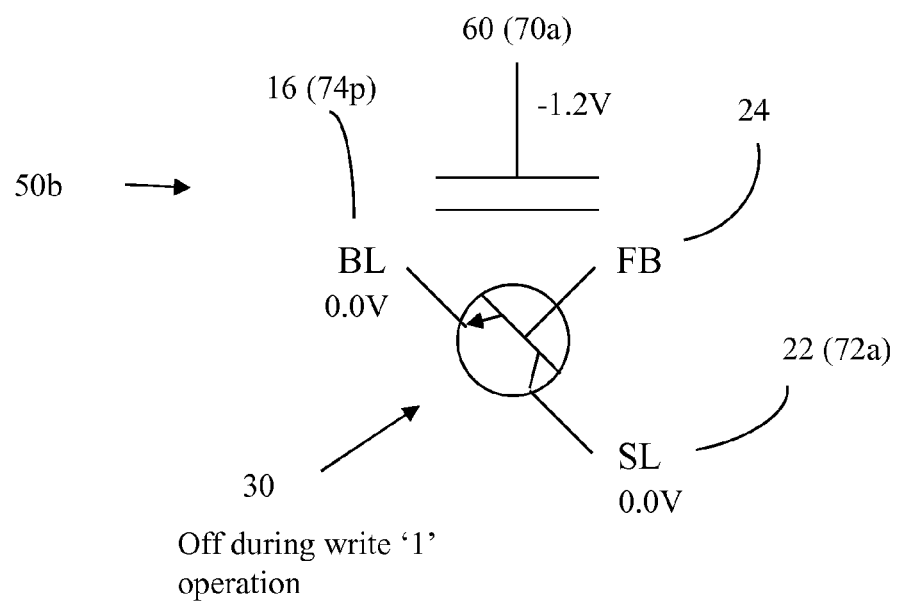
Figure 15E:
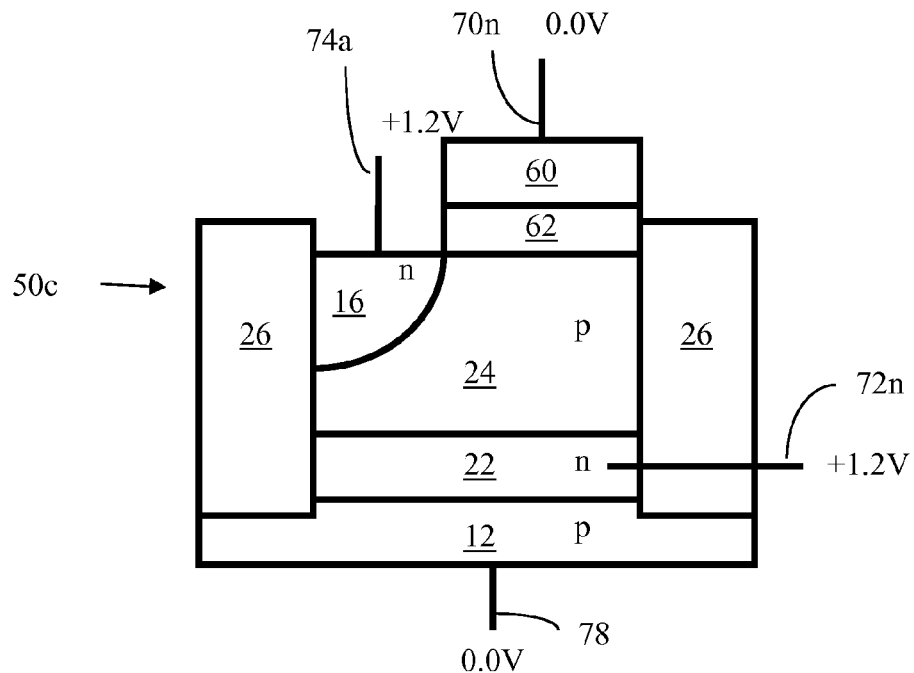
Figure 15F:
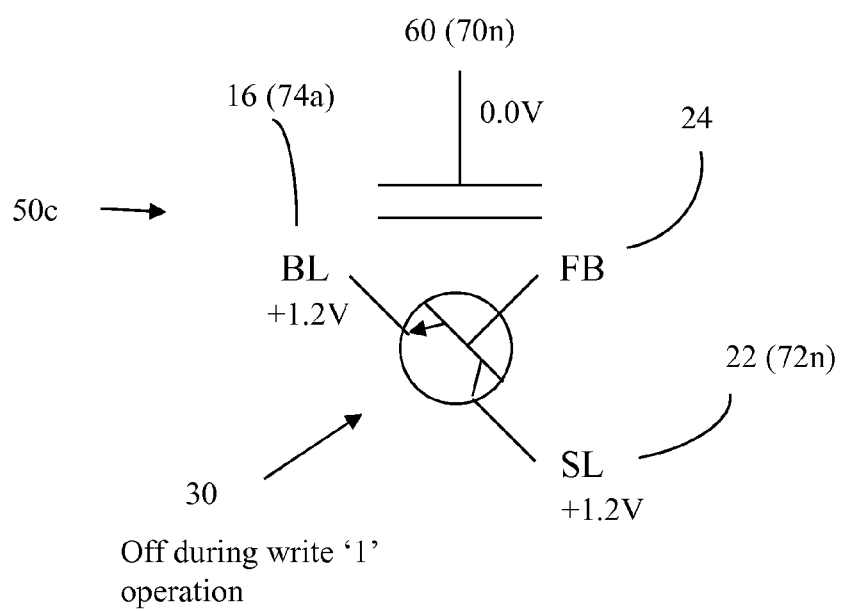
Figure 15G:
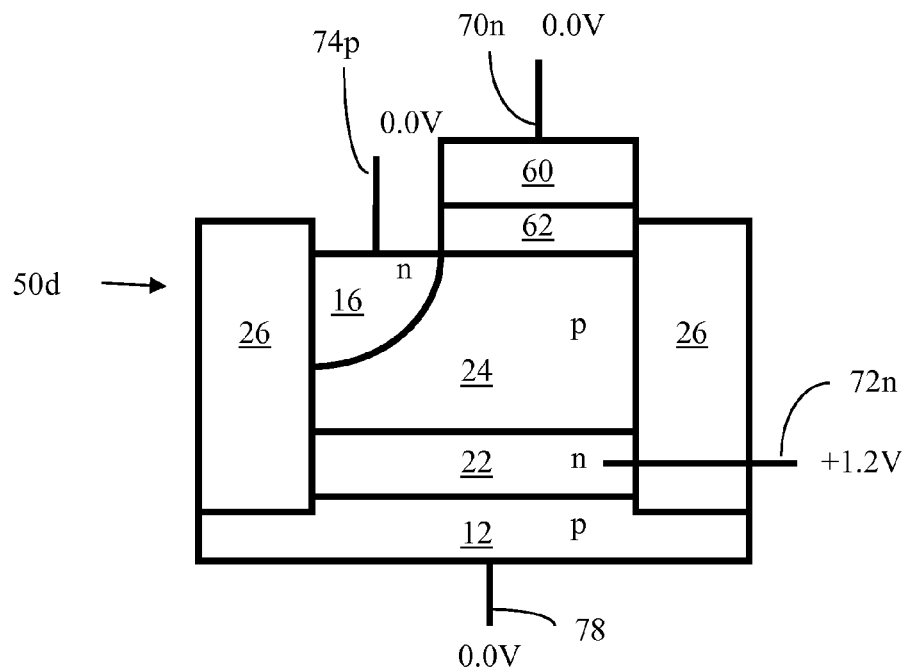
Figure 15H:
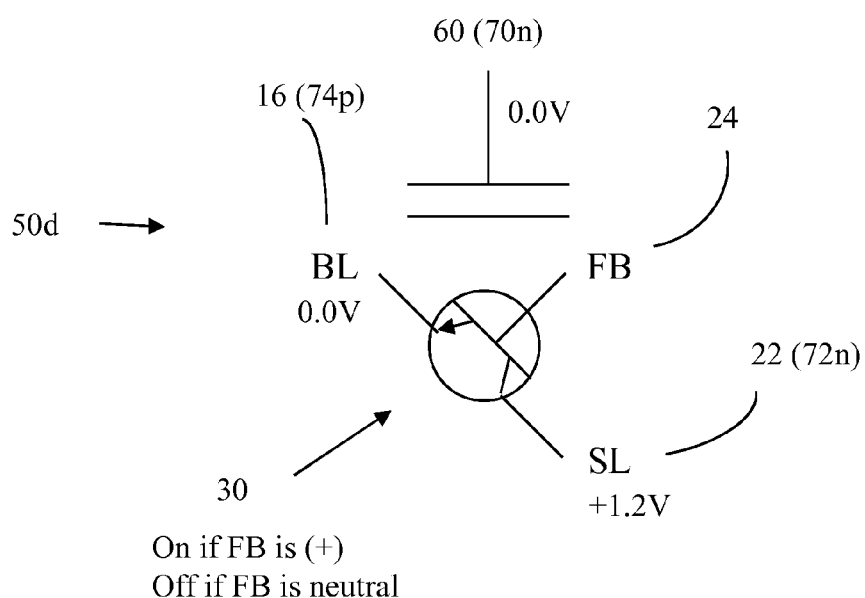

The unselected memory cells during write logic-1 operations are shown in FIGS. 15C through 15H. The bias conditions for memory cells sharing the same row (e.g. representative memory cell 50*b*) are shown in FIGS. 15C and 15D. The bias conditions for memory cells sharing the same column as the selected representative memory cell 50*a* (e.g. representative memory cell 50*c*) are shown in FIGS. 15E and 15F. The bias conditions for memory cells 50 not sharing the same row nor the same column as the selected representative memory cell 50*a* (e.g. representative memory cell 50*d*) are shown in FIGS. 15G and 15H.

As illustrated in FIGS. 15C and 15D, representative memory cell 50*b*, sharing the same row as the selected representative memory cell 50*a*, has both terminals 72*a* and 74*p* grounded, while about −1.2 volts is applied to WL terminal 70*a*. Because SL terminal 70*a* is grounded, memory cell 50*b* will not be at the holding mode since there is no voltage across between the emitter and collector terminals of the n-p-n bipolar device 30 turning it off. However, because the write logic-1 operation is accomplished much faster (on the order of nanoseconds) compared to the lifetime of the charge in the floating body 24 (on the order of milliseconds), it should cause little disruption to the charge stored in the floating body.

As illustrated in FIGS. 15E and 15F, for representative memory cell 50*c* sharing the same column as the selected memory cell, a positive voltage is applied to the BL terminal 74*n*. No base current will flow into the floating body 24 because there is no potential difference between SL terminal 72*n* and BL terminal 74*a* (i.e. there is no voltage between the emitter and collector terminals of the n-p-n bipolar device 30 turning it off). However, because a write operation is accomplished much faster (in the order of nanoseconds) compared to the lifetime of the charge in the floating body 24 (in the order of milliseconds), it should cause little disruption to the charge stored in the floating body.

As illustrated in FIGS. 15G and 15H, for memory cell 50*d* sharing neither the same row nor the same column as the selected memory cell, the SL terminal 72*n* will remain positively charged while the gate terminal 70*n* and the BL terminal 74*p* remain grounded. As can be seen, these cells will be at holding mode. Memory cells in state logic-1 will maintain the charge in floating body 24 because the intrinsic bipolar device 30a will generate holes current to replenish the charge in floating body 24, while memory cells in state logic-0 will remain in neutral state.

Figure 16:
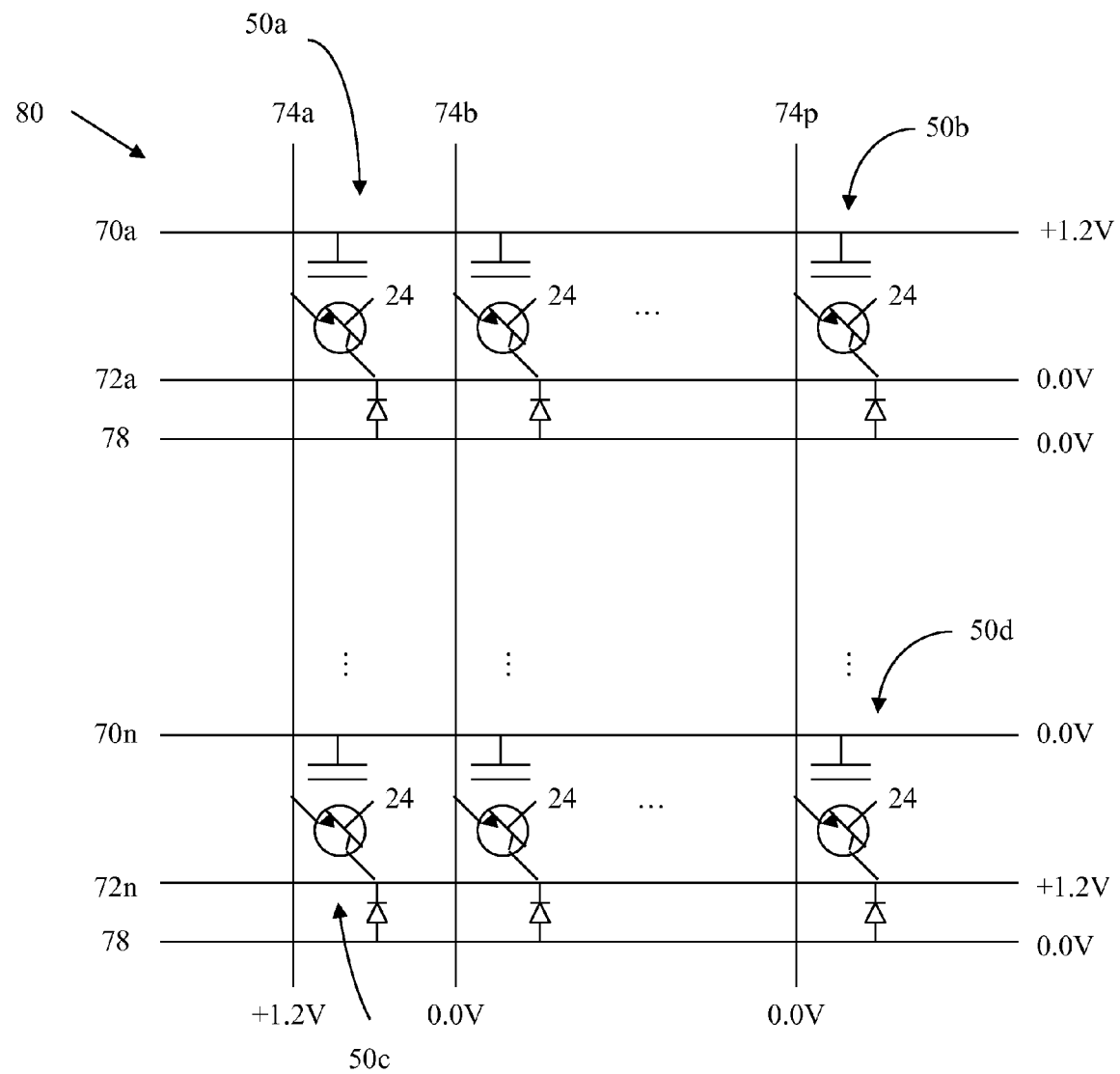
FIG. 16 illustrates an array of memory cells according to the present invention during a second type of write logic-1 operation.

FIG. 16 shows a write logic-1 operation using the impact ionization method. In this case, both the gate 60 and bit line 16 of the memory cell 50 to be written are biased at a positive voltage. This is similar to the holding operation described earlier in conjunction with FIGS. 3A through 4D which also uses impact ionization to supply hole current to the floating body 24. However in the holding operation, the n-p-n bipolar device 30 stays off when a logic-0 is stored in memory cell 50 and impact ionization current only flows when a logic-1 is stored in the cell restoring the charge level in the floating body 24 to a full logic-1 level. By contrast, in the case of a write logic-1 operation using impact ionization, the voltage on the gate terminal is positive rather than zero. The action of raising the gate 60 to a positive voltage has the effect of raising the voltage potential of the floating body region 24 due to capacitive coupling across the gate insulating layer 62 which causes the n-p-n bipolar transistor 30 to turn on regardless of whether or not a logic-1 or logic-0 is stored in memory cell 50. This causes impact ionization current to flow charging the floating body 24 to the logic-1 state regardless of the data originally stored in the cell.

In the exemplary embodiment shown in FIG. 16, the selected word line terminal 70a is biased at about +1.2V while the unselected word line terminals 70b (not shown) through 70n are biased at about 0.0V, the selected bit line terminal 74a is also biased at about +1.2V while the unselected bit line terminals 74b through 74p are biased at about 0.0V, the selected source line 72a is biased at about 0.0V, while the unselected source line terminals 72b (not shown) through 72n are biased at about +1.2V, and the substrate terminal 78 is biased at about 0.0V. These voltage bias levels are exemplary only and will vary from embodiment to embodiment and are thus in no way limiting.

Figure 16A:
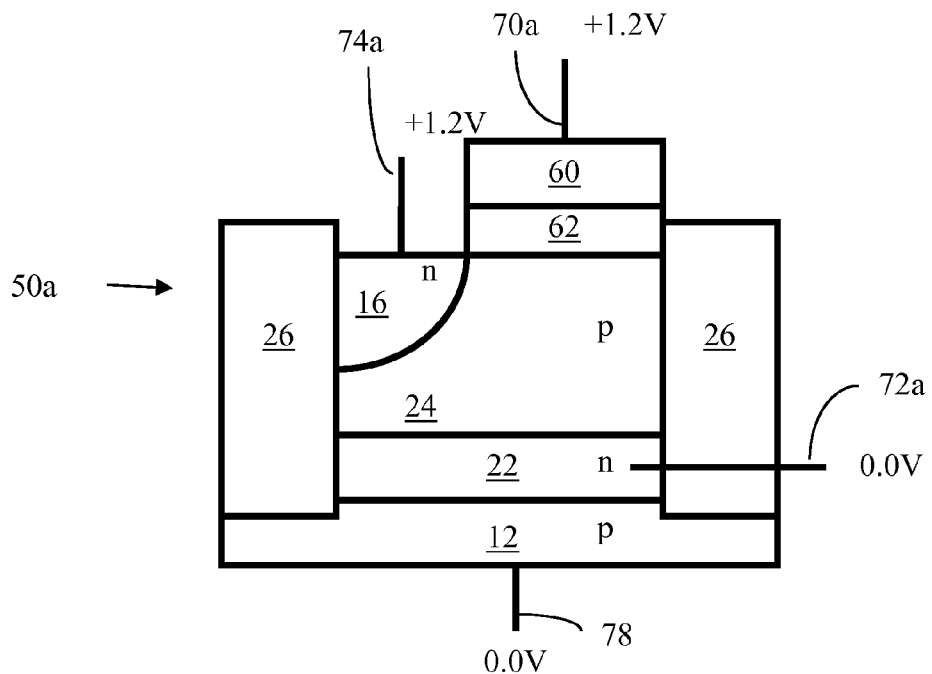
FIGS. 16A through 16H illustrate the operation of four representative memory cells of the array of FIG. 16 during the second type of write logic-1 operation.
Figure 16B:
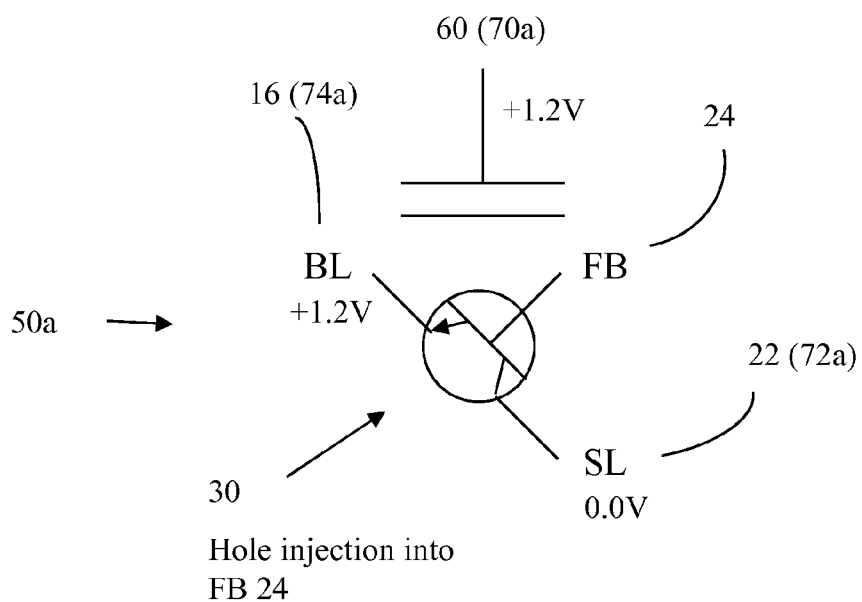

As shown in FIGS. 16A through 16B, selected representative memory cell 50a is shown with gate 60 coupled to WL terminal 70A biased at +1.2V, bit line region 16 coupled to BL terminal 74a biased at +1.2V, and buried layer 22 coupled to source line terminal 72a biased at 0.0V. In this state, impact ionization current flows into the cell from BL terminal 74a injecting holes into the floating body region 24 writing a logic-1 state into representative memory cell 50a.

Figure 16C:
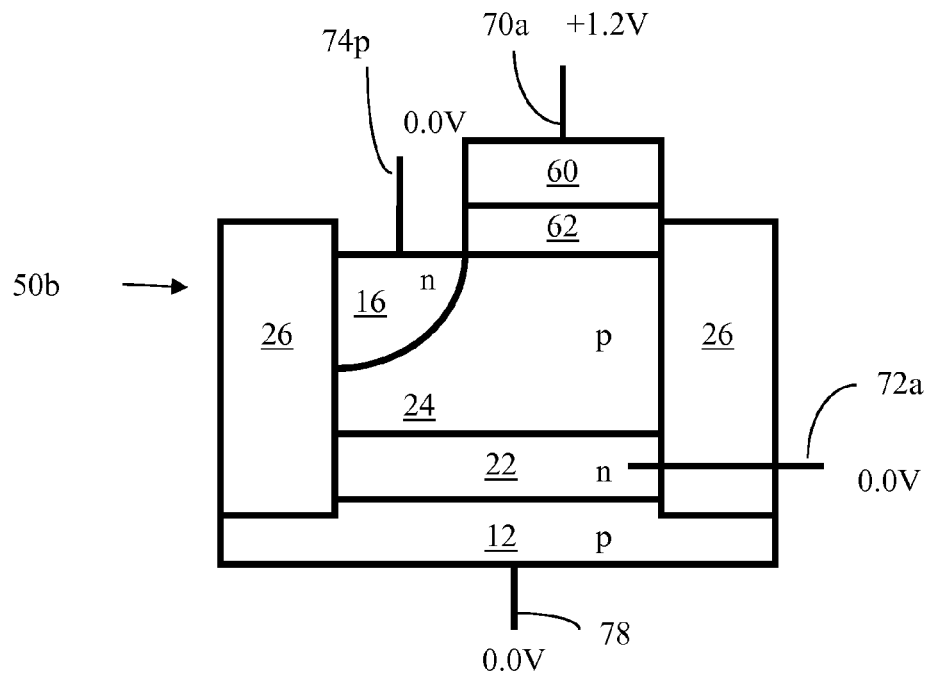
Figure 16D:
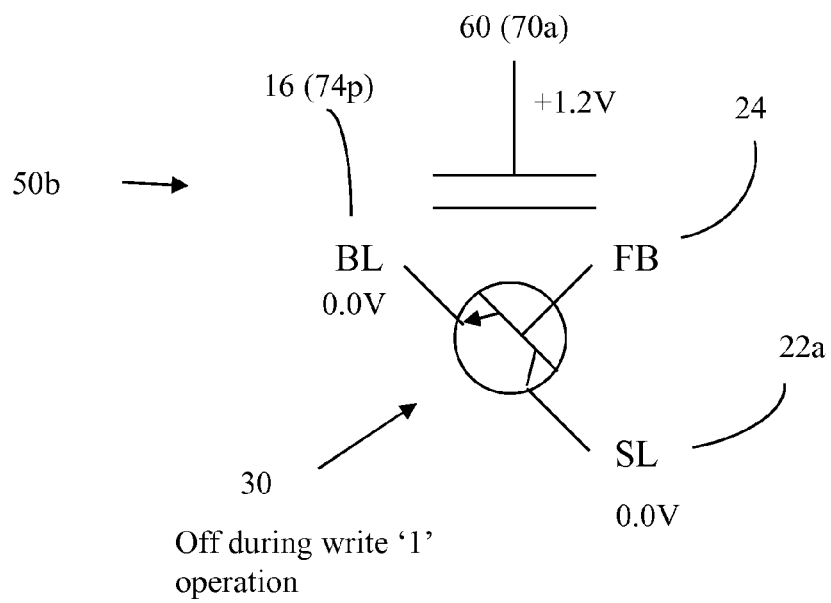

As shown in FIGS. 16C through 16D, unselected representative memory cell 50b, sharing a row but not a column with selected representative memory cell 50a, is shown with gate 60 coupled to WL terminal 70a biased at +1.2V, bit line region 16 coupled to BL terminal 74p biased at 0.0V, and buried layer 22 coupled to source line terminal 72a biased at 0.0V. In this state, the collector-to-emitter voltage of n-p-n bipolar device 30 is 0.0V causing the device to be off protecting the contents of representative memory cell 50b.

Figure 16E:
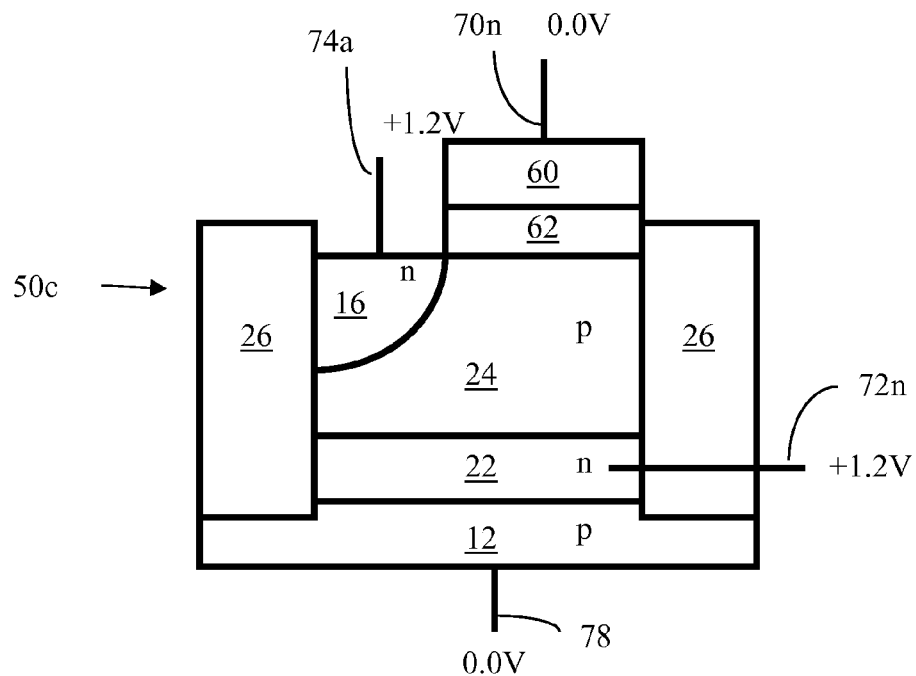
Figure 16F:
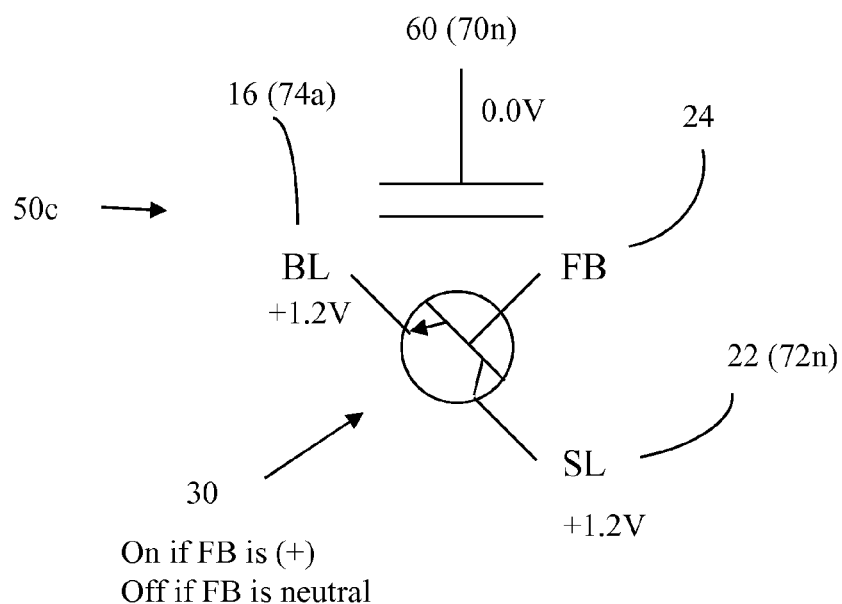

As shown in FIGS. 16E through 16F, unselected representative memory cell 50c, sharing a column but not a row with selected representative memory cell 50a, is shown with gate 60 coupled to WL terminal 70n biased at 0.0V, bit line region 16 coupled to BL terminal 74a biased at +1.2V, and buried layer 22 coupled to source line terminal 72n biased at +1.2V. In this state, the n-p-n bipolar device 30 will be off since there is no voltage difference between the collector and emitter terminals of n-p-n bipolar device 30.

Figure 16G:
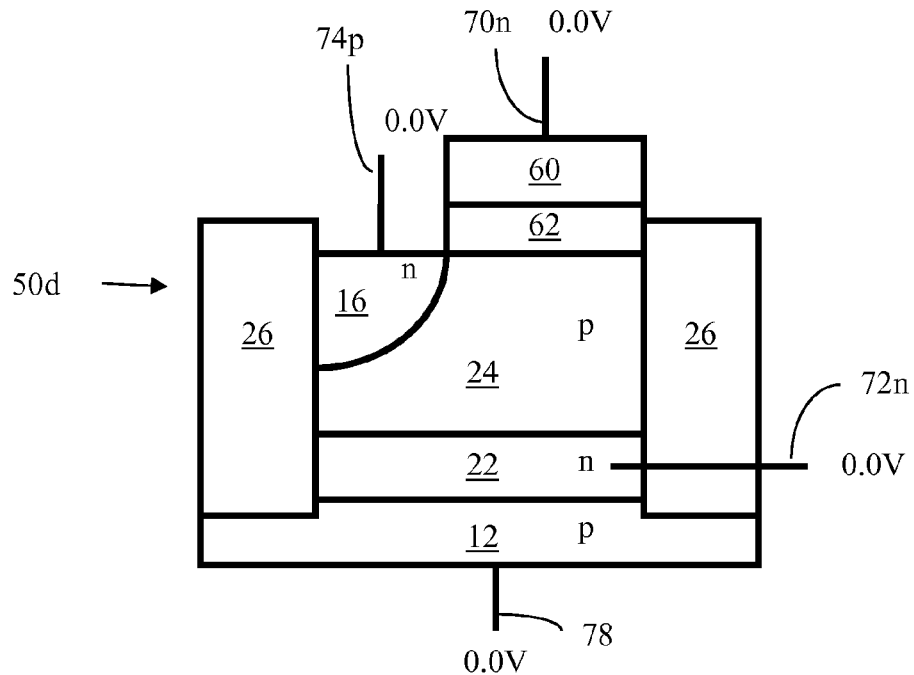
Figure 16H:
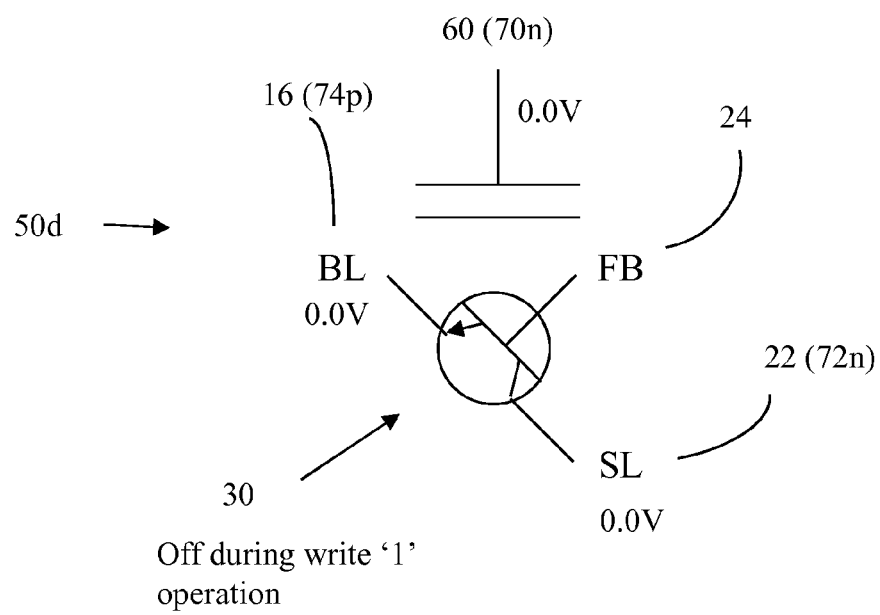

As shown in FIGS. 16G through 16H, unselected representative memory cell 50d, sharing neither a row nor a column with selected representative memory cell 50a, is shown with gate 60 coupled to WL terminal 70n biased at 0.0V, bit line region 16 coupled to BL terminal 74p biased at 0.0V, and buried layer 22 coupled to source line terminal 72n biased at +1.2V. As can be seen, these cells will be at holding mode. Memory cells in state logic-1 will maintain the charge in floating body 24 because the intrinsic bipolar device 30a will generate holes current to replenish the charge in floating body 24, while memory cells in state logic-0 will remain in neutral state.

Figure 17A:
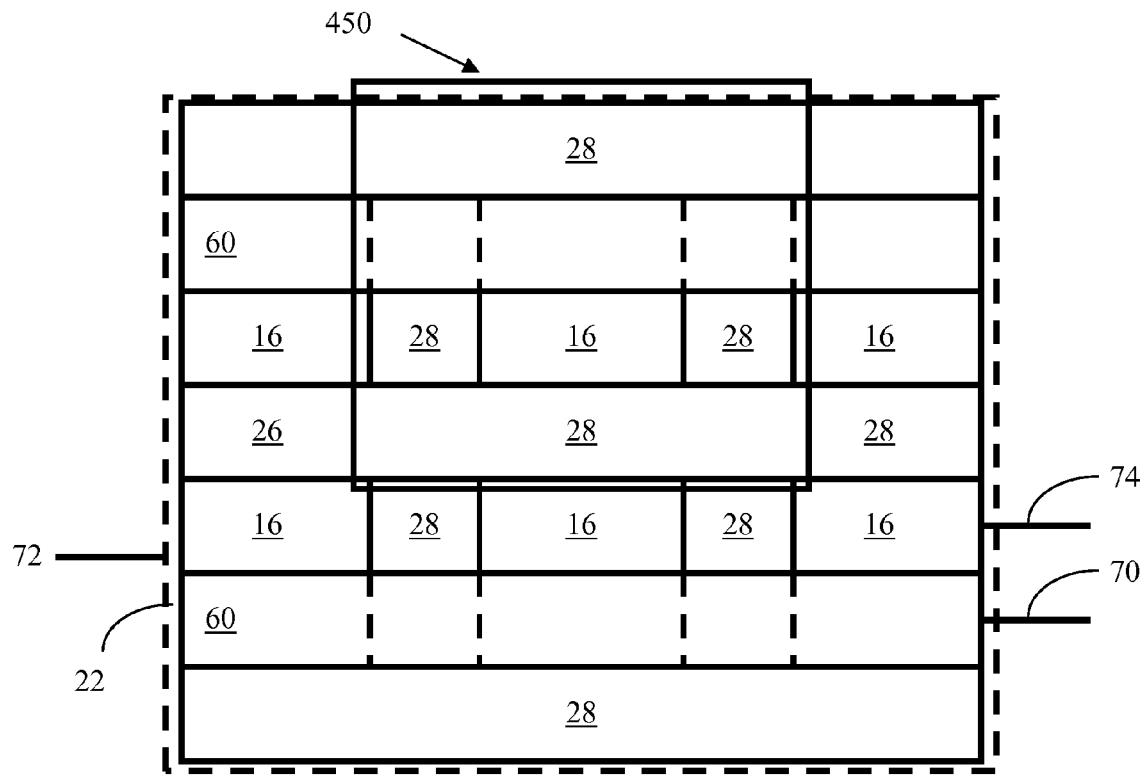
FIGS. 17A through 17E illustrate a second exemplary memory cell according to the present invention.
Figure 17B:
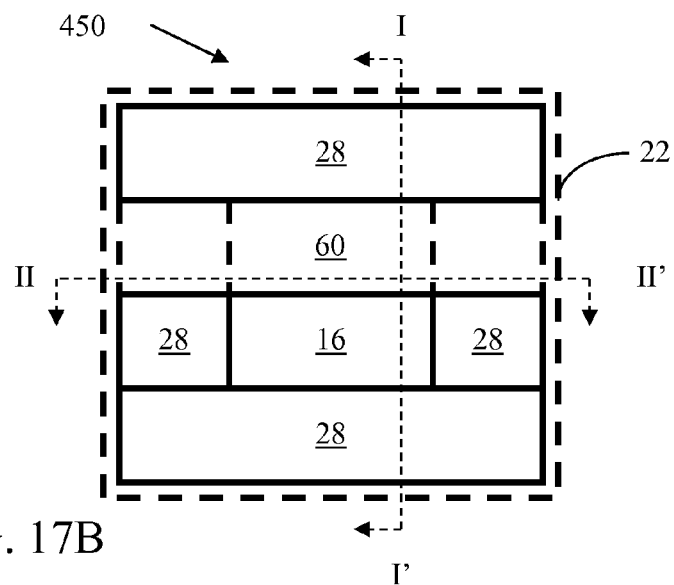
Figure 17C:
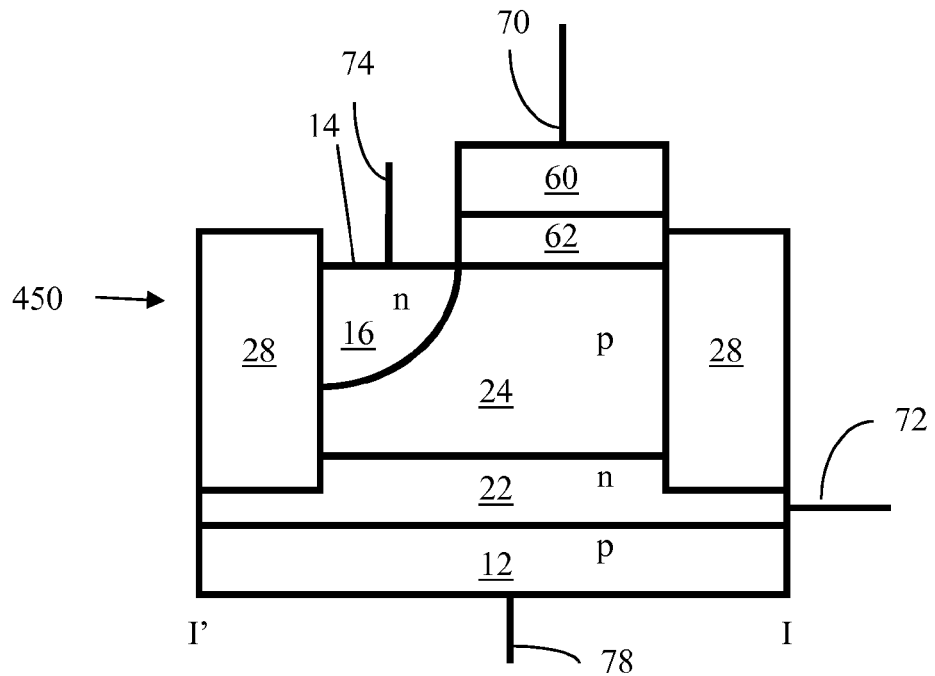
Figure 17D:
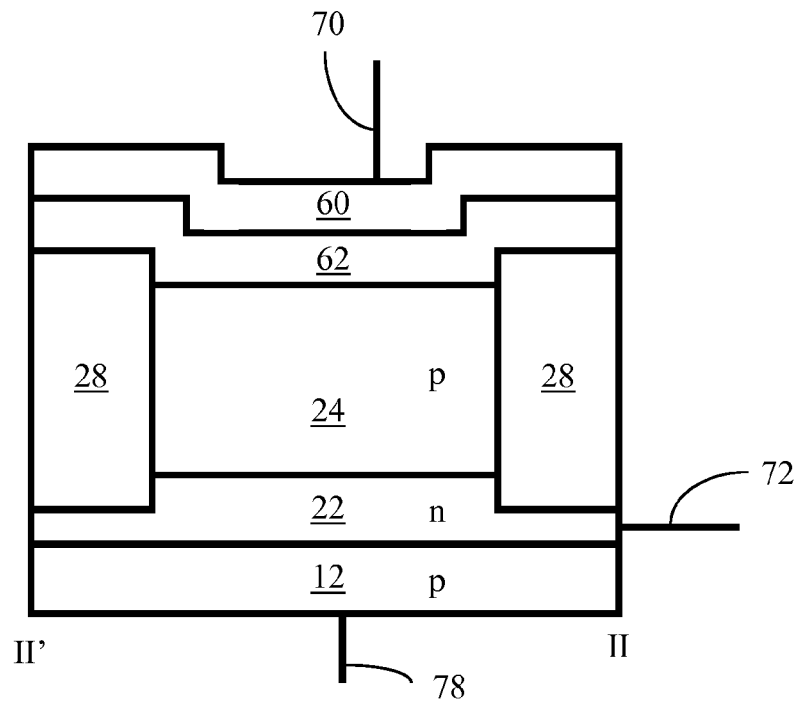
Figure 17E:
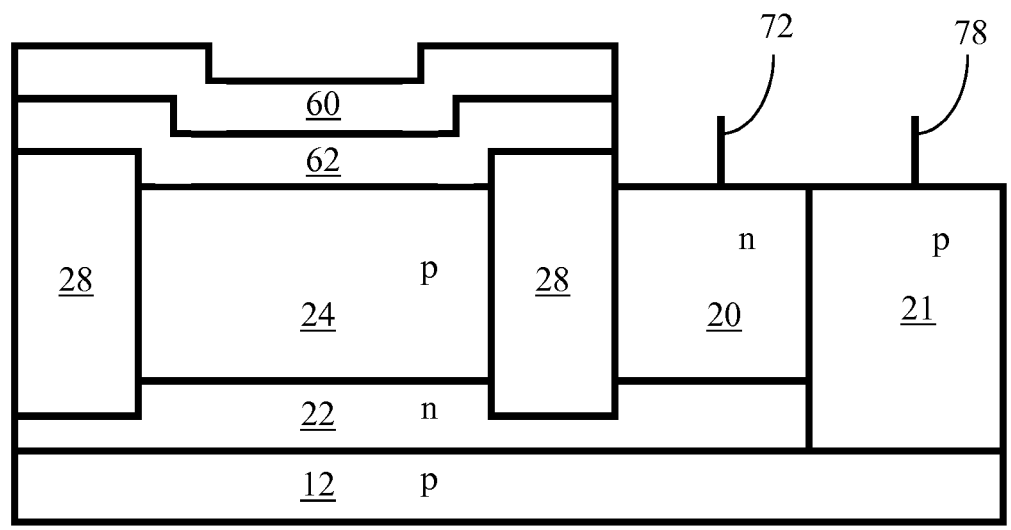

FIG. 17A shows a top view of an embodiment of a partial memory array including Gated half transistor memory cell 450 according to the present invention and FIG. 17B shows memory cell 450 in isolation. FIGS. 17C and 17D show the memory cell 450 cross sections along the I-I' line and II-II' cut lines, respectively, while FIG. 17E shows a method of contacting the buried well and substrate layers beneath the cells. FIGS. 18A through 18H show memory array 480 comprised of rows and columns of memory cell 450. The primary difference between memory cell 50 and memory cell 450 is that while insulating layers 26 isolate the buried layer 22 between memory cells in adjacent rows in memory cell 50, in memory cell 450 the regions occupied by insulating layer 26 are replaced by insulating layer 28. Thus memory cell 450 is surrounded by insulating layer 28 on all four sides and the buried layer 22 is continuously connected as a single "source line" amongst all of the memory cells 450 in memory array 480. This makes for a memory array that is very similar to memory array 80, however some operations will be different as described below in conjunction with FIGS. 18A through 18F. As was the case with memory cell 50 in memory cell 80, there is no contact to the buried layer 22 within the boundary of memory cell 450.

Referring to FIGS. 17C and 17D together, the cell 450 includes a substrate 12 of a first conductivity type such as a p-type, for example. Substrate 12 is typically made of silicon, but may also comprise, for example, germanium, silicon germanium, gallium arsenide, carbon nanotubes, or other semiconductor materials. In some embodiments of the invention, substrate 12 can be the bulk material of the semiconductor wafer. In other embodiments, substrate 12 can be a well of the first conductivity type embedded in either a well of the second conductivity type or, alternatively, in the bulk of the semiconductor wafer of the second conductivity type, such as n-type, for example, (not shown in the figures) as a matter of design choice. To simplify the description, the substrate 12 will is drawn as the semiconductor bulk material as it is in FIGS. 17C and 17D though it may also be a well in a substrate of material of the second type of conductivity.

A buried layer 22 of a second conductivity type such as n-type, for example, is provided in the substrate 12. Buried layer 22 may be formed by an ion implantation process on the material of substrate 12. Alternatively, buried layer 22 can also be grown epitaxially on top of substrate 12.

A floating body region 24 of the first conductivity type, such as p-type, for example, is bounded on top by bit line region 16 an insulating layer 62, on the sides by insulating layer 28, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments, as a matter of design choice.

Insulating layers 28 (like, for example, shallow trench isolation (STI)), may be made of silicon oxide, for example, though other insulating materials may be used. Insulating layers 28 insulate cell 450 from neighboring cells 450 when multiple cells 450 are joined in an array 480 to make a memory device as illustrated in FIGS. 18A-18F. Insulating layer 28 insulates neighboring body regions 24, but not the buried layer 22, allowing the buried layer 22 to be continuous (i.e. electrically conductive) under the entire array 480.

A bit line region 16 having a second conductivity type, such as n-type, for example, is provided in floating body region 24 and is exposed at surface 14. Bit line region 16 is formed by an implantation process formed on the material making up substrate 12, according to any implantation process known and typically used in the art. Alternatively, a solid state diffusion process could be used to form bit line region 16.

A gate 60 is positioned in between the bit line region 16 and insulating layer 28 and above the floating body region 24. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Memory cell 450 further includes word line (WL) terminal 70 electrically connected to gate 60, bit line (BL) terminal 74 electrically connected to bit line region 16, source line (SL) terminal 72 electrically connected to buried layer 22, and substrate terminal 78 electrically connected to substrate 12.

As shown in FIG. 17E, contact between SL terminal 72 and buried layer 22 can be made through region 20 having a second conductivity type, and which is electrically connected to buried well region 22, while contact between substrate terminal 78 and substrate region 12 can be made through region 21 having a first conductivity type, and which is electrically connected to substrate region 12.

The SL terminal 72 connected to the buried layer region 22 serves as a back bias terminal, i.e. a terminal at the back side of a semiconductor transistor device, usually at the opposite side of the gate of the transistor.

Comparing the structure of the memory device 450, for example, as shown in FIG. 17C to the structure of transistor devices 100, 100A and 100B in FIGS. 52A through 52C, it can be seen that the memory device of present invention constitutes a smaller structure relative to the MOSFET devices 100, 100A and 100B, where only one region of a second conductivity type is present at the surface of the silicon substrate. Thus, memory cell 450 of the present invention provides an advantage that it consists of only one region of second conductivity at the surface (i.e. bit line region 16 as opposed to regions 84 and 86 or regions 84A and 86A) and hence requires only one contact per memory cell 50 (i.e. to create a connection between bit line region 16 and terminal 74).

Persons of ordinary skill in the art will appreciate that in FIGS. 17A through 17E and that the first and second conductivity types can be reversed in memory cell 50 as a matter of design choice and that the labeling of regions of the first conductivity type as p-type and the second conductivity type as p-type is illustrative only and not limiting in any way. Thus the first and second conductivity types can be p-type and n-type respectively in some embodiments of memory cell 50 and be n-type and p-type respectively in other embodiments. Further, such skilled persons will realize that the relative doping levels of the various regions of either conductivity type will also vary as a matter of design choice, and that there is no significance to the absence of notation signifying higher or lower doping levels such as p+ or p− or n+ or n− in any of the diagrams.

Figure 18A:
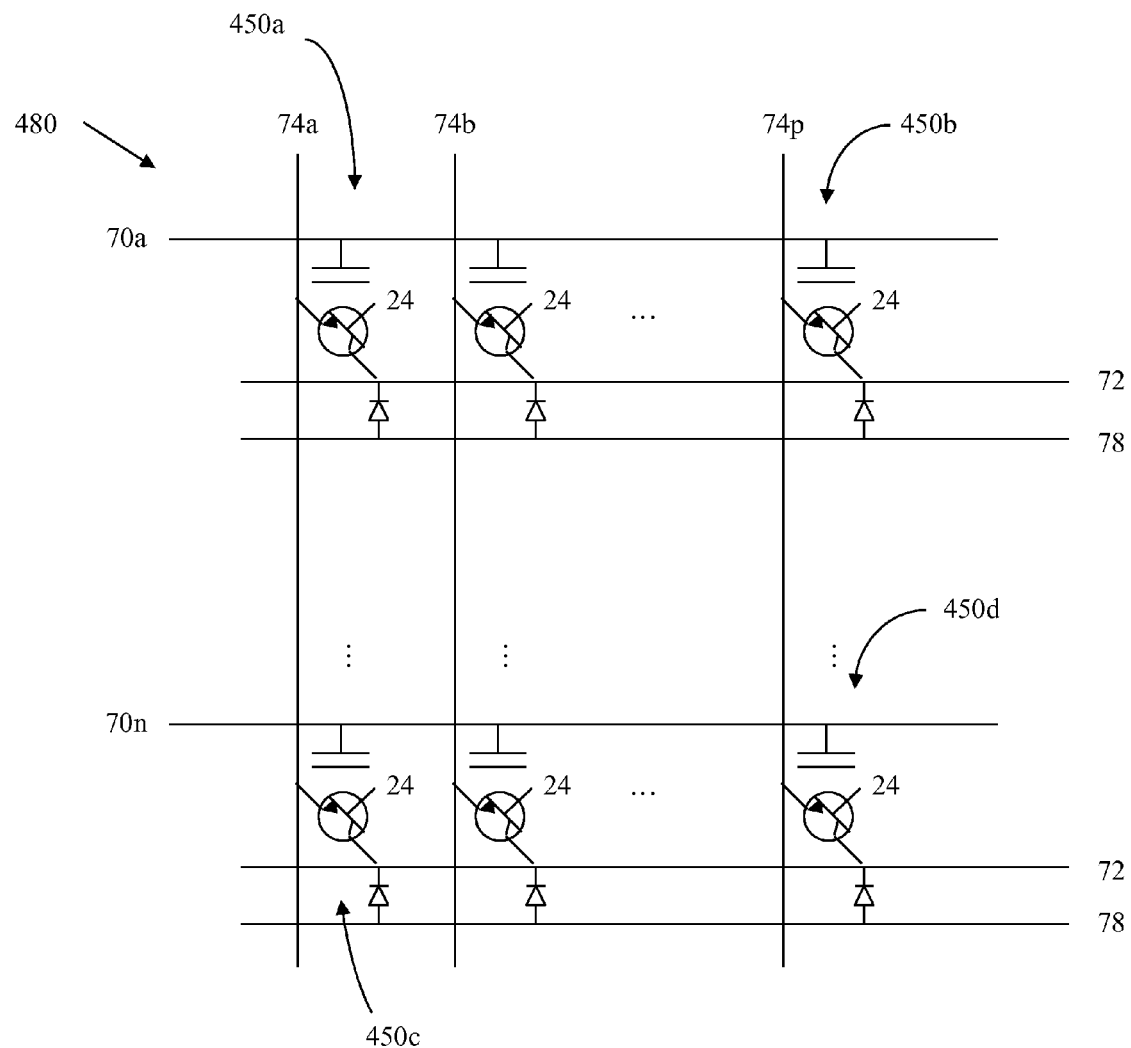
FIGS. 18A through 18H illustrate performing operations on an array of the memory cell of FIGS. 17A through 17E.

FIG. 18A shows an exemplary memory array 480 of memory cells 450 (four exemplary instances of memory cell 450 being labeled as 450a, 450b, 450c and 450d) arranged in rows and columns. In many, but not all, of the figures where exemplary memory array 480 appears, representative memory cell 450a will be representative of a "selected" memory cell 450 when the operation being described has one (or more in some embodiments) selected memory cells 450. In such figures, representative memory cell 450b will be representative of an unselected memory cell 450 sharing the same row as selected representative memory cell 450a, representative memory cell 450c will be representative of an unselected memory cell 450 sharing the same column as selected representative memory cell 450a, and representative memory cell 450d will be representative of a memory cell 450 sharing neither a row or a column with selected representative memory cell 450a.

Present in FIG. 18A are word lines 70a through 70n, source line terminal 72X, bit lines 74a through 74p, and substrate terminal 78. Each of the word lines 70a through 70n is associated with a single row of memory cells 450 and is coupled to the gate 60 of each memory cell 450 in that row. Each of the bit lines 74a through 74p is associated with a single column of memory cells 450 and is coupled to the bit line region 16 of each memory cell 450 in that column. It is noteworthy that while the source line terminal 72X is really no longer a control line terminal associated with the source line 72 of a row of memory cells 450 but a control terminal associated with all of the memory cells 450 in exemplary memory array 480, it will still be referred to as "source line" terminal 72X to minimize confusion since it still serves that function for each individual memory cell 450.

Substrate 12 and buried layer 22 are both present at all locations under array 480. Persons of ordinary skill in the art will appreciate that one or more substrate terminals 78 and one or more buried well terminals 72 will be present in one or more locations as a matter of design choice. Such skilled persons will also appreciate that while exemplary array 480 is shown as a single continuous array in FIG. 18A, that many other organizations and layouts are possible like, for example, word lines may be segmented or buffered, bit lines may be segmented or buffered, source lines may be segmented or buffered, the array 480 may be broken into two or more sub-arrays, control circuits such as word decoders, column decoders, segmentation devices, sense amplifiers, write amplifiers may be arrayed around exemplary array 480 or inserted between sub-arrays of array 480. Thus the exemplary embodiments, features, design options, etc., described are not limiting in any way.

Figure 18B:
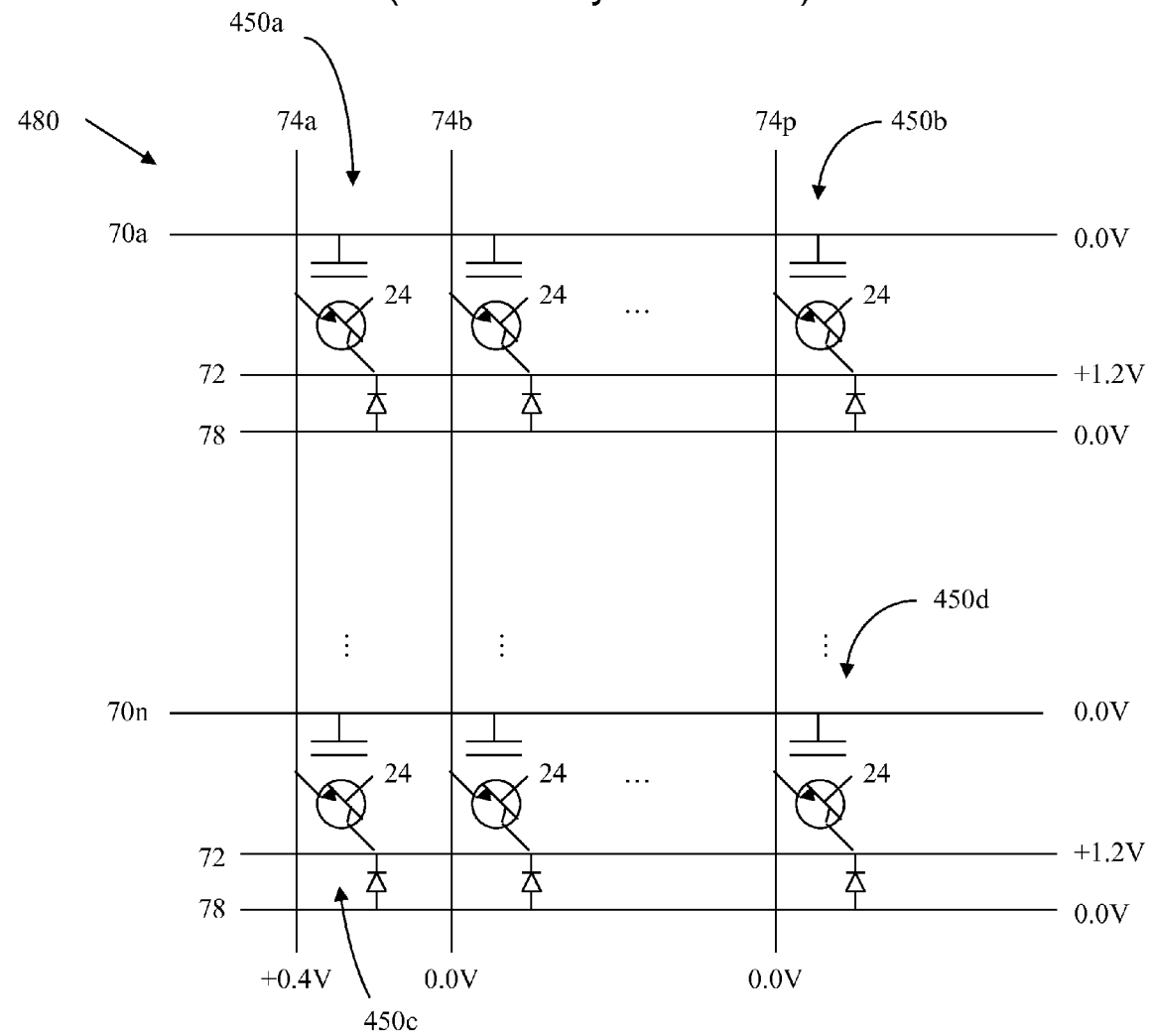

FIG. 18B illustrates an array hold operation on exemplary memory array 480. For all memory cells 450 in the array 480, the hold operation is performed simultaneously by applying about +1.2V to the source line terminal 72 while applying about 0.0V to the word line terminals 70a through 70n, the bit line terminals 74a through 74p, and the substrate terminal 78. This bias condition causes each of the memory cells 450 in the array 480 storing a logic-1 to have its intrinsic bipolar transistor 30 turned on to restore the hole charge on its floating body 24 as discussed above. Simultaneously, this bias condition causes each of the memory cells 450 in the array 480 storing a logic-0 to have its intrinsic bipolar transistor 30 turned off to retain charge neutrality in its floating body 24 as previously discussed. The voltages applied are exemplary only, may vary from embodiment to embodiment and are in no way limiting.

Figure 18C:
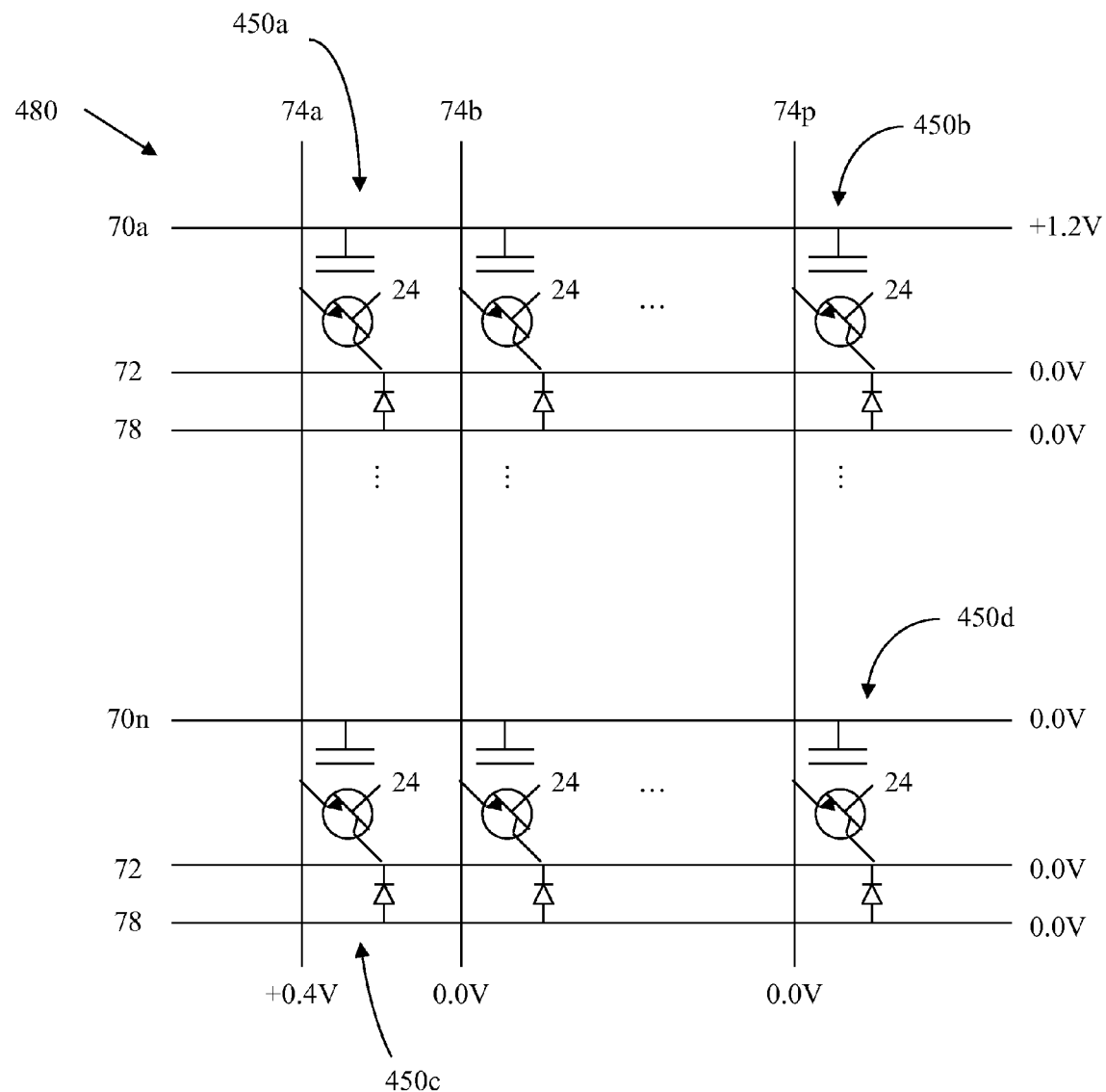

FIG. 18C illustrates a single cell read operation of selected representative memory cell 450*a* in exemplary memory array 450. To accomplish this, the selected word line terminal 70*a* is biased to approximately +1.2V while the unselected word line terminals 70*b* (not shown) through 70*n* are biased to about 0.0V, the selected bit line terminal 74*a* is biased to approximately +0.4V while the unselected bit line terminals 74*b* through 74*p* are biased to about 0.0V, the source line terminal 72 is biased to about 0.0V, and the substrate terminal is biased to about 0.0V. The voltages applied are exemplary only, may vary from embodiment to embodiment, and are in no way limiting.

This has the effect of operating bipolar device 30 as a backward n-p-n transistor in a manner analogous to that described for operating bipolar device 30 for a hold operation as described in conjunction with FIGS. 3A through 3C.

The capacitive coupling between the word line terminal 70*a* and the floating body 24 of selected memory cell 450*a* increase the differentiation in the read current between the logic-1 and logic-0 states as previously described. The optimal bias voltage to apply to WL terminal 70 will vary from embodiment to embodiment and process to process. The actual voltage applied in any given embodiment is a matter of design choice.

Unselected representative memory cell 450*b*, which shares a row with selected representative memory cell 450*a*, has its bipolar device 30 turned off because there is no voltage between the collector and emitter terminals. It retains its logic state during the short duration of the read operation.

Unselected representative memory cell 450*c*, which shares a column with selected representative memory cell 450*a*, will either be off or be in a weak version of the holding operation depending on the device characteristics of the process of any particular embodiment. It also retains its logic state during the short duration of the read operation.

Unselected representative memory cell 450*d*, which shares neither a row nor a column with selected representative memory cell 450*a*, has its bipolar device 30 turned off because there is no voltage between the collector and emitter terminals. It too retains its logic state during the short duration of the read operation.

Figure 18D:
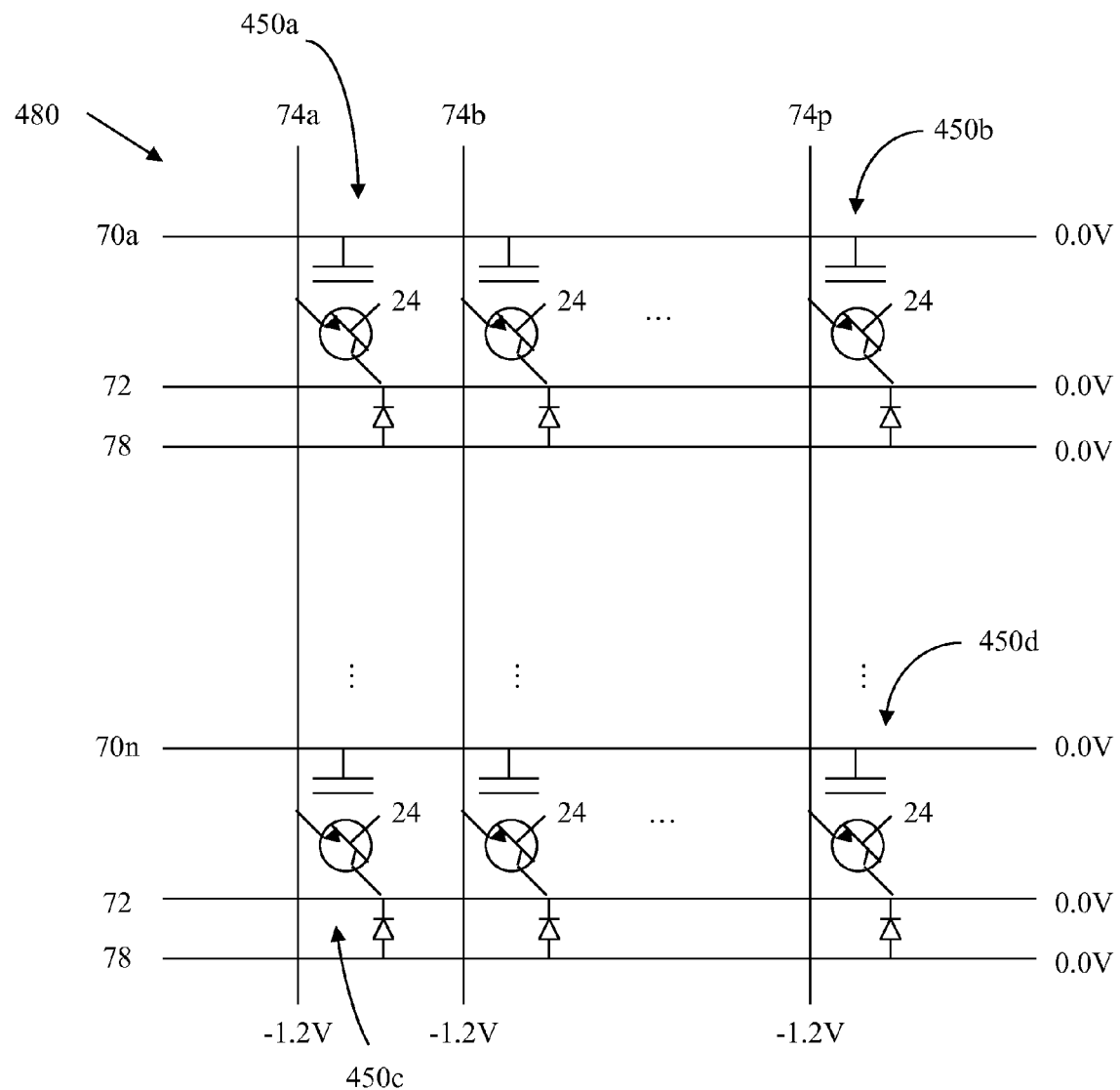

FIG. 18D illustrates an array write logic-0 operation of all the memory cells 450 in exemplary memory array 450. To accomplish this, all the word line terminals 70*a* through 70*n* are biased to approximately 0.0V, all the bit line terminals 74*a* through 74*p* are biased to approximately −1.2V, the source line terminal 72 is biased to about 0.0V, and the substrate terminal is biased to about 0.0V. The voltages applied are exemplary only, may vary from embodiment to embodiment, and are in no way limiting.

This bias condition forward biases the p-n junction between the floating body 24 and the bit line region 16 turning on the intrinsic bipolar device 30 in each of the memory cells 450 as previously described. This evacuates all of the holes in the floating body regions 24 writing a logic-0 to all of the memory cells 450 in array 480.

Figure 18E:
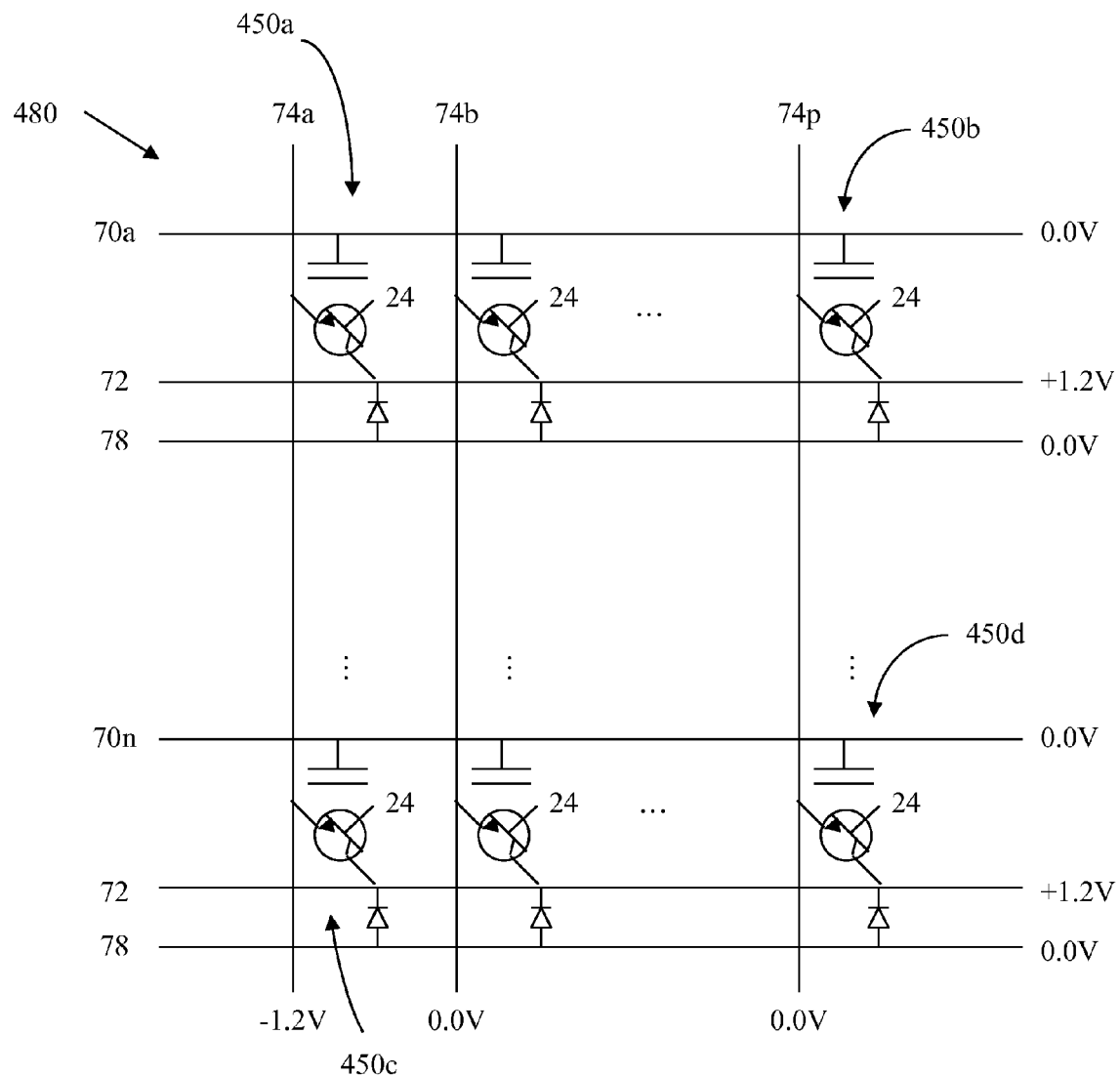

FIG. 18E illustrates a column write logic-0 operation of one column of the memory cells 450 in exemplary memory array 450. To accomplish this, all the word line terminals 70*a* through 70*n* are biased to approximately 0.0V, selected the bit line terminal 74*a* is biased to approximately −1.2V while the unselected bit line terminals 74*b* through 74*p* are biased to about 0.0V, the source line terminal 72 is biased to about +1.2V, and the substrate terminal is biased to about 0.0V. The voltages applied are exemplary only, may vary from embodiment to embodiment, and are in no way limiting.

This bias condition forward biases the p-n junction between the floating body 24 and the bit line region 16 turning on the intrinsic bipolar device 30 in each of the memory cells 450 coupled to bit line 74*a*, including representative memory cells 450*a* and 450*c*, as previously described. This evacuates all of the holes in the floating body regions 24 writing a logic-0 to all of the memory cells 450 in the selected column.

The remaining memory cells 450 in array 480, including representative memory cells 450*b* and 450*d*, are in a holding operation and will retain their logic state during the write logic-0 operation.

Figure 18F:
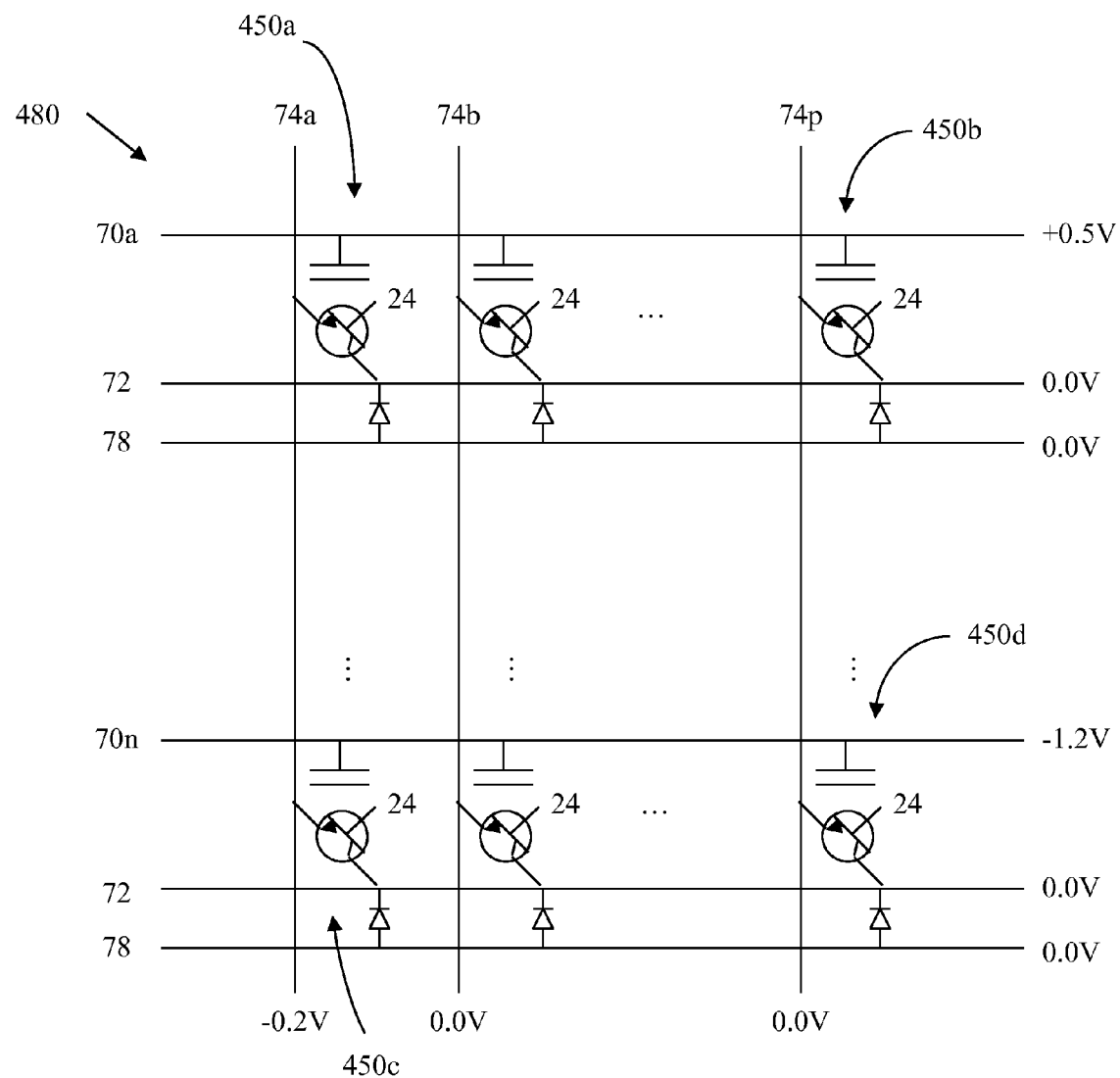

FIG. 18F illustrates a single cell write logic-0 operation of selected representative memory cell 450*a* in exemplary memory array 450. To accomplish this, the selected word line terminal 70*a* is biased to approximately +0.5V while the unselected word line terminals 70*b* (not shown) through 70*n* are biased to about −1.2V, the selected bit line terminal 74*a* is biased to approximately −0.2V while the unselected bit line terminals 74*b* through 74*p* are biased to about 0.0V, the source line terminal 72 is biased to about 0.0V, and the substrate terminal is biased to about 0.0V. The voltages applied are exemplary only, may vary from embodiment to embodiment, and are in no way limiting.

This bias condition forward biases the p-n junction between the floating body 24 and the bit line region 16 turning on the intrinsic bipolar device 30 in selected representative memory cell 450*a*. The capacitive coupling between the word line terminal 70*a* and the floating body 24 of selected memory cell 450*a* causes bipolar device 30 to turn on evacuating the holes in floating body region 24 as previously described.

Unselected representative memory cell 450*b*, which shares a row with selected representative memory cell 450*a*, has its bipolar device 30 turned off because there is no voltage between the collector and emitter terminals. It retains its logic state during the short duration of the read operation.

Unselected representative memory cell 450*c*, which shares a column with selected representative memory cell 450*a*, has the voltage potential of its floating body temporarily lowered because the negative capacitive coupling between its floating body 24 its gate 60 (coupled to word line terminal 70*n*) preventing its bipolar device 30 from turning on. It also retains its logic state during the short duration of the read operation, and the voltage potential of its floating body 24 is restored to its previous level by the positive coupling between its floating body 24 its gate 60 (coupled to word line terminal 70*n*) when the word line terminal is returned to its nominal value of about 0.0V after the operation is complete.

Unselected representative memory cell 450*d*, which shares neither a row nor a column with selected representative memory cell 450*a*, has its bipolar device 30 turned off because there is no voltage between the collector and emitter terminals. It too retains its logic state during the short duration of the read operation.

Figure 18G:
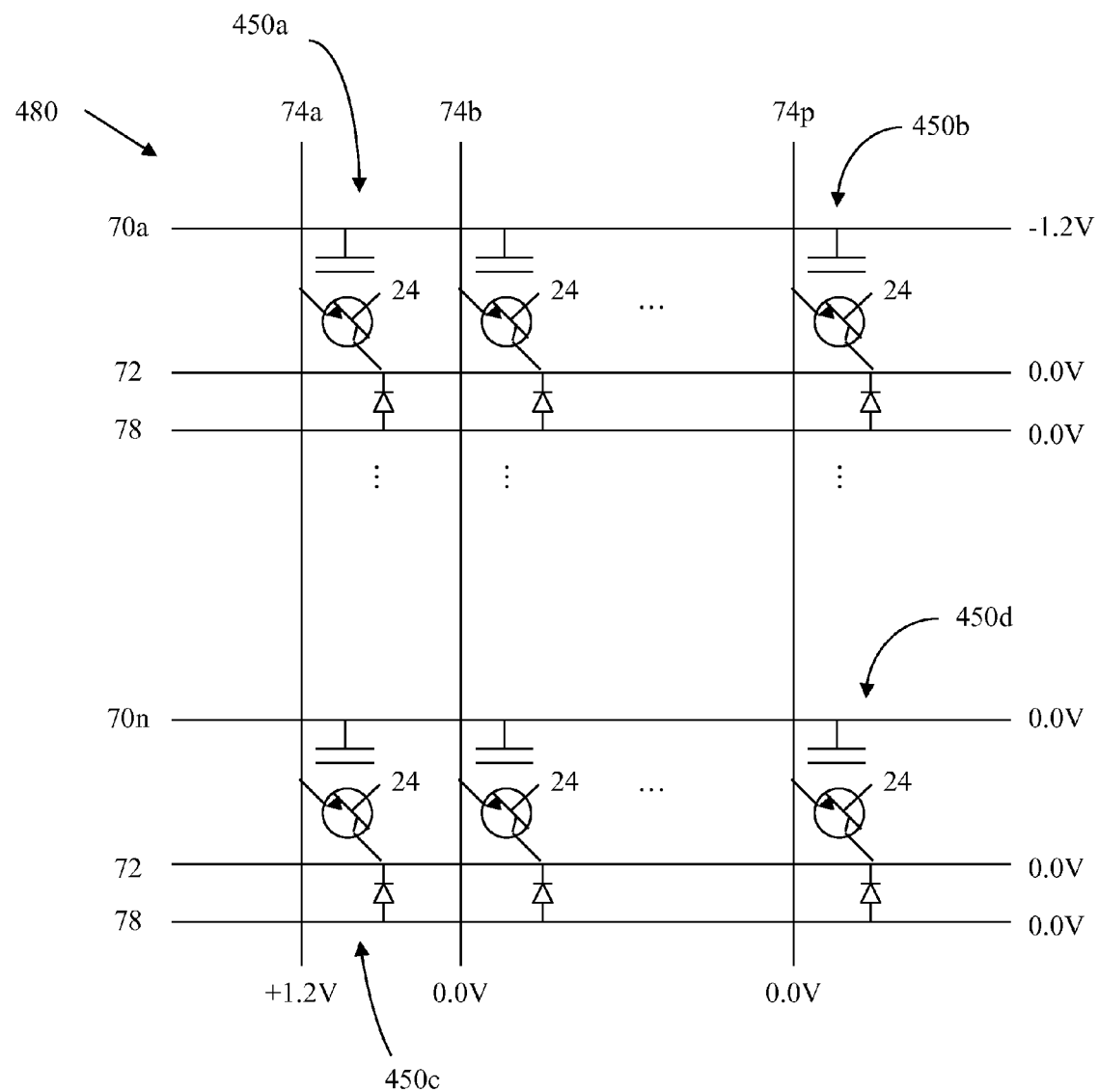

FIG. 18G illustrates a single cell write logic-1 operation using a GIDL mechanism in selected representative memory cell 450*a* in exemplary memory array 450. To accomplish this, the selected word line terminal 70*a* is biased to approximately −1.2V while the unselected word line terminals 70*b* (not shown) through 70*n* are biased to about 0.0V, the selected bit line terminal 74a is biased to approximately +1.2V while the unselected bit line terminals 74b through 74p are biased to about 0.0V, the source line terminal 72 is biased to about 0.0V, and the substrate terminal is biased to about 0.0V. The voltages applied are exemplary only, may vary from embodiment to embodiment, and are in no way limiting.

This bias condition causes selected representative memory cell 450a to conduct current due to the GIDL mechanism discussed with reference to Yoshida cited above. The combination of −1.2V on word line terminal and +1.2V on bit line terminal 74a creates the strong electric field necessary to produce GIDL current from bit line 74a into representative memory cell 450a generating sufficient hole charge in its floating body 24 to place it in the logic-1 state.

Unselected representative memory cell 450b, which shares a row with selected representative memory cell 450a, has its bipolar device 30 turned off because there is no voltage between the collector and emitter terminals. It retains its logic state during the short duration of the read operation.

Unselected representative memory cell 450c, which shares a column with selected representative memory cell 450a, is in the holding state. It also retains its logic state during the short duration of the write logic-1 operation.

Unselected representative memory cell 450d, which shares neither a row nor a column with selected representative memory cell 450a, has its bipolar device 30 turned off because there is no voltage between the collector and emitter terminals. It too retains its logic state during the short duration of the read operation.

Figure 18H:
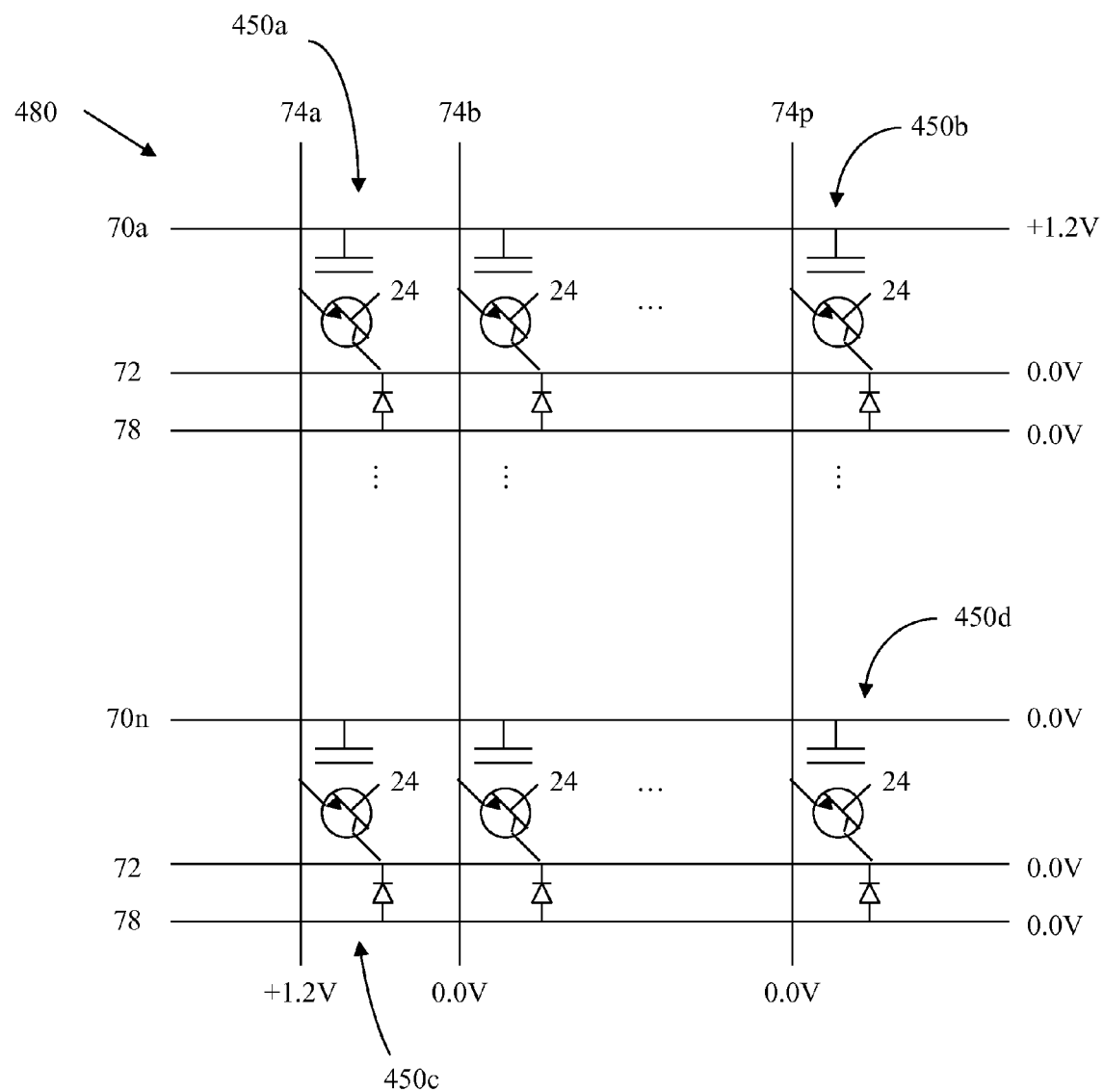

FIG. 18H illustrates a single cell write logic-1 operation using an impact ionization mechanism in selected representative memory cell 450a in exemplary memory array 450. To accomplish this, the selected word line terminal 70a is biased to approximately +1.2V while the unselected word line terminals 70b (not shown) through 70n are biased to about 0.0V, the selected bit line terminal 74a is biased to approximately +1.2V while the unselected bit line terminals 74b through 74p are biased to about 0.0V, the source line terminal 72 is biased to about 0.0V, and the substrate terminal is biased to about 0.0V. The voltages applied are exemplary only, may vary from embodiment to embodiment, and are in no way limiting.

This bias condition causes selected representative memory cell 450a to conduct current due to the impact ionization mechanism discussed with reference to Lin cited above. The combination of +1.2V on word line terminal and +1.2V on bit line terminal 74a turns on the bipolar device 30 in representative memory cell 450a regardless of its prior logic state and generating sufficient hole charge in its floating body 24 to place it in the logic-1 state.

Unselected representative memory cell 450b, which shares a row with selected representative memory cell 450a, has its bipolar device 30 turned off because there is no voltage between the collector and emitter terminals. It retains its logic state during the short duration of the read operation.

Unselected representative memory cell 450c, which shares a column with selected representative memory cell 450a, is in the holding state. It also retains its logic state during the short duration of the write logic-1 operation.

Unselected representative memory cell 450d, which shares neither a row nor a column with selected representative memory cell 450a, has its bipolar device 30 turned off because there is no voltage between the collector and emitter terminals. It too retains its logic state during the short duration of the read operation.

In the previous embodiments, a single binary bit has been written to, read from, and maintained in a single memory cell 50 or 450. While this approach makes for the simplest support circuitry, the simplest operating methods, and the largest noise margins, greater memory density may be achieved by storing two or more bits per memory cell 50 or 450 at the cost of increasing the complexity of the support circuitry and operating methods. Additionally, the noise margin is also reduced because the voltage window inside memory cell 50 or 450 is shared by more than two logic levels.

Preferably the information stored in memory cell 50 or 450 corresponds to an integer number of binary bits, meaning that the number of voltage levels stored in memory cell 50 or 450 will be equal to a power of two (e.g., 2, 4, 8, 16, etc.), though other schemes are possible within the scope of the invention. Due to the lower noise margins, it may be desirable to encode the data in memory array 80 or 480 using any error correction code (ECC) known in the art. In order to make the ECC more robust, the voltage levels inside may be encoded in a non-binary order like, for example, using a gray code to assign binary values to the voltage levels. In the case of gray coding, only one bit changes in the binary code for a single level increase or decrease in the voltage level. Thus for an example a two bit gray encoding, the lowest voltage level corresponding to the floating body region 24 voltage being neutral might be encoded as logic-00, the next higher voltage level being encoded as logic-01, the next higher voltage level after that being encoded as logic-11, and the highest voltage level corresponding to the maximum voltage level on floating body region 24 being encoded as logic-10. In an exemplary three bit gray encoding, the logic levels from lowest to highest might be ordered logic-000, logic-001, logic-011, logic-010, logic-110, logic-111, logic-101, and logic-100. Since the most likely reading error is to mistake one voltage level for one of the two immediately adjacent voltage levels, this sort of encoding ensures that a single level reading error will produce at most a single bit correction per error minimizing the number of bits needing correction for any single error in a single cell. Other encodings may be used, and this example is in no way limiting.

A multi-level write operation can be performed using an alternating write and verify algorithm, where a write pulse is first applied to the memory cell 50 or 450, followed by a read operation to verify if the desired memory state has been achieved. If the desired memory state has not been achieved, another write pulse is applied to the memory cell 50, followed by another read verification operation. This loop is repeated until the desired memory state is achieved.

For example, using band-to-band hot hole injection to write memory cell 50 or 450, initially zero voltage is applied to BL terminal 74, zero voltage is applied to SL terminal 72, a negative voltage is applied to WL terminal 70, and zero voltage is applied to the substrate terminal 78. Then positive voltages of different amplitudes are applied to BL terminal 74 to write different states to floating body 24. This results in different floating body potentials 24 corresponding to the different positive voltages or the number of positive voltage pulses that have been applied to BL terminal 74. Note that memory cell 50 must be written to the lowest voltage state on floating body region 24 prior to executing this algorithm.

In one particular non-limiting embodiment, the write operation is performed by applying the following bias condition: a potential of about 0.0 volts is applied to SL terminal 72, a potential of about −1.2 volts is applied to WL terminal 70, and about 0.0 volts is applied to substrate terminal 78, while the potential applied to BL terminal 74 is incrementally raised. For example, in one non-limiting embodiment, 25 millivolts is initially applied to BL terminal 74, followed by a read verify operation. If the read verify operation indicates that the cell current has reached the desired state (i.e. cell current corresponding to whichever binary value of 00, 01, 11 or 10 is desired is achieved), then the multi-level write operation is successfully concluded. If the desired state is not achieved, then the voltage applied to BL terminal 74 is raised, for example, by another 25 millivolts, to 50 millivolts. This is subsequently followed by another read verify operation, and this process iterates until the desired state is achieved. However, the voltage levels described may vary from embodiment to embodiment and the above voltage levels are exemplary only and in no way limiting. To write four levels to the memory cells, at least three different positive voltage pulses (which may comprise of different amplitudes) to the BL terminal 74 are required. The first pulse corresponds to writing the memory cell to the level associated with the binary value of 01, the second pulse corresponds to writing the memory cell to the level associated with the binary value of 11, and the third pulse corresponds to writing the memory cell to the level associated with the binary value of 10.

The write-then-verify algorithm is inherently slow since it requires multiple write and read operations. The present invention provides a multi-level write operation that can be performed without alternate write and read operations as described in FIGS. 19A through 19F with respect to exemplary memory array 80. Persons of ordinary skill in the art will appreciate that the principles described will apply to all of the Half Transistor memory cells within the scope of the present invention.

Figure 19A:
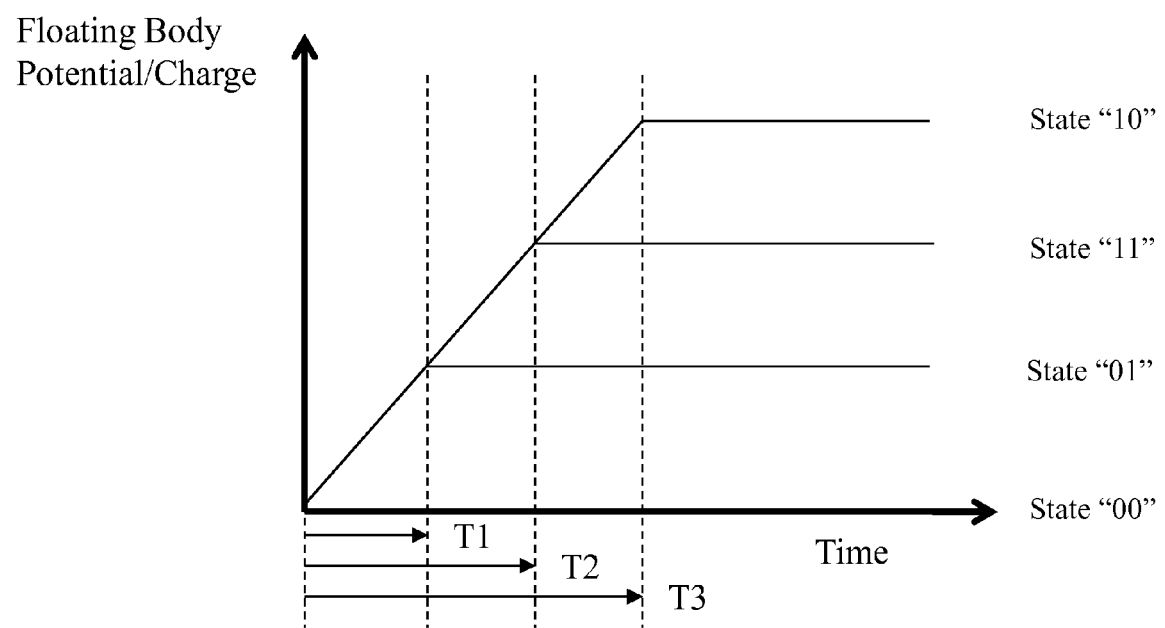
FIGS. 19A through 19F illustrate multilevel operations on a memory cell according to the present invention.

As shown in FIG. 19A, the potential of the floating body 24 increases over time as a result of hole injection to floating body 24, for example through an impact ionization mechanism. Once the change in cell current reaches the level associated with the desired state of the selected representative memory cell 50, the voltage applied to BL terminal 74 can be removed. In this manner, the multi-level write operation can be performed without alternate write and read operations by applying a voltage ramp of the correct duration. After the end of the pulse time, the applied voltage returns to the starting value like, for example, ground. Thus as shown in FIG. 19A, a voltage ramp of pulse width T1 applied to the bit line terminal 74 of memory cell 50 in the lowest (logic-00 state) potential state will increase the potential of the floating body 24 from the logic-00 level to the logic-01 level. Similarly, a voltage ramp of pulse width T2 applied to the bit line terminal 74 of memory cell 50 in the lowest (logic-00 state) potential state will increase the potential of the floating body 24 from the logic-00 level to the logic-11 level, and a voltage ramp of pulse width T3 applied to the bit line terminal 74 of memory cell 50 in the lowest (logic-00 state) potential state will increase the potential of the floating body 24 from the logic-00 level to the logic-10 level.

Figure 19B:
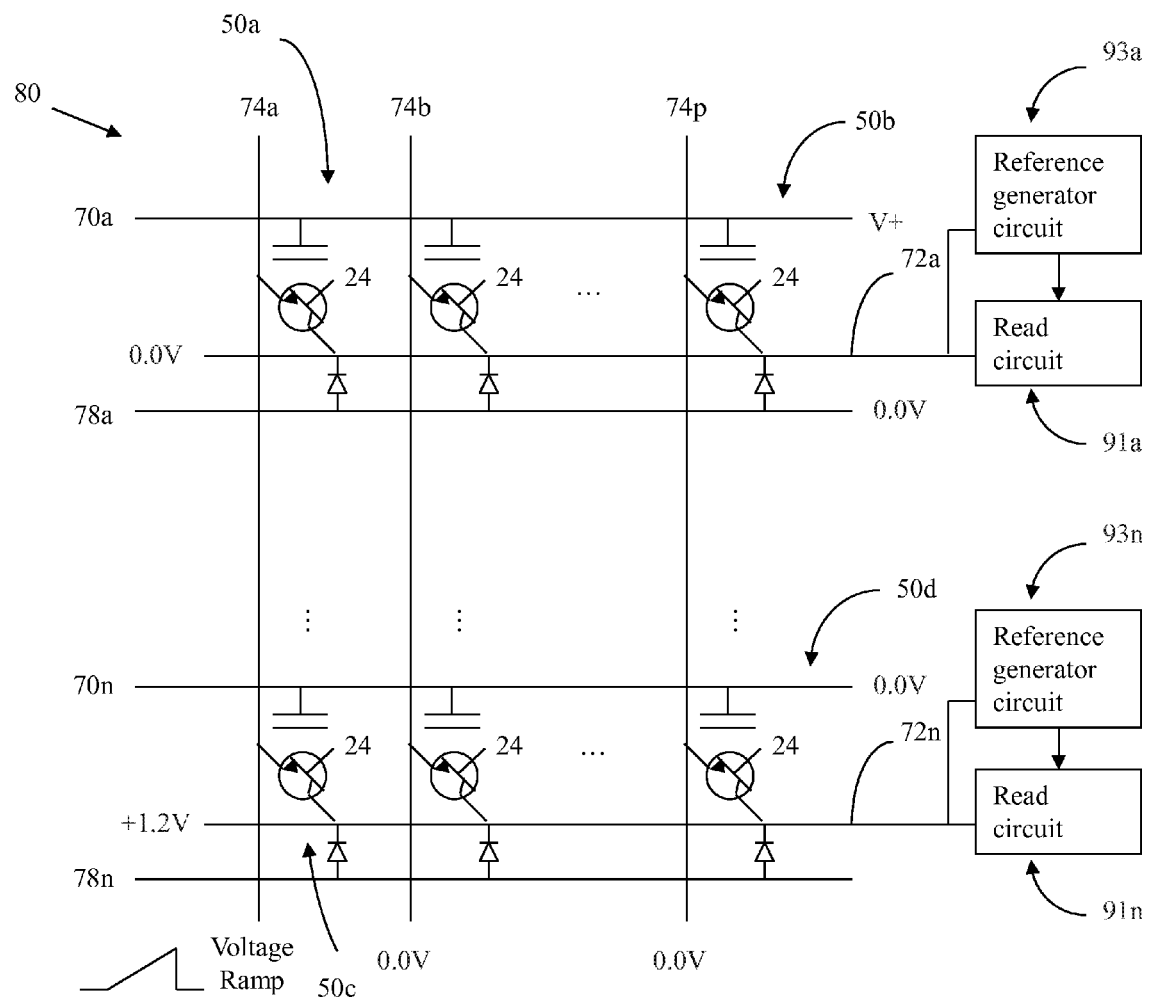

In FIG. 19B this is accomplished in selected representative memory cell 50a by ramping the voltage applied to BL terminal 74a, while applying zero voltage to SL terminal 72a, a positive voltage to WL terminal 70, and zero voltage to substrate terminal 78 of the selected memory cells. These bias conditions will result in a hole injection to the floating body 24 through an impact ionization mechanism. The state of the memory cell 50a can be simultaneously read for example by monitoring the change in the cell current through read circuitry 91a coupled to the source line 72a.

In the rest of array 80, zero voltage is applied to the unselected WL terminals 70b (not shown) through 70n, zero voltage is applied to the unselected SL terminals 72b (not shown) through 72n, and zero voltage is applied to the unselected BL terminals 74b through 74p. The cell current measured in the source line direction is the total cell current of all memory cells 50 which share the same source line 72a, but all of the unselected cells like representative memory cell 50b are biased with zero voltage across them from their bit line region 16 to their source line region 22 and do not conduct current as long as the source line terminal 72a is correctly biased to maintain zero volts. As a result, only one selected memory cell 50a sharing the same source line 72 can be written at a time.

In FIG. 19B, the unselected representative memory cell 50b has zero volts between the BL terminal 74p and the SL terminal 72a so no current flows and the state of the data stored in them will not change. Unselected representative memory cell 50c sharing BL terminal 74a with selected representative memory cell 50a has its WL terminal grounded. Thus its floating body region 24 does not get the voltage coupling boost that the floating body region 24 in selected representative memory cell 50a gets. A positive bias is also applied to the unselected SL terminal 72n. This condition substantially reduces the current in representative memory cell 50c which reduces the degree of hole charge its floating body region 24 receives as the voltage applied to BL terminal 74a is ramped up. Unselected representative memory cell 50d, sharing neither a row nor a column with selected representative memory cell 50a, is shown with gate 60 coupled to WL terminal 70n biased at 0.0V, bit line region 16 coupled to BL terminal 74p biased at 0.0V, and buried layer 22 coupled to source line terminal 72n biased at +1.2V. As can be seen, these cells will be at holding mode. Memory cells in state logic-1 will maintain the charge in floating body 24 because the intrinsic bipolar device 30a will generate holes current to replenish the charge in floating body 24, while memory cells in state logic-0 will remain in neutral state.

FIG. 19B also shows reference generator circuits 93a through 93n coupled respectively to source line terminals 72a through 72n and read circuits 91a through 91n coupled respectively to source line terminals 72a through 72n and coupled respectively to reference generator circuit 93a through 93n. Reference generator circuit 93a serves to store the initial total cell current of selected representative memory cell 50a and provide this value to read circuit 91a during the write operation in real time so that the change in current can be monitored and feedback (not shown in FIG. 19B) can be used to shut off the voltage ramp at the appropriate time. This function can be implemented in a variety of ways.

Figure 19C:
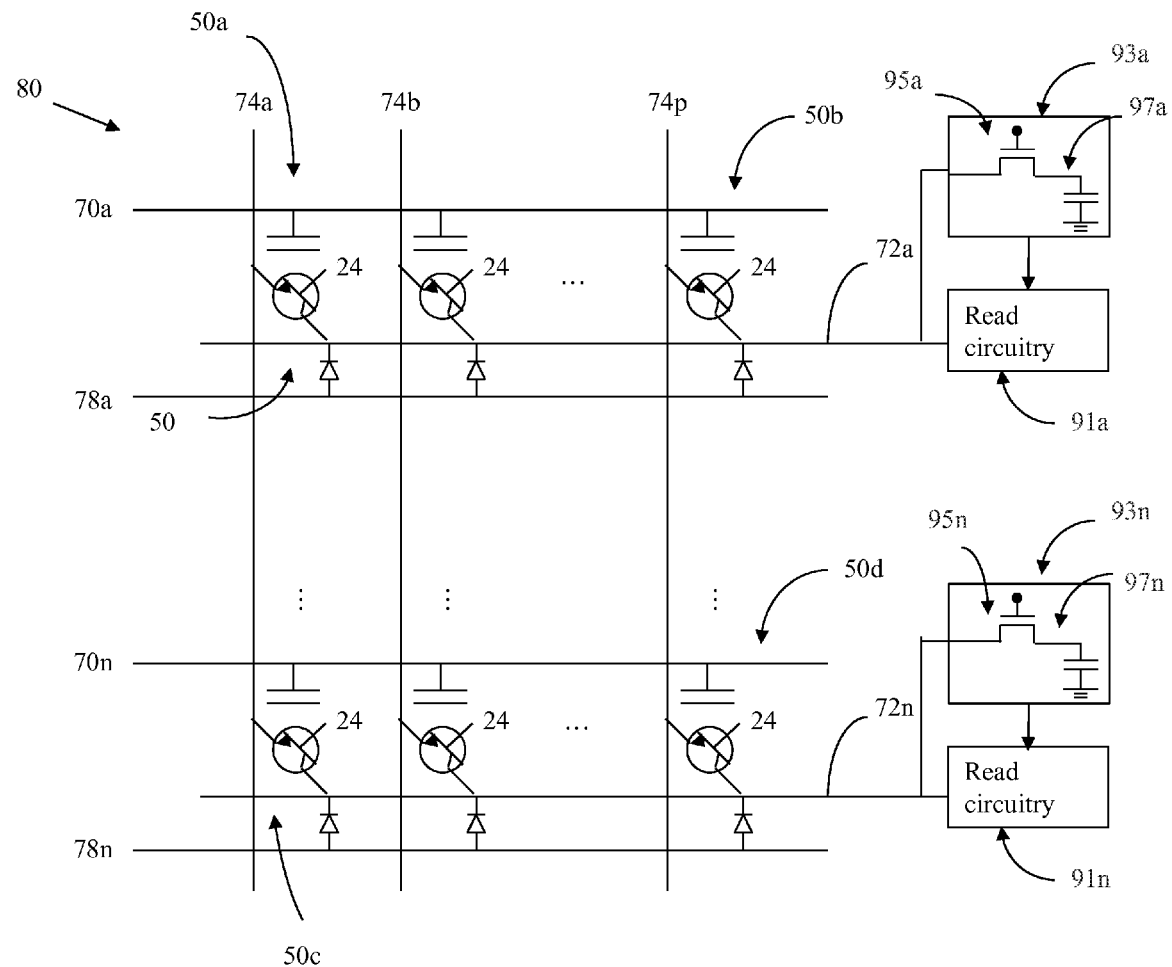

In FIG. 19C, for example, the cumulative charge of the initial state for selected memory cell 50a sharing the same source line 72a can be stored in a capacitor 97a. Transistor 95a is turned on when charge is to be written into or read from capacitor 94.

Figure 19D:
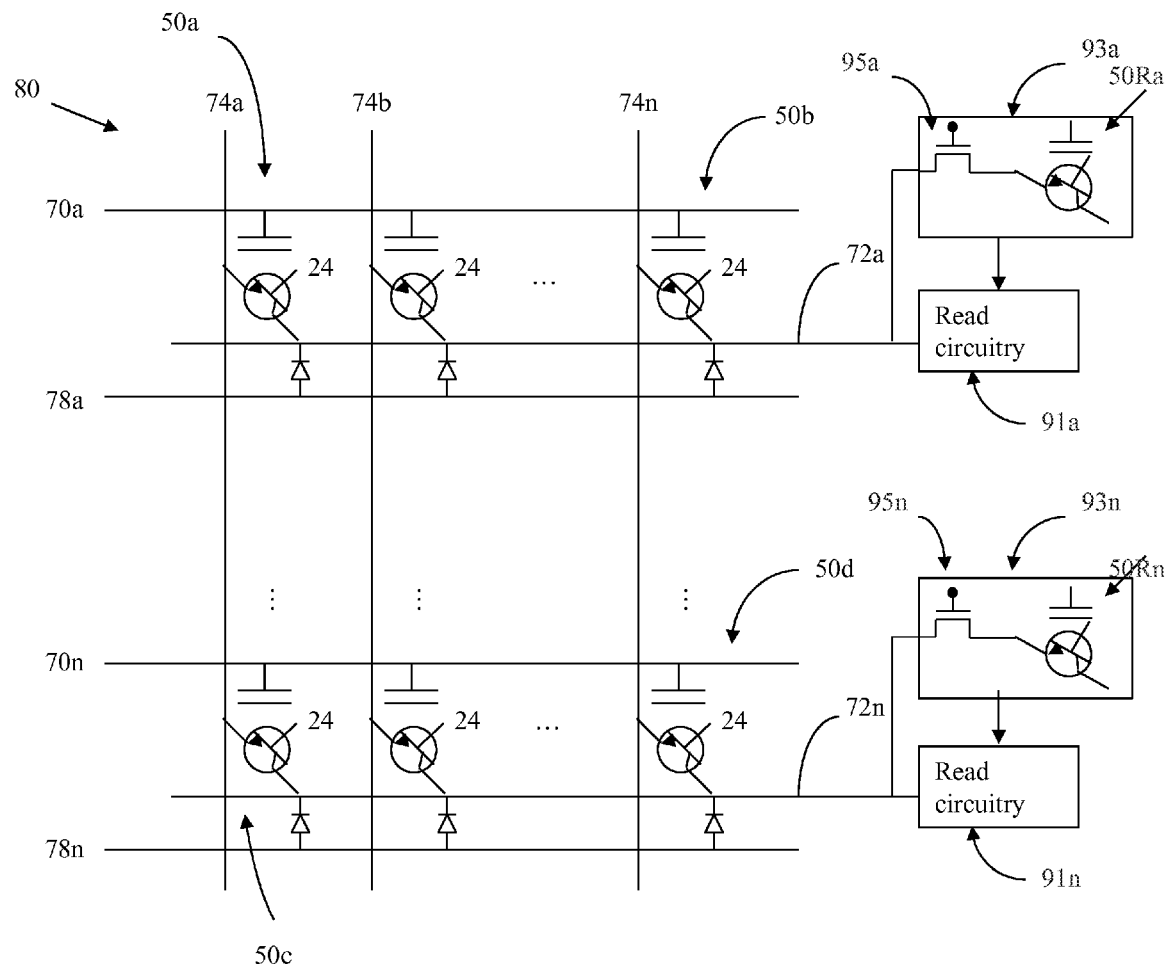

Alternatively, as shown in FIG. 19D, reference cells 50Ra through 50Rn similar to a memory cell 50 replace capacitors 97a through 97n in reference generator circuits 93a through 93n. The reference cells 50Ra through 50Rn can also be used to store the initial state of selected representative memory cell 50a.

In a similar manner, a multi-level write operation using an impact ionization mechanism can be performed by ramping the write current applied to BL terminal 74 instead of ramping the BL terminal 74 voltage.

In another embodiment, a multi-level write operation can be performed on memory cell 50 through a band-to-band tunneling mechanism by ramping the voltage applied to BL terminal 74, while applying zero voltage to SL terminal 72, a negative voltage to WL terminal 70, and zero voltage to substrate terminal 78 of the selected memory cells 50. The unselected memory cells 50 will remain in holding mode, with zero or negative voltage applied to WL terminal 70, zero voltage applied to BL terminal 74, and a positive voltage applied to SL terminal 72. Optionally, multiple BL terminals 74 can be simultaneously selected to write multiple cells in parallel. The potential of the floating body 24 of the selected memory cell(s) 50 will increase as a result of the band-to-band tunneling mechanism. The state of the selected memory cell(s) 50 can be simultaneously read for example by monitoring the change in the cell current through a read circuit 91 coupled to the source line. Once the change in the cell current reaches the desired level associated with a state of the memory cell, the voltage applied to BL terminal 74 can be removed. In this manner, the multi-level write operation can be performed without alternate write and read operations.

Similarly, the multi-level write operation using band-to-band tunneling mechanism can also be performed by ramping the write current applied to BL terminal 74 instead of ramping the voltage applied to BL terminal 74.

Figure 19E:
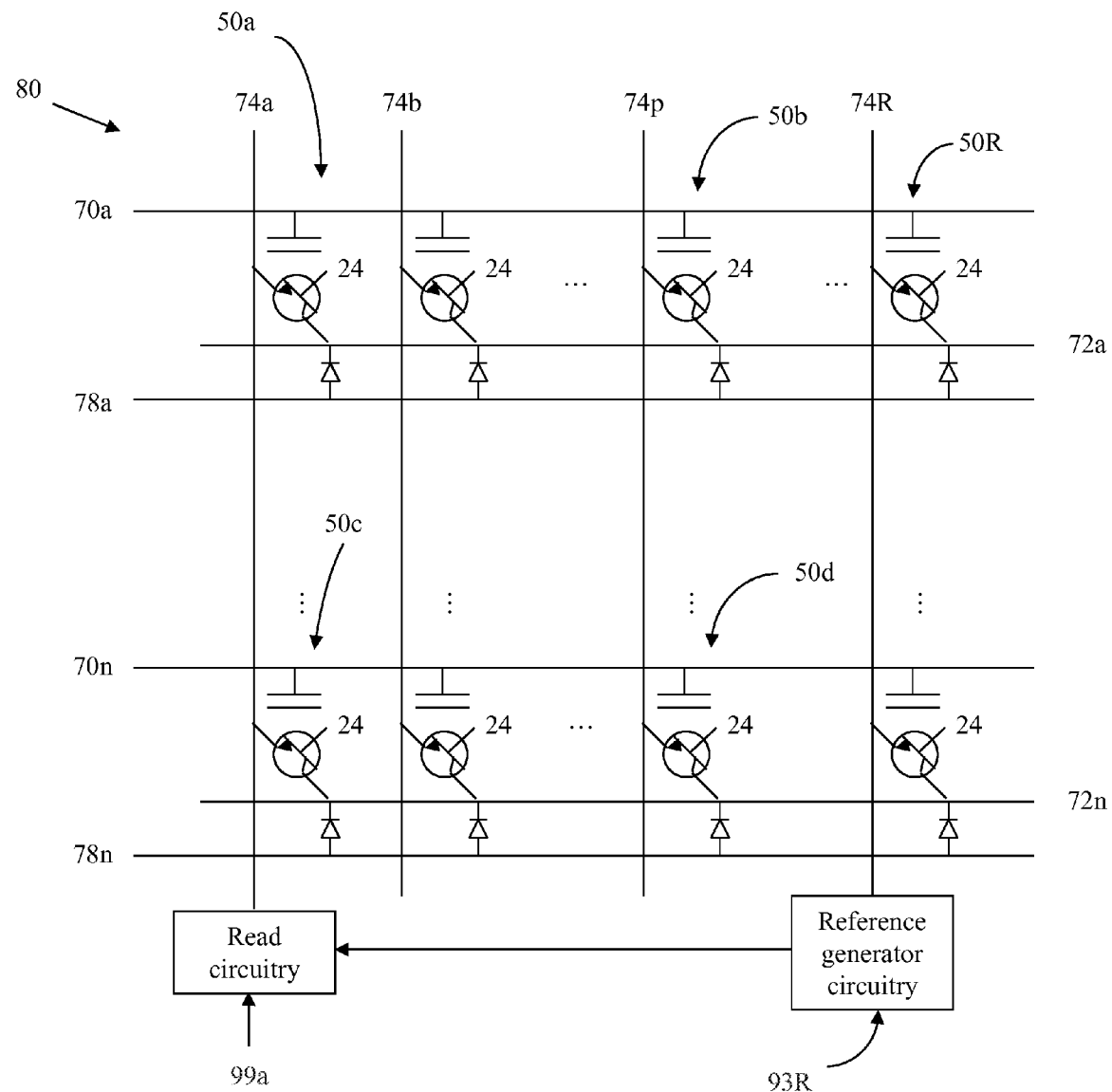

In another embodiment, as shown in FIG. 19E, a read while writing operation can be performed by monitoring the change in cell current in the bit line direction through a reading circuit 99a coupled to the bit line 74a. In some embodiments a reading circuit 99b through 99p (not shown in FIG. 19E) may be coupled to each bit of the other bit lines 74b through 74p, while in other embodiments reading circuit 99a may be shared between multiple columns using a decoding scheme (not shown).

Reference cells 50R representing different memory states are used to verify the state of the write operation. The reference cells 50R can be configured through a write-then-verify operation, for example, when the memory device is first powered up or during subsequent refresh periods. Thus while selected representative memory cell 50a is being written, selected reference cell 50R containing the desired voltage state (or a similar voltage) to be written is read and the value is used to provide feedback to read circuit so that the write operation may be terminated when the desired voltage level in selected representative memory cell 50a is reached. In some embodiments, multiple columns of reference cells containing different reference values corresponding to the different multilevel cell write values may be present (not shown in FIG. 19E).

In the voltage ramp operation, the resulting cell current of the representative memory cell 50a being written is compared to the reference cell 50R current by means of the read circuitry 99a. During this read while writing operation, the reference cell 50R is also being biased at the same bias conditions applied to the selected memory cell 50 during the write operation. Therefore, the write operation needs to be ceased after the desired memory state is achieved to prevent altering the state of the reference cell 50R.

Figure 19F:
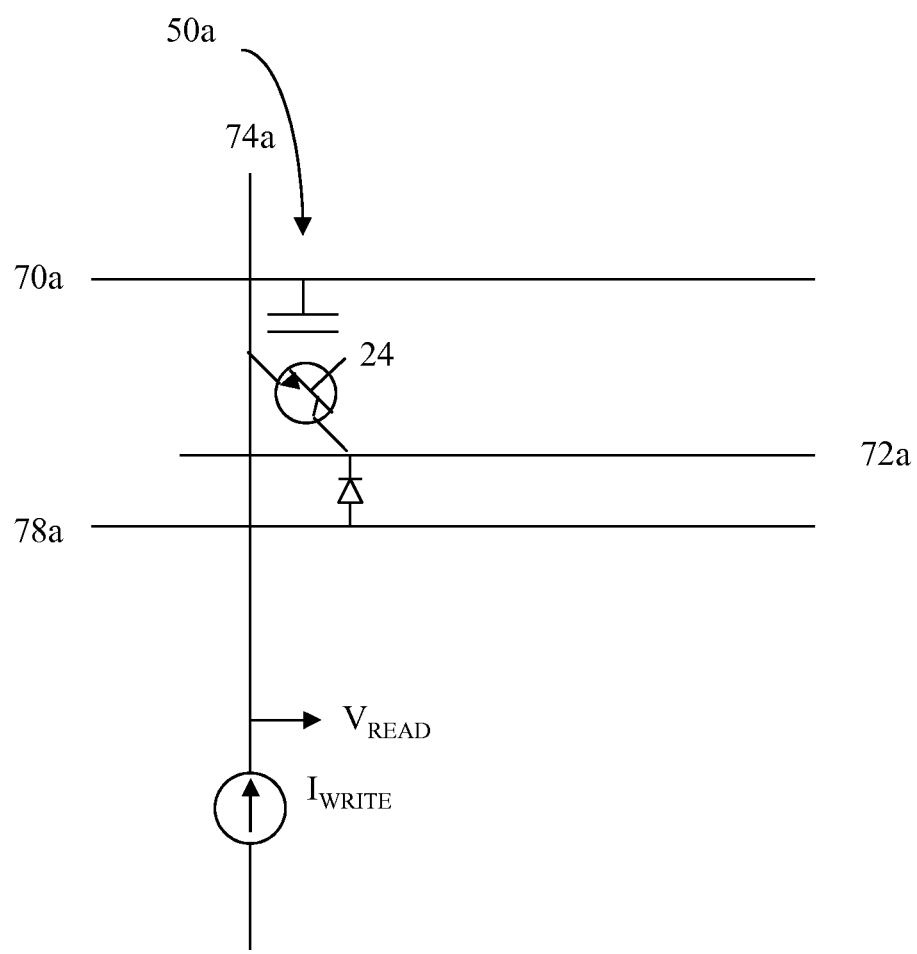

As shown in FIG. 19F, for the current ramp operation, the voltage at the bit line 74a can be sensed instead of the cell current. In the current ramp operation, a positive bias is applied to the source line terminal 72a and current is forced through the BL terminal 74a. The voltage of the BL terminal 74a will reflect the state of the memory cell 50a. Initially, when memory cell 50a is in logic-0 state, a large voltage drop is observed across the memory cell 50a and the voltage of the BL terminal 74a will be low. As the current flow through the memory cell 50a increases, hole injection will increase, resulting memory cell 50a to be in logic-1 state. At the conclusion of the logic-1 state write operation, the voltage drop across the memory cell 50a will decrease and an increase in the potential of BL terminal 74a will be observed.

An example of a multi-level write operation without alternate read and write operations, using a read while programming operation/scheme in the bit line direction is given, where two bits are stored per memory cell 50, requiring four states to be storable in each memory cell 50.

With increasing charge in the floating body 24, the four states are referred to as states "00", "01", "10", and "11". To program a memory cell 50a to a state "01", the reference cell 50R corresponding to state "01" is activated. Subsequently, the bias conditions described above are applied both to the selected memory cell 50 and to the "01" reference cell 50R: zero voltage is applied to the source line terminal 72, zero voltage is applied to the substrate terminal 78, a positive voltage is applied to the WL terminal 70 (for the impact ionization mechanism), while the BL terminal 74 is being ramped up, starting from zero voltage. Starting the ramp voltage from a low voltage (i.e. zero volts) ensures that the state of the reference cell 50R does not change.

The voltage applied to the BL terminal 74a is then increased. Consequently, holes are injected into the floating body 24 of the selected cell 50 and subsequently the cell current of the selected cell 50 increases. Once the cell current of the selected cell 50 reaches that of the "01" reference cell, the write operation is stopped by removing the positive voltage applied to the BL terminal 74 and WL terminal 70.

Unselected representative memory cell 50b, which shares a row with selected representative memory cell 50a, has its bipolar device 30 turned off because there is no voltage between the collector and emitter terminals. It retains its logic state during the short duration of the multi-level write operation.

Unselected representative memory cell 50c, which shares a column with selected representative memory cell 50a, is in the holding state. Less base current will flow into the floating body 24 due to the smaller potential difference between SL terminal 72n and BL terminal 74a (i.e. the emitter and collector terminals of the n-p-n bipolar device 30). It also retains its logic state during the short duration of the multi-level write operation.

Unselected representative memory cell 50d, which shares neither a row nor a column with selected representative memory cell 50a, is in the holding state. It too retains its logic state during the short duration of the multi-level write operation.

It is noteworthy that the holding operation for memory cell 50 in multistate mode is self selecting. In other words, the quantity of holes injected into the floating body 24 is proportional to the quantity of holes (i.e., the charge) already present on the floating body 24. Thus each memory cell selects its own correct degree of holding current.

Figure 20:
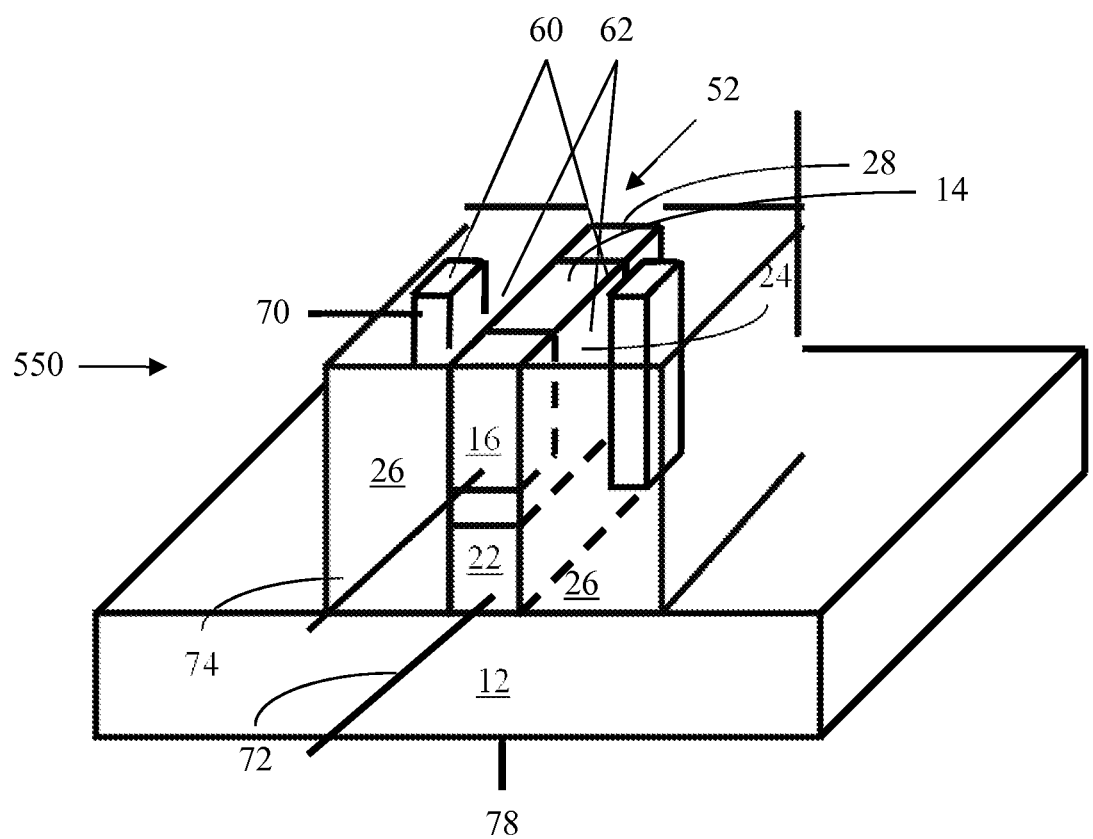
FIG. 20 illustrates an alternate method of manufacturing a memory cell according to the present invention.
Figure 21:
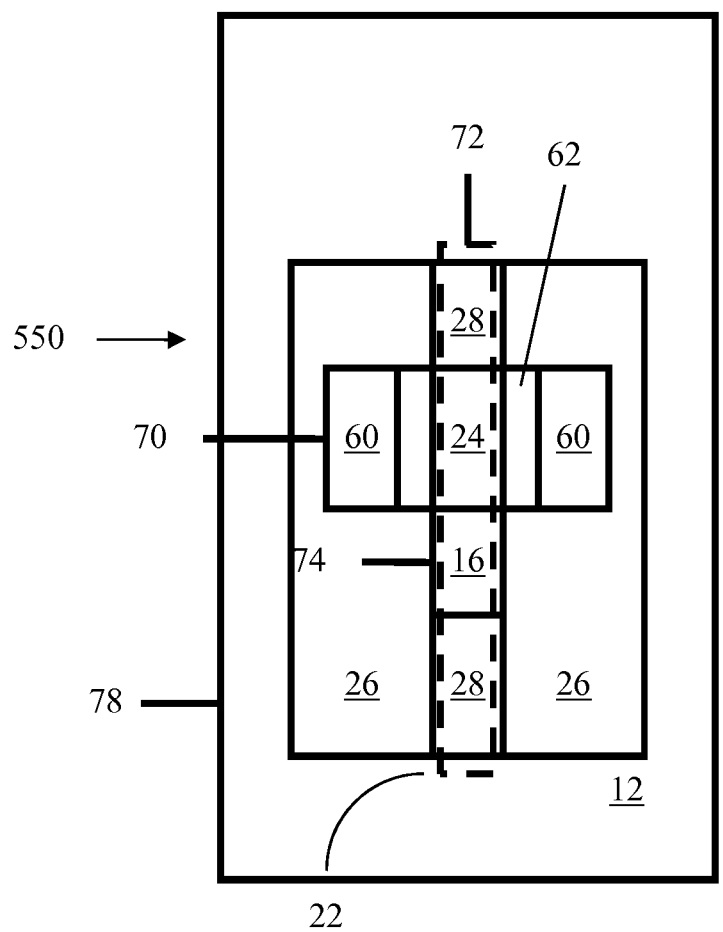
FIG. 21 illustrates a top view of the memory cell of FIG. 20.

FIGS. 20 and 21 show gated half transistor memory cell 550 with FIG. 21 showing the top view of the memory cell 550 shown in FIG. 20. Referring now to both FIGS. 20 and 21, reference numbers previously referred to in earlier drawing figures have the same, similar, or analogous functions as in the earlier described embodiments. Memory cell 550 has a fin structure 52 fabricated on substrate 12, so as to extend from the surface of the substrate to form a three-dimensional structure, with fin 52 extending substantially perpendicular to and above the top surface of the substrate 12. Fin structure 52 is conductive and is built on buried well layer 22 which is itself built on top of substrate 12. Alternatively, buried well 22 could be a diffusion inside substrate 12 with the rest of the fin 52 constructed above it, or buried well 22 could be a conductive layer on top of substrate 12 connected to all the other fin 52 structures in a manner similar to memory cell 450 described above. Fin 52 is typically made of silicon, but may comprise germanium, silicon germanium, gallium arsenide, carbon nanotubes, or other semiconductor materials known in the art.

Buried well layer 22 may be formed by an ion implantation process on the material of substrate 12 which may be followed by an etch so that buried well 22 is above the portion of substrate 12 remaining after the etch. Alternatively, buried well layer 22 may be grown epitaxially above substrate 22 and the unwanted portions may then be etched away. Buried well layer 22, which has a second conductivity type (such as n-type conductivity type), insulates the floating body region 24, which has a first conductivity type (such as p-type conductivity type), from the bulk substrate 12 also of the first conductivity type. Fin structure 52 includes bit line region 16 having a second conductivity type (such as n-type conductivity type). Memory cell 550 further includes gates 60 on two opposite sides of the floating substrate region 24 insulated from floating body 24 by insulating layers 62. Gates 60 are insulated from floating body 24 by insulating layers 62. Gates 60 are positioned between the bit line region 16 and the insulating layer 28, adjacent to the floating body 24.

Thus, the floating body region 24 is bounded by the top surface of the fin 52, the facing side and bottom of bit line region 16, top of the buried well layer 22, and insulating layers 26, 28 and 62. Insulating layers 26 and 28 insulate cell 550 from neighboring cells 550 when multiple cells 550 are joined to make a memory array. Insulating layer 26 insulates adjacent buried layer wells 22, while insulating layer 28 does not. Thus the buried layer 22 is therefore continuous (i.e. electrically conductive) in one direction. In this embodiment, the surface 14 of the semiconductor is at the level of the top of the fin structure. As in other embodiments, there is no contact to the buried layer 22 at the semiconductor surface 14 inside the boundary of memory cell 550.

Figure 22A:
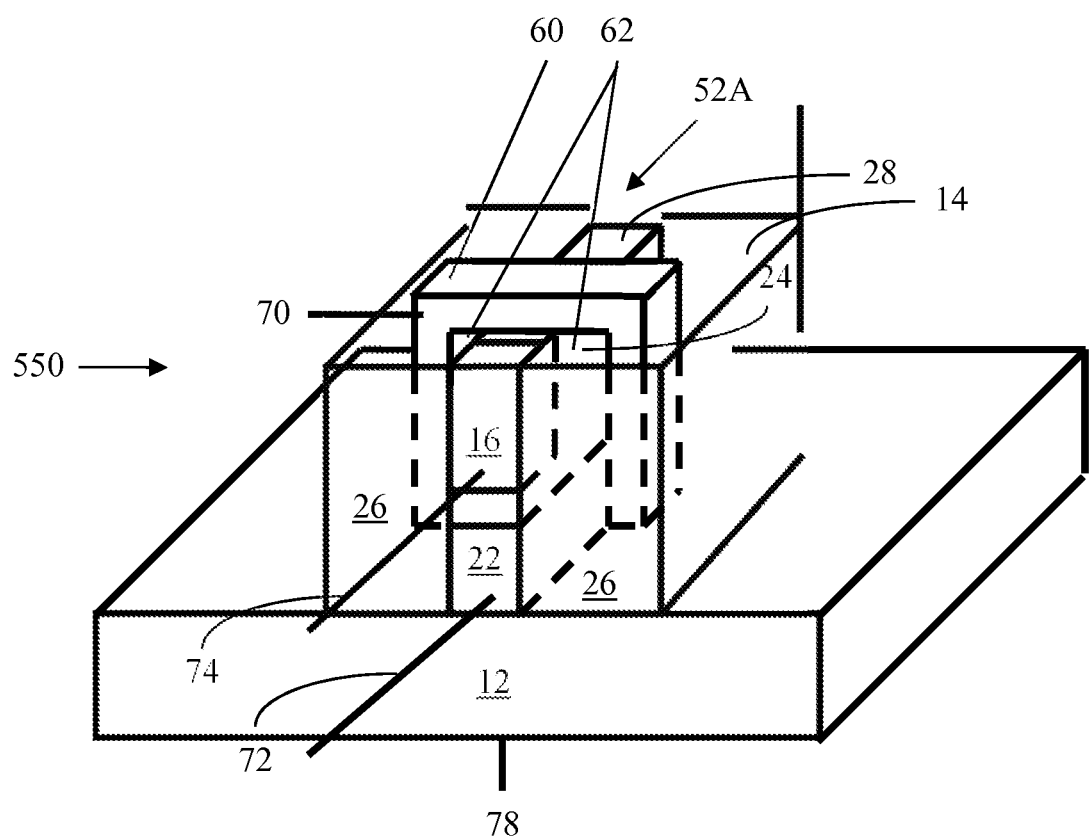
FIG. 22A illustrates another alternate method of manufacturing a memory cell according to the present invention.

As shown in FIG. 22, an alternate fin structure 52A can be constructed. In this embodiment, gates 60 and insulating layers 62 can enclose three sides of the floating substrate region 24. The presence of the gate 60 on three sides allows better control of the charge in floating body region 24.

Memory cell 550 can be used to replace memory cell 50 in an array similar to array 80 having similar connectivity between the cells and the array control signal terminals. In such a case, the hold, read and write operations are similar to those in the lateral device embodiments described earlier for memory cell 50 in array 80. As with the other embodiments, the first and second conductivity types can be reversed as a matter of design choice. As with the other embodiments, many other variations and combinations of elements are possible, and the examples described in no way limit the present invention.

Figure 22B:
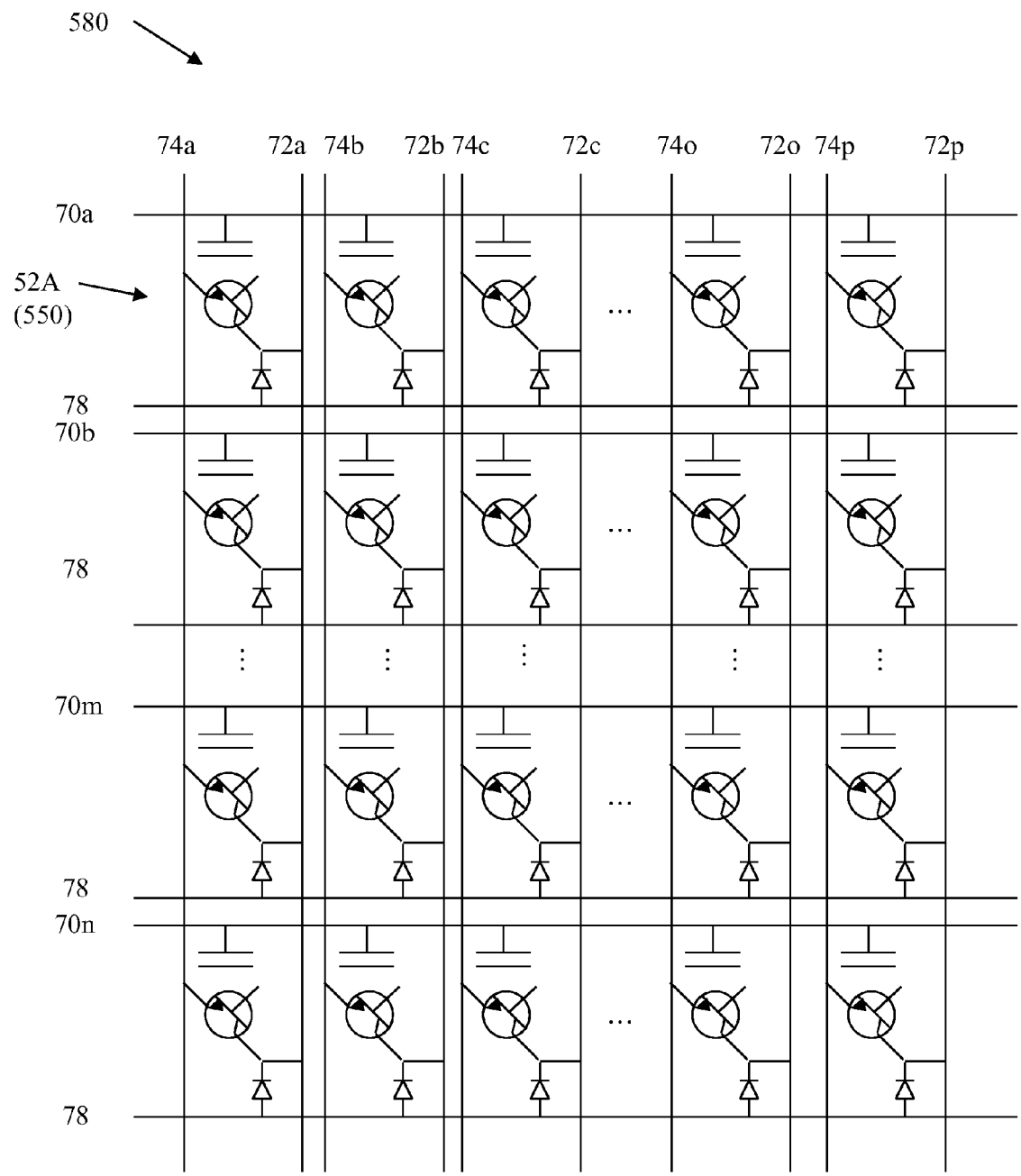
FIG. 22B illustrates an array of the memory cell of FIG. 22A.

FIG. 22B shows an array 580 of memory cells 550. Due the nature of fin structure 52A, the most compact layout will typically be with the word lines 70 running perpendicular to the source lines 72, instead of in parallel as in memory array 80 discussed above. This leads to the structure of array 580 where the cell 550 is constructed using fin structure 52A and the source lines 72a through 72p run parallel to the bit lines 74a through 74p and orthogonal to the word lines 70a through 70m. The operation of memory array 580 is described in commonly assigned U.S. patent application entitled "COMPACT SEMICONDUCTOR MEMORY DEVICE HAVING REDUCED NUMBER OF CONTACTS, METHODS OF OPERATING AND METHODS OF MAKING", Ser. No. 12/897,528, filed on Oct. 4, 2010, the content of which is incorporated by reference above.

Figure 23A:
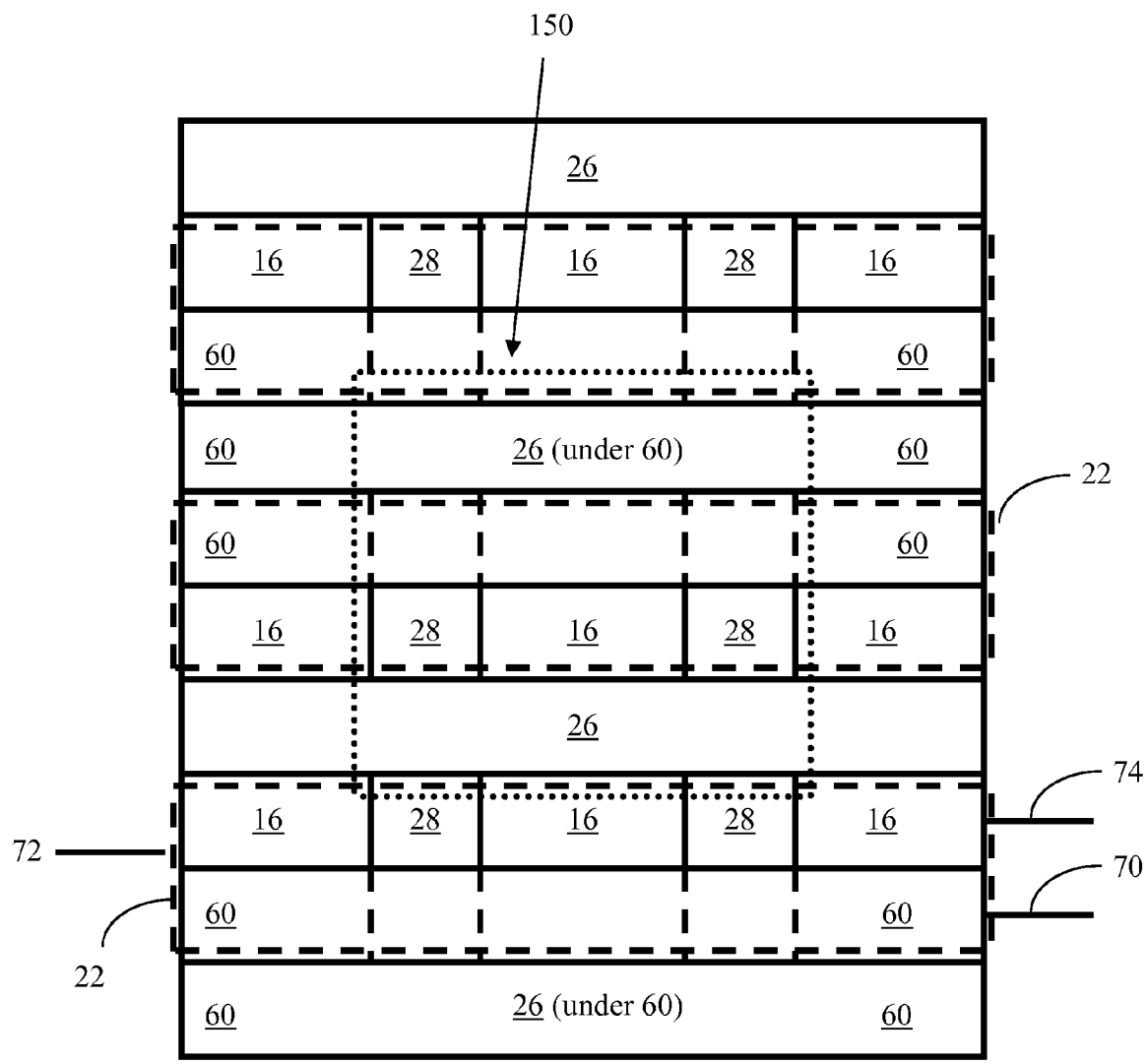
FIGS. 23A through 23F illustrates a third exemplary memory cell according to the present invention.
Figure 23B:
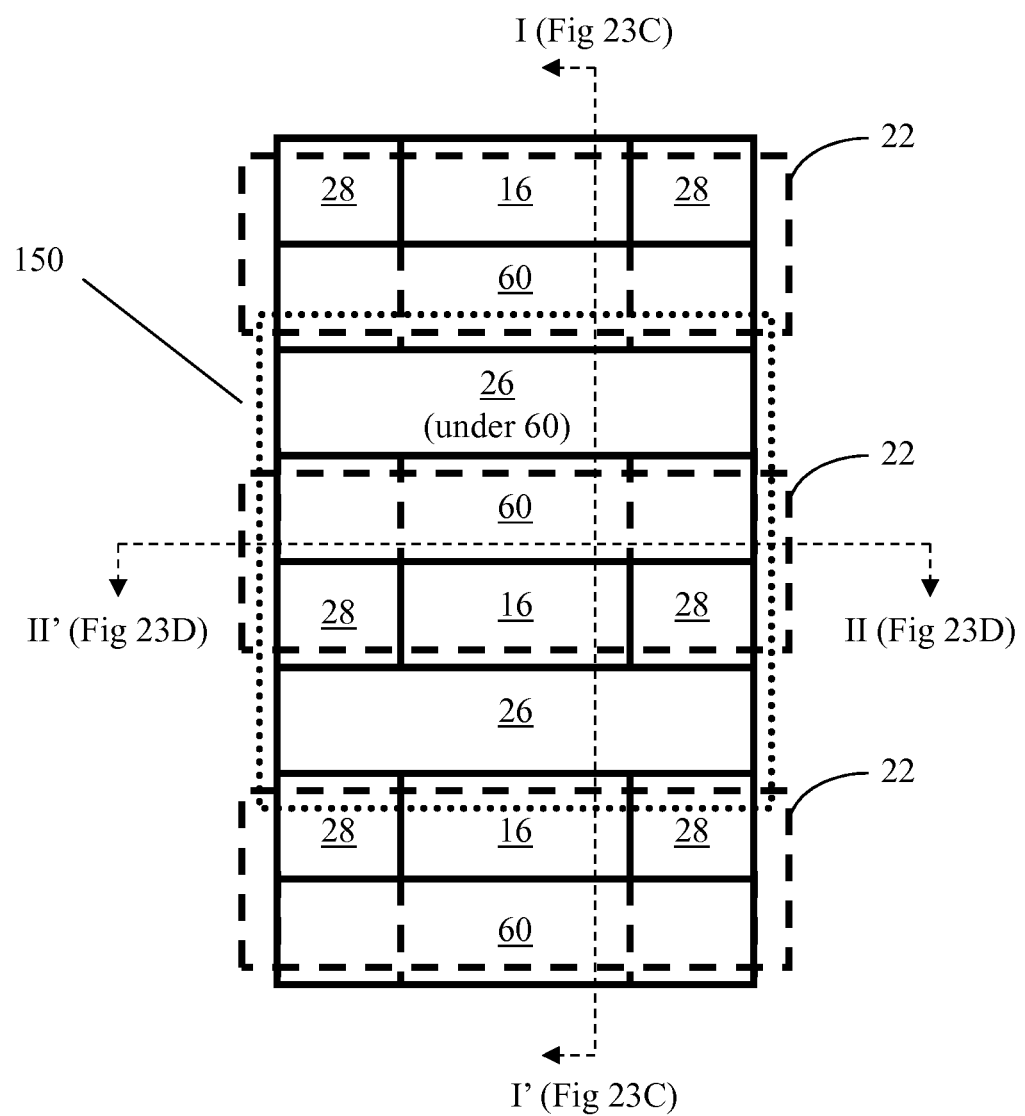
Figure 23C:
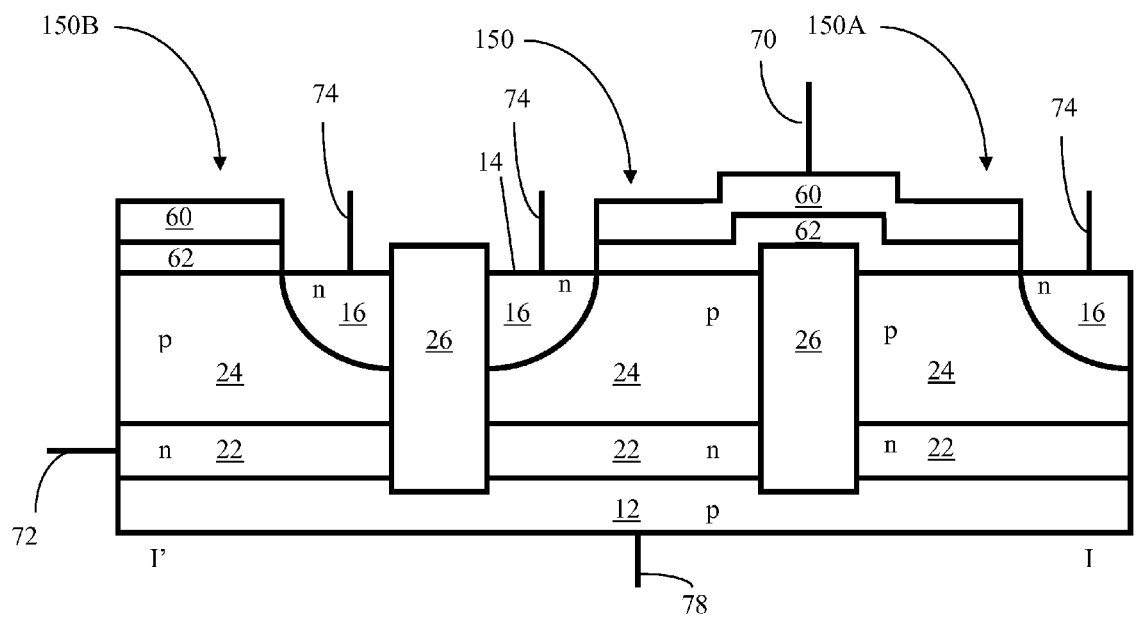
Figure 23D:
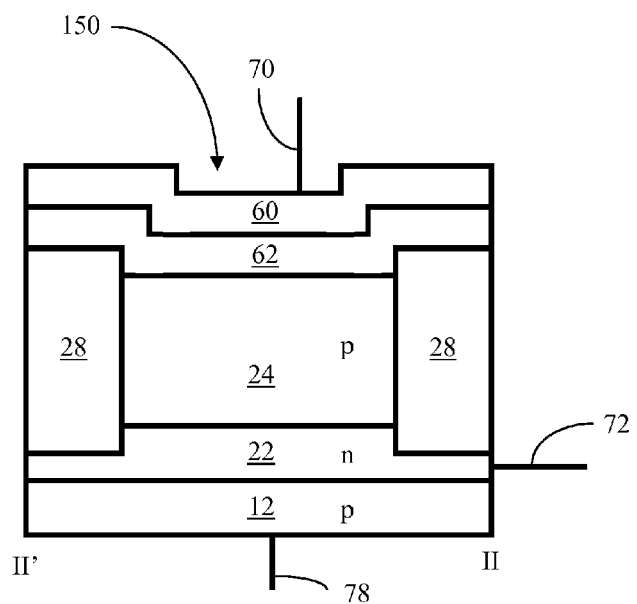

FIG. 23A shows another embodiment of a gated half transistor memory cell 150 (denoted by a dotted line) according to the present invention. FIG. 23B shows a smaller portion of FIG. 23A comprising a single memory cell 150 with two cross section lines I-I' and II-IF. FIG. 23C shows the cross section designated I-I' in FIG. 23B. FIG. 23D shows the cross section designated II-II' in FIG. 23B. Present in FIGS. 23A through 23F are substrate 12, semiconductor surface 14, bit line region 16, buried well layer 22, floating body region 24, insulating layers 26 and 28, gate 60, gate insulator 62, word line terminal 70, buried well terminal 72, bit line terminal 74 and substrate terminal 78, all of which perform similar functions in the exemplary embodiments of memory cell 150 as they did in the exemplary embodiments of memory cell 50 described above.

Referring now to FIGS. 23A, 23B, 23C and 23D, the cell 150 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. A buried layer 22 of the second conductivity type is provided in the substrate 12. Buried layer 22 is also formed by an ion implantation process on the material of substrate 12. Alternatively, buried layer 22 can also be grown epitaxially.

A bit line region 16 having a second conductivity type, such as n-type, for example, is provided in floating body 24 and is exposed at surface 14. Bit line region 16 is formed by an implantation process formed on the material making up floating body 24, according to any of implantation processes known and typically used in the art. Alternatively, a solid state diffusion process could be used to form bit line region 16.

A floating body region 24 of the substrate 12 is bounded by surface 14, bit line region 16, insulating layers 26 and 28 and buried layer 22. Insulating layers 26 and 28 (e.g., shallow trench isolation (STI)), may be made of silicon oxide, for example. Insulating layers 26 and 28 insulate cell 150 from neighboring cells 150 when multiple cells 150 are joined in an array 180 to make a memory device as illustrated in FIG. 25. Insulating layer 26 insulates both neighboring body regions 24 and buried regions 22 of adjacent cells memory cells 150A, 150, and 150B, while insulating layer 28 insulates neighboring body regions 24, but not neighboring buried layer regions 22, allowing the buried layer 22 to be continuous (i.e. electrically conductive) in one direction in parallel with the II-II' cut line as shown in FIGS. 23B and 23D. As in other embodiments, there is no contact to the buried layer 22 at the semiconductor surface 14 inside the boundary of memory cell 150.

A gate 60 is positioned in between bit line regions 16 of neighboring cells 150 and 150A and above the surface 14, the floating body regions 24, and one of the adjacent insulating layers 26 as shown in FIG. 23C. In this arrangement, the gate terminal 70 is coupled to the gates 60 of both memory cells 150 and 150A. The gate 60 is insulated from surface 14 by an insulating layer 62. Insulating layer 62 may be made of silicon oxide and/or other dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides. In FIGS. 23A, 23B and 23C, the gate 60 is shown above the insulating layer 26 isolating neighboring cells 150 and 150A.

Cell 150 further includes word line (WL) terminal 70 electrically connected to gate 60, bit line (BL) terminal 74 electrically connected to bit line region 16, source line (SL) terminal 72 electrically connected to the buried layer 22, and substrate terminal 78 electrically connected to substrate 12.

Figure 23E:
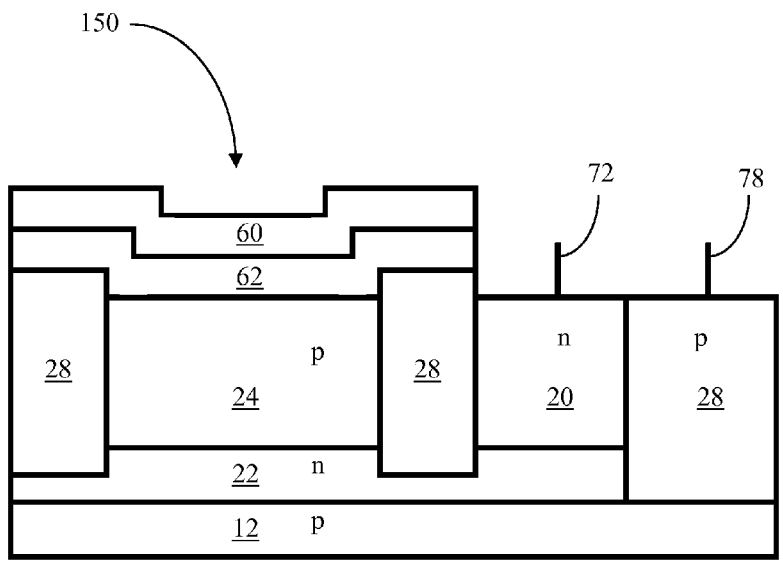

As shown in FIG. 23E, contact to buried well region 22 can be made through region 20 having a second conductivity type, and which is electrically connected to buried well region 22 and buried well terminal 72, while contact to substrate region 12 can be made through region 28 having a first conductivity type, and which is electrically connected to substrate region 12 and substrate terminal 78. The SL terminal 72 serves as the back bias terminal for the memory cell 150.

Figure 23F:
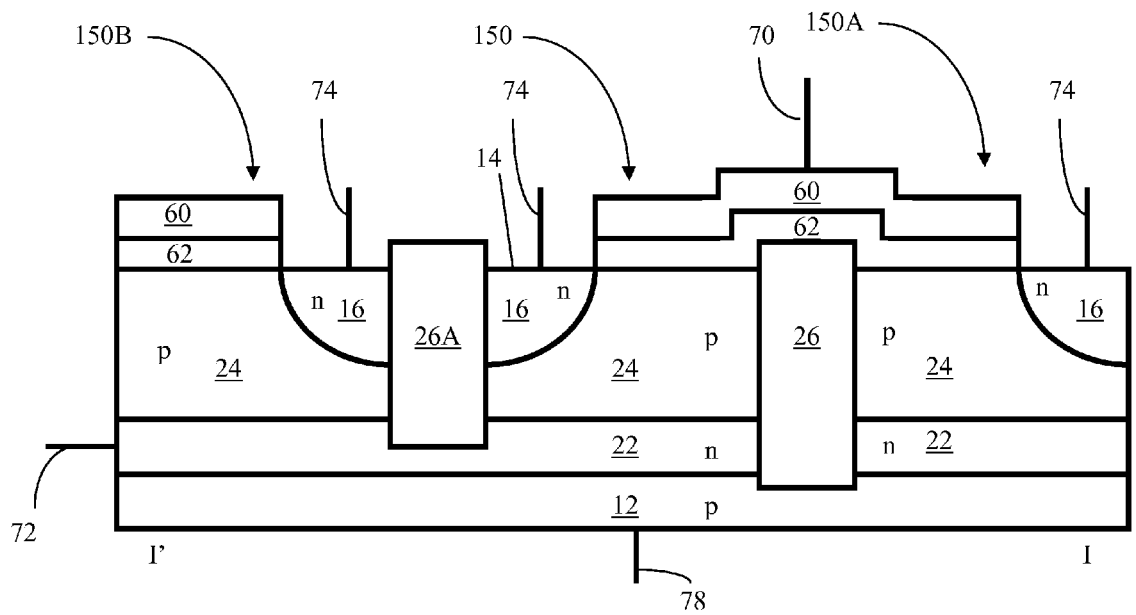

As shown in FIG. 23F, the buried well 22 (and subsequently SL terminal 72) may also be shared between two adjacent memory cells 150 and 150B not sharing the same WL terminal 70. In this embodiment, insulating layer 26A is built to a similar depth as insulating layer 28 allowing this connection to be made using buried well 22. Thus when a plurality of memory cells 150 are arranged in an array the source line terminals 72 are shared between pairs of adjacent rows of cells 150 and the word line terminals 70 are shared between pairs of adjacent rows that are offset by one row from the pairs of rows sharing source line terminal 72. Thus each memory cell 150 shares a source line terminal with one adjacent cell (e.g., 150B) and a word line terminal 70 with another adjacent cell (e.g., 150A). It is worth noting that this connectivity is possible because when memory cells 150 are mirrored in alternate rows when arrayed, while memory cell 50 is not mirrored when arrayed.

FIGS. 24A through 24E shown an alternate embodiment of memory cell 150 where a part of the gate 60 can also be formed inside a trench adjacent to the floating body regions 24 of two adjacent memory cells 150. The primary difference between this embodiment and the one described in FIGS. 23A through 23E is that the insulating layers 26 in alternate rows adjacent to the floating body regions 24 and under the gates 60 are replaced with a trench labeled 26T in FIG. 24C. This trench can be filled with gate insulator 62 and gate material 60 to form a "T" shaped structure. This allows gate 60 to be adjacent to floating body region 24 on two sides allowing better control of the charge in floating body region 24 in response to electrical signals applied to gate 60 through word line terminal 70. In particular, operations where word line terminal is driven to a positive voltage potential to provide a boost to the voltage potential of the floating body 24 by means of capacitive coupling will benefit from this arrangement. since the capacitance between the gate 60 and the floating body 24 will be substantially increased.

Figure 24A:
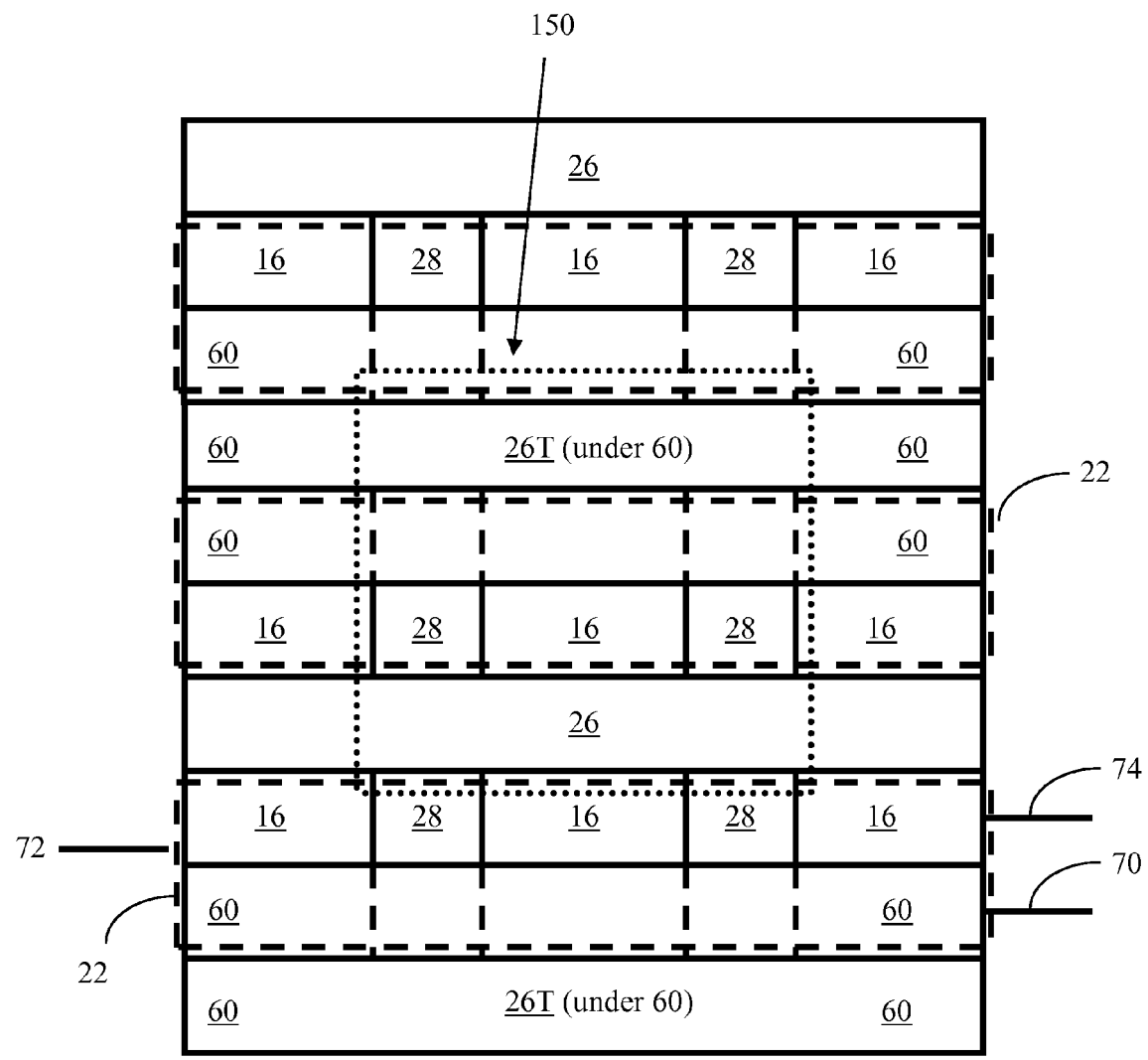
FIGS. 24A through 24F illustrate an alternate physical embodiment of the memory cell of FIGS. 23A through 23F.
Figure 24B:
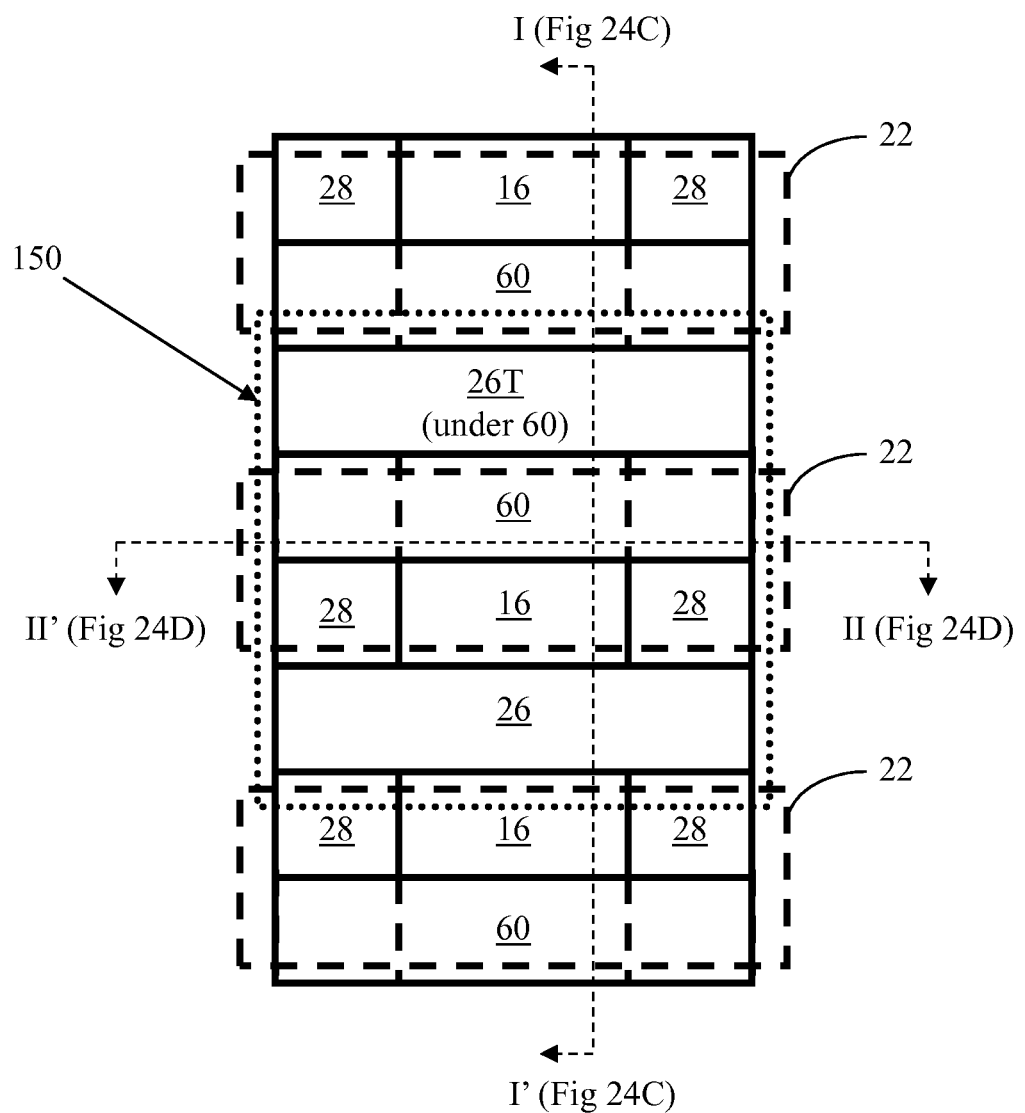
Figure 24C:
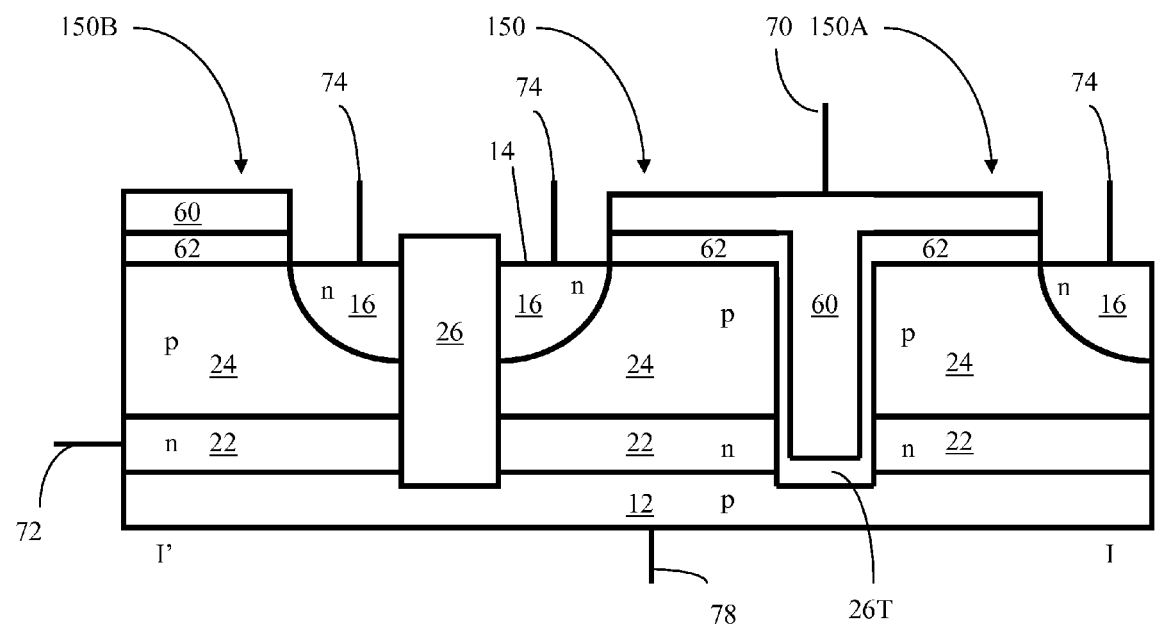
Figure 24D:
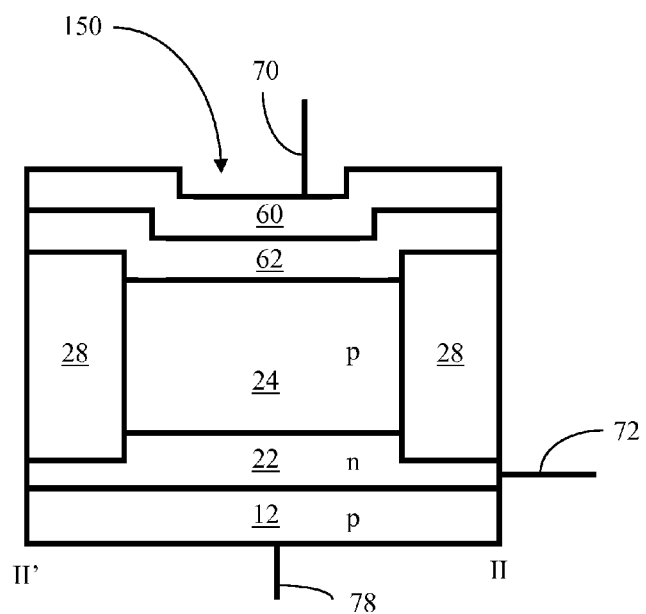

FIG. 24A shows a top view of one such embodiment of a memory cell 150 (denoted by a dotted line) according to the present invention. FIG. 24B shows a smaller portion of FIG. 24A with two cross section lines I-I' and II-II'. FIG. 24C shows the cross section designated I-I' in FIG. 24B. FIG. 24D shows the cross section designated II-II' in FIG. 24B. Present in FIGS. 24A through 24F are substrate 12, semiconductor surface 14, region 16, buried well layer 22, floating body region 24, insulating layers 26 and 28, gate 60, gate insulator 62, word line terminal 70, buried well terminal 72, bit line terminal 74 and substrate terminal 78, all of which perform similar functions in this exemplary embodiment as they did in the earlier exemplary embodiments of memory cell 150 described above.

Referring now to FIGS. 24A, 24B, 24C and 24D, the cell 150 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. A buried layer 22 of the second conductivity type is provided in the substrate 12. Buried layer 22 is also formed by an ion implantation process on the material of substrate 12. Alternatively, buried layer 22 can also be grown epitaxially.

A region 16 having a second conductivity type, such as n-type, for example, is provided in floating body 24 and is exposed at surface 14. Region 16 is formed by an implantation process formed on the material making up floating body 24, according to any of implantation processes known and typically used in the art. Alternatively, a solid state diffusion process could be used to form region 16.

A floating body region 24 of the substrate 12 is bounded by surface 14, region 16, insulating layers 26, and 28, buried layer 22, and trench 26T. Insulating layers 26 and 28 (e.g., shallow trench isolation (STI)), may be made of silicon oxide, for example. Insulating layers 26 and 28 combined with trench 26T insulate cell 150 from neighboring cells 150 when multiple cells 150 are joined in an array 180 to make a memory device as illustrated in FIG. 25. Insulating layer 26 and trench 26T together insulate both neighboring body regions 24 and buried regions 22 of adjacent cells memory cells 150A, 150, and 150B, while insulating layer 28 insulates neighboring body regions 24, but not neighboring buried layer regions 22, allowing the buried layer 22 to be continuous (i.e. electrically conductive) in one direction in parallel with the II-IF cut line as shown in FIGS. 24B and 24D.

A gate 60 is positioned in trench 26T in between bit line regions 16 of neighboring cells 150 and 150A and above the surface 14 over the floating body regions 24 forming a "T" shaped structure as shown in FIG. 24C. In this arrangement, the gate terminal 70 is coupled to the gates 60 of both memory cells 150 and 150A. The gate 60 is insulated from floating body regions 24 by an insulating layer 62 both on surface 14 and along the walls and bottom of trench 26T. Insulating layer 62 may be made of silicon oxide and/or other dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides. The trench 26T could be formed through silicon etching process similar to the STI formation after the STI 26 and 28 have been formed. Instead of filling the trench 26T with thick oxide, gate oxide 62 could be grown after the trench etch, followed by gate 60 formation.

Cell 150 further includes word line (WL) terminal 70 electrically connected to gate 60, bit line (BL) terminal 74 electrically connected to region 16, source line (SL) terminal 72 electrically connected to the buried layer 22, and substrate terminal 78 electrically connected to substrate 12.

Figure 24E:
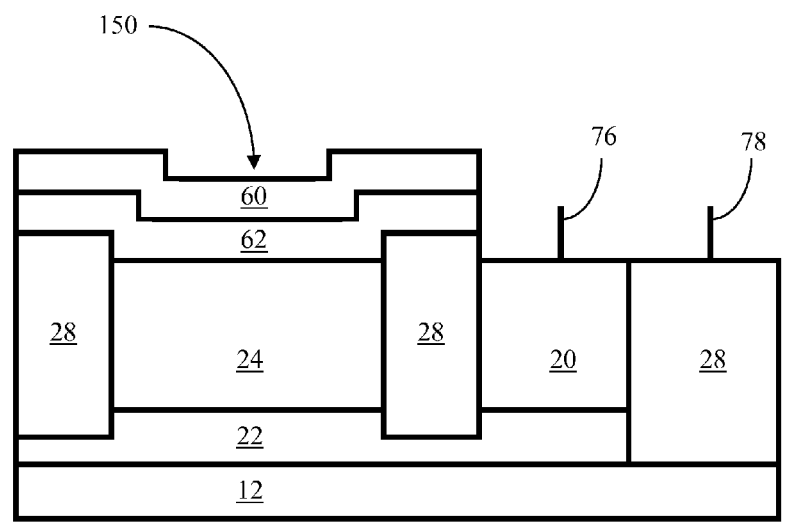

As shown in FIG. 24E, contact to buried well region 22 can be made through region 20 having a second conductivity type, and which is electrically connected to buried well region 22 and buried well terminal 72, while contact to substrate region 12 can be made through region 28 having a first conductivity type, and which is electrically connected to substrate region 12 and substrate terminal 78. The SL terminal 72 serves as the back bias terminal for the memory cell 150.

Figure 24F:
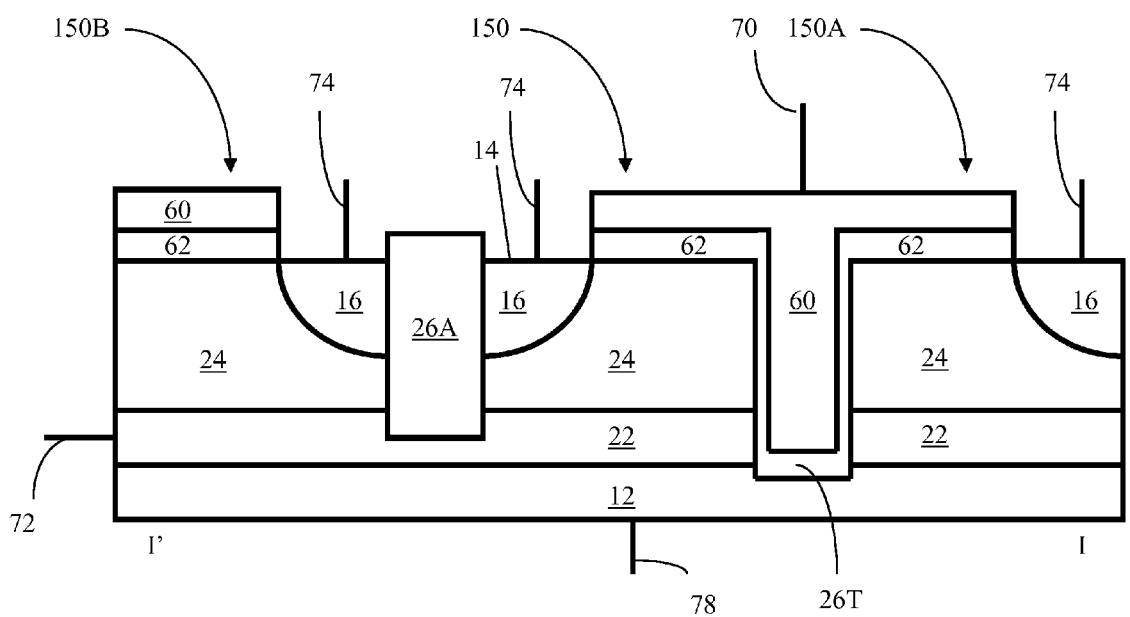

As shown in FIG. 24F, the buried well 22 (and subsequently SL terminal 72) may also be shared between two adjacent memory cells 150 and 150B not sharing the same WL terminal 70. In this embodiment, insulating layer 26A is built to a similar depth as insulating layer 28 allowing this connection to be made using buried well 22. Thus when a plurality of memory cells 150 are arranged in an array the source line terminals 72 are shared between pairs of adjacent rows of cells 150 and the word line terminals 70 are shared between pairs of adjacent rows that are offset by one row from the pairs of rows sharing source line terminal 72. Thus each memory cell 150 shares a source line terminal with one adjacent cell (e.g., 150B) and a word line terminal 70 with another adjacent cell (e.g., 150A). It is worth noting that this connectivity is possible because when memory cells 150 are mirrored in alternate rows when arrayed, while memory cell 50 is not mirrored when arrayed.

Persons of ordinary skill in the art will appreciate that many other embodiments of the memory cell 150 other than the exemplary embodiments described in conjunction with FIGS. 23A through 24F are possible. For example, the first and second conductivity types may be reversed as a matter of design choice. Other physical geometries may be used like, for example, substrate 12 may be replaced by a well placed in a substrate of the second conductivity type (not shown) as a matter of design choice. Thus the embodiments shown are in no way limiting of the present invention.

Figure 25A:
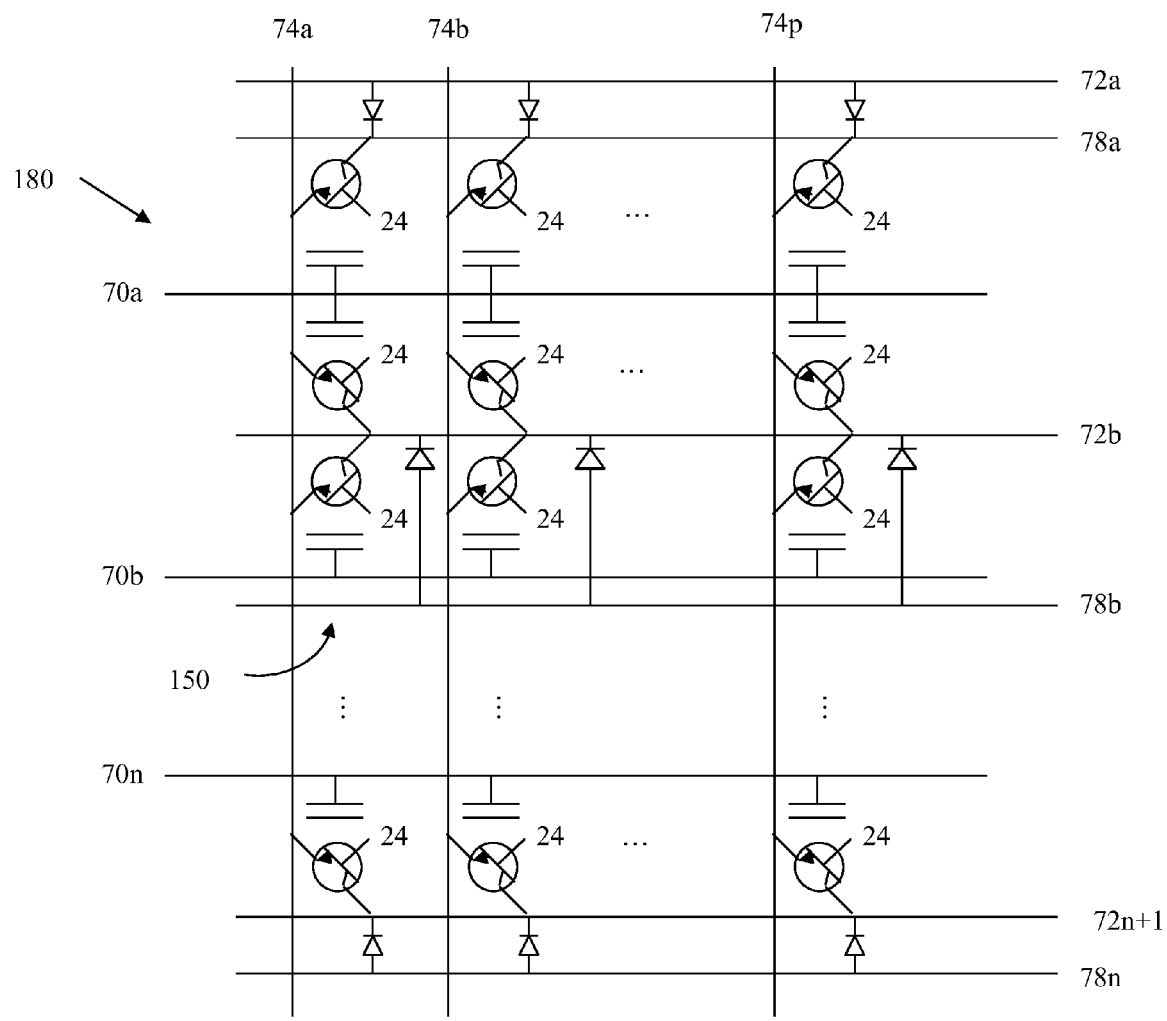
FIG. 25A illustrates an array of the memory cell of the embodiments of FIGS. 23A through 23F and FIGS. 24A through 24F.

FIG. 25A shows an exemplary memory array 180 of memory cells 150. In the exemplary array 180 an embodiment of memory cell 150 is chosen where word lines 70a through 70n are shared between adjacent rows of memory cells 150 and source lines 72a through 72n+1 are shared between adjacent rows of memory cells 150 offset by one row. Thus there is one more source line 72 than there are row lines 70 because the top and bottom rows do not have an adjacent row of memory cells 150 to share source lines 72 with. Because the WL terminals 70a through 70n and source line terminals 72a through 72n+1 can be shared between neighboring memory cells, a smaller memory array 180 may be realized since the effective size of memory cell 150 is reduced due the shared features. Alternatively, the memory array 180 of memory cells 150 can be arranged with one more word line 70 than there are source lines 72 with the top and bottom rows each not sharing word line 70 with adjacent rows.

Figure 25B:
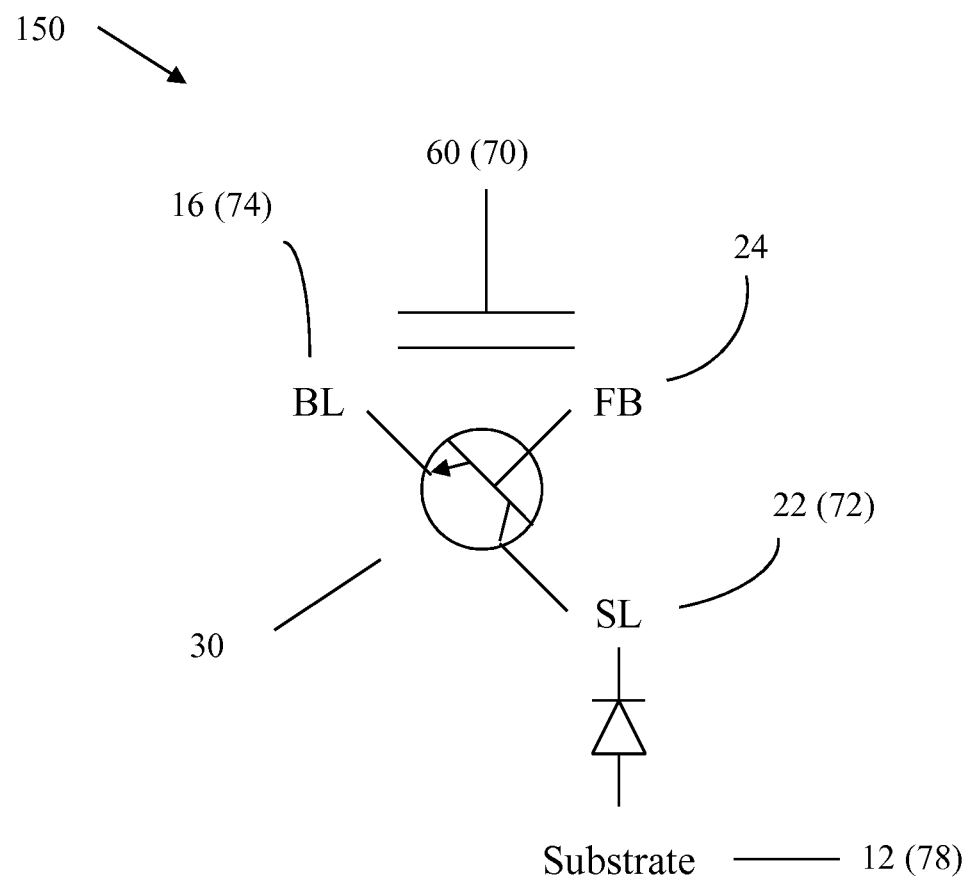
FIG. 25B illustrates a circuit schematic of an individual cell of the embodiments of FIGS. 23A through 23F and FIGS. 24A through 24F.

As shown in FIG. 25B, the circuit schematic for an individual memory cell 150 is identical to that for memory cell 50 as shown in FIG. 3A, the main differences between memory cells 50 and 150 being the physical construction, relative orientation, and the sharing of control lines. Thus the operating principles of memory cell 150 will follow the principles of the previously described memory cell 50. The memory cell operations will be described, realizing that the WL and SL terminals are now shared between neighboring memory cells. Persons of ordinary skill in the art will realize the operation of the embodiments of memory cell 150 which share word lines 70 but have separate source lines 72 can be handled identically by manipulating the non-shared source lines 72 identically or by manipulating them in an analogous manner to other rows in the memory array as a matter of design choice.

Figure 26:
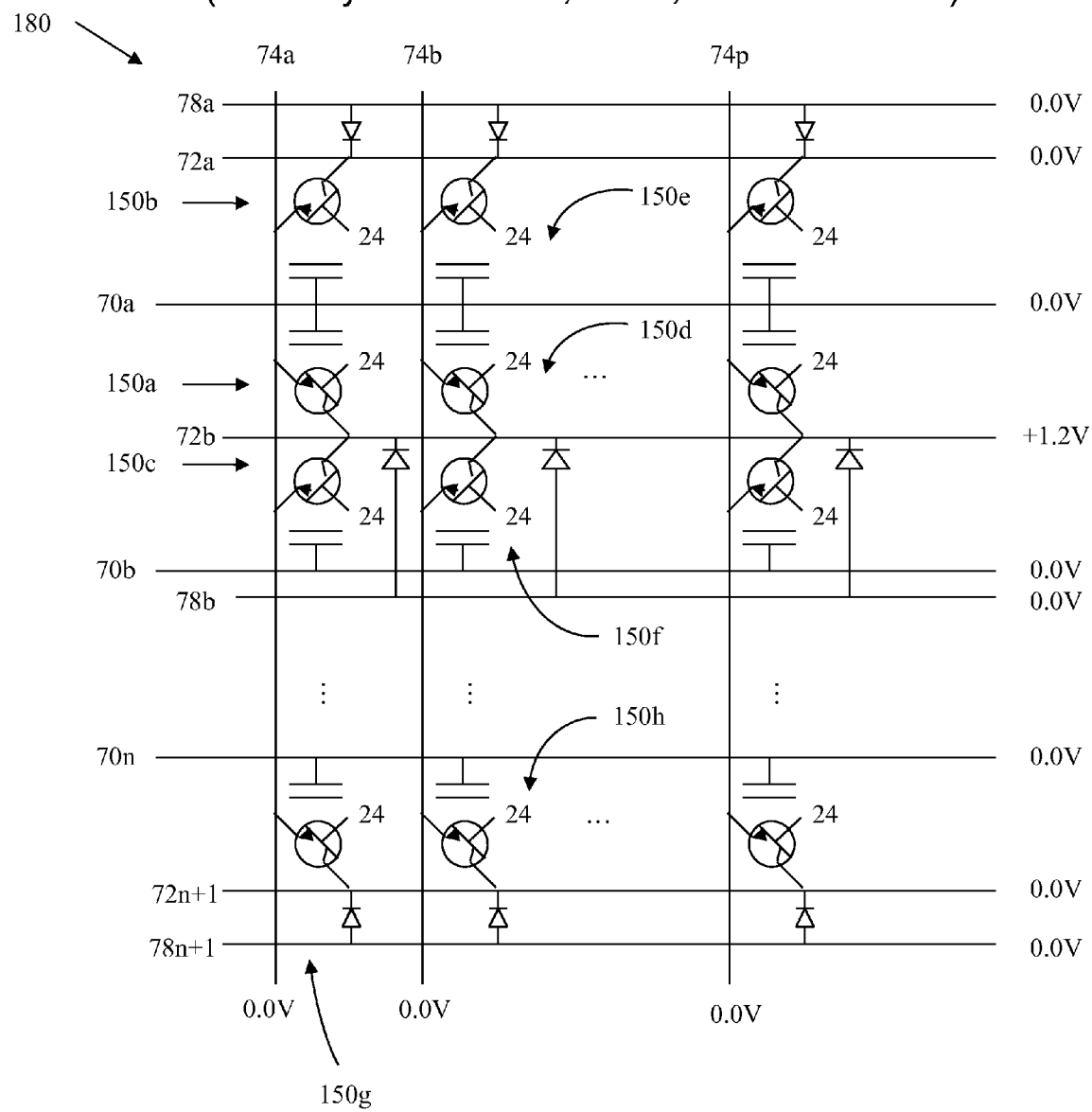
FIG. 26 illustrates a hold operation performed on the array of FIG. 25A.

As illustrated in FIG. 26, the holding operation for memory cell 150 can be performed in a similar manner to that for memory cell 50 by applying a positive bias to the back bias terminal (i.e. SL terminal 72 coupled to buried well region 22) while grounding bit line terminal 74 coupled to bit line region 16 and substrate terminal 78 coupled to substrate 12. As previously described, the holding operation is relatively independent of the voltage applied to terminal 70 which is preferably grounded in some embodiments Inherent in the memory cell 150 is n-p-n bipolar device 30 formed by buried well region 22, floating body 24, and bit line region 16.

If floating body 24 is positively charged (i.e. in a logic-1 state), the bipolar transistor 30 formed by bit line region 16, floating body 24, and buried well region 22 will be turned on as discussed above in conjunction with FIGS. 3A through 3C above. A fraction of the bipolar transistor current will then flow into floating body region 24 (usually referred to as the base current) and maintain the logic-1 data. The efficiency of the holding operation can be enhanced by designing the bipolar device formed by buried well region 22, floating region 24, and bit line region 16 to be a low-gain bipolar device, where the bipolar gain is defined as the ratio of the collector current flowing out of SL terminal 72 to the base current flowing into the floating region 24.

For memory cells in the logic-0 state, the bipolar device will not be turned on, and consequently no base hole current will flow into floating body region 24 as discussed above in conjunction with FIGS. 3A through 3C above. Therefore, memory cells in state logic-0 will remain in state logic-0.

A periodic pulse of positive voltage can be applied to the SL terminal 72 as opposed to applying a constant positive bias to reduce the power consumption of the memory cell 150 in a manner analogous to that described in conjunction with FIGS. 4A through 4D above.

As illustrated in FIG. 26, an example of the bias condition for a two row holding operation is applied to exemplary memory array 180. In one particular non-limiting embodiment, about +1.2 volts is applied to SL terminal 72b, about 0.0 volts is applied to the other source line terminals 72a and 72c (not shown) through 72n+1, about 0.0 volts is applied to BL terminals 74a through 74p, about 0.0 volts is applied to WL terminals 70a through 70n, and about 0.0 volts is applied to substrate terminals 78a through 78n+1. This will place representative memory cells 150a, 150c, 150d, and 150f into a holding state. These voltage levels are exemplary only may vary substantially as a matter of design choice and processing technology node and are in no way limiting.

Figure 27:
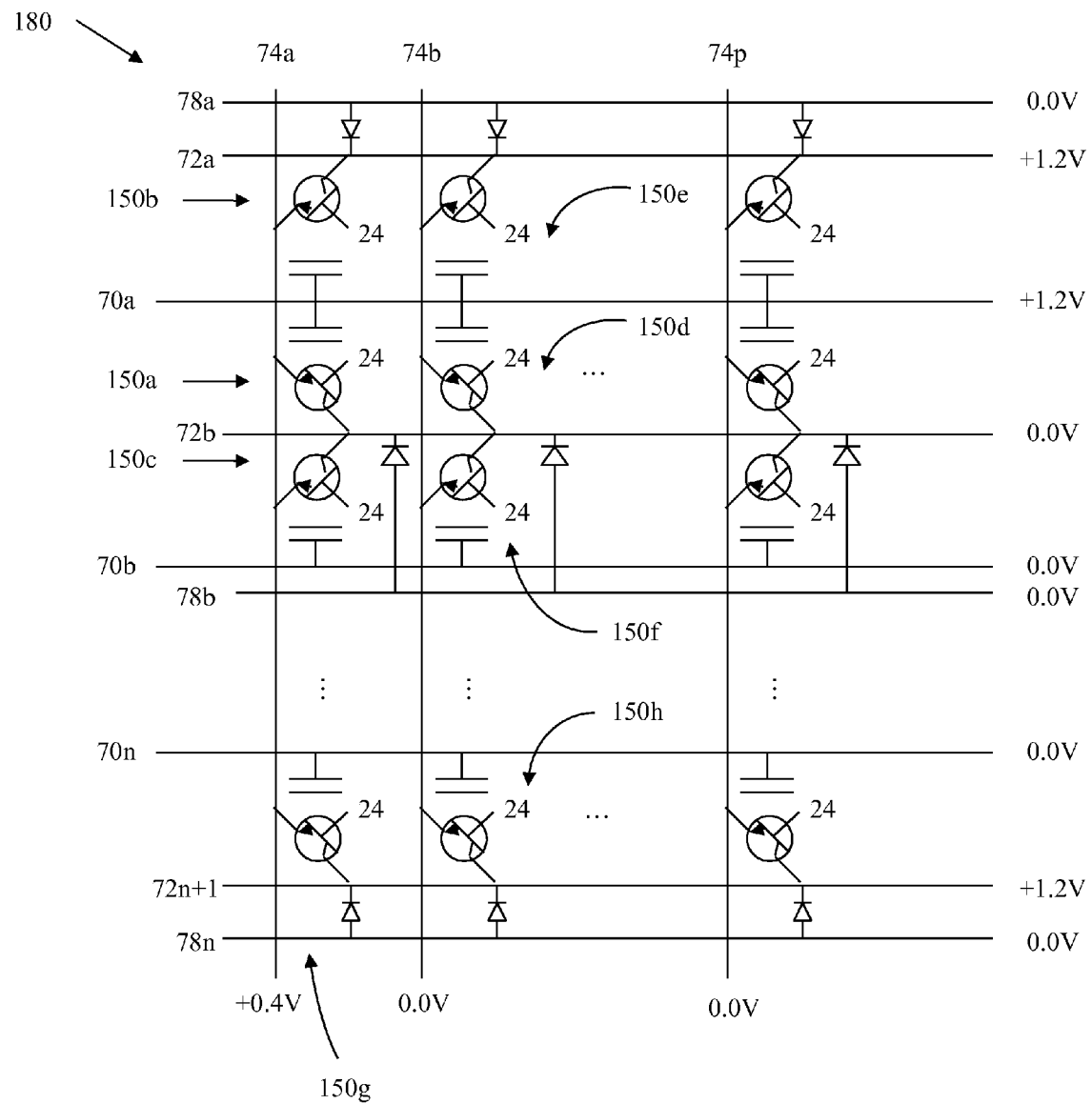
FIG. 27 illustrates a read operation performed on the array of FIG. 25A.
Figure 28A:
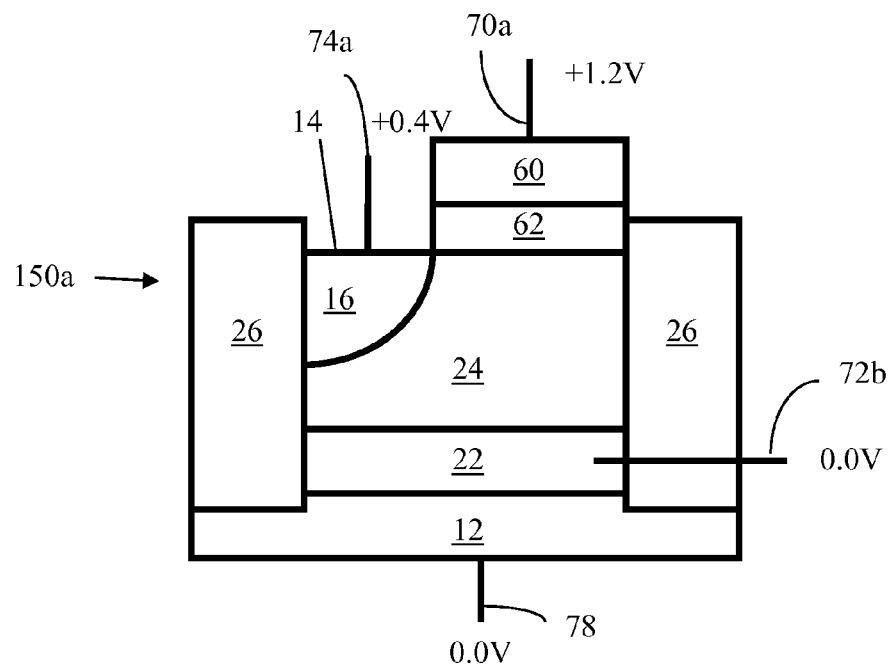
FIGS. 28A through 28P illustrate the operation of eight representative memory cells of the array of FIG. 27.
Figure 28B:
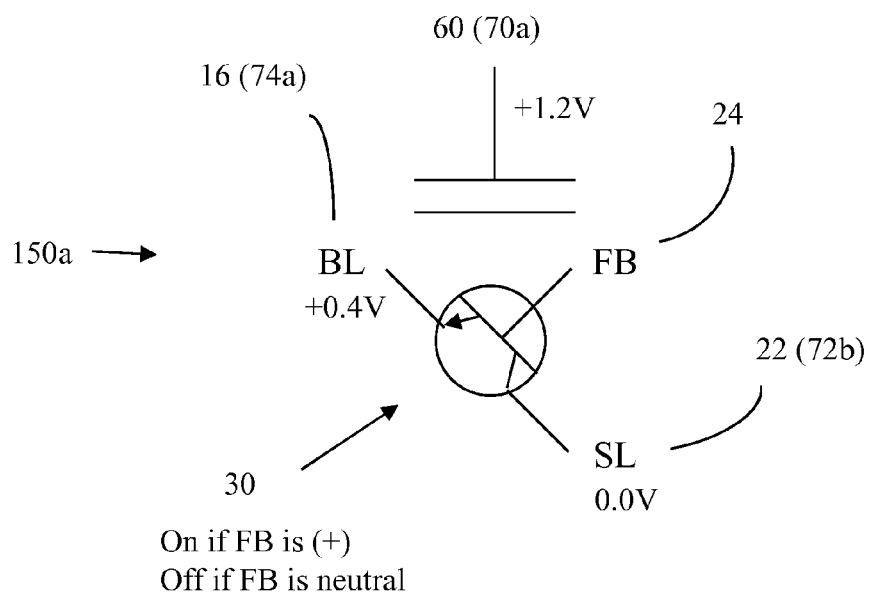
Figure 28C:
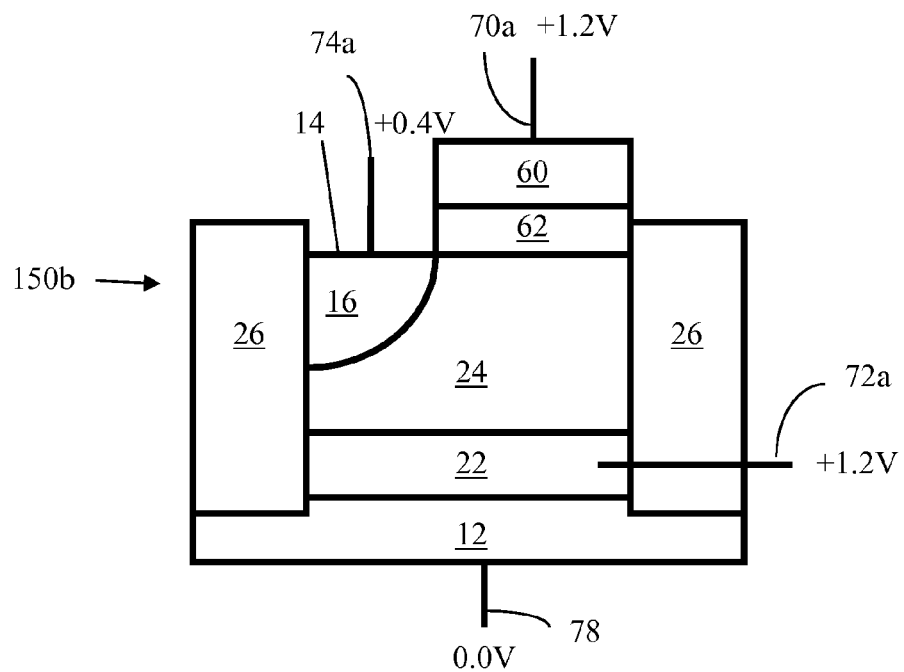
Figure 28D:
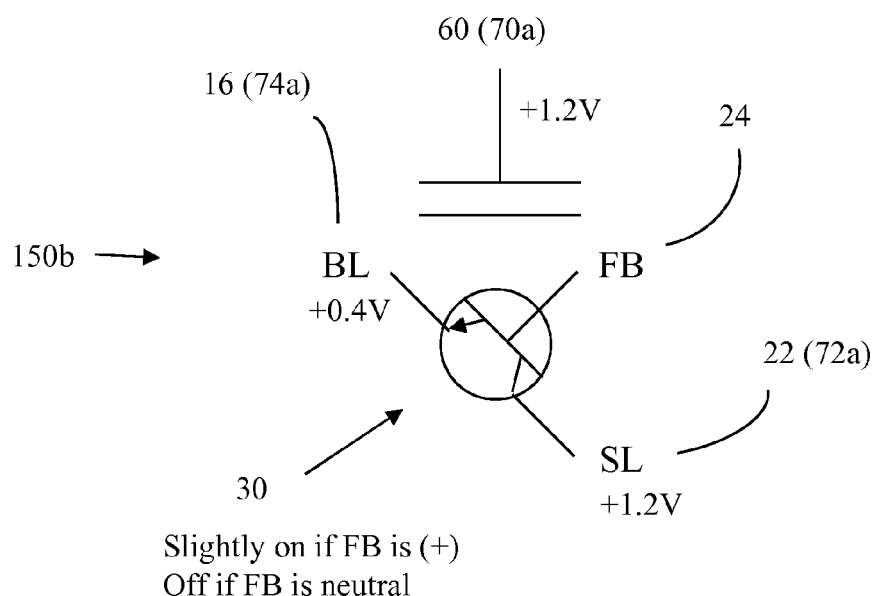
Figure 28E:
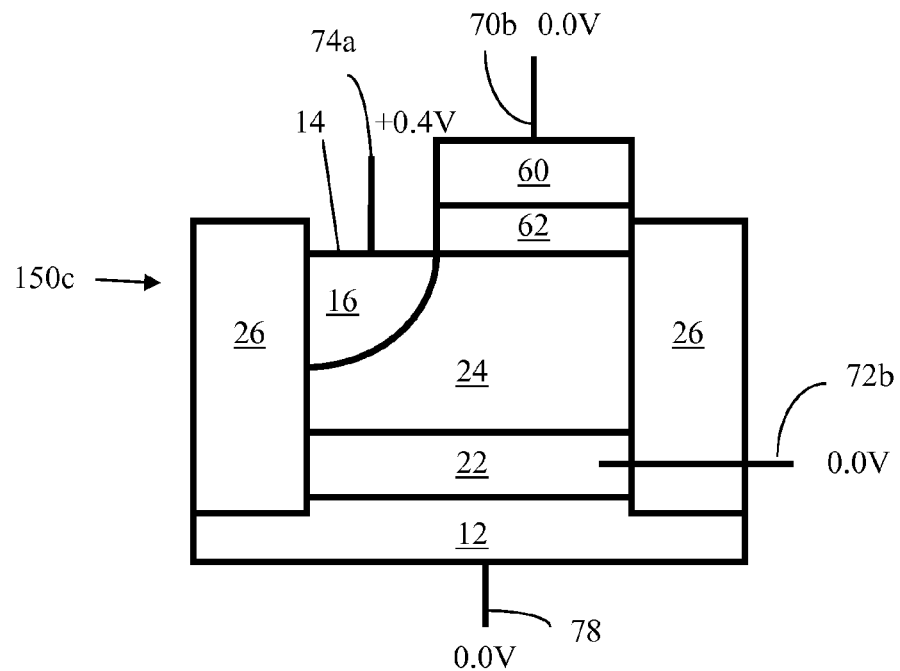
Figure 28F:
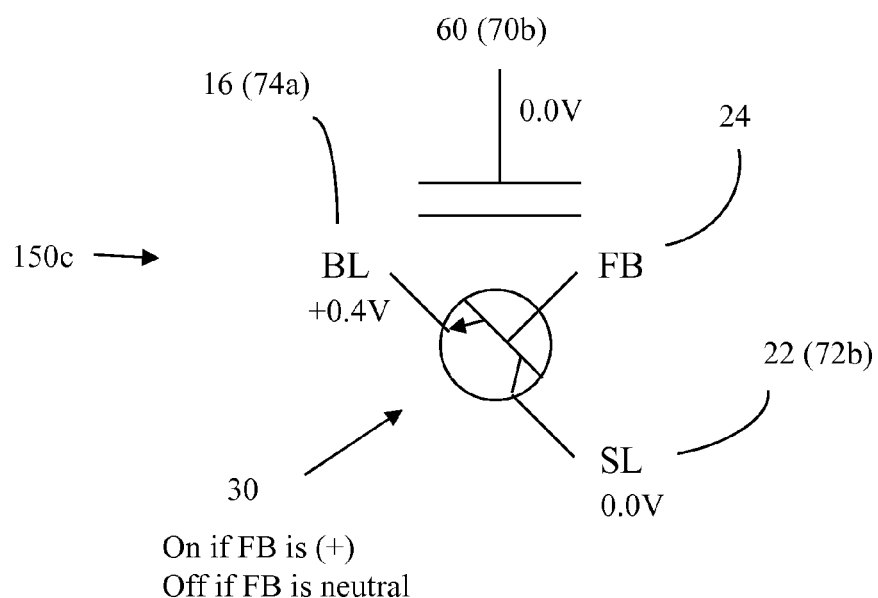
Figure 28G:
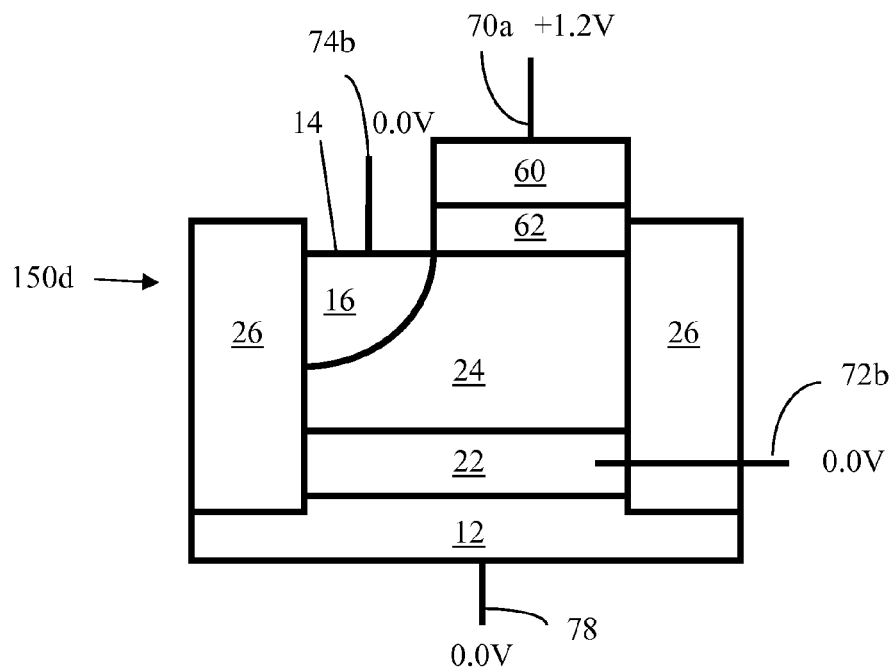
Figure 28H:
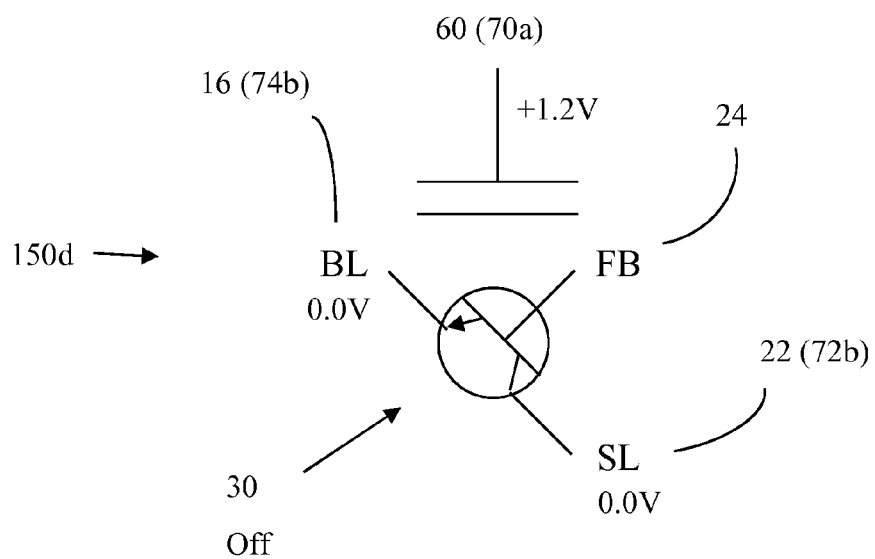
Figure 28I:
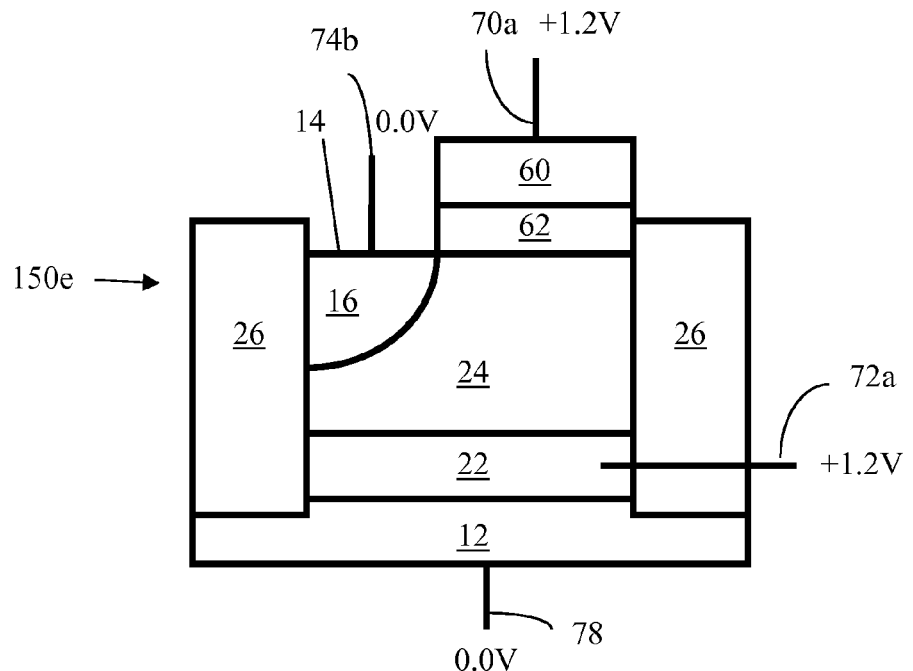
Figure 28J:
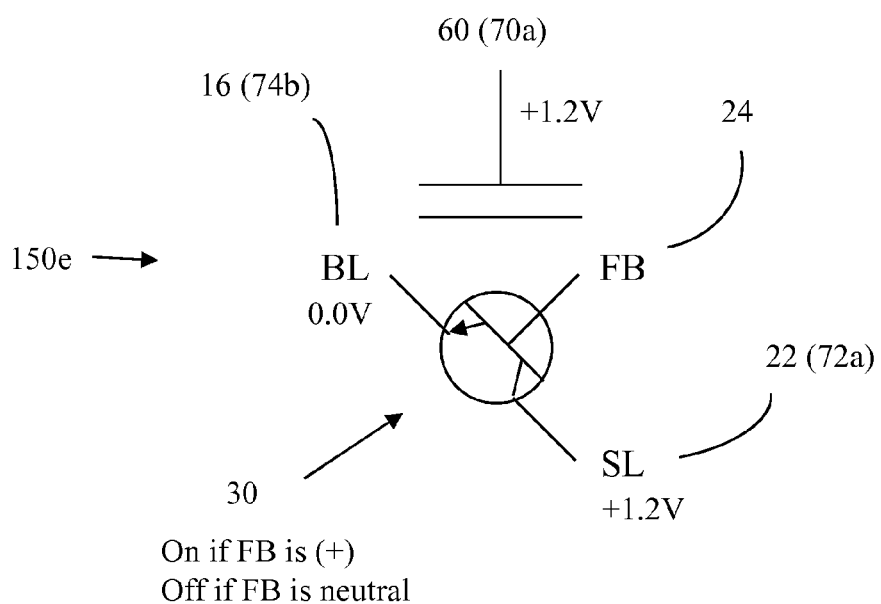
Figure 28K:
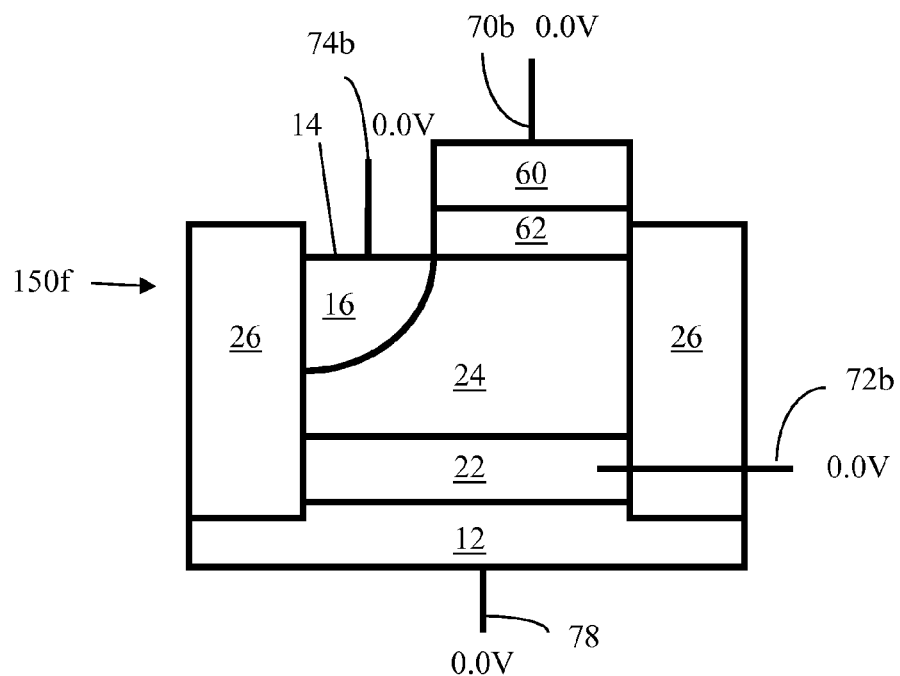
Figure 28L:
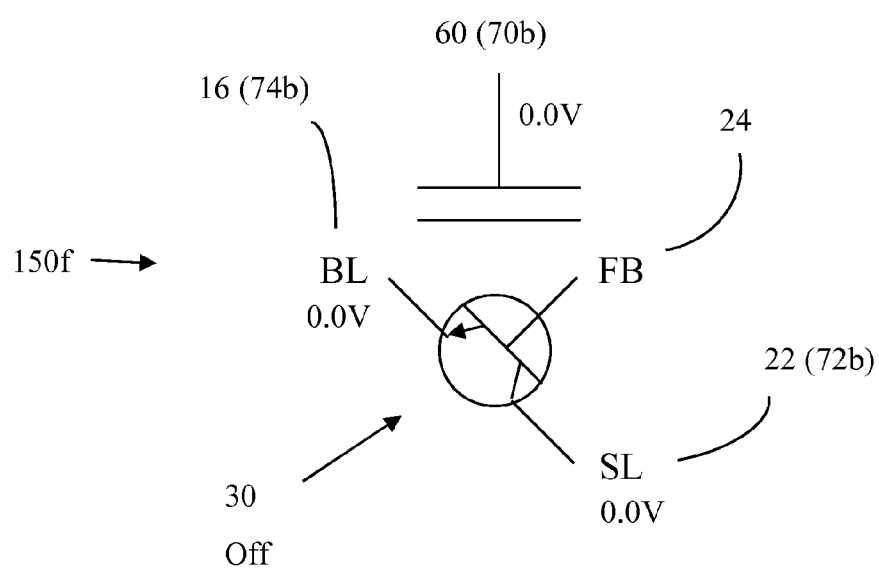
Figure 28M:
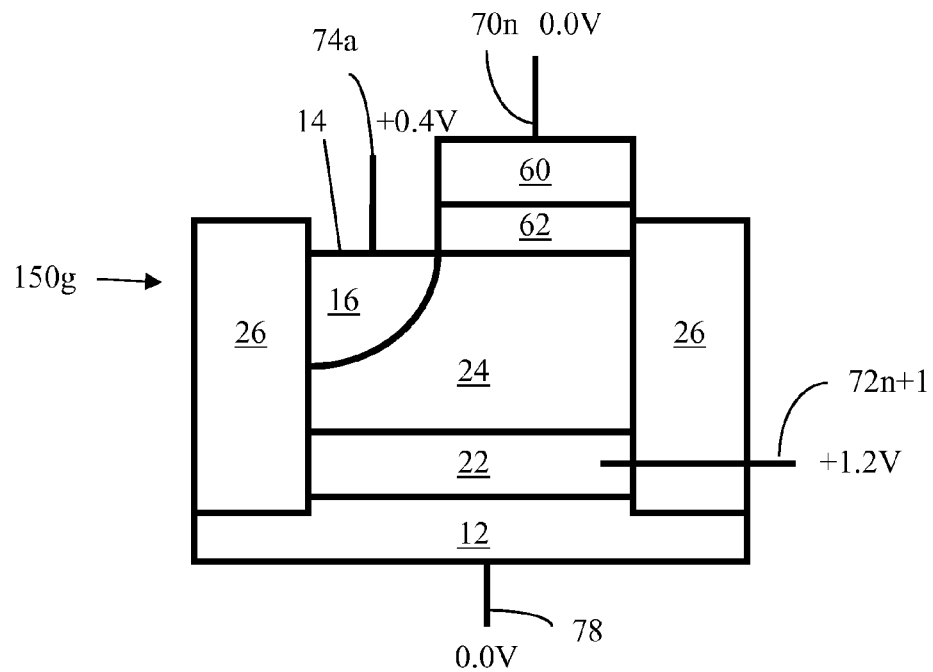
Figure 28N:
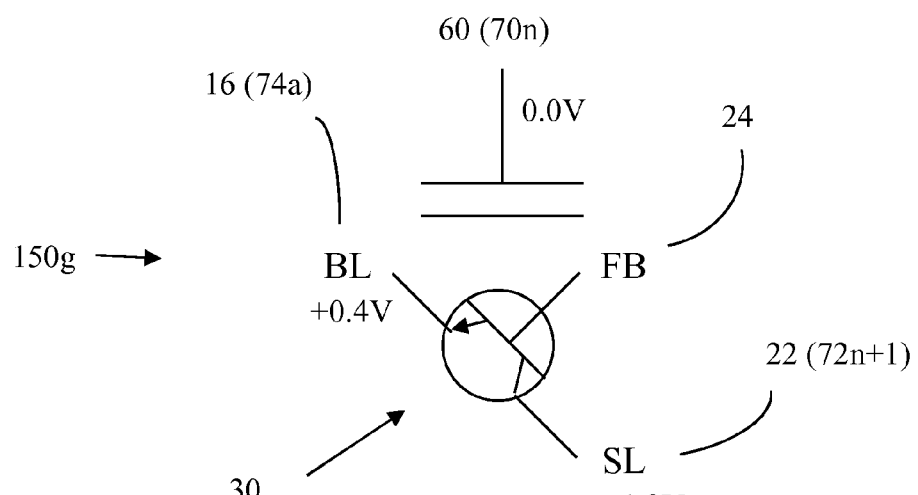
Figure 28O:
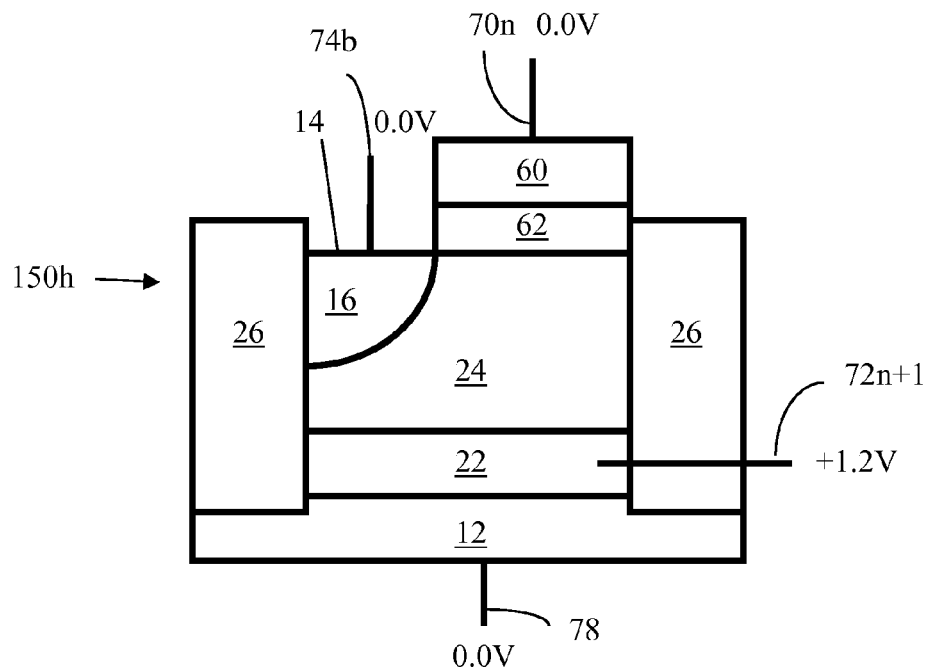
Figure 28P:
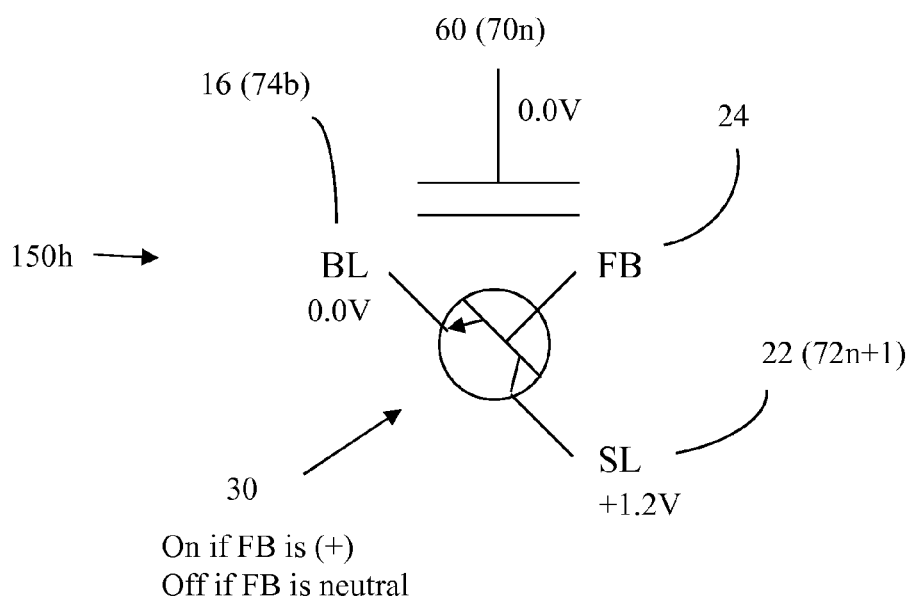

As illustrated in FIGS. 27 and 28A through 28P, the charge stored in the floating body 24 can be sensed by monitoring the cell current of the memory cell 150. If cell 150 is in a state logic-1 having holes in the body region 24, then the memory cell will have a higher cell current, compared to if cell 150 is in a state logic-0 having no holes in body region 24. A sensing circuit typically connected to BL terminal 74 of memory array 180 can then be used to determine the data state of the memory cell. Examples of the read operation are described with reference to Yoshida, Ohsawa-1, and Ohsawa-2 discussed above.

The read operation can be performed by applying the following bias condition to memory cell 150: a positive voltage is applied to the selected BL terminal 74, and a positive voltage greater than the positive voltage applied to the selected BL terminal 74 is applied to the selected WL terminal 70, zero voltage is applied to the selected SL terminal 72, and zero voltage is applied to the substrate terminal 78. The unselected BL terminals will remain at zero voltage, the unselected WL terminals will remain at zero voltage, and the unselected SL terminals will remain at positive voltage.

The bias conditions for an exemplary embodiment for a read operation for the exemplary memory array 180 are shown in FIG. 27, while the bias conditions during a read operation for selected representative memory cell 150*a* are further illustrated in FIGS. 28A through 28B and the bias conditions during a read operation for the seven cases illustrated by unselected representative memory cells 150*b* through 150*h* during read operations are further shown in FIGS. 28C through 28P. In particular, the bias conditions for unselected representative memory cell 150*b* sharing the same WL terminal 70*a* and BL terminal 74*a* but not the same SL terminal 72 as the selected representative memory cell 150*a* are shown in FIGS. 28C through 28D. The bias conditions for unselected representative memory cell 150*c* sharing the same SL terminal 72*b* and BL terminal 74*a* but not the same WL terminal 70 as the selected representative memory cell 150*a* are shown in FIGS. 28E through 28F. The bias conditions for unselected representative memory cell 150*d* sharing the same WL terminal 70*a* and SL terminal 72*b* but not the same BL terminal 74 as the selected representative memory cell 150*a* are shown in FIGS. 28G through 28H. FIGS. 28I through 28J show the bias conditions for unselected representative memory cell 150*e* sharing the same WL terminal 70*a* but neither the same SL terminal 72 nor BL terminal 74 as the selected representative memory cell 150*a*. FIGS. 28K through 28L show the bias conditions for unselected representative memory cell 150*f* sharing the same SL terminal 72*b* but neither the same WL terminal 70 nor BL terminal 74 as the selected representative memory cell 150*a*. The bias conditions for unselected representative memory cell 150*g* sharing the same BL terminal 74*a* as the selected representative memory cell 150*a* but not the same WL terminal 70 nor SL terminal 72 is shown in FIGS. 28M through 28N. The bias condition for representative memory cell 150*h* not sharing any control terminals as the selected representative memory cell 150*a* is shown in FIGS. 28O through 28P.

In one particular non-limiting and exemplary embodiment illustrated in FIGS. 27, 28A and 28B, the bias conditions for selected representative memory cell 150*a* and are shown. In particular, about 0.0 volts is applied to the selected SL terminal 72*b*, about +0.4 volts is applied to the selected bit line terminal 74*a*, about +1.2 volts is applied to the selected word line terminal 70*a*, and about 0.0 volts is applied to substrate terminal 78 (not shown in FIG. 28B).

In the remainder of exemplary array 180, the unselected bit line terminals 74*b* through 74*p* remain at 0.0 volts, the unselected word line terminals 70*b* through 70*n* remain at 0.0 volts, and the unselected SL terminals 72*a* and 72*c* (not shown in FIG. 27) through 72*n*+1 remain at +1.2 volts. FIGS. 28C through 28P show in more detail the unselected representative memory cells 150*b*-150*h* in memory array 180. It is noteworthy that these voltage levels are exemplary only may vary substantially as a matter of design choice and processing technology node, and are in no way limiting.

As shown in FIGS. 27, 28C and 28D, representative memory cell 150*b* sharing the same WL terminal 70*a* and BL terminal 74*a* but not the same SL terminal 72 as the representative selected memory cell 150*a*, both the BL and SL terminal are positively biased. The potential difference between the BL and SL terminals (i.e. the emitter and collector terminals of the bipolar device 30) is lower compared to the memory cells in the holding mode, reducing the base current flowing to the floating body 24. However, because read operation is accomplished much faster (in the order of nanoseconds) compared to the lifetime of the charge in the floating body 24 (in the order of milliseconds), it should cause little disruptions to the charge stored in the floating body.

As shown in FIGS. 27, 28E and 28F, representative memory cell 150*c* sharing the same SL terminal 72*b* and BL terminal 74*a* but not the same WL terminal 70 as the selected representative memory cell 150*a*, both the WL terminal 72*b* and the SL terminal 72 are grounded with the BL terminal positively biased. As a result, memory cell 150*c* will still be at holding mode, where memory cells in state logic-1 will maintain the charge in floating body 24 because the intrinsic bipolar device 30 will generate hole current to replenish the charge in floating body 24; while memory cells in state logic-0 will remain in neutral state.

As shown in FIGS. 27, 28G and 28H, representative memory cell 150*d* sharing the same WL terminal 70*a* and SL terminal 72*b* but not the same BL terminal 74 as the selected representative memory cell 150*a*, both the SL terminal 72*b* and BL terminal 74*b* are grounded with the WL terminal 70*a* at +1.2V. As a result, there is no potential difference between the emitter and collector terminals of the n-p-n bipolar device 30 and consequently representative memory cell 150*d* is no longer in holding mode. However, because read operation is accomplished much faster (in the order of nanoseconds) compared to the lifetime of the charge in the floating body 24 (in the order of milliseconds), it should cause little disruptions to the charge stored in the floating body.

As shown in FIGS. 27, 28I and 28J, representative memory cell 150*e* sharing the same WL terminal 70*a* but not the same SL terminal 72 nor BL terminal 74 as the selected representative memory cell 150*a*, the SL terminal remains positively biased. As a result, memory cell 150*e* will still be at holding mode, where memory cells in state logic-1 will maintain the charge in floating body 24 because the intrinsic bipolar device 30 will generate holes current to replenish the charge in floating body 24; while memory cells in state logic-0 will remain in the neutral state.

As shown in FIGS. 27, 28K and 28L, representative memory cell 150*f* sharing the same SL terminal 72*b* but not the same WL terminal 70 nor BL terminal 74 as the selected representative memory cell 150*a*, both the SL terminal 72 and BL terminal 74 are now grounded. As a result, there is no potential difference between the emitter and collector terminals of the n-p-n bipolar device 30 and consequently memory cells 150*f* is no longer in holding mode. However, because read operation is accomplished much faster (in the order of nanoseconds) compared to the lifetime of the charge in the floating body 24 (in the order of milliseconds), it should cause little disruptions to the charge stored in the floating body.

As shown in FIGS. 27, 28M and 28N, representative memory cell 150*g* sharing the same BL terminal 74*a* but not the same WL terminal 70 nor SL terminal 72 as the selected representative memory cell 150*a*, a positive voltage is applied to the BL terminal 74. Less base current will flow into the floating body 24 due to the smaller potential difference between SL terminal 72 and BL terminal 74 (i.e. the emitter and collector terminals of the n-p-n bipolar device 30). However, because read operation is accomplished much faster (in the order of nanoseconds) compared to the lifetime of the charge in the floating body 24 (in the order of milliseconds), it should cause little disruptions to the charge stored in the floating body.

As shown in FIGS. 27, 28O and 28P, representative memory cells 150h not sharing WL, BL, and SL terminals as the selected representative memory cell 150a, both the SL terminal 72 will remain positively charged and the BL terminal 72 remain grounded (FIGS. 28O-28P). As can be seen, these cells will be at holding mode, where memory cells in state logic-1 will maintain the charge in floating body 24 because the intrinsic bipolar device 30 will generate holes current to replenish the charge in floating body 24; while memory cells in state logic-0 will remain in the neutral state.

It is noteworthy that the voltage levels described in all the different cases above are exemplary only may vary substantially from embodiment to embodiment as a matter of both design choice and processing technology node, and are in no way limiting.

A two row write logic-0 operation of the cell 150 is now described with reference to FIG. 29. A negative bias may be applied to the back bias terminal (i.e. SL terminal 72), zero potential may be applied to WL terminal 70, zero voltage may be applied to BL terminal 72 and substrate terminal 78. The unselected SL terminal 72 will remain positively biased. Under these conditions, the p-n junction between floating body 24 and buried well 22 of the selected cell 50 is forward-biased, evacuating any holes from the floating body 24. In one particular non-limiting embodiment, about −0.5 volts is applied to terminal 72, about 0.0 volts is applied to terminal 70, and about 0.0 volts is applied to terminal 74 and 78. However, these voltage levels may vary, while maintaining the relative relationship between the charges applied, as described above.

Figure 29:
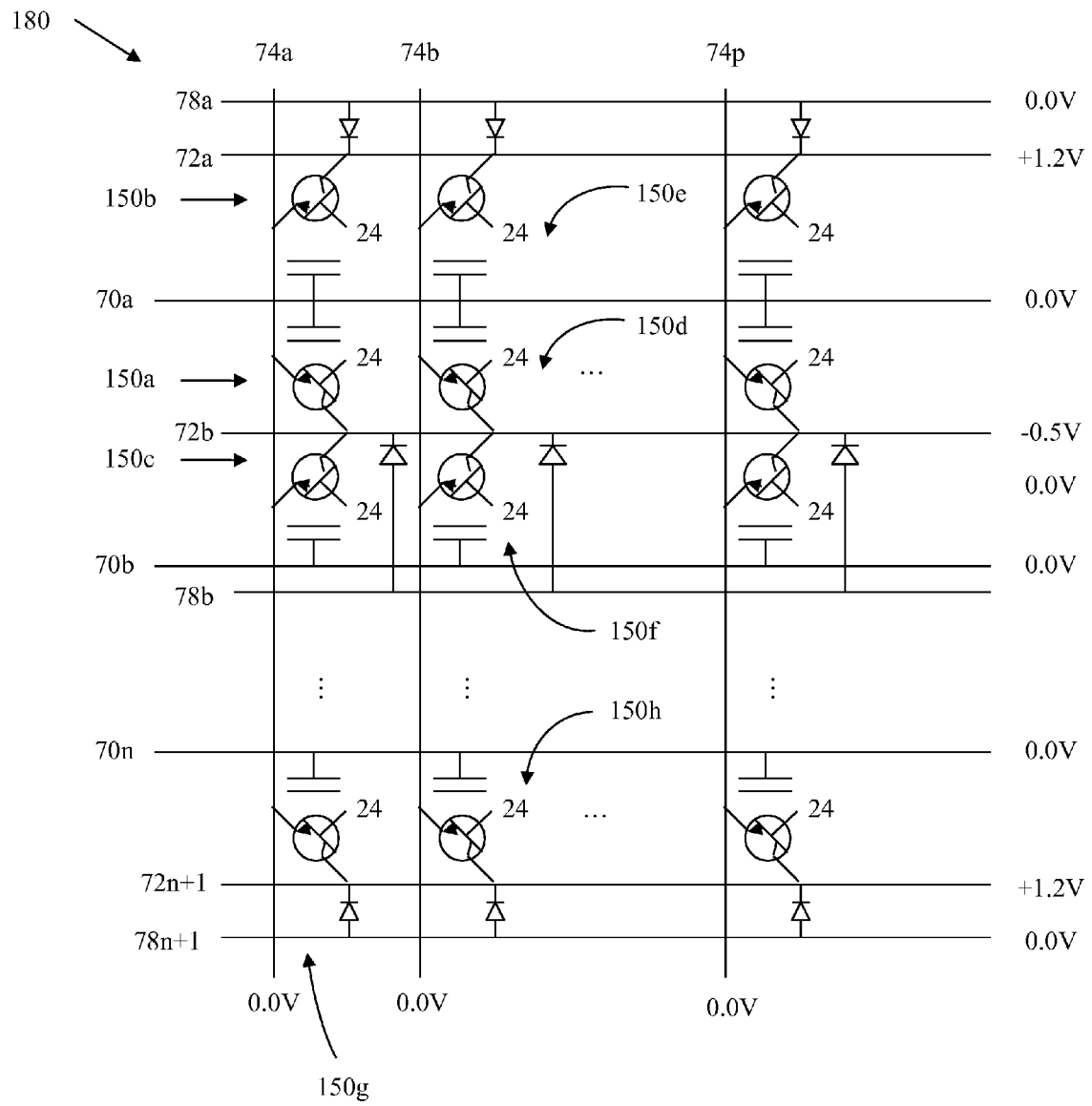
FIG. 29 illustrates a two row write logic-0 operation on the memory array of FIG. 25A.

In FIG. 29, the selected SL terminal 72b is biased at about −0.5V while the unselected SL terminals 72a, and 72c (not shown) through 72n+1 are biased at about +1.2V, the WL terminals 70a through 70n are biased at about 0.0V, the BL terminals 74a through 74p are biased at about 0.0V and the substrate terminals 78a through 78n+1 are biased at about 0.0V. In some embodiments where the substrate is really a well in another substrate (not shown), the substrate terminals may be biased at about −0.5V to avoid unwanted current from the selected SL terminal 72b. This condition causes all of the memory cells 150 coupled to SL terminal 72b, including the selected representative memory cells 150a, 150c, 150d, and 150f, to be written to the logic-0 state.

Figure 29A:
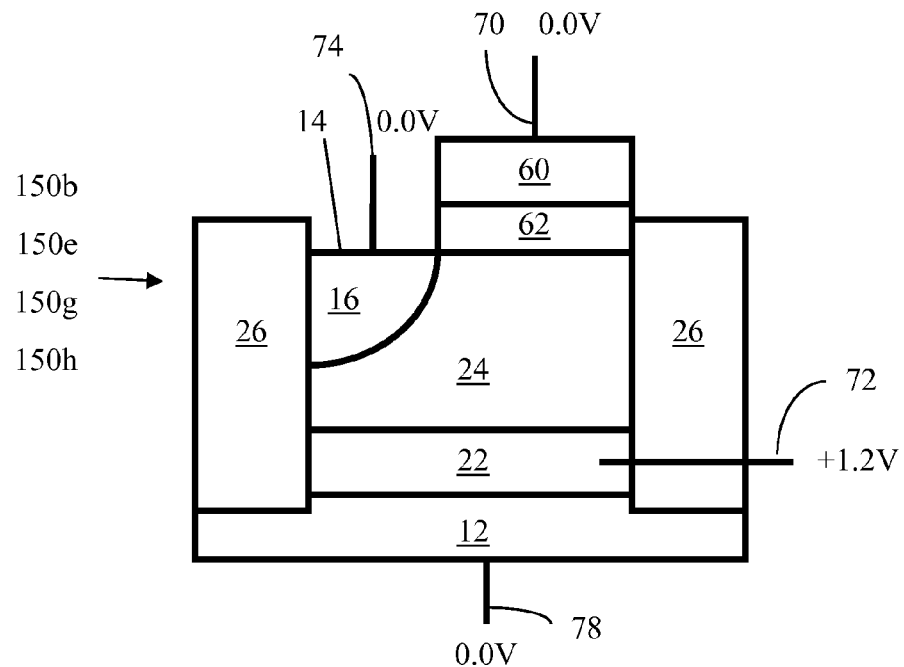
FIGS. 29A and 29B illustrate the operation of unselected memory cells in FIG. 29.
Figure 29B:
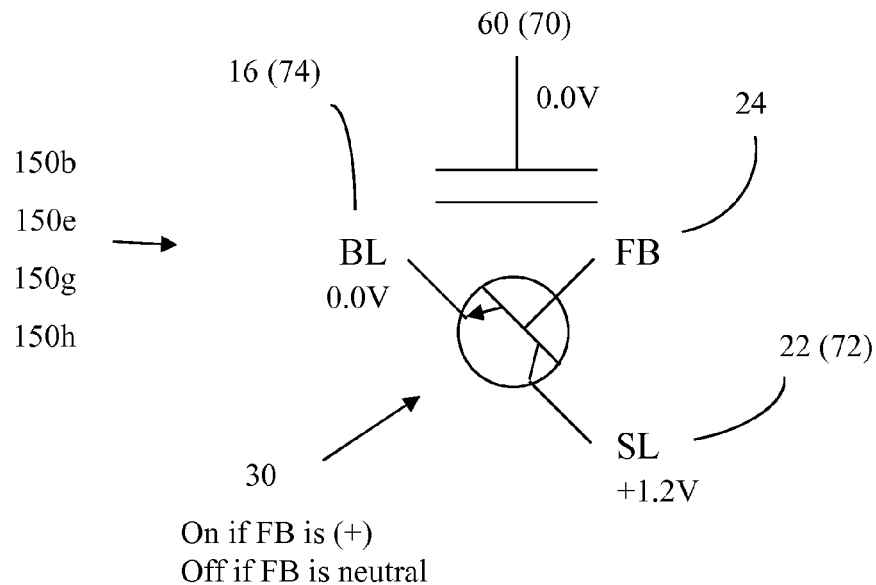

FIGS. 29, 29A and 29B show an example of bias conditions for the selected and unselected memory cells 150 during a two row write logic-0 operation in memory array 180. For the selected memory cells, including representative memory cells 150a, 150c, 150d and 150f, the negative bias applied to SL terminal 72 causes large potential difference between floating body 24 and buried well region 22. This causes the hole charge in the floating body 24 to be discharged as discussed above. Because the buried well 22 is shared among multiple memory cells 50, all memory cells 150 sharing the same SL terminal 72 will be written into state logic-0.

An example of bias conditions and an equivalent circuit diagram illustrating the intrinsic n-p-n bipolar devices 30 of unselected memory cells 150, including representative memory cells 150b, 150e, 150g and 150h, during write logic-0 operations are illustrated in FIGS. 29A through 29B. Since the write logic-0 operation only involves a negative voltage to the selected SL terminal 72, the bias conditions for all the unselected cells are the same. As can be seen, the unselected memory cells will be in a holding operation, with the BL terminal at about 0.0 volts, WL terminal at zero or negative voltage, and the unselected SL terminal positively biased.

Figure 30:
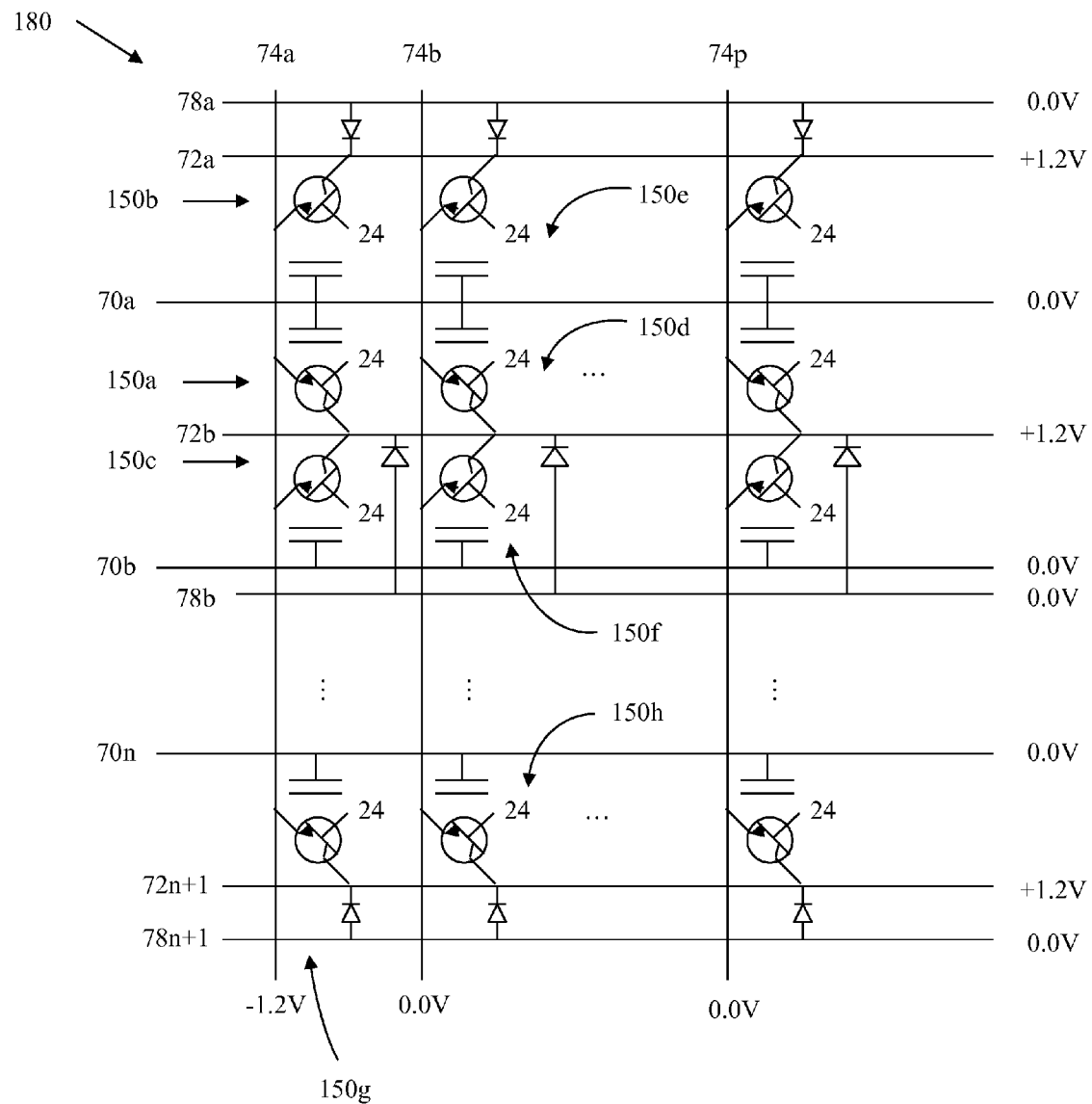
FIG. 30 illustrates a single column write logic-0 operation on the memory array of FIG. 25A.

As illustrated in FIG. 30, a single column write logic-0 operation can be performed by applying a negative bias to the BL terminal 74 as opposed to the SL terminal 72 (as in FIGS. 29, 29A, and 29B). The SL terminal 72 will be positively biased, while zero voltage is applied to the substrate terminal 78, and zero voltage is applied to the WL terminal 70. Under these conditions, all memory cells sharing the same BL terminal 74 will be written into state logic-0 while all the other memory cells 150 in the array 180 will be in the holding state.

In FIG. 30, selected BL terminal 74a may be biased at about −1.2V while the unselected BL terminals 74b through 74p may be biased at about 0.0V, the WL terminals 70a through 70n may be biased at about 0.0V, the source line terminals 72a through 27n+1 may be biased at +1.2V, and the substrate terminals 78a through 78n+1 may be biased at 0.0V. This condition causes all of the memory cells 150 coupled to BL terminal 74a, including the selected representative memory cells 150a, 150b, 150c, and 150g, to be written to the logic-0 state while the remaining memory cells 150, including unselected representative memory cells 150d, 150e, 150f, and 150h, to be in a holding operation. These voltage levels are exemplary only may vary substantially from embodiment to embodiment as a matter of design choice and processing technology node used, and are in no way limiting.

Figure 31:
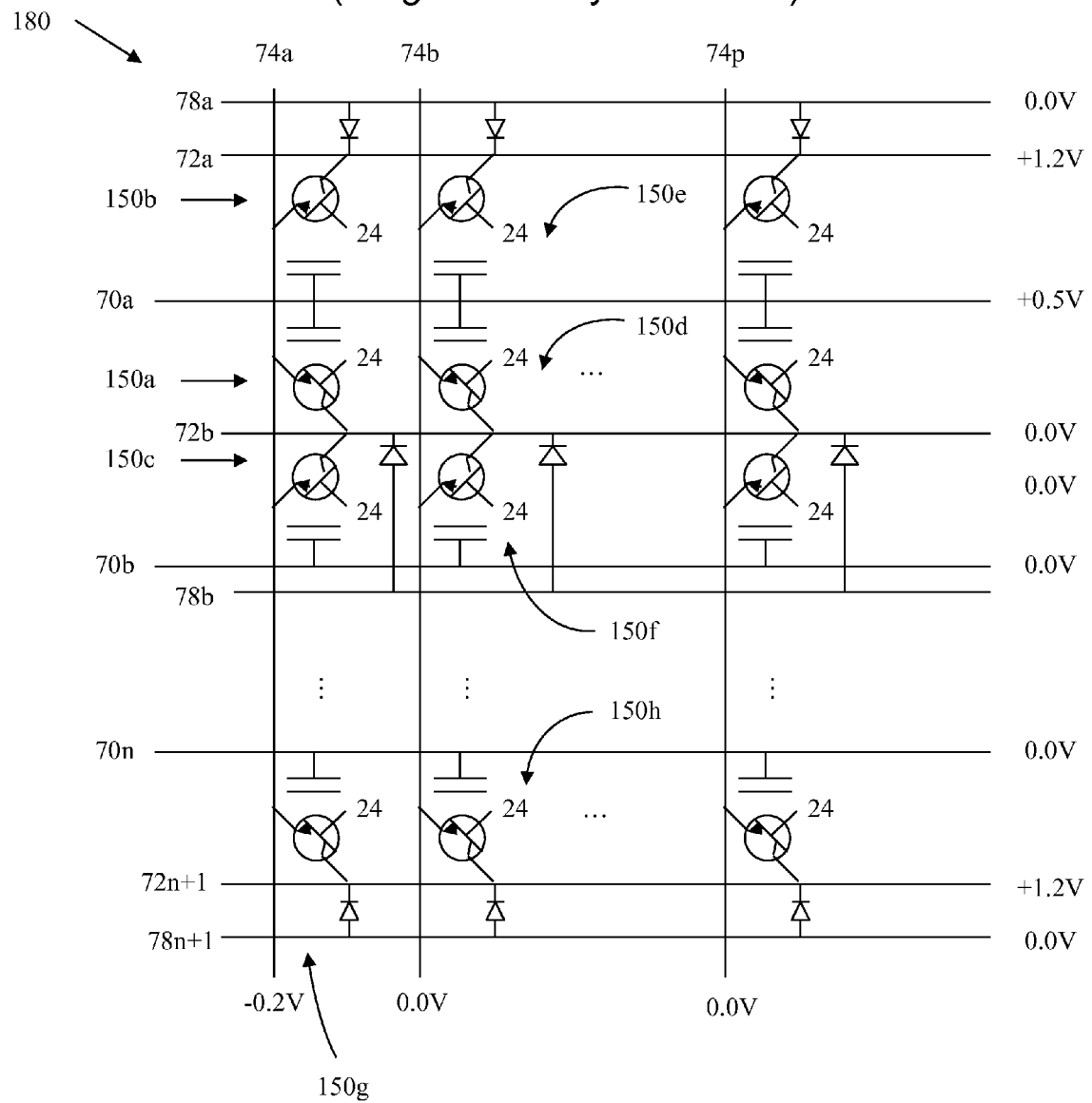
FIG. 31 illustrates a single memory cell write logic-0 operation on the memory array of FIG. 25A.
Figure 32A:
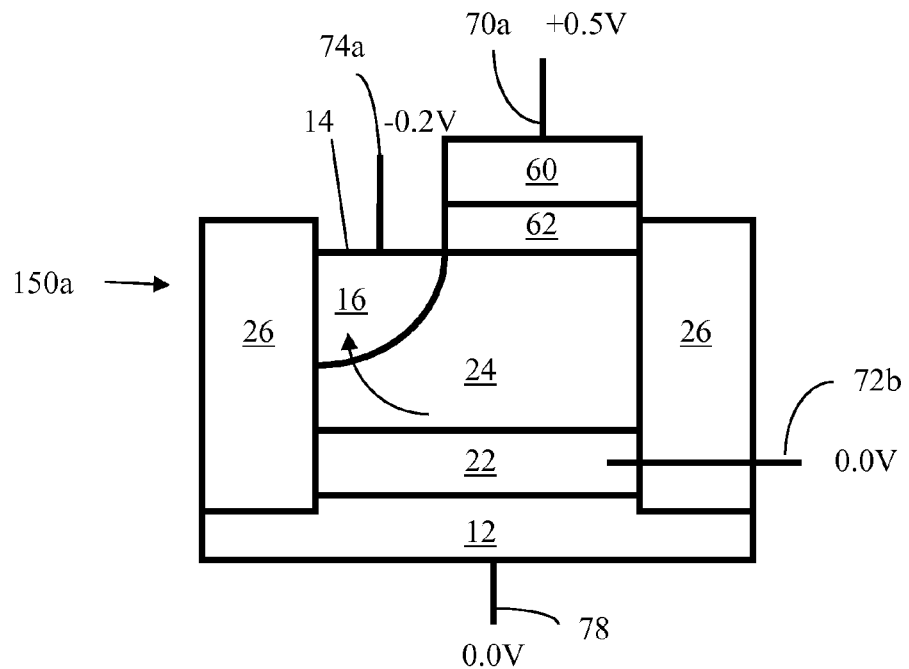
FIGS. 32A through 32P illustrate the operation of eight representative memory cells of the array of FIG. 31.
Figure 32B:
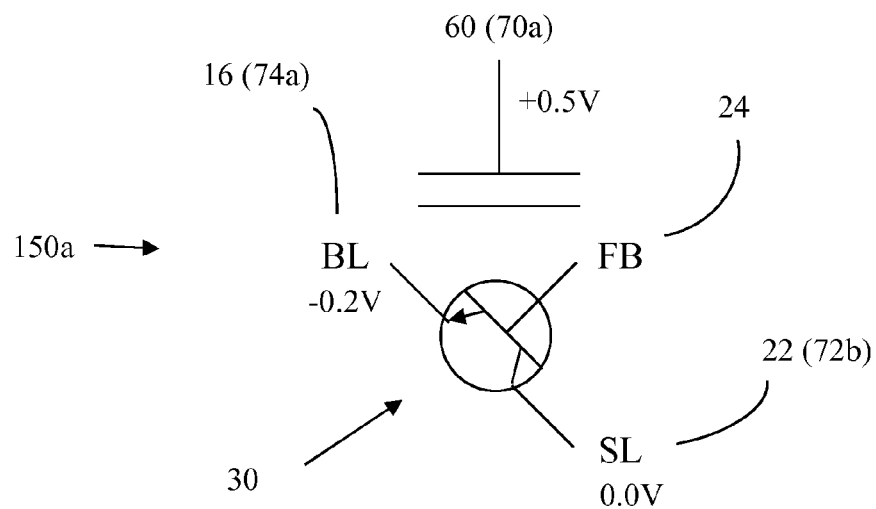
Figure 32C:
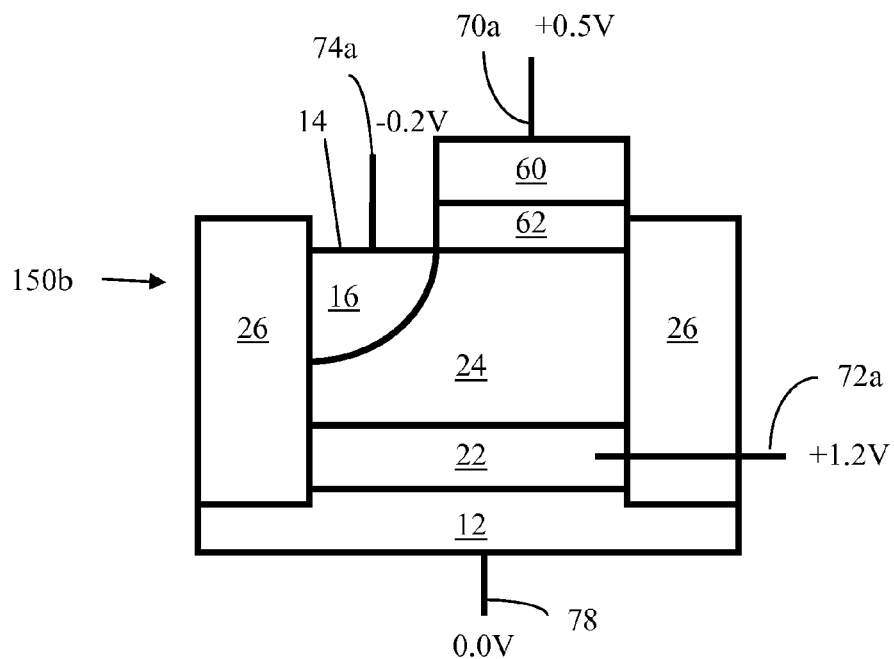
Figure 32D:
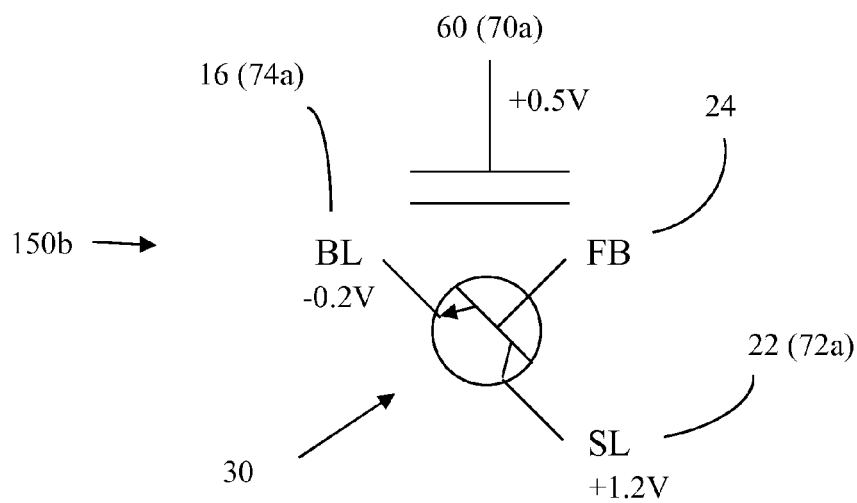
Figure 32E:
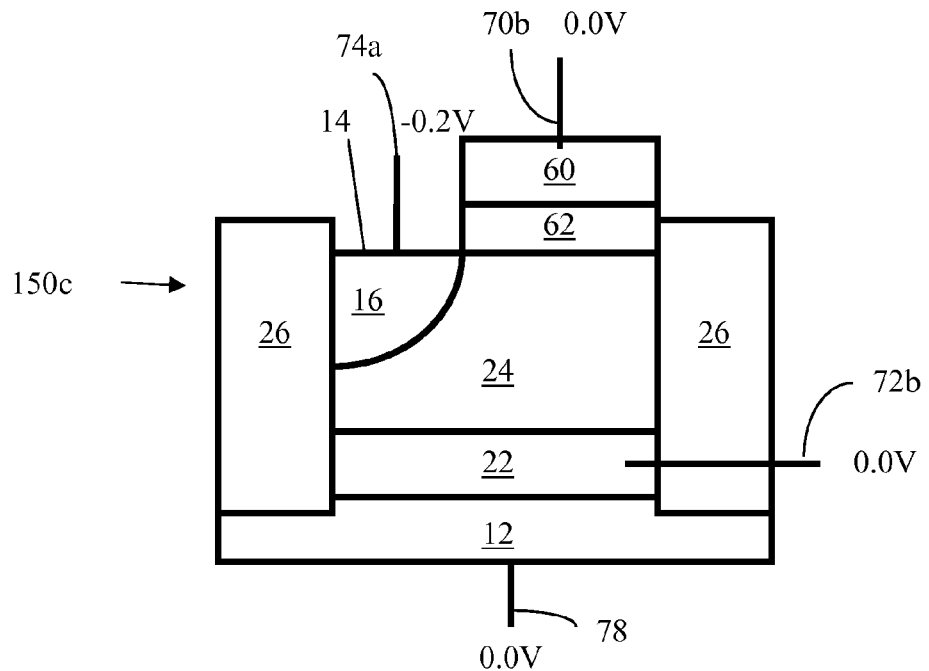
Figure 32F:
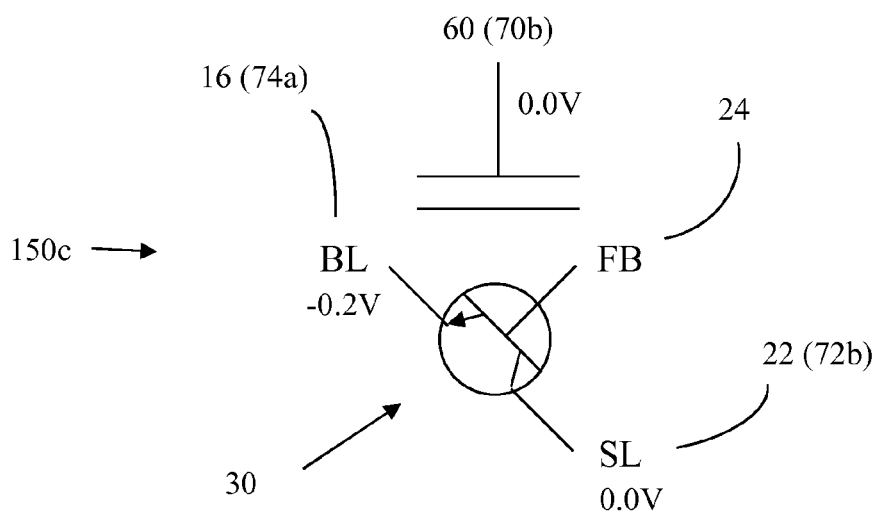
Figure 32G:
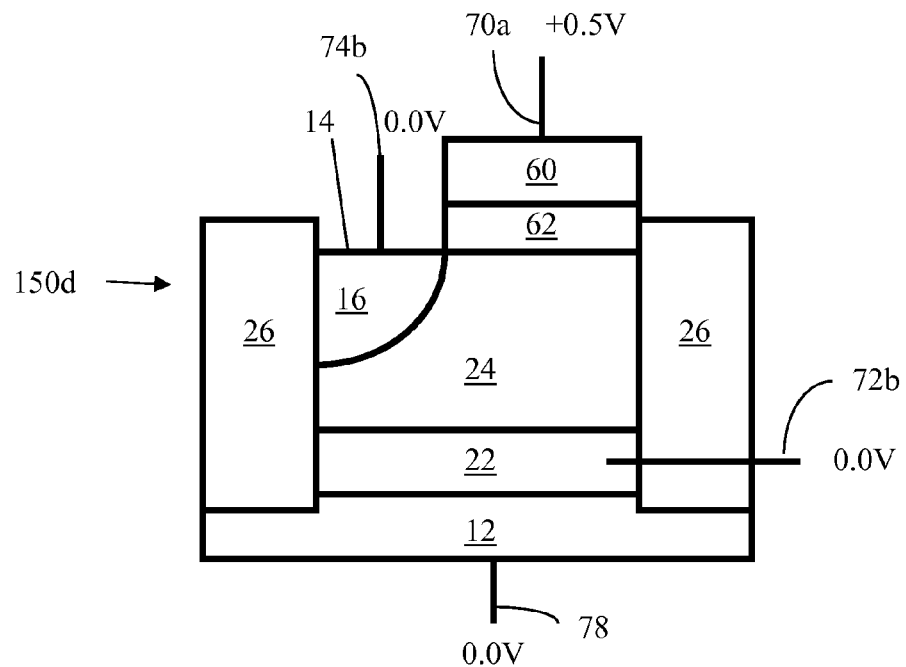
Figure 32H:
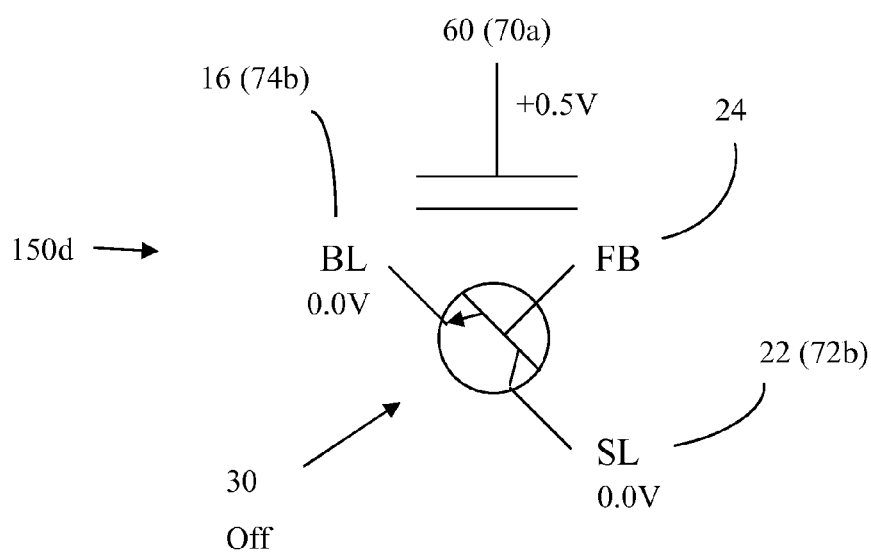
Figure 32I:
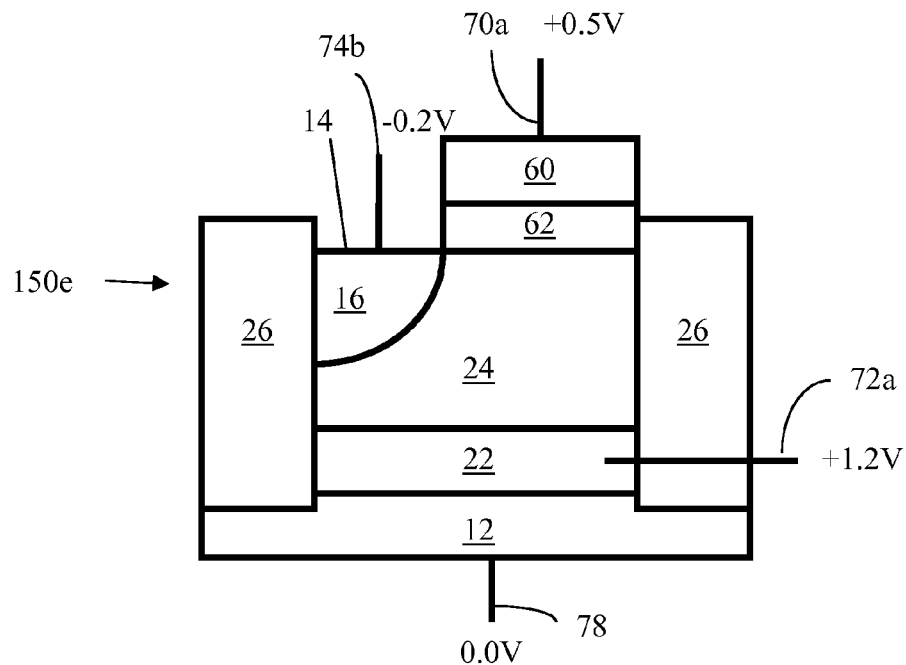
Figure 32J:
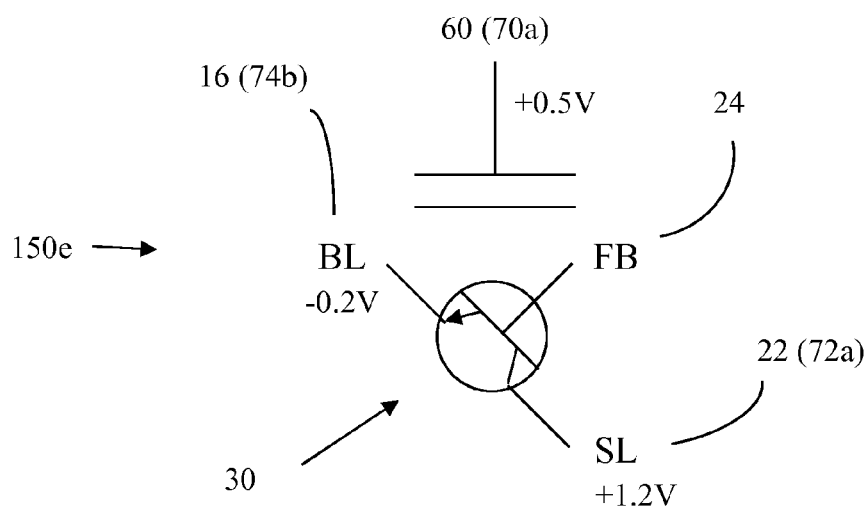
Figure 32K:
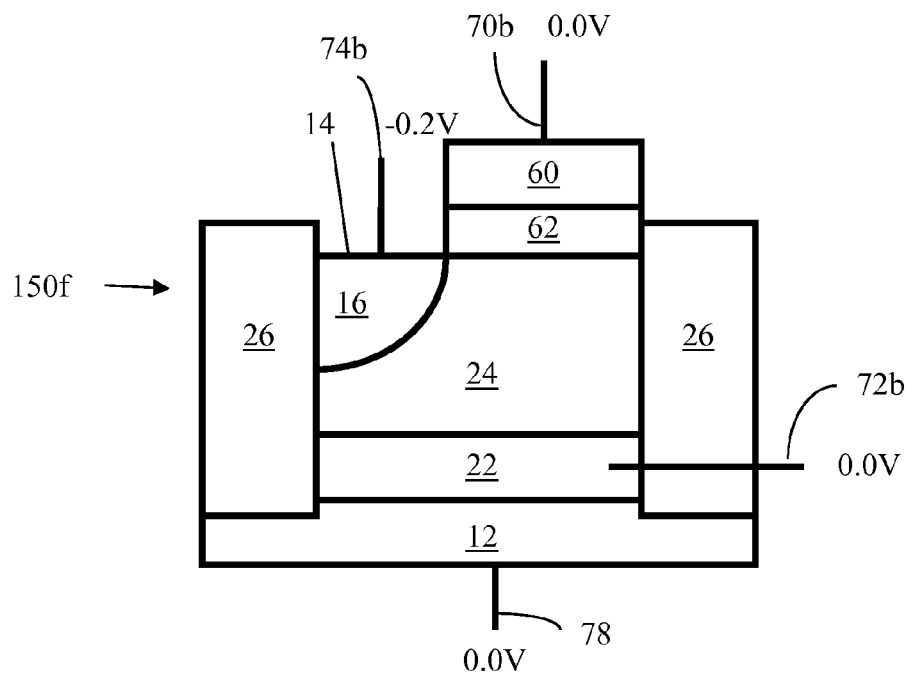
Figure 32L:
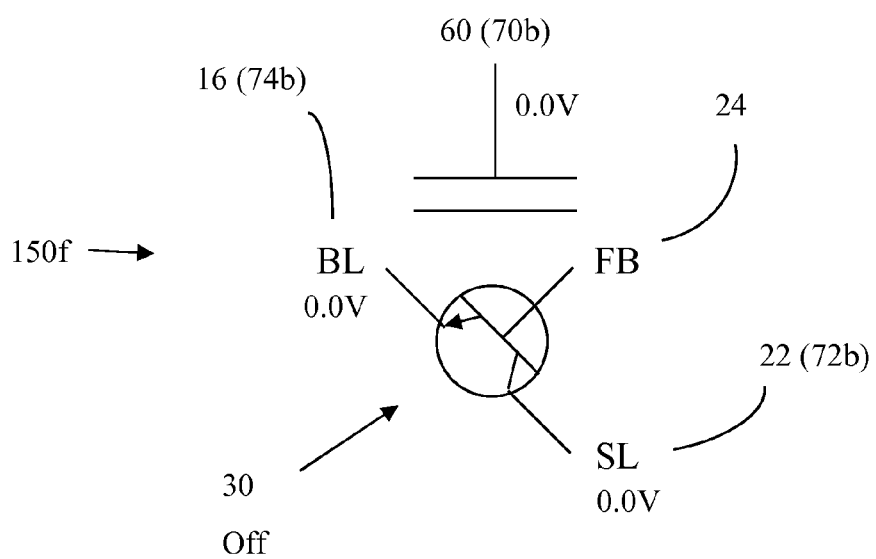
Figure 32M:
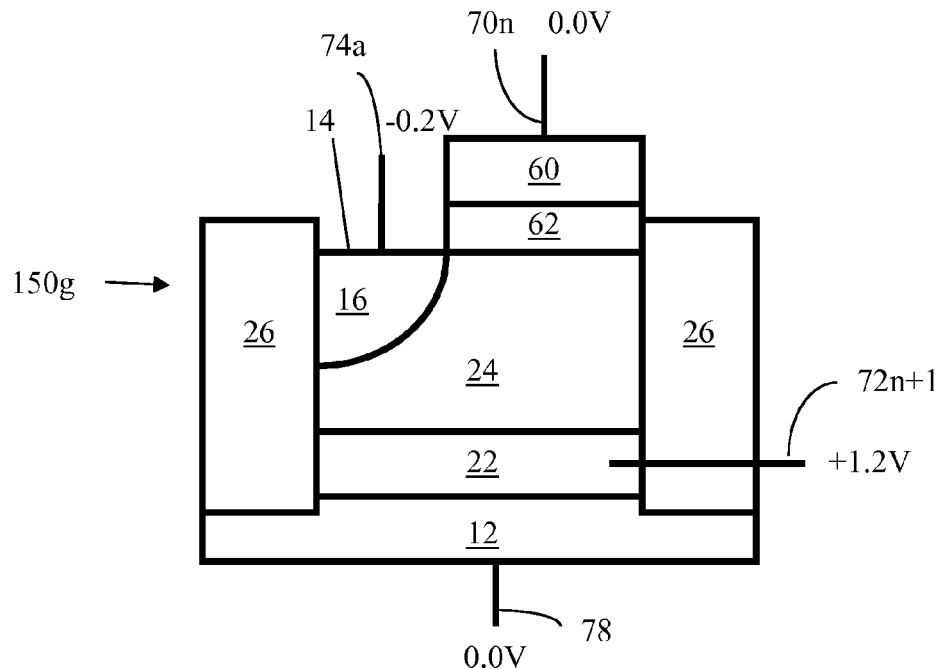
Figure 32N:
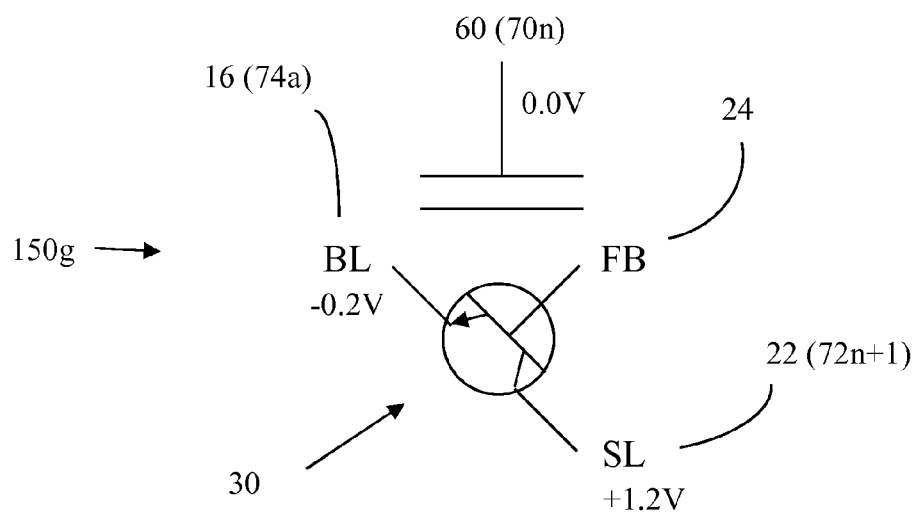
Figure 32O:
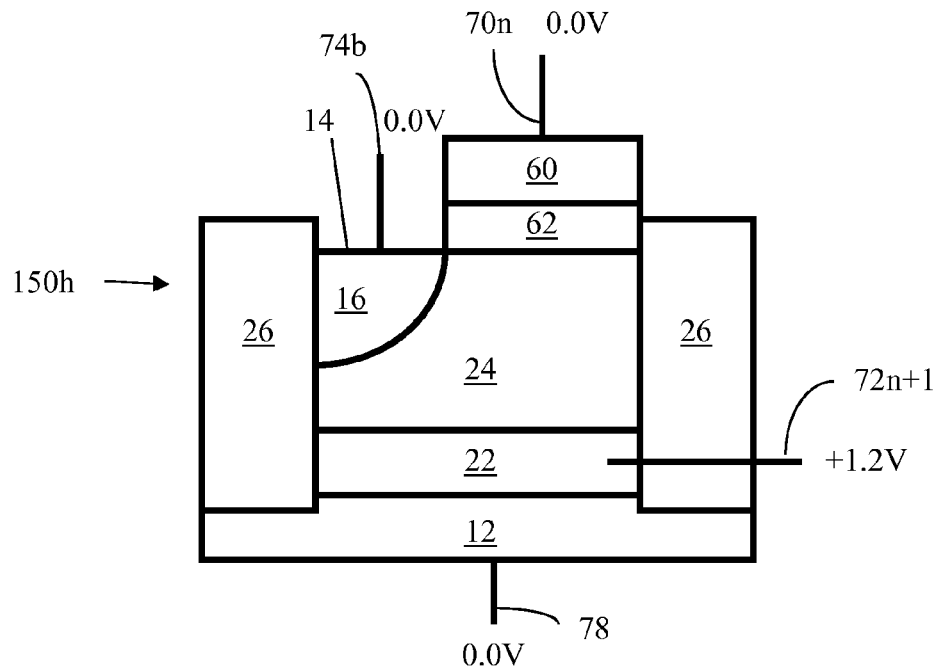
Figure 32P:
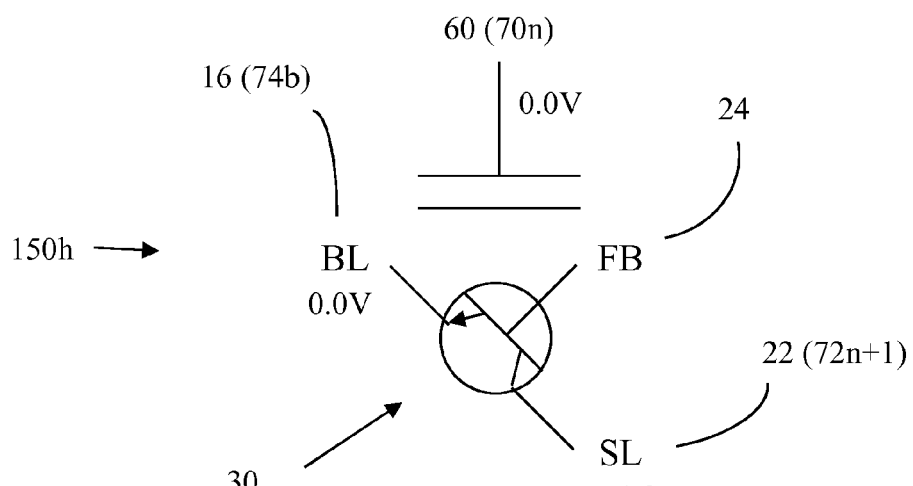

As illustrated in FIGS. 31 and 32A through 32P, a single cell write logic-0 operation that allows for individual bit writing can be performed by applying a positive voltage to WL terminal 70, a negative voltage to BL terminal 74, zero or positive voltage to SL terminal 72, and zero voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between floating body 24 and bit line region 16 is forward-biased, evacuating any holes from the floating body 24. To reduce undesired write logic-0 disturb to other memory cells 150 in the memory array 180, the applied potential can be optimized as follows: if the floating body 24 potential of state logic-1 is referred to $V_{FB1}$, then the voltage applied to the WL terminal 70 is configured to increase the floating body 24 potential by $V_{FB1}/2$ while $-V_{FB1}/2$ is applied to BL terminal 74.

In one particular non-limiting embodiment, the following bias conditions are applied to the selected memory cell 150a: a potential of about 0.0 volts to SL terminal 72b, a potential of about −0.2 volts to BL terminal 74a, a potential of about +0.5 volts is applied to WL terminal 70a, and about 0.0 volts is applied to substrate terminals 78a through 78n+1; while about +1.2 volts is applied to unselected SL terminals 72a and 72c (not shown) through 72n+1, about 0.0 volts is applied to unselected BL terminals 74b through 74p, and about 0.0 volts is applied to unselected WL terminals 70b through 70n. FIG. 31 shows the bias condition for the selected and unselected memory cells 150 in memory array 180. However, these voltage levels are exemplary only may vary substantially from embodiment to embodiment as a matter of design choice and processing technology node used, and are in no way limiting.

The bias conditions of the selected representative memory cell 150a under write logic-0 operation are further elaborated and are shown in FIGS. 32A through 32B. As discussed above, the potential difference between floating body 24 and bit line region 16 (connected to BL terminal 74a) is now increased, resulting in a higher forward bias current than the base hole current generated by the n-p-n bipolar devices 30 formed by buried well region 22, floating body 24, and bit line region 16. The net result is that holes will be evacuated from floating body 24.

The unselected memory cells 150 during write logic-0 operations are shown in FIGS. 32C through 32P: The bias conditions for memory cell 150b sharing the same WL terminal 70a and BL terminal 74a but not the same SL terminal 72 as the selected memory cell 150a are shown in FIGS. 32C through 32D. The bias conditions for memory cell 150c sharing the same SL terminal 72b and BL terminal 74a but not the same WL terminal 70 as the selected memory cell 150a are shown in FIGS. 32E through 32F. The bias conditions for memory cell 150d sharing the same WL terminal 70a and SL terminal 72b but not the same BL terminal 74 as the selected memory cell 150 are shown in FIGS. 32G through 32H. FIGS. 32I through 32J show the bias conditions for memory cell 150e sharing the same WL terminal 70a but not the same SL terminal 72 nor BL terminal 74 as the selected memory cell 150a. FIGS. 32K through 32L show the bias conditions for memory cell 150f sharing the same SL terminal 72b but not the same WL terminal 70 nor BL terminal 74 as the selected memory cell 150a. The bias conditions for memory cells sharing the same BL terminal 74a as the selected memory cell 150a but not the same WL terminal 70 nor SL terminal 72 (e.g. memory cell 150g) are shown in FIGS. 32M through 32N, while the bias condition for memory cells not sharing the same WL, SL, and BL terminals 70, 72, and 74 respectively as the selected memory cell 150a (e.g. memory cell 150h) is shown in FIG. 32O through 32P.

The floating body 24 potential of memory cells sharing the WL terminal 70 as the selected memory cell will increase due to capacitive coupling from WL terminal 70 by AVFB. For memory cells in state logic-0, the increase in the floating body 24 potential is not sustainable as the forward bias current of the p-n diodes formed by floating body 24 and junction 16 will evacuate holes from floating body 24. As a result, the floating body 24 potential will return to the initial state logic-0 equilibrium potential. For memory cells in state logic-1, the floating body 24 potential will initially also increase by $\Delta V_{FB}$, which will result in holes being evacuated from floating body 24. After the positive bias on the WL terminal 70 is removed, the floating body 24 potential will decrease by $\Delta V_{FB}$. If the initial floating body 24 potential of state logic-1 is referred to as $V_{FB1}$, the floating body 24 potential after the write logic-0 operation will become $V_{FB1} - \Delta V_{FB}$. Therefore, the WL potential needs to be optimized such that the decrease in floating body potential of memory cells 50 in state logic-1 is not too large. For example, the maximum floating body potential due to the coupling from the WL potential cannot exceed $V_{FB1}/2$.

As shown in FIGS. 32C through 32D, for unselected representative memory cell 150b sharing the same WL terminal 70a and BL terminal 74a but not the same SL terminal 72 as the selected memory cell 150a, a negative bias is applied to the BL terminal while the SL terminal is positively biased. The potential difference between the BL and SL terminals (i.e. the emitter and collector terminals of the bipolar device 30) is greater compared to the memory cells in the holding mode. As a result, the forward bias current of the p-n diode formed by floating body 24 and bit line region 16 is balanced by higher base current of the bipolar device 30. As a result, memory cell 150b will still be at holding mode. Thus, when memory cell 150b is in state logic-1 it will maintain the charge in floating body 24 because the intrinsic bipolar device 30 will generate holes current to replenish the charge in floating body 24, and when memory cell 150b is in state logic-0 the bipolar device 30 will remain off leaving the floating body 24 charge level a in neutral state.

As shown in FIGS. 32E through 32F, for unselected representative memory cell 150c sharing the same SL terminal 72b and BL terminal 74A but not the same WL terminal 70 as the selected memory cell 150a, the SL terminal 72 is now grounded with the BL terminal now negatively biased. As a result, the p-n diode formed between floating body 24 and bit line region 16 will be forward biased. For memory cells in state logic-0, the increase in the floating body 24 potential will not change the initial state logic-0 as there is initially no hole stored in the floating body 24. For memory cells in state logic-1, the net effect is that the floating body 24 potential after write logic-0 operation will be reduced. Therefore, the BL potential also needs to be optimized such that the decrease in floating body potential of memory cells 50 in state logic-1 is not too large. For example, the $-V_{FB1}/2$ is applied to the BL terminal 74. For memory cells in the logic-0 state, the bipolar device 30 remains off leaving the cell in the logic-0 state.

As shown in FIGS. 32G through 32H, for unselected representative memory cell 150d sharing the same WL terminal 70a and SL terminal 72b but not the same BL terminal 74 as the selected memory cell 150a, both the SL terminal 72 and BL terminal 74 are now grounded. As a result, there is no potential difference between the emitter and collector terminals of the n-p-n bipolar device 30 and consequently memory cells 150d is no longer in holding mode. However, because write operation is accomplished much faster (in the order of nanoseconds) compared to the lifetime of the charge in the floating body 24 (in the order of milliseconds), it should cause little disruptions to the charge stored in the floating body.

As shown in FIGS. 32I through 32J, for unselected representative memory cell 150e sharing the same WL terminal 70a but not the same SL terminal 72 nor BL terminal 74 as the selected memory cell 150a, the SL terminal is positively biased. As a result, memory cell 150e will still be at holding mode, where memory cells in state logic-1 will maintain the charge in floating body 24 because the intrinsic bipolar device 30 will generate holes current to replenish the charge in floating body 24, while memory cells in state logic-0 will remain in neutral state.

As shown in FIGS. 32K through 32L, for unselected representative memory cell 150f sharing the same SL terminal 72b but not the same WL terminal 70 nor BL terminal 74 as the selected memory cell 150a, both the SL terminal 72 and BL terminal 74 are grounded. As a result, there is no potential difference between the emitter and collector terminals of the n-p-n bipolar device 30 and consequently memory cells 150f is no longer in holding mode. However, because write operation is accomplished much faster (in the order of nanoseconds) compared to the lifetime of the charge in the floating body 24 (in the order of milliseconds), it should cause little disruptions to the charge stored in the floating body.

As shown in FIGS. 32M through 32N, for unselected representative memory cell 150g sharing the same BL terminal 74a but not the same WL terminal 70 nor SL terminal 72, a negative bias is applied to the BL terminal while the SL terminal remains positively biased. The potential difference between the BL and SL terminals (i.e. the emitter and collector terminals of the bipolar device 30) is greater compared to the memory cells in the holding mode. As a result, the forward bias current of the p-n diode formed by floating body 24 and bit line region 16 is balanced by higher base current of the bipolar device 30. As a result, memory cell 150g will still be at holding mode. Thus memory cells in state logic-1 will maintain the charge in floating body 24 because the intrinsic bipolar device 30 will generate hole current to replenish the charge in floating body 24, while memory cells in state logic-0 will remain in neutral state.

As shown in FIGS. 32O through 32P, for unselected representative memory cell 150h not sharing WL, BL, and SL terminals 70, 74, and 72 respectively as the selected memory cell 150a, both the SL terminal 72 will remain positively charged and the BL terminal will remain grounded. As can be seen, these cells will be at holding mode, where memory cells in state logic-1 will maintain the charge in floating body 24 because the intrinsic bipolar device 30 will generate holes current to replenish the charge in floating body 24, while memory cells in state logic-0 will remain in neutral state.

Several different types of a write logic-0 operation have been described as examples illustrating the present invention. While exemplary voltage levels have been given, the actual voltages used in practice may vary substantially from embodiment to embodiment as a matter of design choice and processing technology node used, and are in no way limiting.

A write logic-1 operation can be performed on memory cell 150 by means of impact ionization as described for example with reference to Lin cited above, or by means of a band-to-band tunneling (GIDL) mechanism, as described for example with reference to Yoshida cited above.

Figure 33:
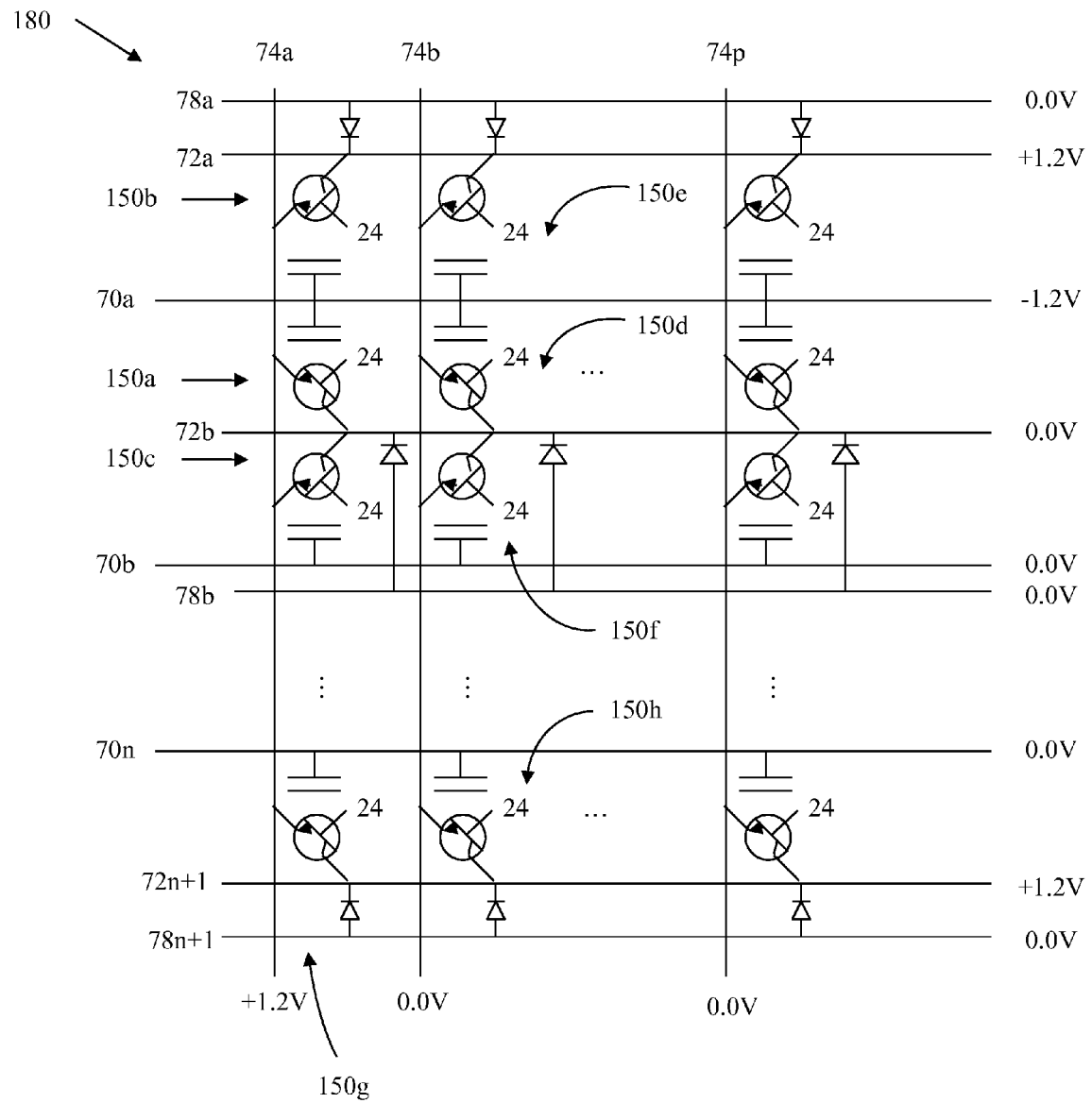
FIG. 33 illustrates a single memory cell write logic-1 operation on the memory array of FIG. 25A.

Illustrated in FIG. 33, is an example of the bias condition of the selected memory cell 150a in memory array 180 under a band-to-band tunneling (GIDL) write logic-1 operation. The negative bias applied to the WL terminal 70a and the positive bias applied to the BL terminal 74a of the selected representative memory cell 150a result in hole injection to the floating body 24 of the selected memory cell 150 as discussed above with reference to Yoshida. The SL terminal 72 and the substrate terminal 78 are grounded during the write logic-1 operation.

Figure 34A:
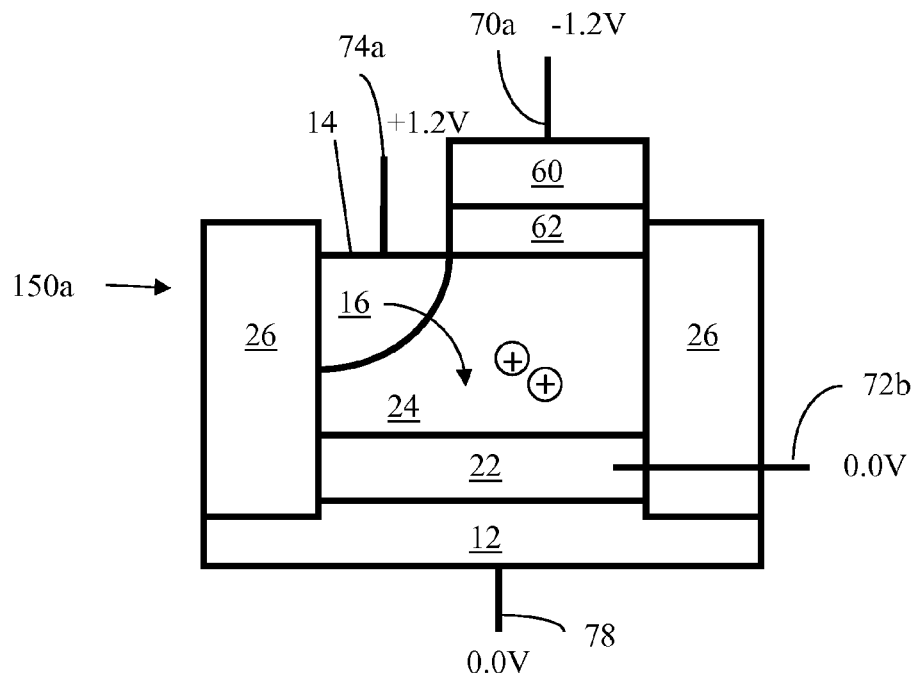
FIGS. 34A through 34P illustrate the operation of eight representative memory cells of the array of FIG. 33.
Figure 34B:
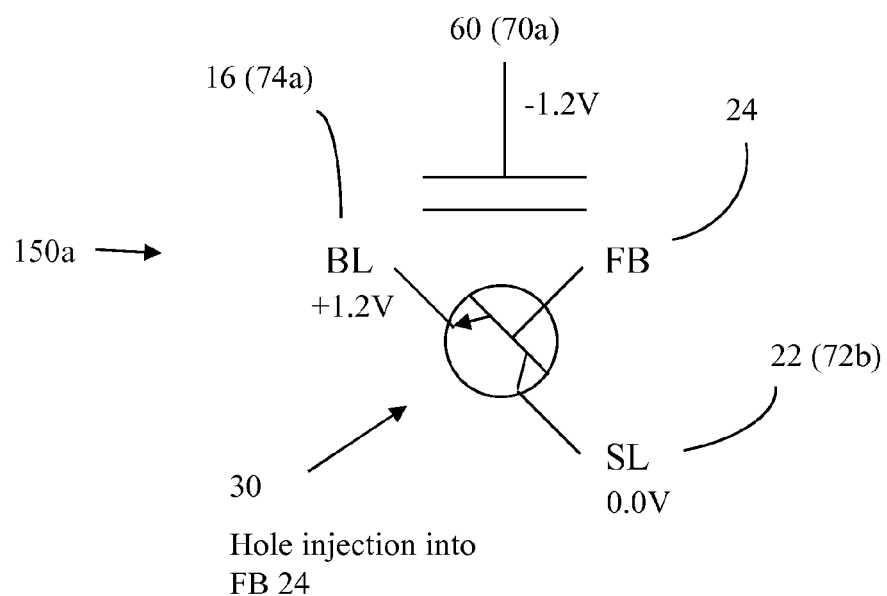

As further illustrated in FIGS. 34A and 34B, in one particular non-limiting embodiment, the following bias conditions are applied to the selected memory cell 150a: a potential of about 0.0 volts is applied to SL terminal 72b, a potential of about +1.2 volts is applied to BL terminal 74a, a potential of about −1.2 volts is applied to WL terminal 70a, and about 0.0 volts is applied to substrate terminal 78 (not shown in FIG. 34B). This bias condition bends the energy bands upward in the portion of bit line region 16 near the gate 60 in selected representative memory cell 150a creating GIDL current on the bit line (electrons) while injecting holes into the floating body 24 charging it up to a logic-1 level.

Also shown in FIG. 33, the following bias conditions are applied to the unselected terminals: about +1.2 volts is applied to unselected SL terminals 72a and 72c (not shown) through 72n+1, about 0.0 volts is applied to unselected BL terminals 74b through 74p, a potential of about 0.0 volts is applied to unselected WL terminals 70b through 70n+1, and about 0.0 volts is applied to substrate terminals 78a through 78n+1.

Figure 34C:
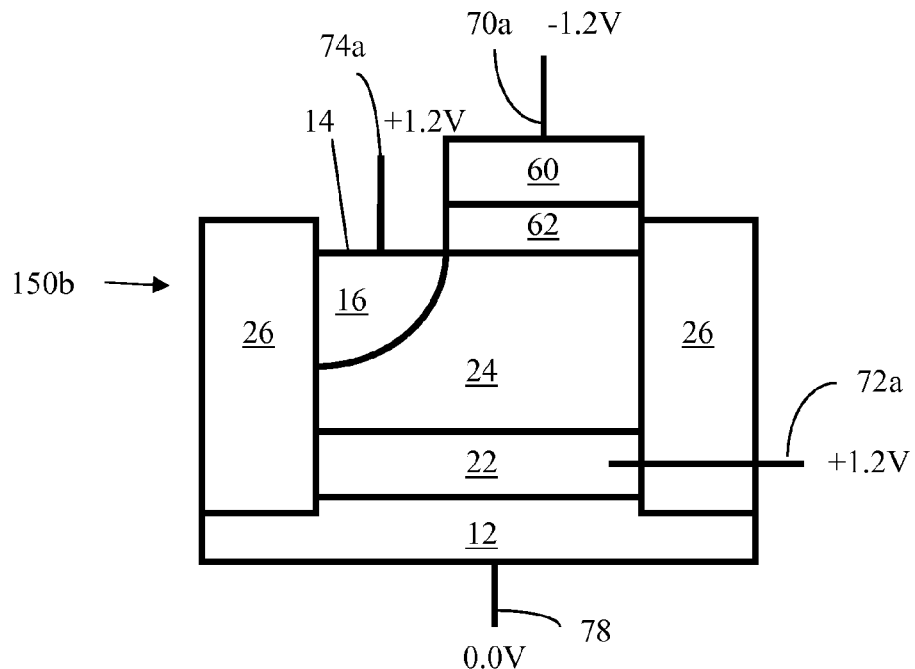
Figure 34D:
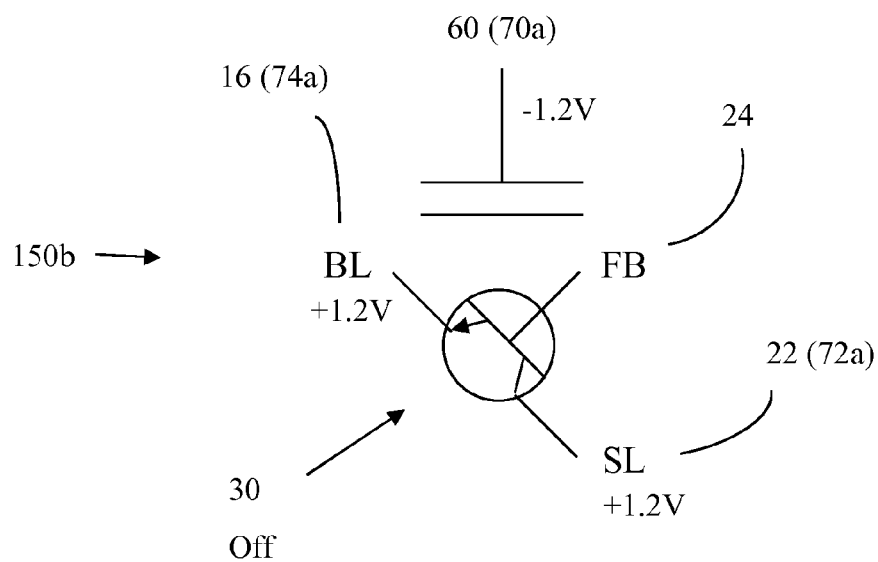
Figure 34E:
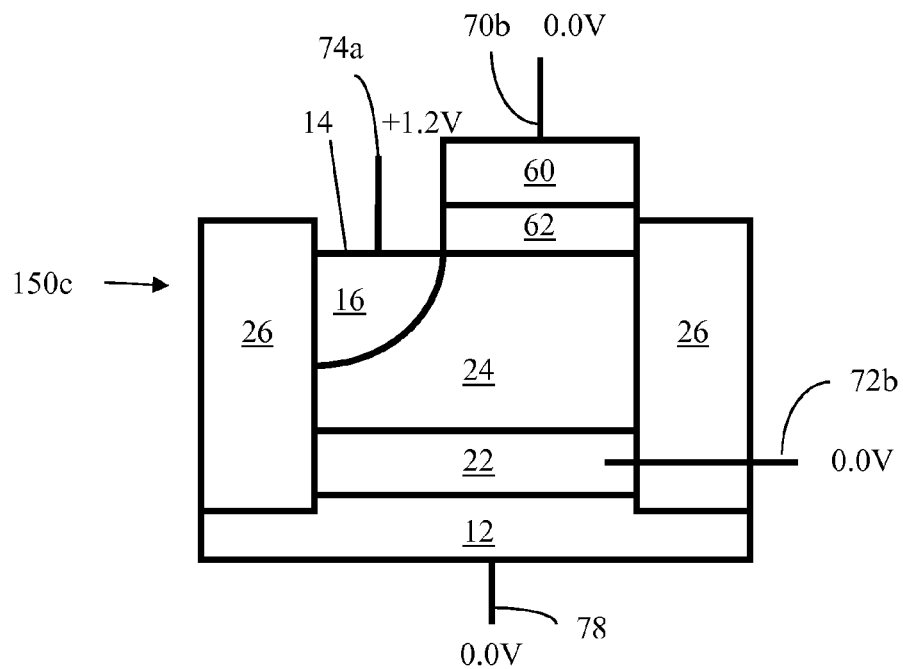
Figure 34F:
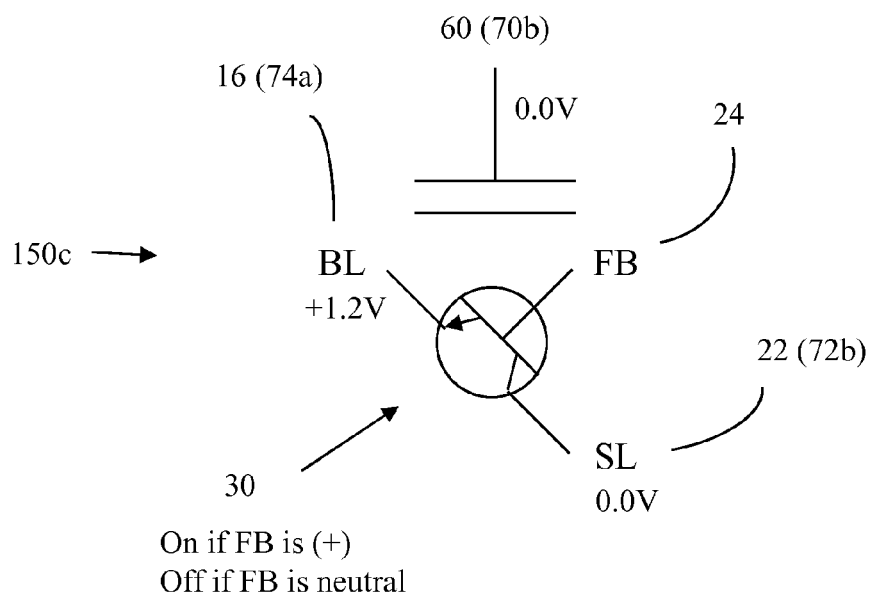
Figure 34G:
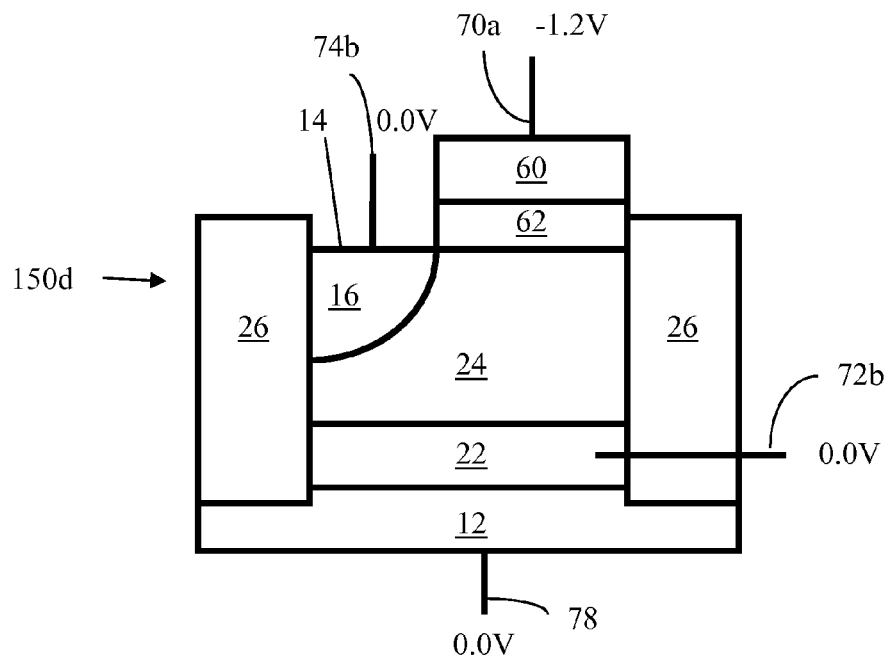
Figure 34H:
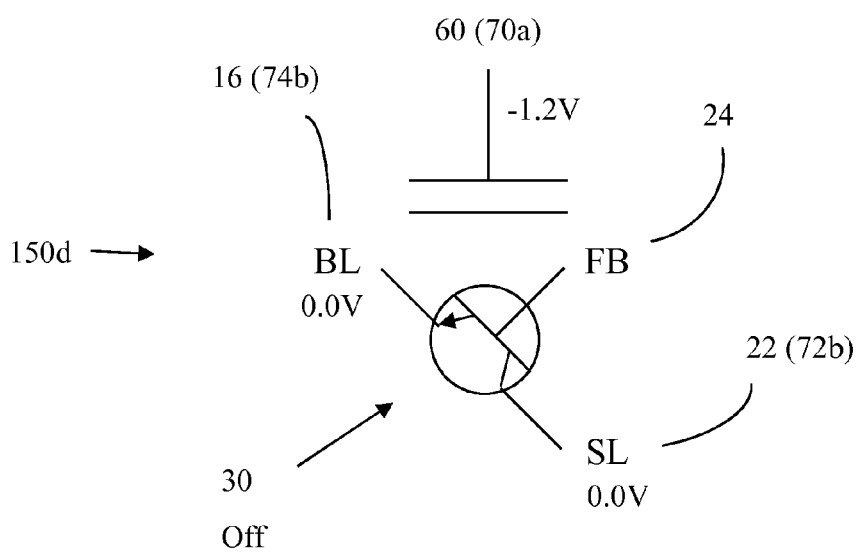
Figure 34I:
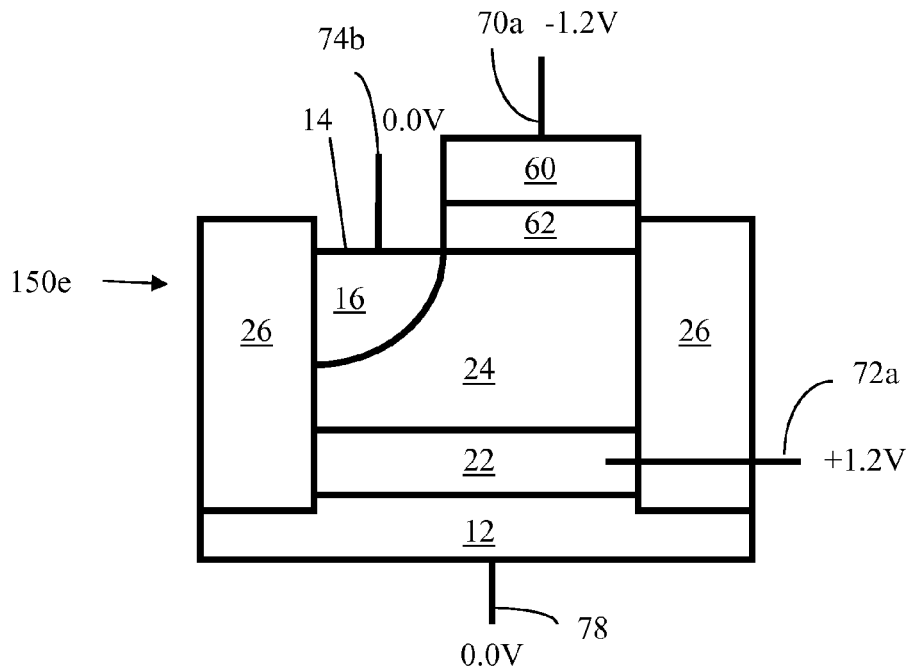
Figure 34J:
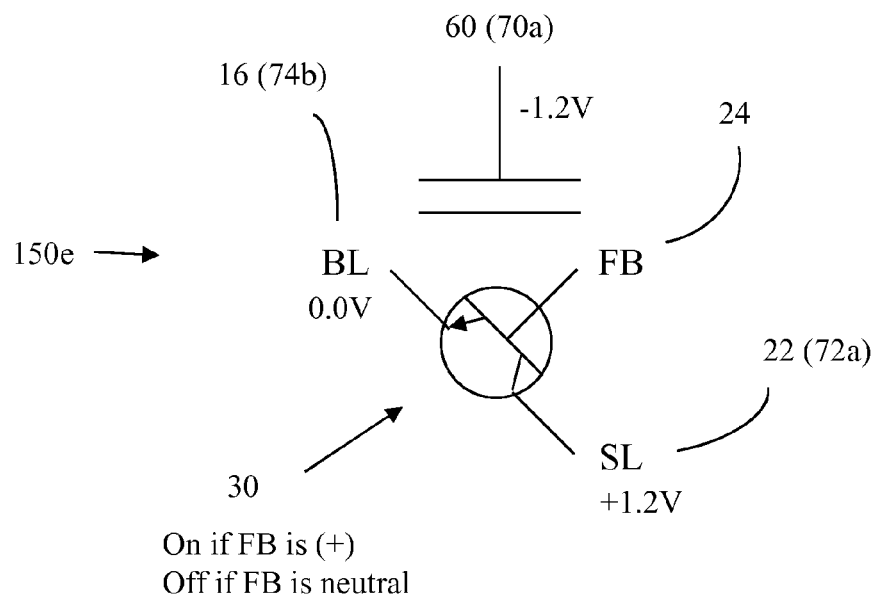
Figure 34K:
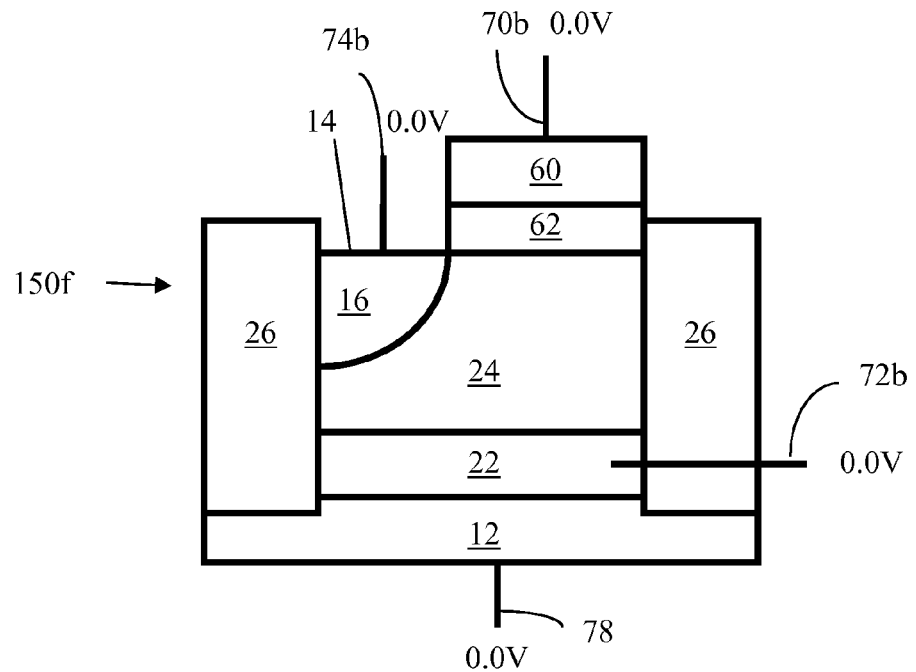
Figure 34L:
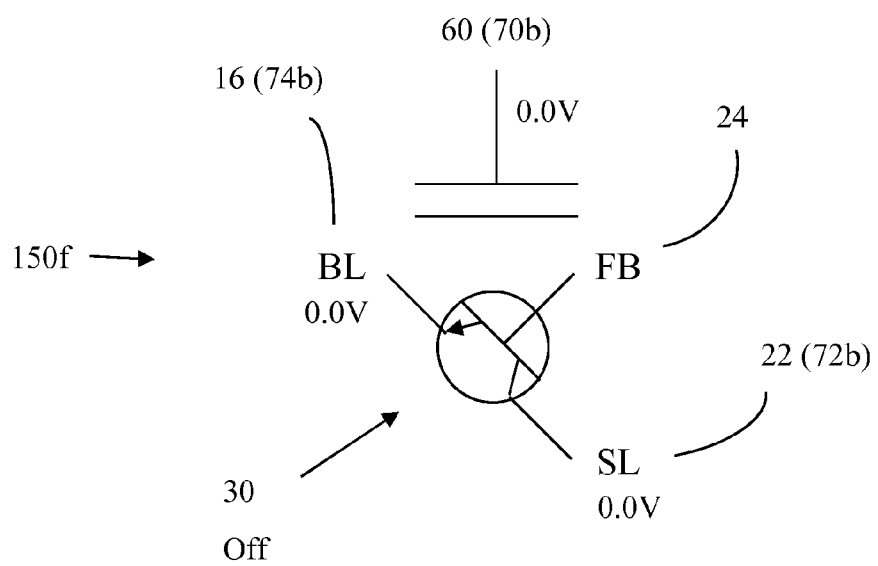
Figure 34M:
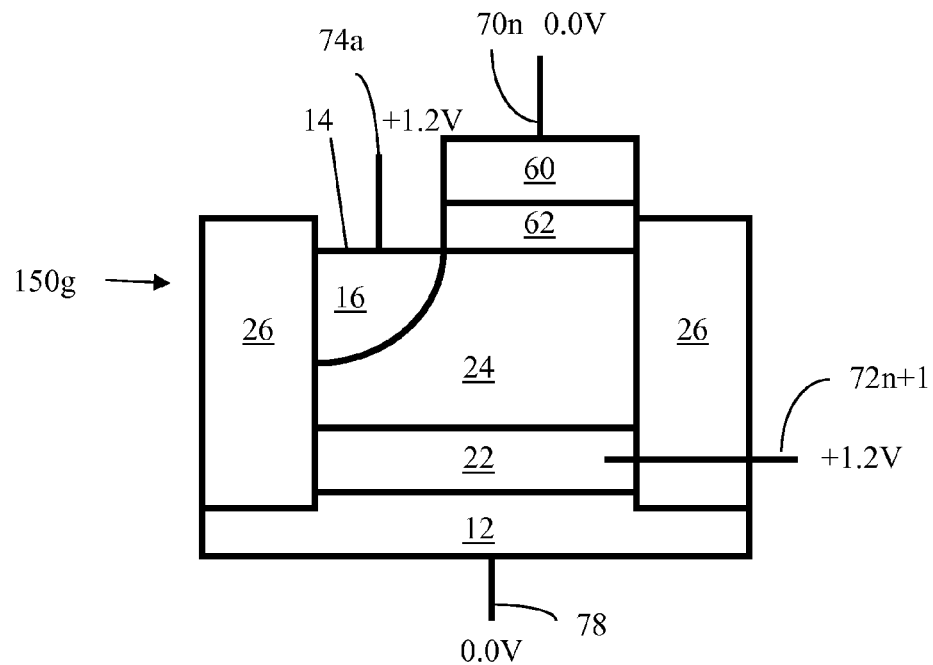
Figure 34N:
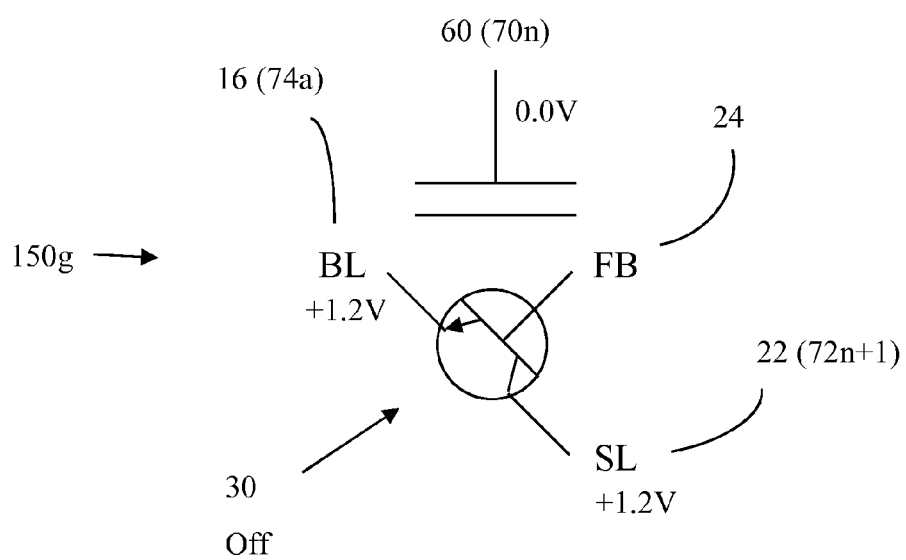
Figure 34O:
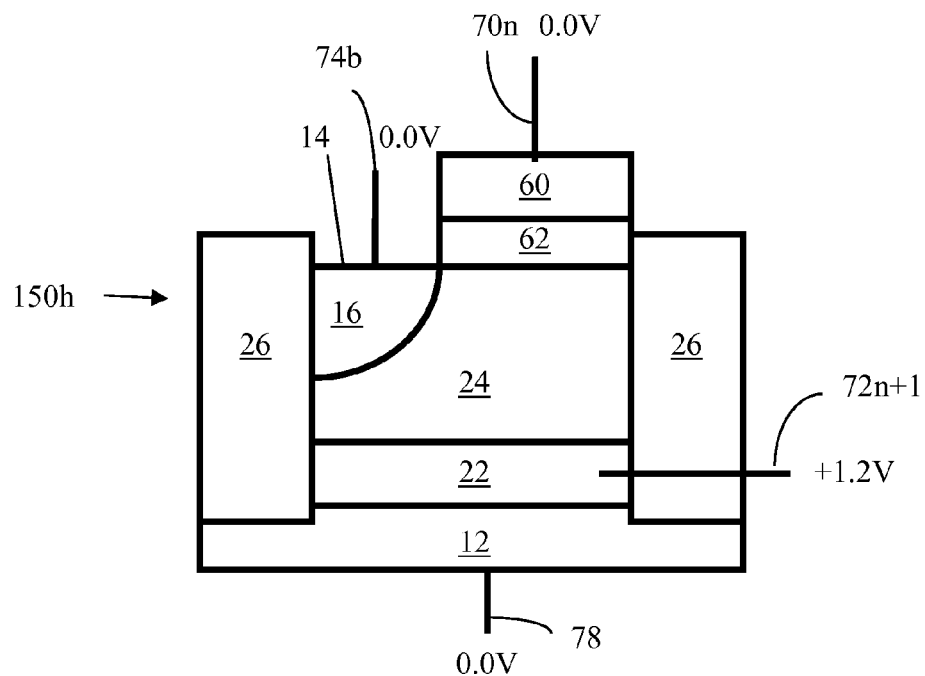
Figure 34P:
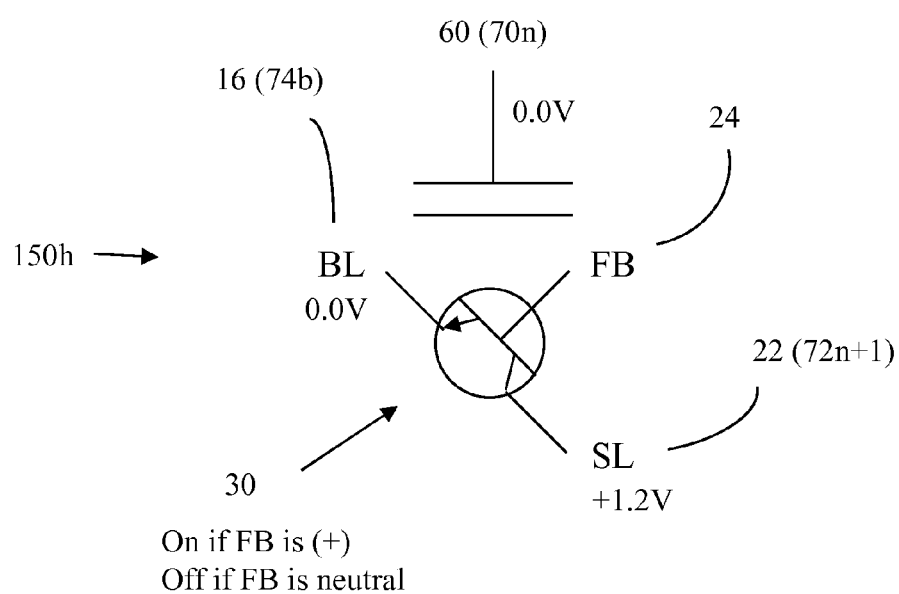

The unselected memory cells during write logic-1 operations are shown in FIGS. 34C through 34O: The bias conditions for memory cell 150b sharing the same WL terminal 70a and BL terminal 74a but not the same SL terminal 72 as the selected memory cell 150a are shown in FIGS. 34C through 34D. The bias conditions for memory cell 150c sharing the same SL terminal 72b and BL terminal 74a but not the same WL terminal 70 as the selected memory cell 150a are shown in FIGS. 34E through 34F. The bias conditions for memory cell 150d sharing the same WL terminal 70a and SL terminal 72b but not the same BL terminal 74 as the selected memory cell 150a are shown in FIGS. 34G through 34H. FIGS. 34I through 34J show the bias conditions for memory cell 150e sharing the same WL terminal 70a but not the same SL terminal 72 nor BL terminal 74 as the selected memory cell 150a. FIGS. 34K through 34L show the bias conditions for memory cell 150f sharing the same SL terminal 72b but not the same WL terminal 70 nor BL terminal 74 as the selected memory cell 150a. The bias conditions for memory cells sharing the same BL terminal 74a as the selected memory cell 150a but not the same WL terminal 70 nor SL terminal 72 (e.g. memory cell 150g) are shown in FIGS. 34M through 34N, while the bias condition for memory cells not sharing the WL, SL, and BL terminals 70, 72 and 74 respectively, as the selected memory cell 150a (e.g. memory cell 150h) are shown in FIG. 34O through 34P.

As shown in FIGS. 34C through 34D, for unselected representative memory cell 150b sharing the same WL terminal 70a and BL terminal 74a but not the same SL terminal 72 as the selected memory cell 150a, both BL and SL terminals are positively biased. As a result, there is no potential difference between the emitter and collector terminals of the n-p-n bipolar device 30 and consequently memory cell 150b is no longer in holding mode. However, because the write operation is accomplished much faster (on the order of nanoseconds) compared to the lifetime of the charge in the floating body 24 (on the order of milliseconds), it should cause little disruption to the charge stored in the floating body.

As shown in FIGS. 34E through 34F, for unselected representative memory cell 150c sharing the same SL terminal 72b and BL terminal 74a but not the same WL terminal 70 as the selected memory cell 150a, the SL terminal 72 is now grounded with the BL terminal now positively biased. As a result, memory cell 150c will be in a holding mode, where memory cells in state logic-1 will maintain the charge in floating body 24 because the intrinsic bipolar device 30 will generate hole current to replenish the charge in floating body 24 and memory cells in state logic-0 will remain in the neutral state.

As shown in FIGS. 34G through 34H, for unselected representative memory cell 150d sharing the same WL terminal 70a and SL terminal 72b but not the same BL terminal 74 as the selected memory cell 150a, both the SL terminal 72 and BL terminal 74 are now grounded. As a result, there is no potential difference between the emitter and collector terminals of the n-p-n bipolar device 30 and consequently memory cell 150d is not in a holding mode. However, because the write operation is accomplished much faster (on the order of nanoseconds) compared to the lifetime of the charge in the floating body 24 (on the order of milliseconds), it should cause little disruption to the charge stored in the floating body.

As shown in FIGS. 34I through 34J, for unselected representative memory cell 150e sharing the same WL terminal 70a but not the same SL terminal 72 nor BL terminal 74 as the selected memory cell 150a, the SL terminal remains positively biased. As a result, memory cell 150e will still be in a holding mode, where memory cells in state logic-1 will maintain the charge in floating body 24 because the intrinsic bipolar device 30 will generate holes current to replenish the charge in floating body 24, and while memory cells in state logic-0 will remain in a neutral state.

As shown in FIGS. 34K through 34L, for unselected representative memory cell 150*f* sharing the same SL terminal 72*b* but not the same WL terminal 70 nor BL terminal 74 as the selected memory cell 150*a*, both the SL terminal 72 and BL terminal 74 are now grounded. As a result, there is no potential difference between the emitter and collector terminals of the n-p-n bipolar device 30 and consequently memory cell 150*f* is no longer in a holding mode. However, because the write operation is accomplished much faster (on the order of nanoseconds) compared to the lifetime of the charge in the floating body 24 (on the order of milliseconds), it should cause little disruption to the charge stored in the floating body.

As shown in FIGS. 34M through 34N, for unselected representative memory cell 150*g* sharing the same BL terminal 74*a* but not the same WL terminal 70 nor SL terminal 72, a positive bias is applied to the BL terminal and the SL terminal. As a result, there is no potential difference between the emitter and collector terminals of the n-p-n bipolar device 30 and consequently memory cell 150*g* is no longer in a holding mode. However, because write operation is accomplished much faster (on the order of nanoseconds) compared to the lifetime of the charge in the floating body 24 (on the order of milliseconds), it should cause little disruption to the charge stored in the floating body.

As shown in FIGS. 34O through 34P, for unselected representative memory cell 150*h* not sharing WL, BL, and SL terminals 70, 74 and 72 respectively as the selected memory cell, the SL terminal 72*n*+1 will remain positively charged and the BL terminal 74*b* and the WL terminal 70*n* are grounded. As can be seen, memory cell 150*h* will be at holding mode, where memory cells in state logic-1 will maintain the charge in floating body 24 because the intrinsic bipolar device 30 will generate hole current to replenish the charge in floating body 24, while memory cells in state logic-0 will remain in the neutral state.

Figure 35:
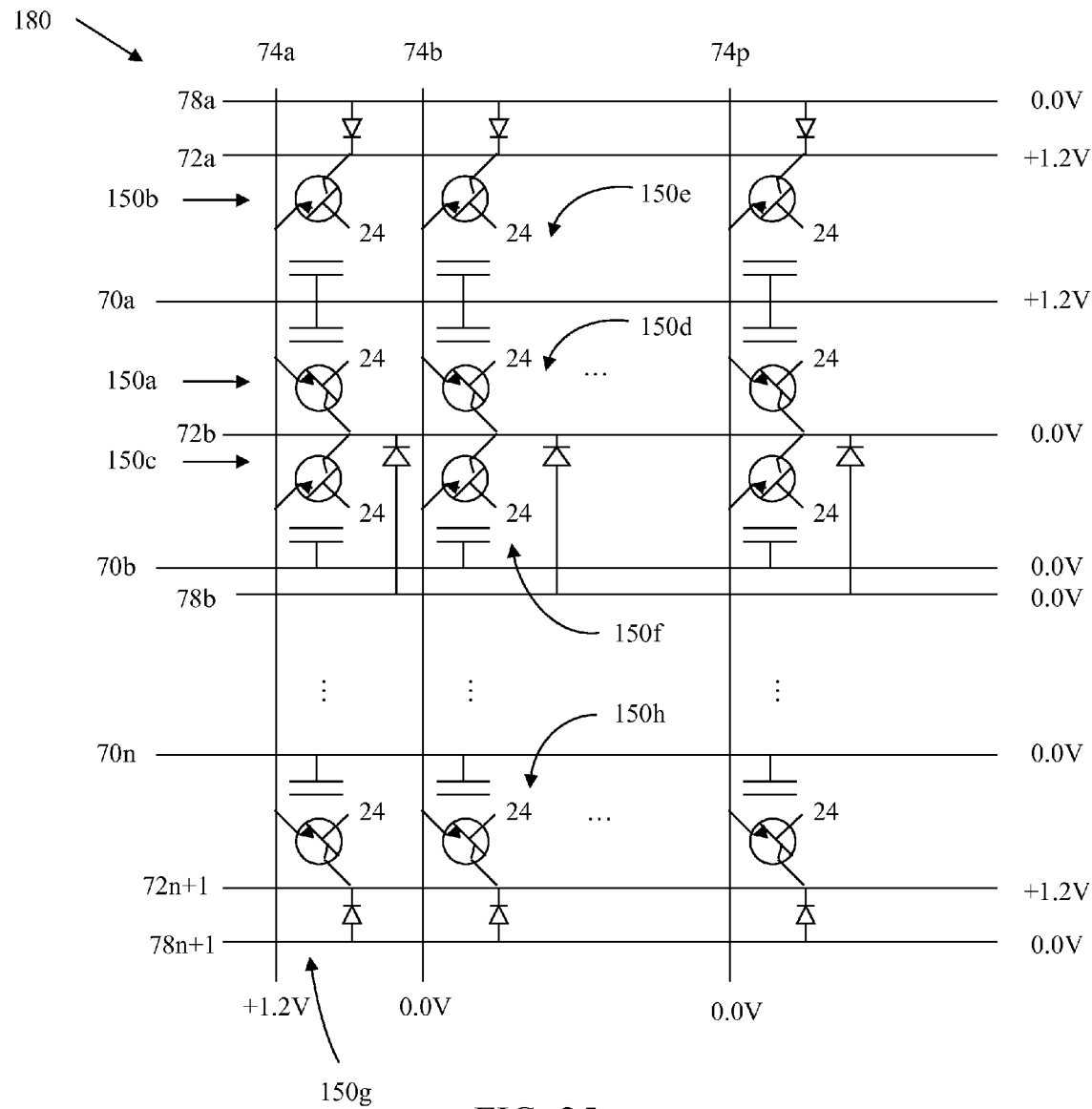
FIG. 35 illustrates an alternate single memory cell write logic-1 operation on the memory array of FIG. 25A.

Illustrated in FIG. 35, is an example of the bias condition of the selected memory cell 150*a* in memory array 180 under an impact ionization write logic-1 operation. The positive bias applied to the WL terminal 70*a* and the positive bias applied to the BL terminal 74*a* of the selected representative memory cell 150*a* results in hole injection to the floating body 24 of the selected memory cell 150 as discussed above with reference to Lin cited above. The SL terminal 72*b* and the substrate terminals 78*a* through 78*n*+1 are grounded during the write logic-1 operation.

As further illustrated in FIG. 35, in one particular non-limiting embodiment, the following bias conditions are applied to the selected memory cell 150*a*: a potential of about 0.0 volts is applied to SL terminal 72*b*, a potential of about +1.2 volts is applied to BL terminal 74*a*, a potential of about +1.2 volts is applied to WL terminal 70*a*, and about 0.0 volts is applied to substrate terminals 78*a* through 78*n*+1. This bias condition causes selected representative memory cell 150*a* to conduct current due to the impact ionization mechanism discussed with reference to Lin cited above. The combination of +1.2V on word line terminal and +1.2V on bit line terminal 74*a* turns on the bipolar device 30 in representative memory cell 150*a* regardless of its prior logic state and generating sufficient hole charge in its floating body 24 to place it in the logic-1 state.

Also shown in FIG. 35, the following bias conditions are applied to the unselected terminals: about +1.2 volts is applied to unselected SL terminals 72*a* and 72*c* (not shown) through 72*n*+1, about 0.0 volts is applied to unselected BL terminals 74*b* through 74*p*, a potential of about 0.0 volts is applied to unselected WL terminals 70*b* through 70*n*+1, and about 0.0 volts is applied to substrate terminals 78*a* through 78*n*+1.

For unselected representative memory cell 150*b* sharing the same WL terminal 70*a* and BL terminal 74*a* but not the same SL terminal 72 as the selected memory cell 150*a*, both BL and SL terminals are positively biased. As a result, there is no potential difference between the emitter and collector terminals of the n-p-n bipolar device 30 and consequently memory cell 150*b* is no longer in a holding mode. However, because the write operation is accomplished much faster (in the order of nanoseconds) compared to the lifetime of the charge in the floating body 24 (in the order of milliseconds), it should cause little disruption to the charge stored in the floating body.

For unselected representative memory cell 150*c* sharing the same SL terminal 72*b* and BL terminal 74*a* but not the same WL terminal 70 as the selected memory cell 150*a*, the SL terminal 72*b* is now grounded with the BL terminal now positively biased. As a result, memory cell 150*c* will be in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 150*d* sharing the same WL terminal 70*a* and SL terminal 72*b* but not the same BL terminal 74 as the selected memory cell 150*a*, both the SL terminal 72 and BL terminal 74 are now grounded. As a result, there is no potential difference between the emitter and collector terminals of the n-p-n bipolar device 30 and consequently memory cell 150*d* is not in a holding mode. However, because the write operation is accomplished much faster (in the order of nanoseconds) compared to the lifetime of the charge in the floating body 24 (in the order of milliseconds), it should cause little disruption to the charge stored in the floating body.

For unselected representative memory cell 150*e* sharing the same WL terminal 70*a* but not the same SL terminal 72 nor BL terminal 74 as the selected memory cell 150*a*, the SL terminal remains positively biased. As a result, memory cell 150*e* will still be in a holding mode, where memory cells in state logic-1 will maintain the charge in floating body 24 because the intrinsic bipolar device 30 will generate holes current to replenish the charge in floating body 24, and while memory cells in state logic-0 will remain in a neutral state. There is a possible write disturb issue with memory cell 150*e* in this case which will be discussed in more detail below in conjunction with FIGS. 36A through 36B.

For unselected representative memory cell 150*f* sharing the same SL terminal 72*b* but not the same WL terminal 70 nor BL terminal 74 as the selected memory cell 150*a*, both the SL terminal 72 and BL terminal 74 are now grounded. As a result, there is no potential difference between the emitter and collector terminals of the n-p-n bipolar device 30 and consequently memory cell 150*f* is no longer in a holding mode. However, because the write operation is accomplished much faster (in the order of nanoseconds) compared to the lifetime of the charge in the floating body 24 (in the order of milliseconds), it should cause little disruption to the charge stored in the floating body.

For unselected representative memory cell 150*g* sharing the same BL terminal 74*a* but not the same WL terminal 70 nor SL terminal 72, a positive bias is applied to the BL terminal 74*a* and the SL terminal 72*n*+1. As a result, there is no potential difference between the emitter and collector terminals of the n-p-n bipolar device 30 and consequently memory cell 150g is no longer in a holding mode. However, because the write operation is accomplished much faster (in the order of nanoseconds) compared to the lifetime of the charge in the floating body 24 (in the order of milliseconds), it should cause little disruption to the charge stored in the floating body.

For unselected representative memory cell 150h not sharing WL, BL, and SL terminals 70, 74 and 72 respectively as the selected memory cell 150a, the SL terminal 72n+1 will remain positively charged and the BL terminal 74b and the WL terminal 70n are grounded. As can be seen, memory cell 150h will be at holding mode, where memory cells in state logic-1 will maintain the charge in floating body 24 because the intrinsic bipolar device 30 will generate holes current to replenish the charge in floating body 24; while memory cells in state logic-0 will remain in neutral state.

Figure 36A:
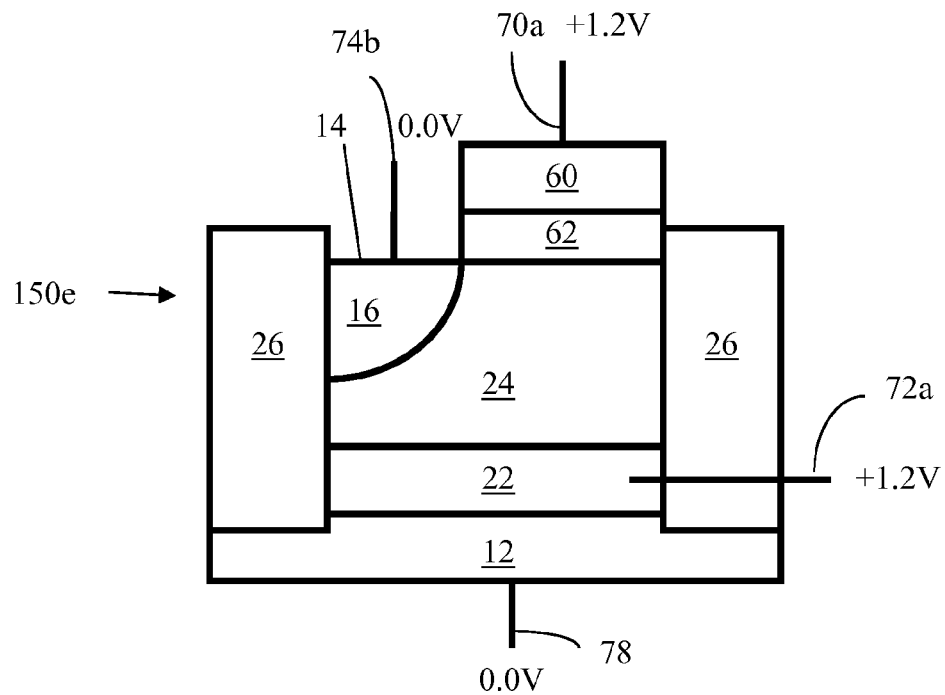
FIGS. 36A through 36B illustrates a possible write disturb condition resulting from the single memory cell write logic-1 operation of FIG. 35.
Figure 36B:
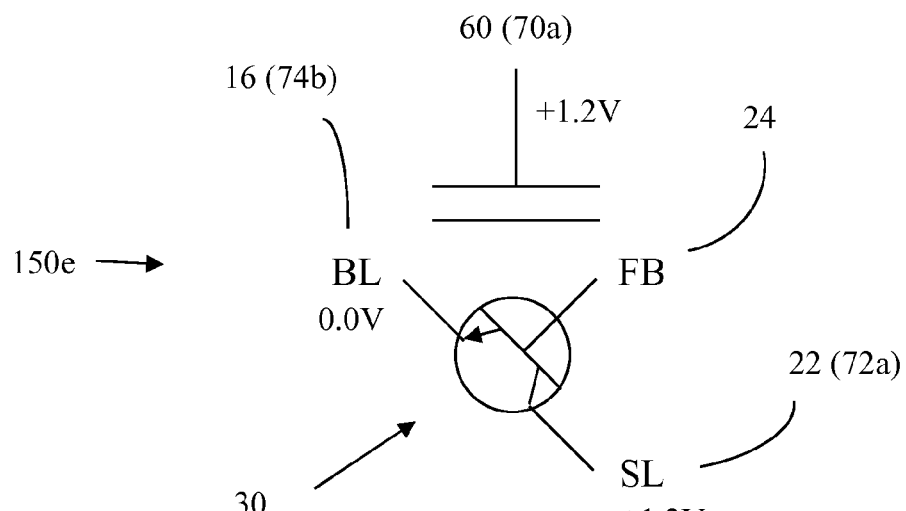

FIGS. 36A and 36B illustrate the bias conditions of representative memory cell 150e under the bias conditions shown in FIG. 35. Memory cell 150e is coupled to word line terminal 70a biased at +1.2V, bit line terminal 74b biased at 0.0V, and source line terminal 72a biased at +1.2V. The concern is that the floating body region 24 of memory cell 150e boosted by capacitive coupling from word line 70a while having 1.2 volts of bias across it—albeit of the opposite voltage potential of selected representative memory cell 150a. If bipolar device 30 were to turn on under these conditions, a write disturb condition (writing an unwanted logic-1 in an unselected memory cell) would occur with a logic-1 being written into unselected memory cell 150e.

One solution to the write disturb in representative memory cell 150e is to design memory cell 150 such that the impact ionization is less efficient at generating charge carriers when the source line terminal 72 is positively biased than it is in the case when the bit line terminal 74 is positively biased using techniques known in the art. This creates enough current to place representative memory cell 150e in a holding mode while generating a larger current sufficient for writing a logic-1 in memory cell 150a.

Figure 37:
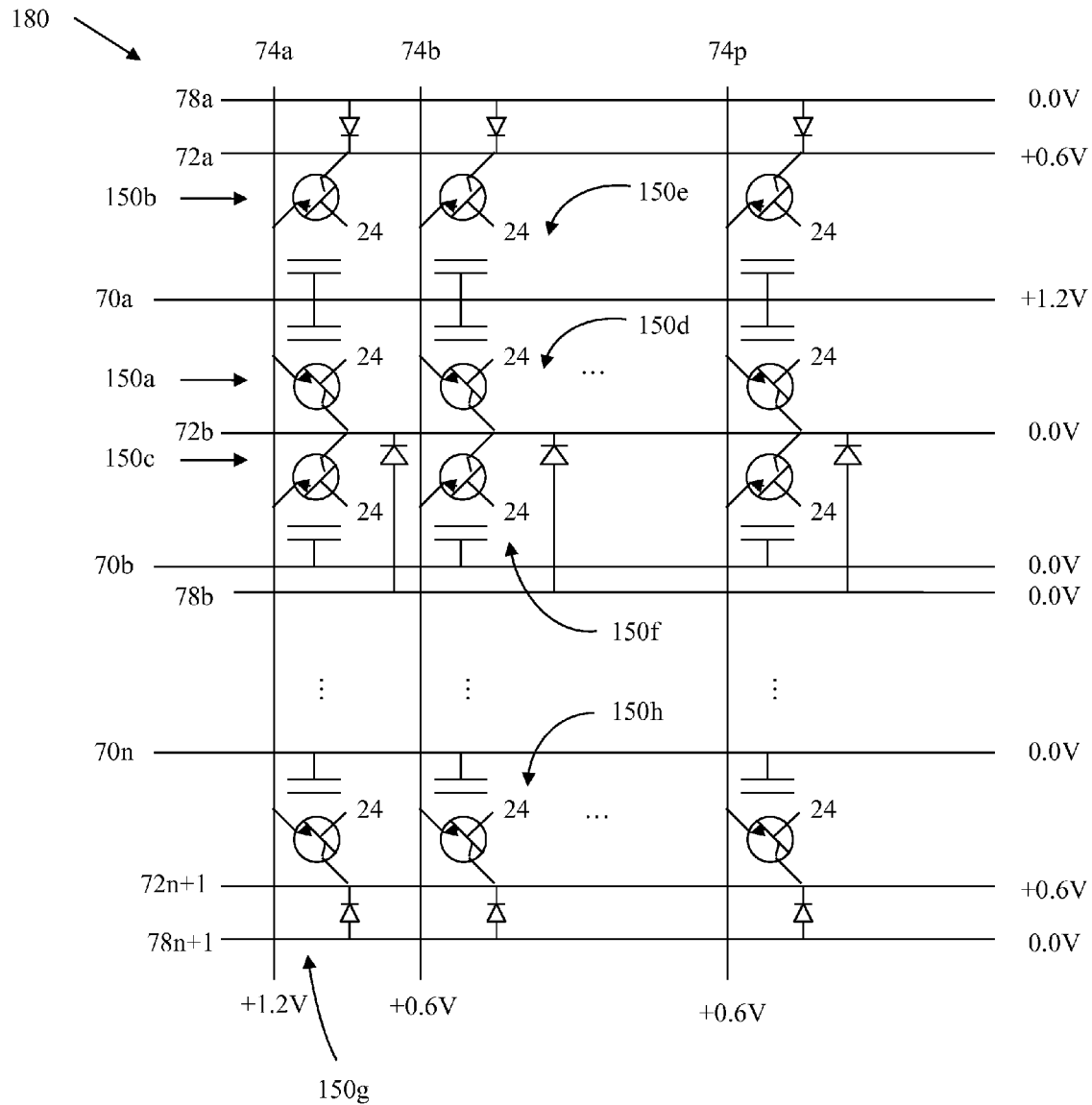
FIG. 37 illustrates another alternate single memory cell write logic-1 operation on the memory array of FIG. 25A.

Alternatively, a different set of bias conditions may be used as illustrated in FIG. 37 which shows another example of writing logic-1 into selected memory cell 150a in memory array 180 using impact ionization. As in FIG. 35, the positive bias applied to the WL terminal 70a and the positive bias applied to the BL terminal 74a of the selected representative memory cell 150a results in hole injection to the floating body 24 of the selected memory cell 150 as discussed above with reference to Lin cited above. The SL terminal 72b and the substrate terminals 78a through 78n+1 are grounded during the write logic-1 operation. The difference in this write logic-1 operation are the bias conditions of the unselected bit lines 74b through 74p and the unselected source lines 72a and 72c (not shown) through 72n+1.

As further illustrated in FIG. 37, in one particular non-limiting embodiment, the following bias conditions are applied to the selected memory cell 150a: a potential of about 0.0 volts is applied to SL terminal 72b, a potential of about +1.2 volts is applied to BL terminal 74a, a potential of about +1.2 volts is applied to WL terminal 70a, and about 0.0 volts is applied to substrate terminals 78a through 78n+1. This bias condition causes selected representative memory cell 150a to conduct current due to the impact ionization mechanism discussed with reference to Lin cited above. The combination of +1.2V on word line terminal and +1.2V on bit line terminal 74a turns on the bipolar device 30 in representative memory cell 150a regardless of its prior logic state and generating sufficient hole charge in its floating body 24 to place it in the logic-1 state.

Also shown in FIG. 37, the following bias conditions are applied to the unselected terminals: about +0.6 volts is applied to unselected SL terminals 72a and 72c (not shown) through 72n+1, about +0.6 volts is applied to unselected BL terminals 74b through 74p, a potential of about 0.0 volts is applied to unselected WL terminals 70b through 70n+1, and about 0.0 volts is applied to substrate terminals 78a through 78n+1.

For unselected representative memory cell 150b sharing the same WL terminal 70a and BL terminal 74a but not the same SL terminal 72 as the selected memory cell 150a, both BL and SL terminals are positively biased with a larger bias applied to the BL than the SL. As a result, bipolar device 30 is on and memory cell 150b is in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 150c sharing the same SL terminal 72b and BL terminal 74a but not the same WL terminal 70 as the selected memory cell 150a, the SL terminal 72b is now grounded with the BL terminal now positively biased. As a result, memory cell 150c will be in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 150d sharing the same WL terminal 70a and SL terminal 72b but not the same BL terminal 74 as the selected memory cell 150a, the SL terminal 72b is now grounded and the BL terminal 74b has a slight positive bias. As a result, memory cell 150d will be in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 150e sharing the same WL terminal 70a but not the same SL terminal 72 nor BL terminal 74 as the selected memory cell 150a, the SL terminal 72a and the BL terminal 74b both have a slight positive bias. As a result, there is no potential difference between the emitter and collector terminals of the n-p-n bipolar device 30 and consequently memory cell 150e is no longer in a holding mode. However, because the write operation is accomplished much faster (in the order of nanoseconds) compared to the lifetime of the charge in the floating body 24 (in the order of milliseconds), it should cause little disruption to the charge stored in the floating body. This also eliminates the potential write disturb condition for representative memory cell 150e present with the bias conditions of FIGS. 35, 36A and 36B.

For unselected representative memory cell 150f sharing the same SL terminal 72b but not the same WL terminal 70 nor BL terminal 74 as the selected memory cell 150a, the SL terminal 72b is grounded and BL terminal 74b has a small positive bias. As a result, memory cell 150f will be in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 150g sharing the same BL terminal 74a but not the same WL terminal 70 nor SL terminal 72, a positive bias is applied to the BL terminal 74a and a smaller positive bias is applied to SL terminal 72n+1. As a result, memory cell 150g will be in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 150h not sharing WL, BL, and SL terminals 70, 74 and 72 respectively as the selected memory cell 150a, the SL terminal 72n+1 and the BL terminal 74b will have a slight positive bias while the WL terminal 70n is grounded. As a result, there is no potential difference between the emitter and collector terminals of the n-p-n bipolar device 30 and consequently memory cell 150e is no longer in a holding mode. However, because the write operation is accomplished much faster (in the order of nanoseconds) compared to the lifetime of the charge in the floating body 24 (in the order of milliseconds), it should cause little disruption to the charge stored in the floating body.

Different structures and methods of operation have been discussed with respect to exemplary memory array 180 comprised of a plurality of memory cells 150. Many other embodiments are possible within the scope of the invention. For example, regions of the first conductivity type may be changed from p-type to n-type and regions of the second conductivity type may be changed from n-type to p-type combined with a reversal of the polarities of the bias voltages for various operations. The bias levels themselves are exemplary only and will vary from embodiment to embodiment as a matter of design choice. Memory array 180 may be altered so that the outside rows share a source line 72 with the adjacent row and have a dedicated word line 70. Many other embodiments will readily suggest themselves to persons skilled in the art, thus the invention is not to be limited in any way except by the appended claims.

It is noteworthy that memory cell 550 constructed using either of the fin structures 52 and 52A described in conjunction with FIGS. 20 through 22B can be used to replace memory cell 150 in memory array 180 with shared word lines with or without shared source lines and will function in a manner similar to that described for memory cell 150. Many other modifications may also made to array 150. For example, the first and second conductivity types may be reversed in either memory cell 150 or memory cell 550 with reversal of the relative polarities of the applied voltages. All of the voltage levels described are exemplary only and will very from embodiment to embodiment as a matter of design choice. Thus the invention is not to be limited in any way.

Figure 38A:
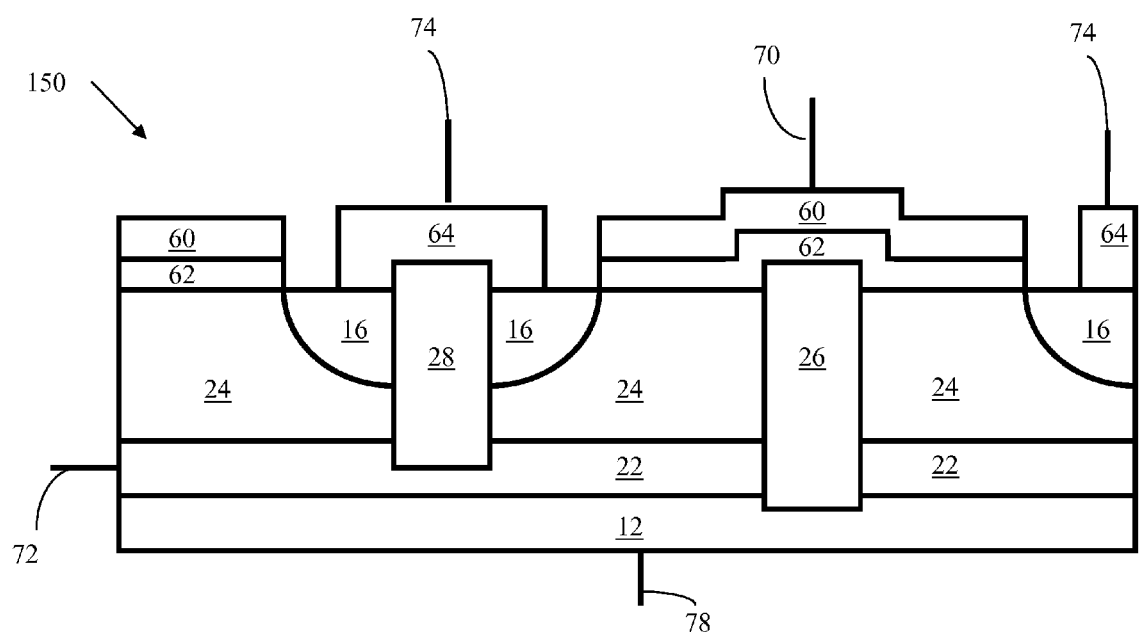
FIGS. 38A and 38B illustrates additional alternate methods of manufacturing a memory cell according to the present invention.

FIG. 38A shows another embodiment of the memory device 150, in which adjacent regions 16, which are separated by insulating layer 28, share a common connection to BL terminal 74 through contact 64. By sharing a common connection to the BL terminal 74, a more compact memory cell can be obtained as only one contact is required for each two memory cells 150.

Figure 38B:
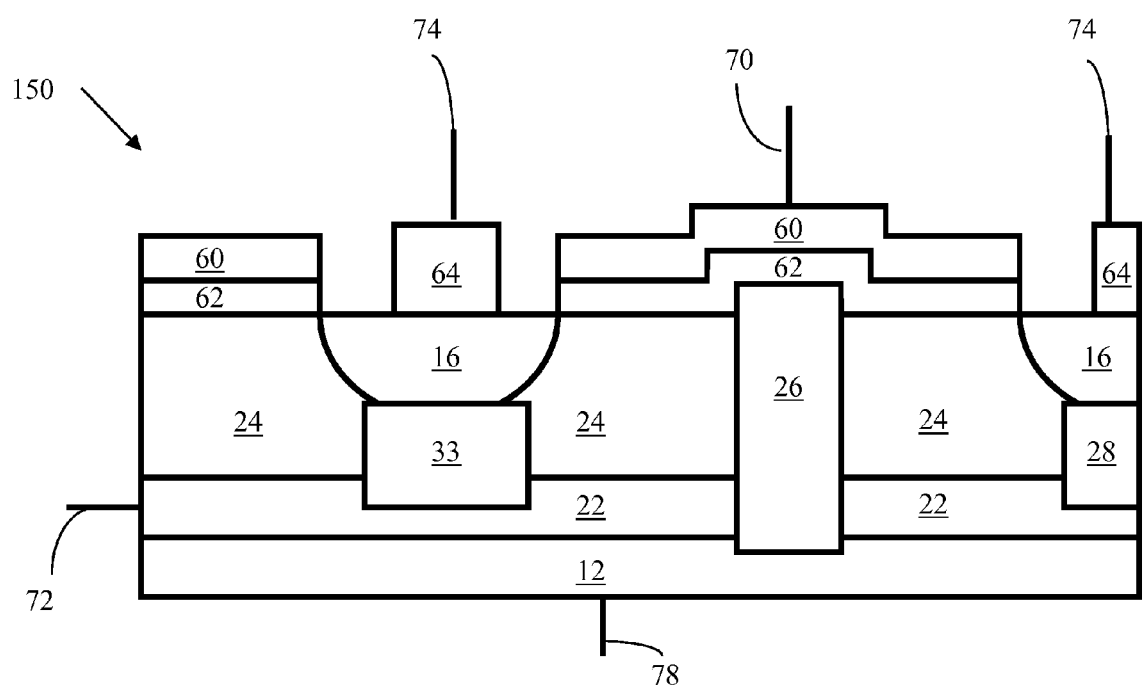

Another embodiment of memory cell 150 is shown in FIG. 38B, where bit line region 16 and contact 64 are now shared between two adjacent memory cells 150. Isolation of the adjacent floating body 24 regions of a first conductivity type is achieved through both insulating region 33 and bit line region 16 of a second conductivity type.

Figure 39G:
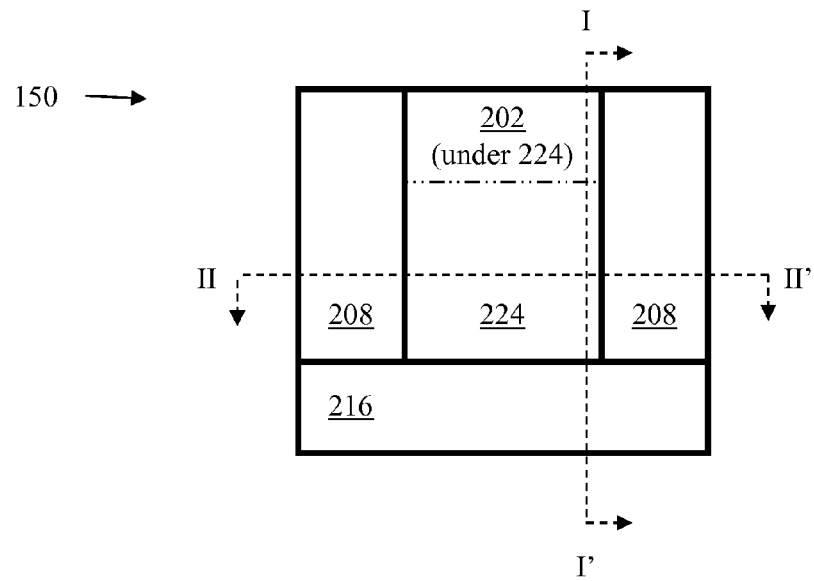
FIGS. 39A through 39AA illustrate a method of manufacturing the memory cell of FIG. 38B.
Figures 39H, 39I:
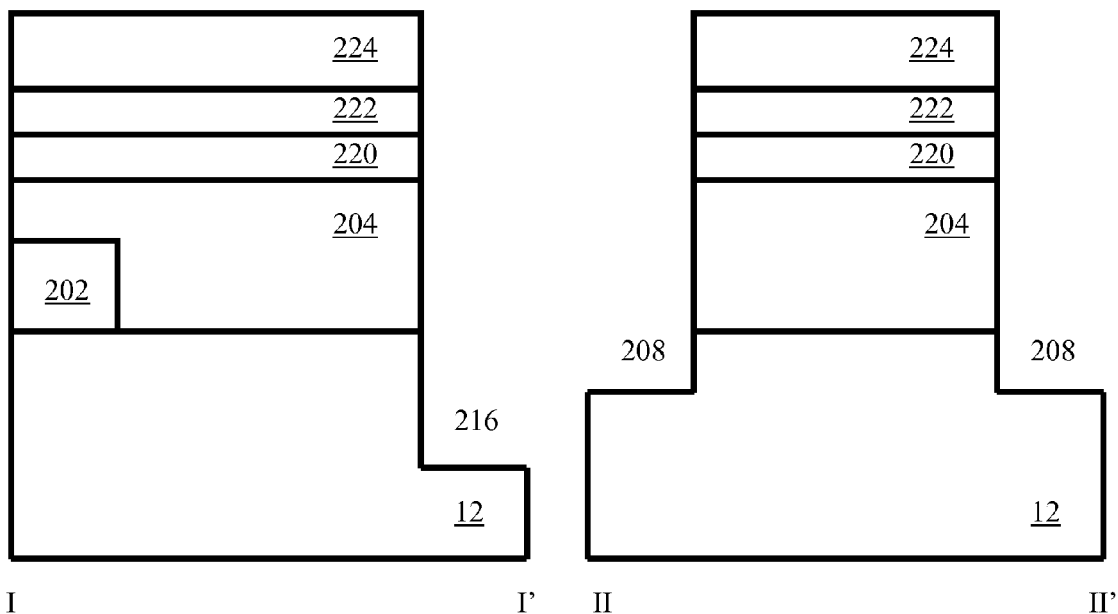
Figure 39M:
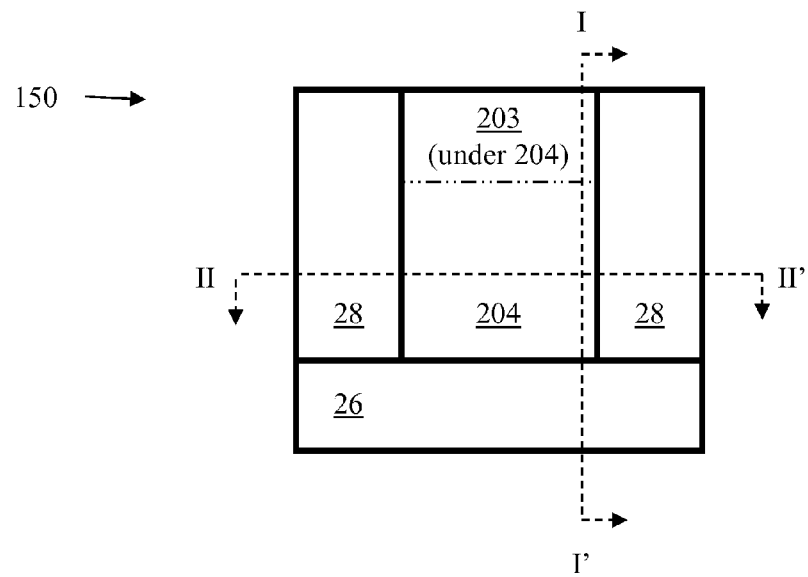
Figures 39N, 39O:
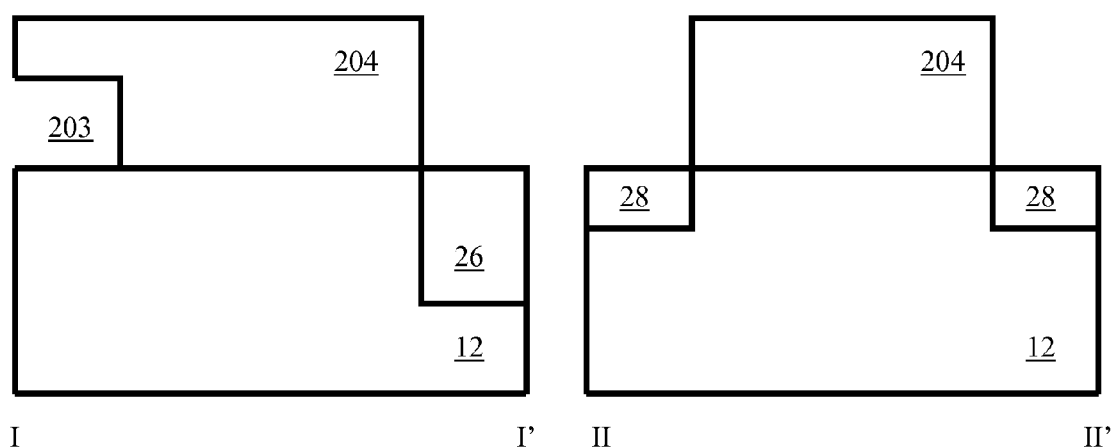

FIGS. 39A through 39O describe a method of manufacturing memory cell 150 as shown in FIG. 38B created using, in part, a replacement insulator technique like that described in S_Kim and Oh discussed above to create insulating region 33.

A method of manufacturing memory cell 150 as shown in FIG. 38B will be described with reference to FIGS. 39A through 39AA. These 27 figures are arranged in groups of three related views, with the first figure of each group being a top view, the second figure of each group being a vertical cross section of the top view in the first figure of the group designated I-I', and the third figure of each group being a horizontal cross section of the top view in the first figure of the group designated II-II'. Thus FIGS. 39A, 39D, 39G, 39J, 39M, 39P, 39S, 39V, and 39Y are a series of top views of the memory cell 50 at various stages in the manufacturing process, FIGS. 39B, 39E, 39H, 39K, 39N, 39Q, 39T, 39W, and 39Z are their respective vertical cross sections labeled I-I', and FIGS. 39C, 39F, 39I, 39L, 39O, 39R, 39U, 39X, and 39AA are their respective horizontal cross sections labeled II-II'. Identical reference numbers from earlier drawing figures appearing in FIGS. 39A through 39AA represent similar, identical, or analogous structures as previously described in conjunction with the earlier drawing figures. Here "vertical" means running up and down the page in the top view diagram and "horizontal" means running left and right on the page in the top view diagram. In the physical embodiment of memory cell 50, both cross sections are "horizontal" with respect to the surface of the semiconductor device.

As illustrated in FIGS. 39A through 39C, a thin conductive region 202 (e.g. 300A in an exemplary 130 nm process, though this will vary with embodiments in different process technologies and geometries) is grown on the surface of substrate 12. The conductive region 202 is comprised of a different material from the materials of the substrate region 12 so that it may be selectively etched away later without simultaneous unwanted etching of substrate 12. For example, the conductive region 202 could be made of silicon germanium (SiGe) material, while substrate 12 could be made of silicon.

As illustrated in FIGS. 39D through 39F, a lithography process is then performed to pattern the conductive region 202. Subsequently, layer 202 is etched, followed by another conductive region 204 growth. As an example, the thickness of region 204 is about 500 A in an exemplary 130 nm process. Region 204 may comprise of the same materials forming substrate 12, for example silicon. A planarization step can then be performed to ensure a planar surface. The resulting structure can be seen in FIGS. 39D through 39F.

As illustrated in FIGS. 39G through 39H, a trench formation process is then performed, which follows a similar sequence of steps as shown in FIGS. 2A through 2I, i.e. formation of silicon oxide 220, polysilicon 222, and silicon nitride 224 layers, followed by lithography patterning and etch processes. Trench 216 is etched such that the trench depth is deeper than that of trench 208. For example, the trench 208 depth is about 1200 A, while the trench 216 depth is about 2000 A in an exemplary 130 nm process. The resulting structures are shown in FIGS. 39G through 39I.

As illustrated in FIGS. 39J through 39L, this is then followed by silicon oxidation step, which will grow silicon oxide films in trench 208 and trench 216. For example, about 4000 A silicon oxide can be grown in an exemplary 130 nm process. A chemical mechanical polishing step can then be performed to polish the resulting silicon oxide films so that the silicon oxide layer is flat relative to the silicon surface. A silicon dry etching step can then be performed so that the remaining silicon oxide layer height is about 300 A from the silicon surface in an exemplary 130 nm process. The silicon nitride layer 224 and the polysilicon layer 222 can then be removed, followed by a wet etch process to remove silicon oxide layer 220 (and a portion of the silicon oxide films formed in the area of former trench 208 and trench 216). FIGS. 39J through 39L show the insulating layers 26 and 28 formed following these steps.

As illustrated in FIGS. 39M through 39O, an oxide etch is then performed to recess the oxide regions 26 and 28 (for example by about 1000 A) to expose the conductive region 202. A wet etch process is then performed to selectively remove region 202 leaving an gap 203 under an overhanging portion of region 204. The resulting structures following these steps are shown in FIGS. 39M through 39O.

Figure 39P:
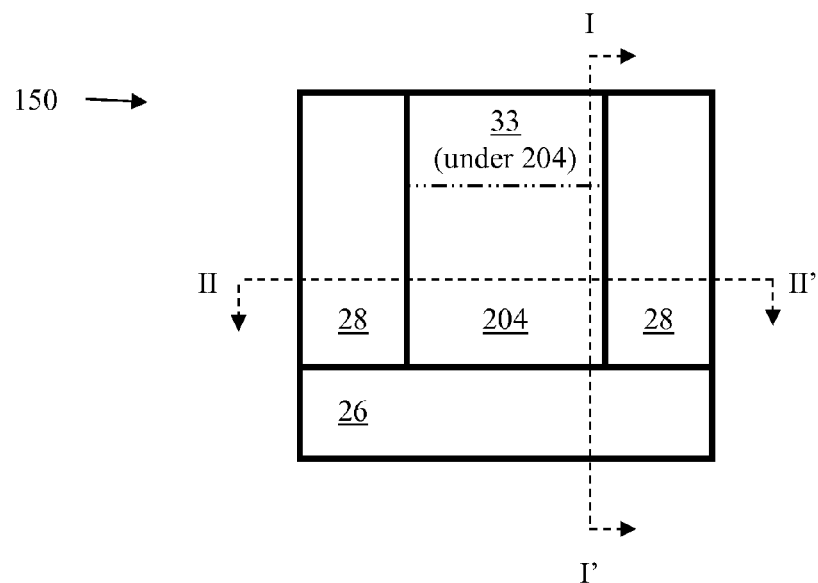
Figures 39Q, 39R:
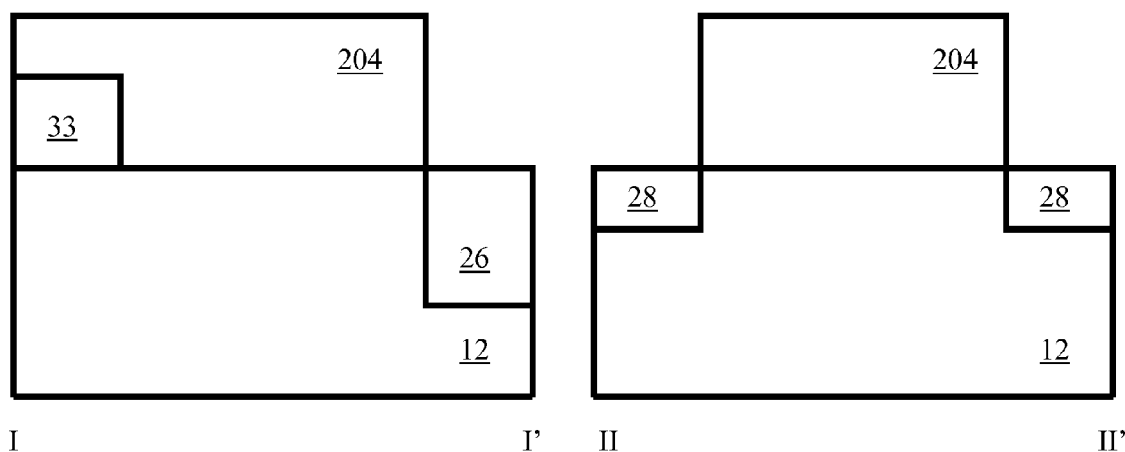

As illustrated in FIGS. 39P through 39R, the resulting gap region 203 is then oxidized to form a buried oxide region 33. Recessing insulating region 26 down to the surface of substrate 12 allows access for the etch of region 202 to form gap 203 and then subsequent oxide growth in gap 203 to form buried oxide region 33. The overhanging portion of region 204 constrains the oxide growth in gap space 203 to keep the buried oxide region 33 from growing to the surface. The resulting structures are shown in FIGS. 39P through 39R.

As illustrated in FIGS. 39S through 39U, an oxide deposition of about 1000 A is then performed followed by a planarization process. This is then followed by an ion implantation step to form the buried well region 22. The ion implantation energy is optimized such that the buried layer region 22 is formed shallower than the bottom of the insulating layer 26. As a result, the insulating layer 26 isolates buried layer region 22 between adjacent cells. On the other hand, the buried layer region 22 is formed such that insulating layers 28 and 33 do not isolate buried layer region 22, allowing buried layer region 22 to be continuous in the direction of II-II' cross section line. Following these steps, the resulting structures are shown in FIGS. 39S through 39U.

Figure 39V:
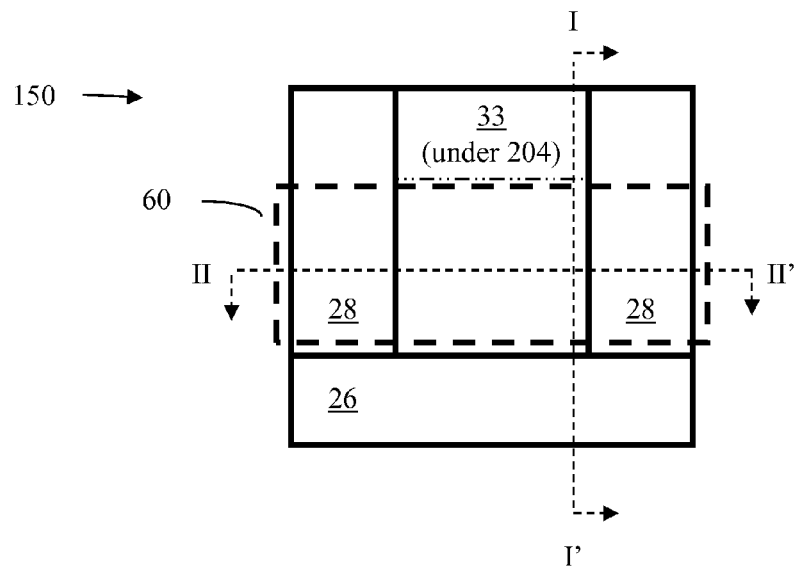
Figures 39W, 39X:
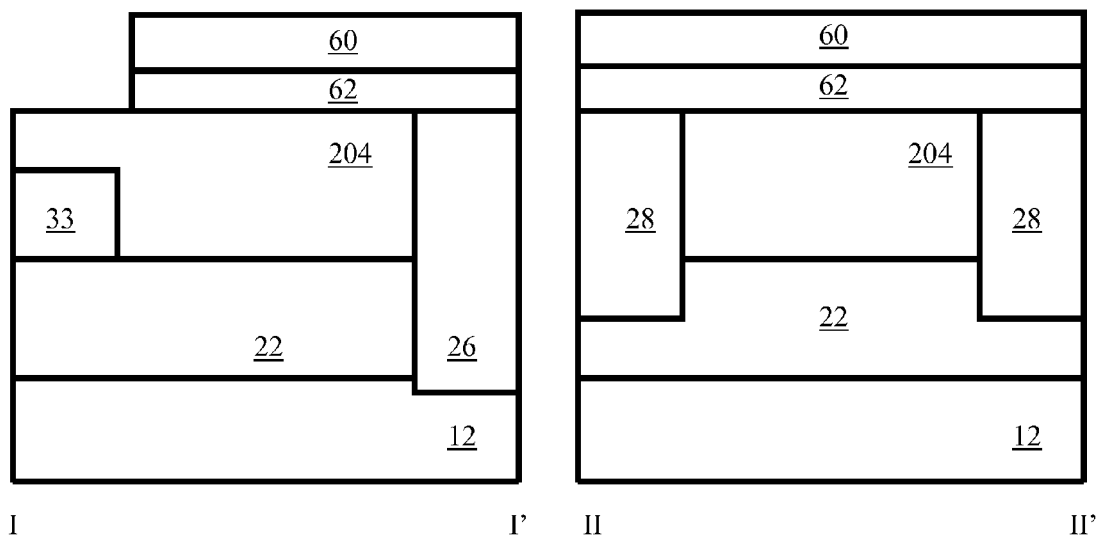

As illustrated in FIGS. 39V through 39X, a silicon oxide layer (or high-dielectric materials) 62 is then formed on the silicon surface (e.g. about 100 A in an exemplary 130 nm process), followed by a polysilicon (or metal) gate 60 deposition (e.g. about 500 A in an exemplary 130 nm process). A lithography step is then performed to form the pattern for the gate and word line, followed by etching of the polysilicon and silicon oxide layers where they are not waned. The resulting structure is shown in FIGS. 39V-39X.

As illustrated in FIGS. 39Y through 39AA, another ion implantation step is then performed to form the bit line region 16 of a second conductivity type (e.g. n-type conductivity). The gate 60 and the insulating layers 26 and 28 serve as masking layer for the implantation process such that regions of second conductivity are not formed outside bit line region 16. This is then followed by backend process to form contact and metal layers.

FIGS. 40A through 40F illustrate an embodiment of a Gateless Half Transistor memory cell. Memory cell 250 according to the present invention eliminates the gate terminal present in earlier memory cells such as memory cell 50 allowing a more compact layout since some design rules like gate-to-contact-spacing no longer affect the minimum cell size.

Present in FIGS. 40A through 40F are substrate 12 of the first conductivity type, buried layer 22 of the second conductivity type, bit line region 16 of the second conductivity type, region of the second conductivity type 20, region of the first conductivity type 21, buried layer region 22, floating body 24 of the first conductivity type, insulating regions 26 and 28, source line terminal 72, and substrate terminal 78 all of which perform substantially similar functions in memory cell 250 as in previously discussed embodiment memory cell 50. The primary difference between memory cell 250 and memory cell 50 previously discussed is the absence of gate 60 and gate insulator 62. As in other embodiments, there is no contact to the buried layer 22 at the semiconductor surface 14 inside the boundary of memory cell 250.

The manufacturing of memory cell 250 is substantially similar to the manufacturing of memory cell 50 described in conjunction with FIGS. 2A through 2U, except that instead of a lithographic step for forming gate 60, a different lithographic step is needed to pattern bit line region 16 for implantation or diffusion.

Figure 40A:
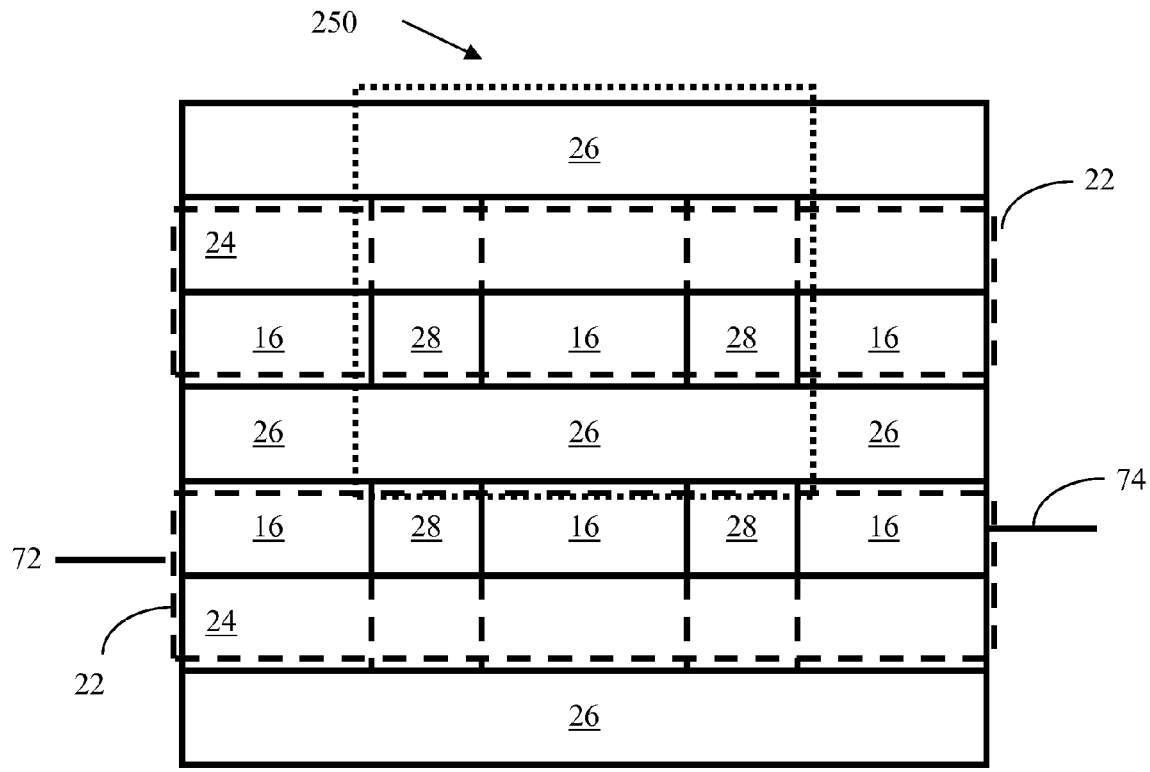
FIGS. 40A through 40F illustrate a fourth exemplary memory cell according to the present invention.

FIG. 40A illustrates a top view of memory cell 250 with several near neighbors.

Figure 40B:
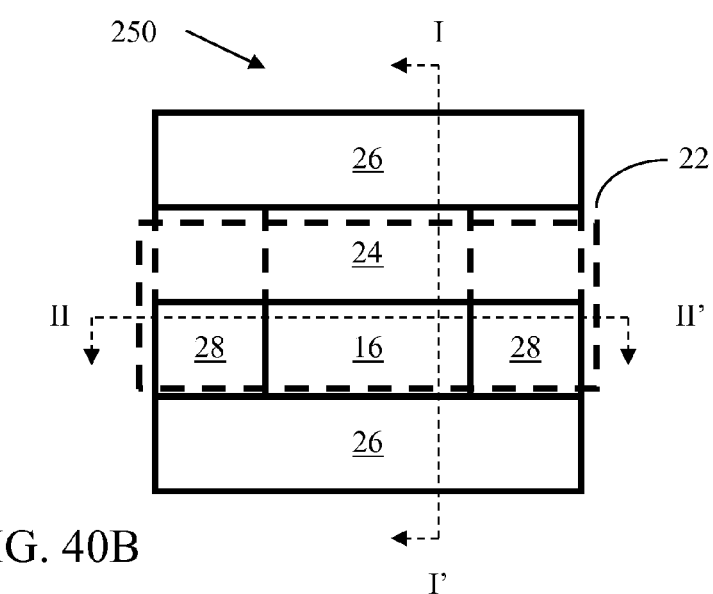
Figure 40C:
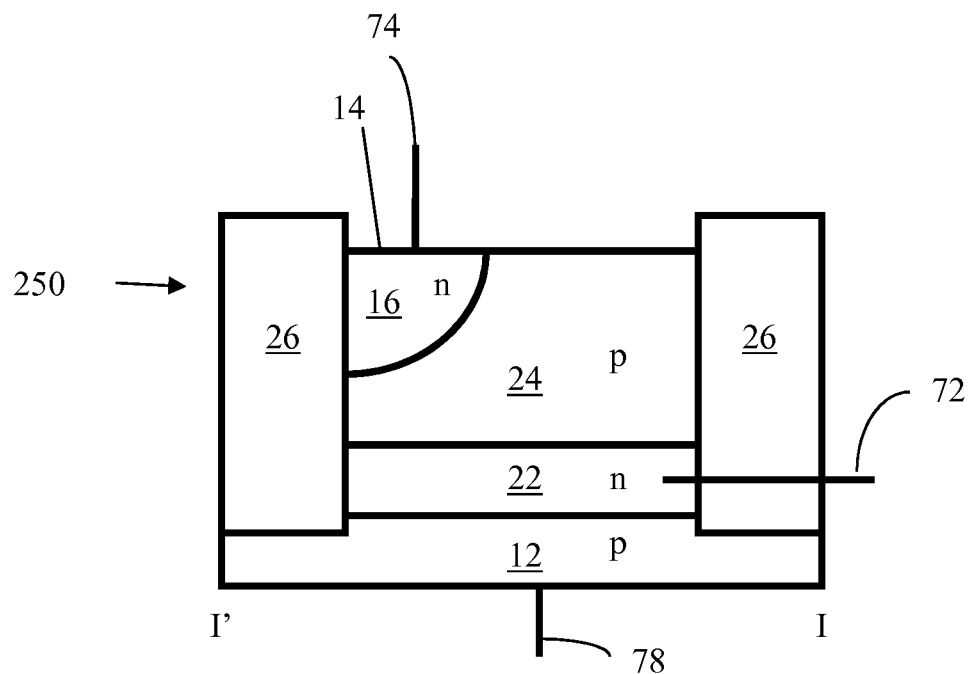
Figure 40D:
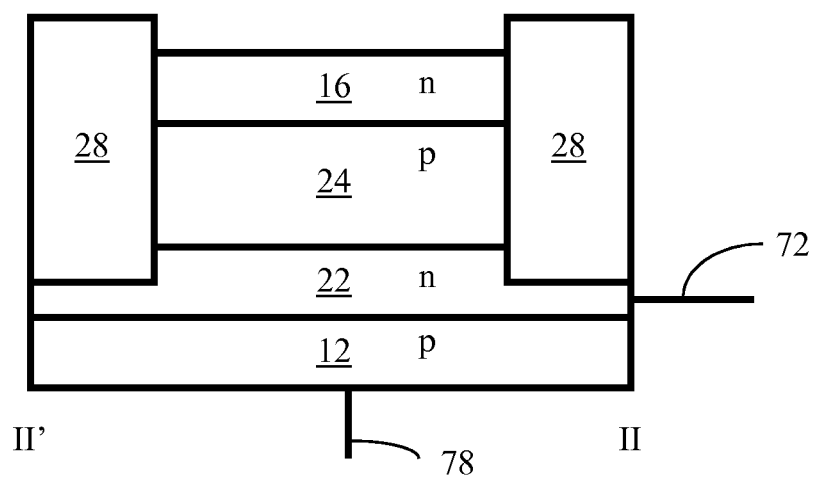

FIG. 40B illustrates a top view a single memory cell 250 with vertical cut line I-I' and horizontal cut line II-II' for the cross sections illustrated in FIGS. 40C and 40D respectively.

Figure 40E:
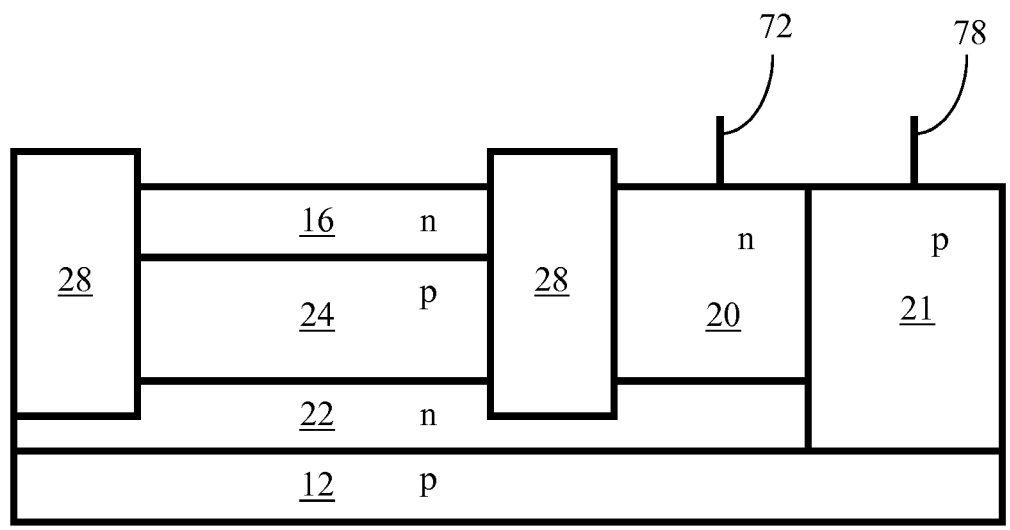

FIG. 40E shows how memory cell 250 may have its buried layer 22 coupled to source line terminal 72 through region 20 of the second conductivity type and its substrate 12 coupled to substrate terminal 78 through region of first conductivity type 21.

Figure 40F:
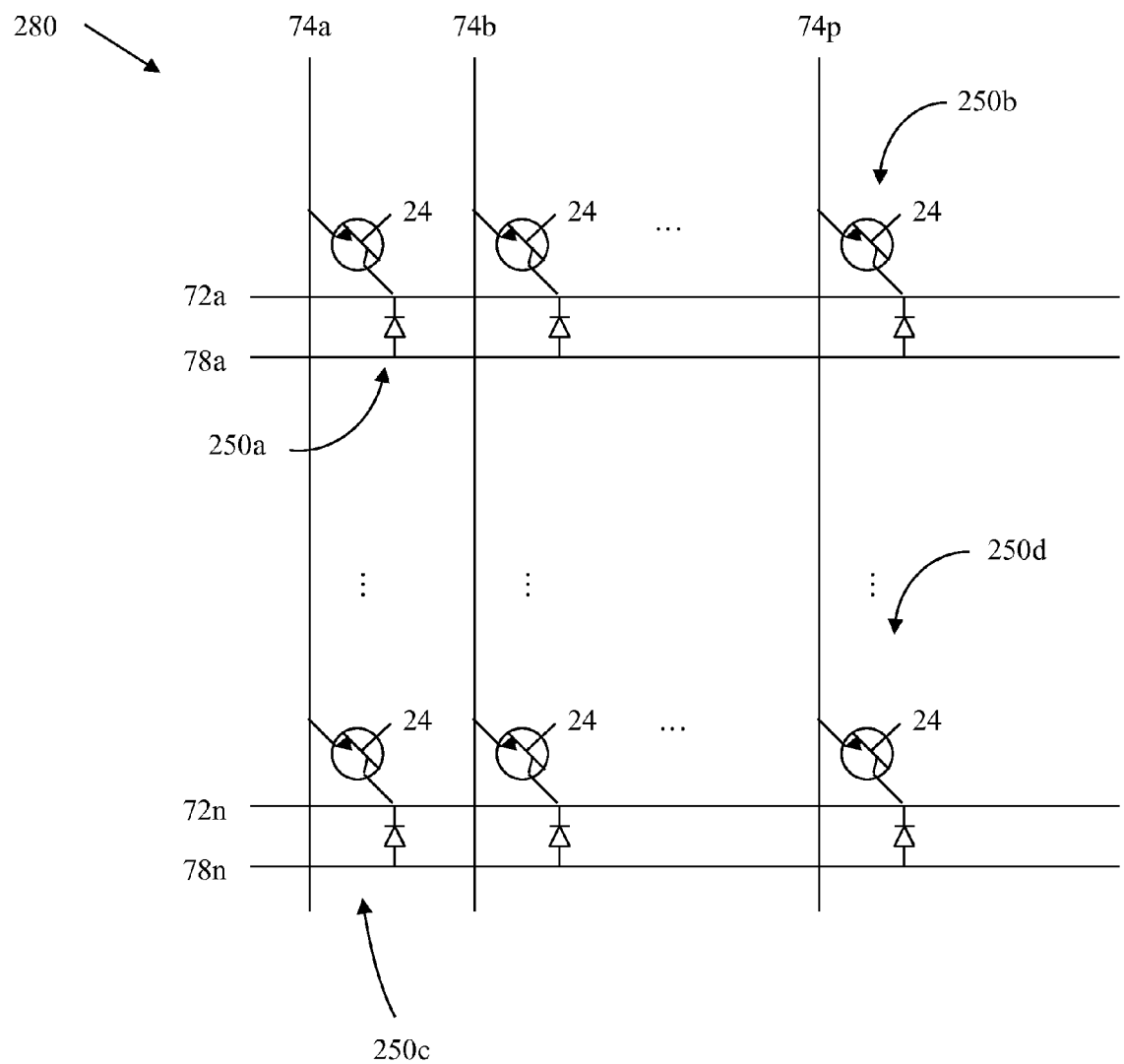

FIG. 40F shows exemplary memory array 280 which will be used in subsequent drawing figures to illustrate the various operations that may be performed on memory cell 250 when arranged in an array to create a memory device. Array 280 comprises in part representative memory cells 250a, 250b, 250c and 250d. In operations where a single memory cell is selected, representative memory cell 250a will represent the selected cell while the other representative memory cells 250b, 250c and 250d will represent the various cases of unselected memory cells sharing a row, sharing a column, or sharing neither a row or a column respectively with selected representative memory cell 250a. Similarly in the case of operations performed on a single row or column, representative memory cell 250a will always be on the selected row or column.

While the drawing figures show the first conductivity type as p-type and the second conductivity type as n-type, as with previous embodiments the conductivity types may be reversed with the first conductivity type becoming n-type and the second conductivity type becoming p-type as a matter of design choice in any particular embodiment.

The memory cell states are represented by the charge in the floating body 24, which modulates the intrinsic n-p-n bipolar device 230 formed by buried well region 22, floating body 24, and BL bit line region 16. If cell 250 has holes stored in the body region 24, then the memory cell will have a higher bipolar current (e.g. current flowing from BL to SL terminals during read operation) compared to if cell 250 does not store holes in body region 24.

The positive charge stored in the body region 24 will decrease over time due to the p-n diode leakage formed by floating body 24 and bit line region 16 and buried layer 22 and due to charge recombination. A unique capability of the invention is the ability to perform the holding operation in parallel to all memory cells of the array.

Figure 41A:
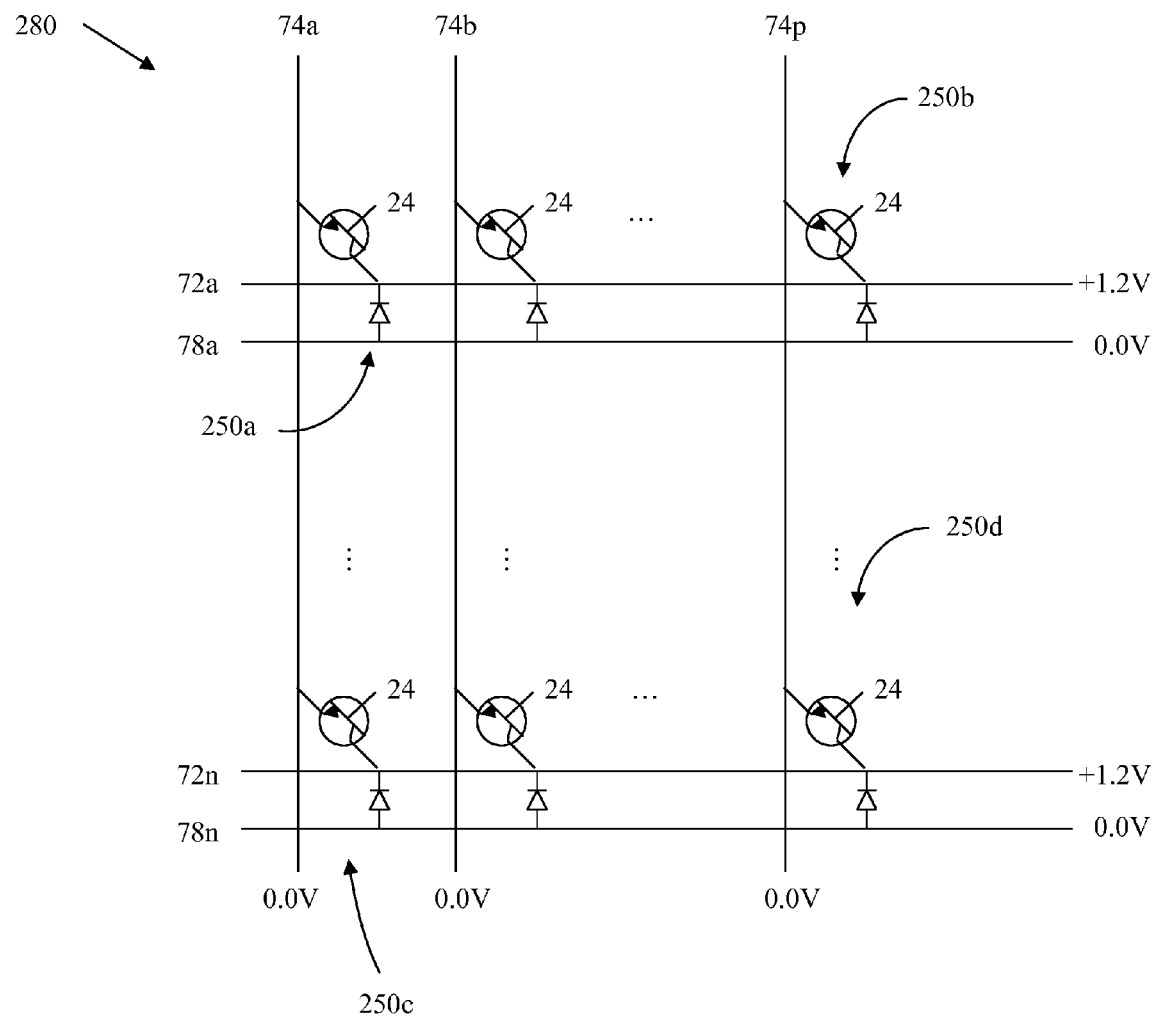
FIGS. 41A and 41B illustrate different holding operations on a memory array of the memory cells of FIGS. 40A through 40F.
Figure 41B:
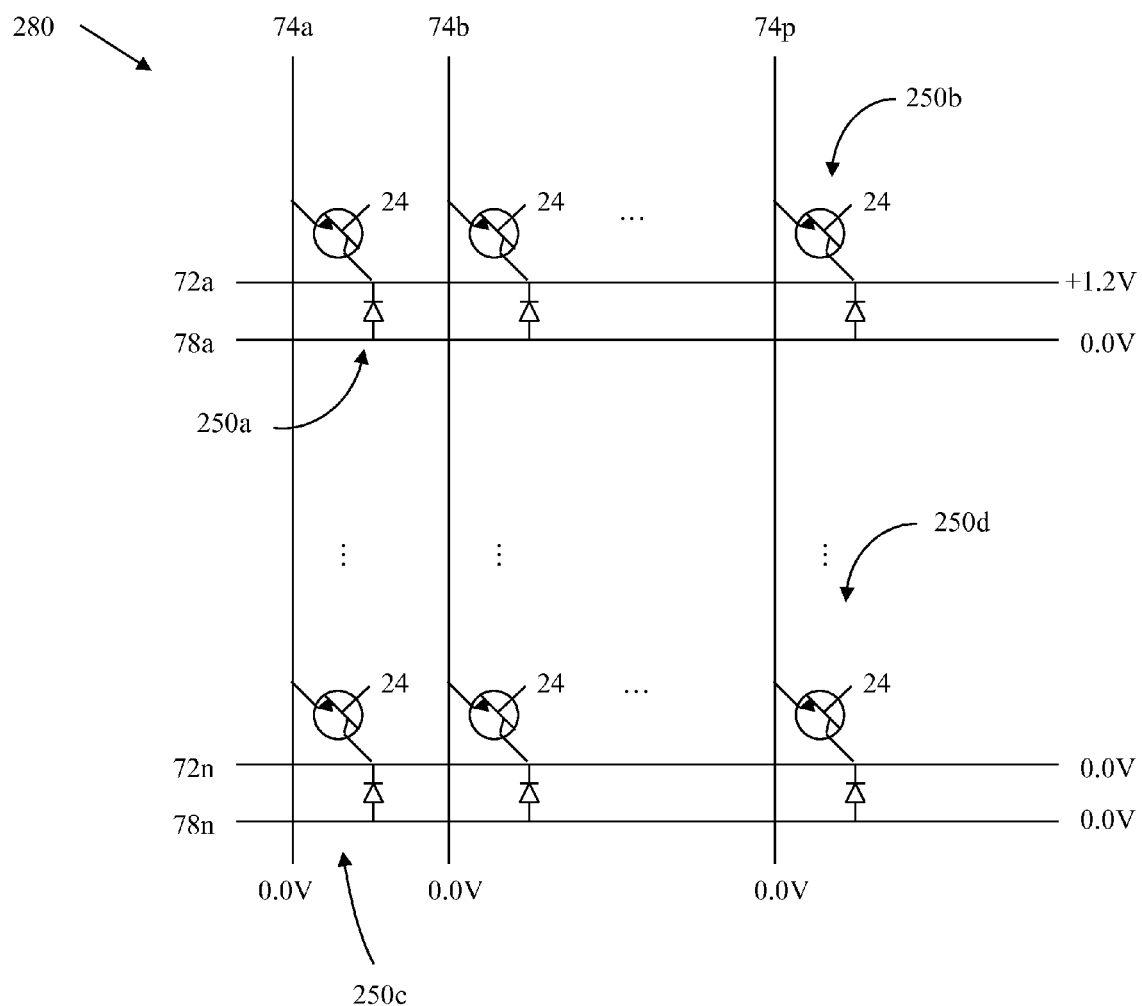

An entire array holding operation is illustrated in FIG. 41A while a single row holding operation is illustrated in FIG. 41B. The holding operation can be performed in a manner similar to the holding operation for memory cell 50 by applying a positive bias to the back bias terminal (i.e. SL terminal 72) while grounding terminal 74 and substrate terminal 78. If floating body 24 is positively charged (i.e. in a state logic-1), the n-p-n bipolar transistor 230 formed by BL bit line region 16, floating body 24, and buried well region 22 will be turned on.

A fraction of the bipolar transistor current will then flow into floating region 24 (usually referred to as the base current) and maintain the state logic-1 data. The efficiency of the holding operation can be enhanced by designing the bipolar device formed by buried well region 22, floating region 24, and bit line region 16 to be a low-gain bipolar device, where the bipolar gain is defined as the ratio of the collector current flowing out of SL terminal 72 to the base current flowing into the floating region 24.

For memory cells in state logic-0 data, the bipolar device will not be turned on, and consequently no base hole current will flow into floating region 24. Therefore, memory cells in state logic-0 will remain in state logic-0.

A periodic pulse of positive voltage can be applied to the SL terminal 72 as opposed to applying a constant positive bias to reduce the power consumption of the memory cell 250.

An example of the bias condition for the holding operation is hereby provided: zero voltage is applied to BL terminal 74, a positive voltage is applied to SL terminal 72, and zero voltage is applied to the substrate terminal 78. In one particular non-limiting embodiment, about +1.2 volts is applied to terminal 72, about 0.0 volts is applied to terminal 74, and about 0.0 volts is applied to terminal 78. However, these voltage levels may vary from embodiment to embodiment as a matter of design choice.

In the entire array holding operation of FIG. 41A, all of the source line terminals 72a through 72n are biased at +1.2V, all of the bit lines 74a through 74p are biased to 0.0V, and all of the source terminals 78a through 78n are biased to 0.0V. This places all of the cells in memory array 280 in the hold state.

In the single row hold operation of FIG. 41B, selected source line terminal 72a is biased at +1.2V while the unselected source line terminals 72b (not shown) through 72n are biased at 0.0V, all of the bit lines 74a through 74p are biased to 0.0V, and all of the source terminals 78a through 78n are biased to 0.0V. This places all of the selected cells in memory array 280 in the hold state.

A single memory cell read operation is illustrated in FIGS. 42 and 42A through 42H. The read operation for memory cell 250 can be performed by sensing the current of the bipolar device 230 by applying the following bias condition: a positive voltage is applied to the selected BL terminal 74, zero voltage is applied to the selected SL terminal 72, and zero voltage is applied to the substrate terminal 78. The positive voltage applied to the selected BL terminal is less than or equal to the positive voltage applied to the SL terminal during holding operation. The unselected BL terminals will remain at zero voltage and the unselected SL terminals will remain at positive voltage.

Figure 42:
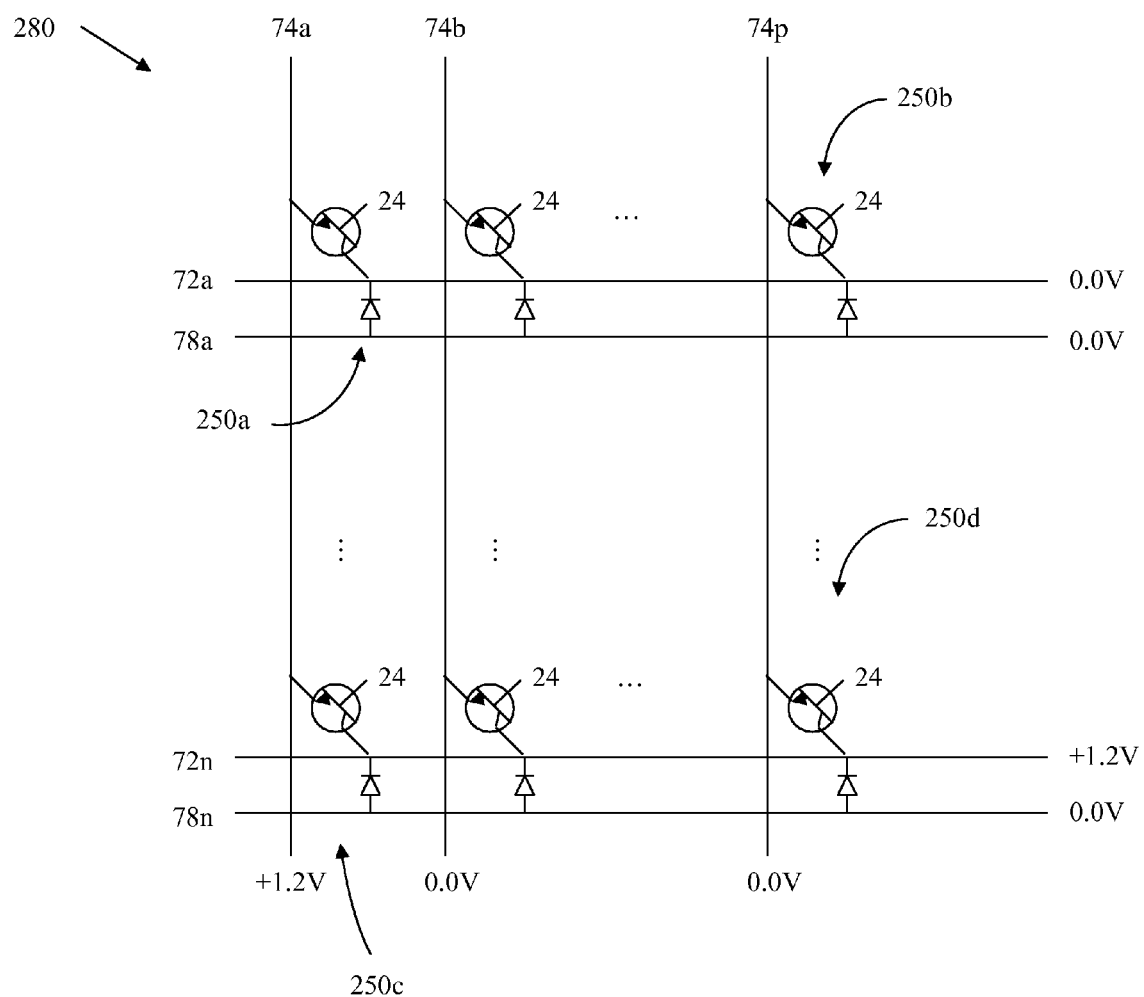
FIGS. 42 and 42A through 42H illustrate a read operation on a memory array of the memory cells of FIGS. 40A through 40F.

FIG. 42 shows the bias condition for the selected memory cell 250a and unselected memory cells 250b, 250c, and 250d in memory array 280. In this particular non-limiting embodiment, about 0.0 volts is applied to the selected SL terminal 72a while about 0.0V is applied to the unselected source line terminals 72b (not shown) through 72n, about +1.2 volts is applied to the selected BL terminal 74a while 0.0V is applied to the unselected bit line terminals 74b through 74p, and about 0.0 volts is applied to substrate terminals 78a through 78n. These voltage levels are exemplary only and may vary from embodiment to embodiment.

Figure 42A:
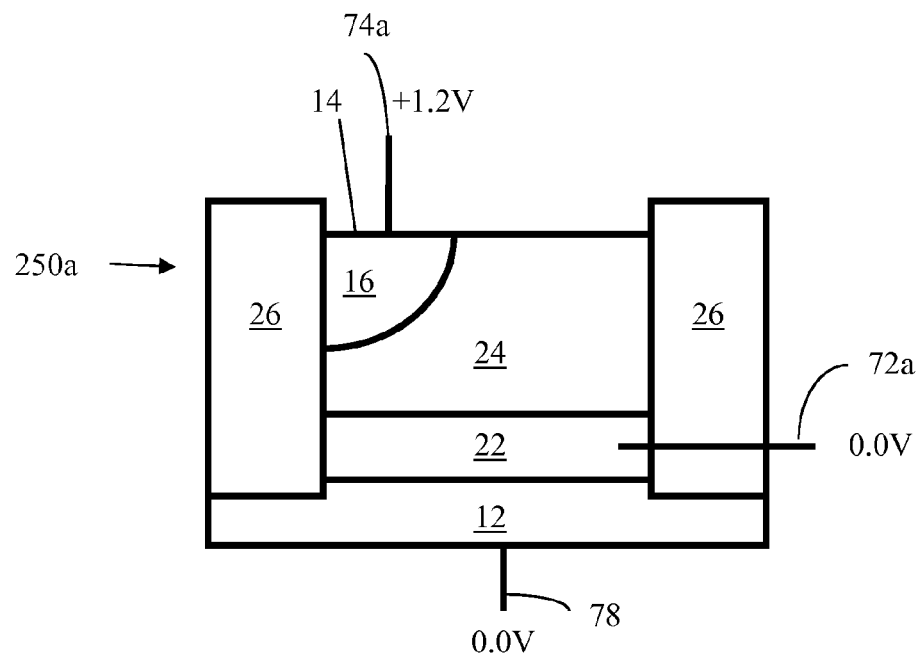
Figure 42B:
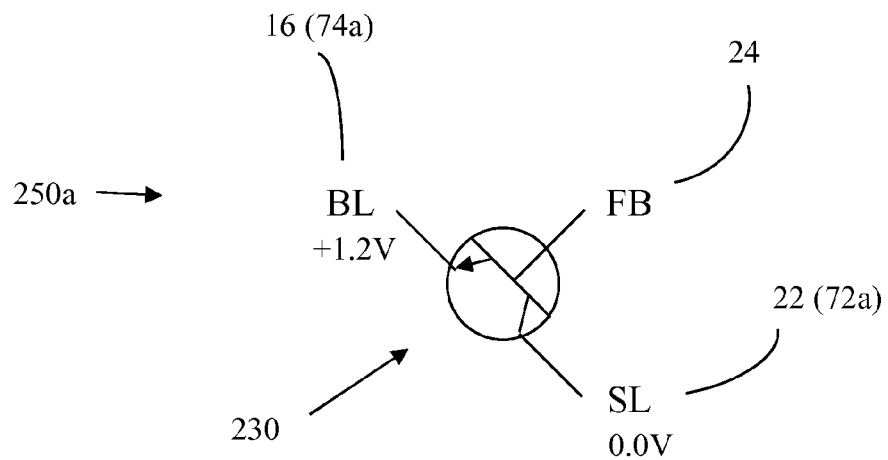

In FIGS. 42A and 42B, the bias conditions for selected representative memory cell 250a are shown. In this particular non-limiting embodiment, about 0.0 volts is applied to the selected SL terminal 72a, about +1.2 volts is applied to the selected BL terminal 74a, and about 0.0 volts is applied to substrate terminal 78 (not shown). This causes current to flow through intrinsic bipolar device 230 if the floating body is positively charged and no current to flow if the floating body is discharged since the bipolar device 230 is off.

Figure 42C:
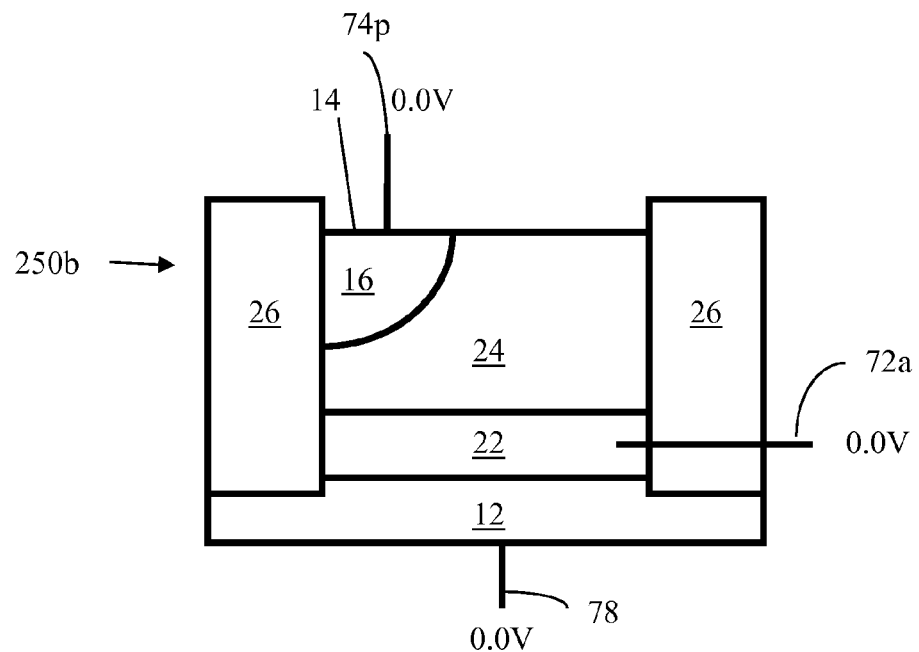
Figure 42D:
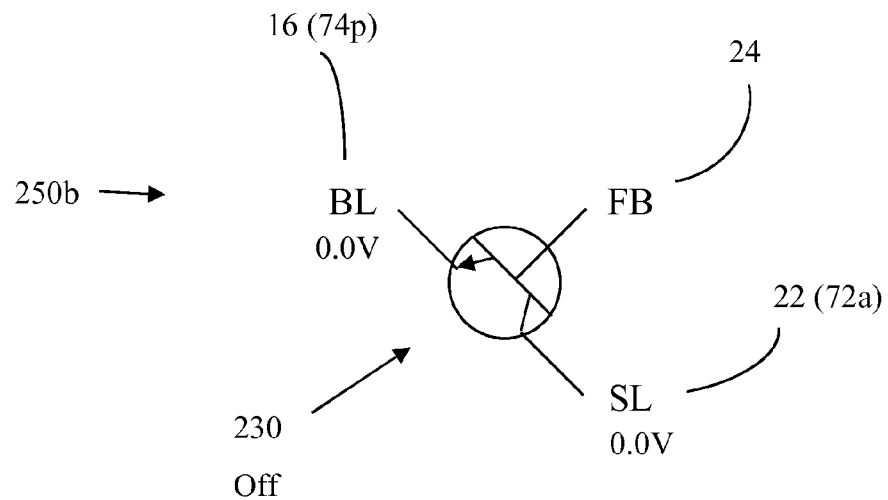
Figure 42E:
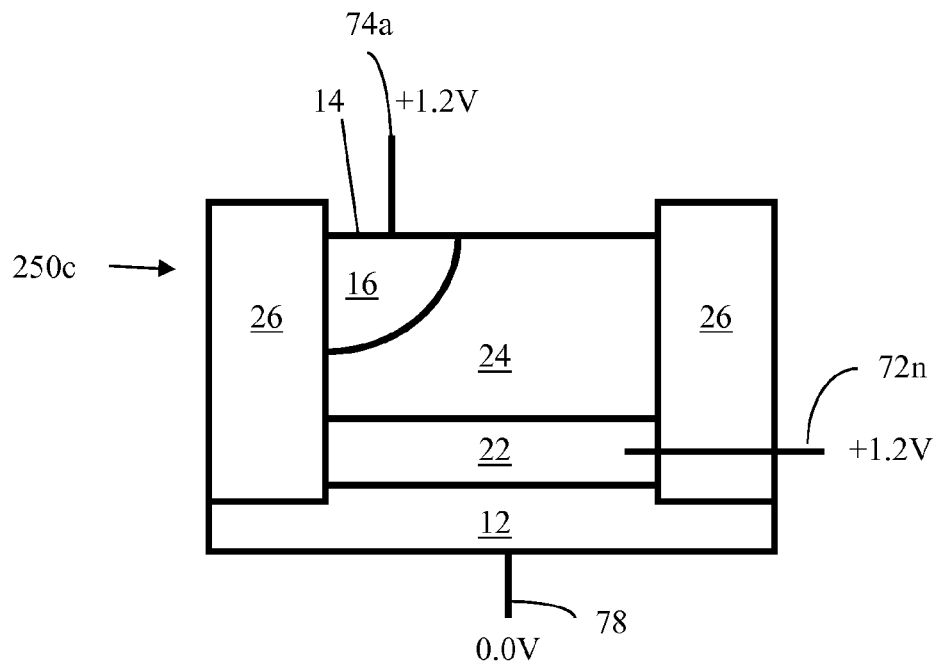
Figure 42F:
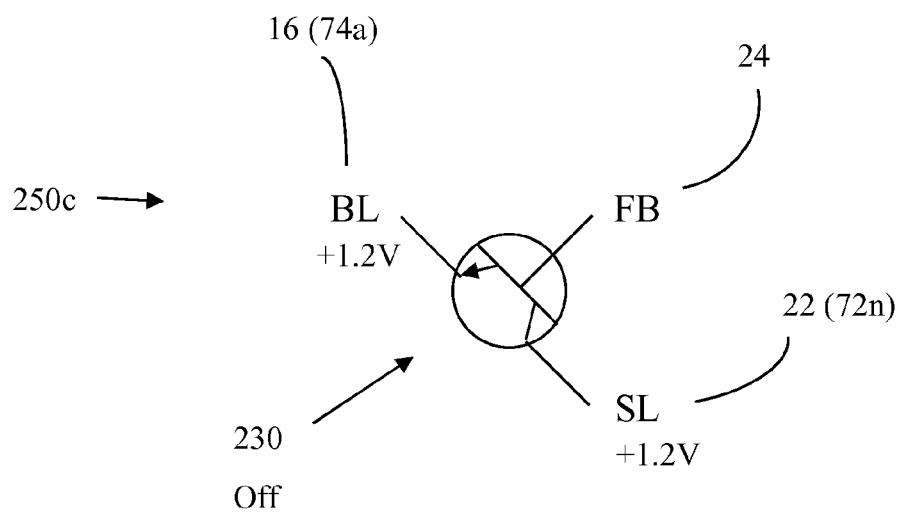
Figure 42G:
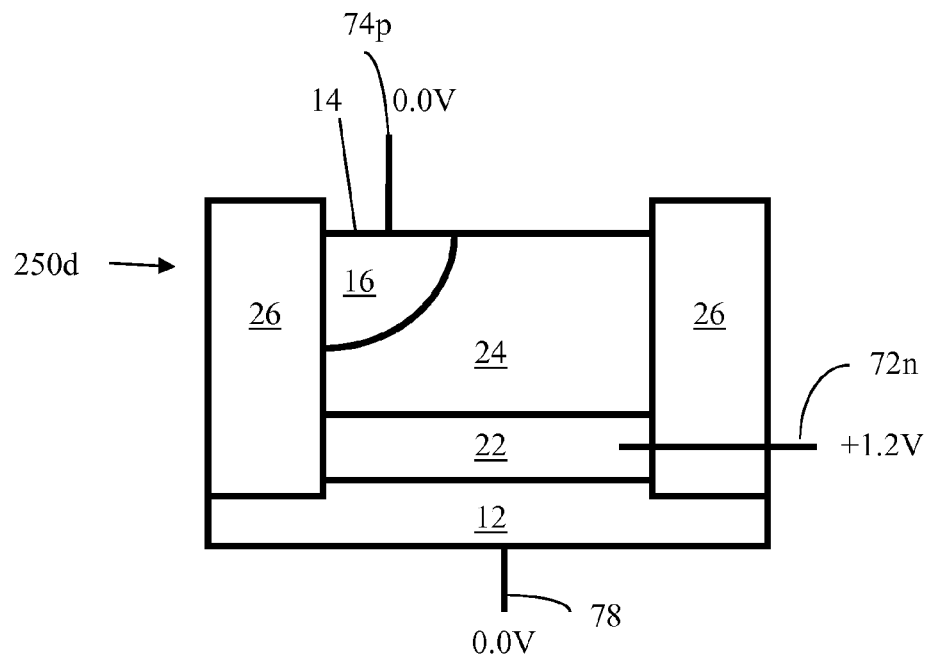
Figure 42H:
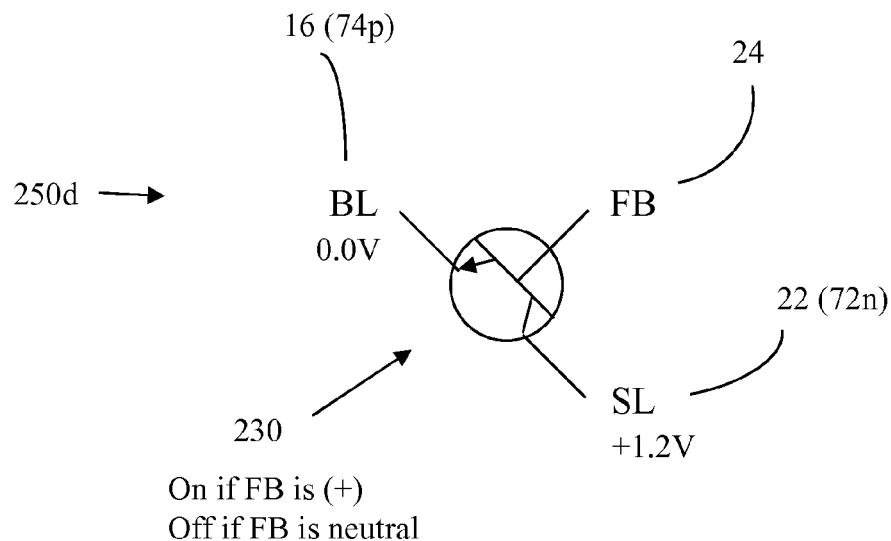

The unselected memory cells during read operations are shown in FIGS. 42C through 42H. The bias conditions for memory cells sharing the same row (e.g. memory cell 250b) are shown in FIGS. 42C and 42D. The bias conditions for memory cells sharing the same column (e.g. memory cell 250c) as the selected memory cell 250a are shown in FIGS. 42E and 42F. The bias conditions for memory cells sharing neither the same row nor the same column as the selected memory cell 250a (e.g. memory cell 250d) are shown in FIG. 42G-42H.

As illustrated in FIGS. 42C and 42D, for memory cell 250b sharing the same row as the selected memory cell 250a, the SL terminal 72a and the BL terminal 74p are both biased to 0.0V and consequently these cells will not be at the holding mode. However, because read operation is accomplished much faster (in the order of nanoseconds) compared to the lifetime of the charge in the floating body 24 (in the order of milliseconds), it should cause little disruption to the charge stored in the floating body.

As illustrated in FIGS. 42E and 42F, for memory cell 250c sharing the same column as the selected memory cell 250a, a positive voltage is applied to the BL terminal 74a and SL terminal 72n. No base current will flow into the floating body 24 because there is no potential difference between SL terminal 72 and BL terminal 74 (i.e. the emitter and collector terminals of the n-p-n bipolar device 230). However, because read operation is accomplished much faster (in the order of nanoseconds) compared to the lifetime of the charge in the floating body 24 (in the order of milliseconds), it should cause little disruption to the charge stored in the floating body.

As illustrated in FIGS. 42G and 42H, for memory cell 250d sharing neither the same row nor the same column as the selected memory cell 250a, both the SL terminal 72n will remain positively charged and the BL terminal 74p remain grounded. Representative memory cell 250d will be in the holding mode, where memory cells in state logic-1 will maintain the charge in floating body 24 because the intrinsic bipolar device 230 will generate hole current to replenish the charge in floating body 24, while memory cells in state logic-0 will remain in neutral state.

The various voltage bias levels above are exemplary only. They will vary from embodiment to embodiment as a function of both design choice and the process technology used.

Figure 43:
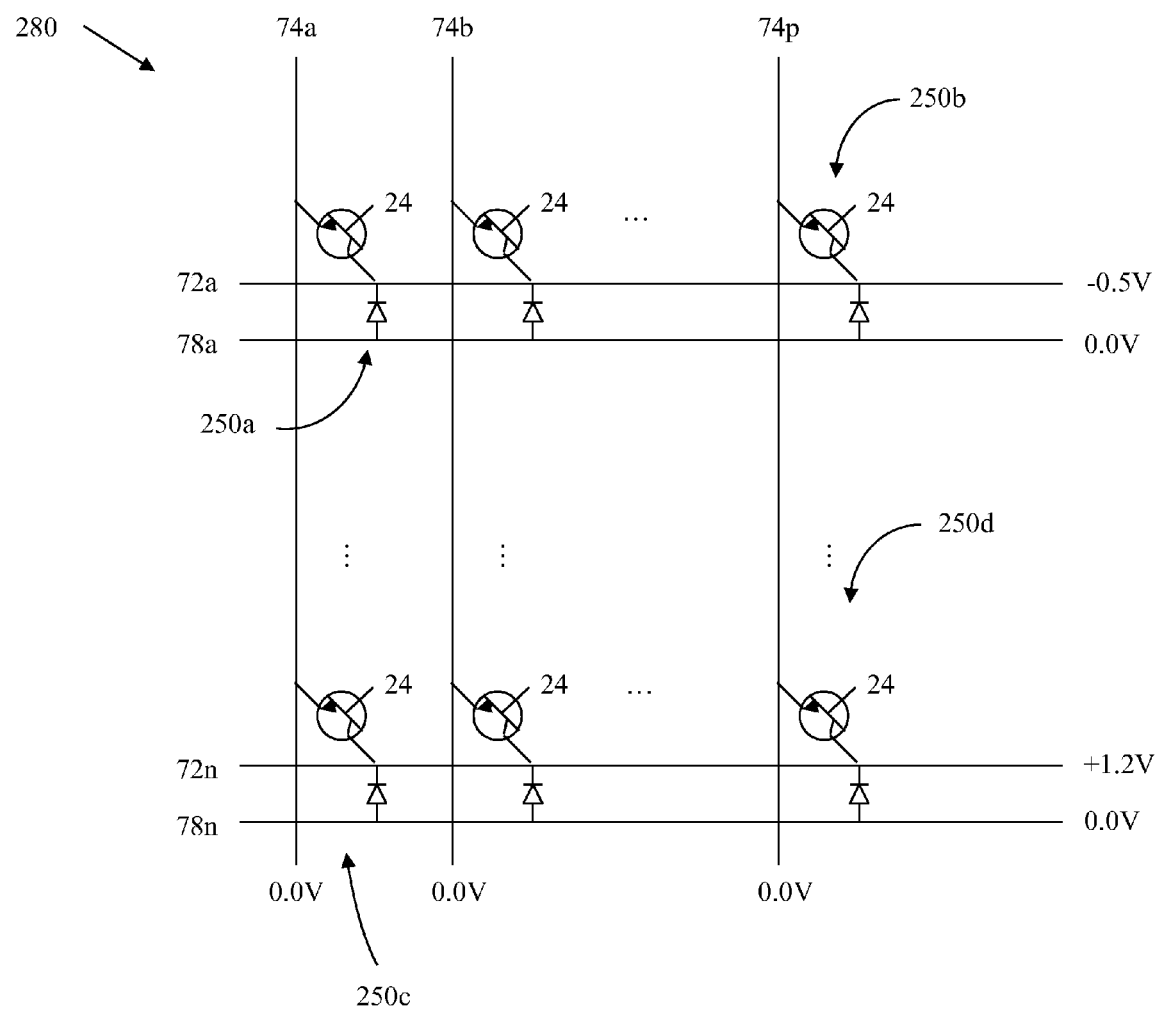
FIG. 43 illustrates a single memory cell write logic-0 operation on the memory array of FIG. 25A.
Figure 44A:
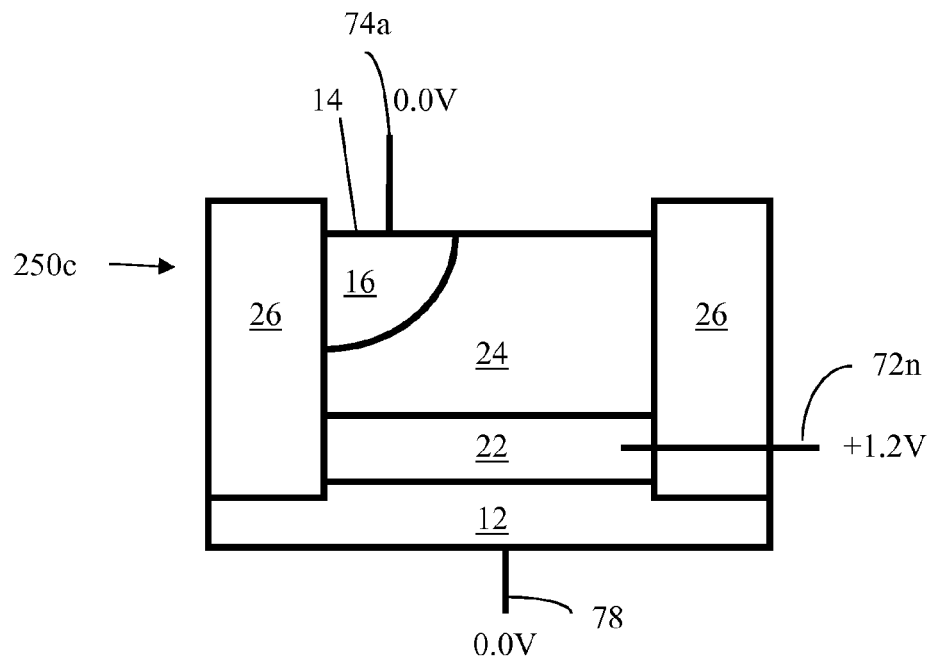
FIGS. 44A through 44B illustrate the operation of the unselected memory cells of the array of FIG. 43.
Figure 44B:
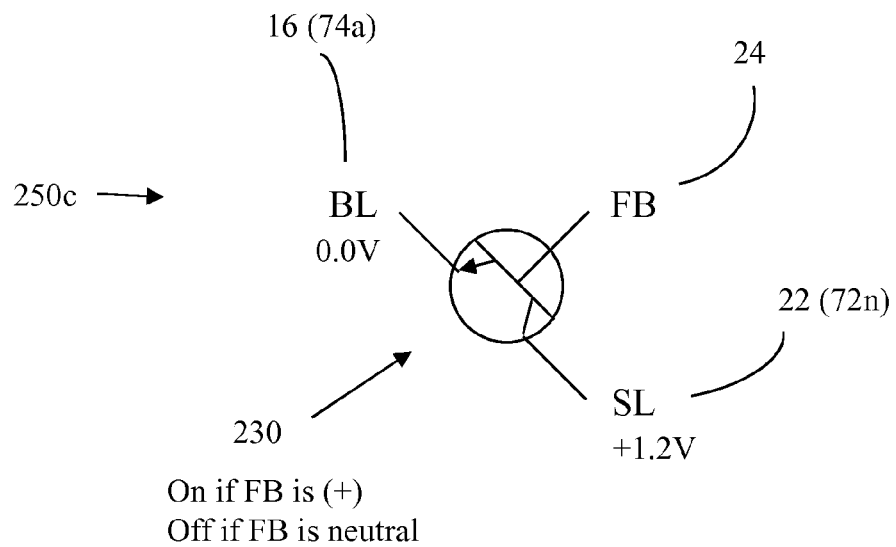

FIG. 43 illustrates a single row write logic-0 operation while FIGS. 44A and 44B illustrate the biasing conditions and operation of unselected representative memory cell 250c. In FIG. 43 the selected row SL terminal 72a is biased negatively at about −0.5V while the unselected row SL terminals 72b (not shown) through 72n are biased at about 0.0V, all the BL terminals 74a through 74p are biased at 0.0V, and all the substrate terminals 78a through 78n are biased at 0.0V. This causes the selected cells 250 like representative memory cells 250a and 250b to have their bipolar devices turn on due to forward bias on the floating body 24 to buried layer 22 junction evacuating the holes from the floating body 24.

FIGS. 44A and 44B show the operation of unselected representative memory cell 250c which in this case is representative of all the memory cells 250 in memory array 280 not on the selected row. Memory cell 250c has its SL terminal 72n at +1.2V and its BL terminal 74a at 0.0V which corresponds to the holding operation described above in conjunction with FIGS. 41A and 41B.

A write logic-0 operation can also be performed on a column basis by applying a negative bias to the BL terminal 74 as opposed to the SL terminal 72. The SL terminal 72 will be zero or positively biased, while zero voltage is applied to the substrate terminal 78. Under these conditions, all memory cells sharing the same BL terminal 74 will be written into state logic-0 and all the other cells will be in a holding operation.

The various voltage bias levels above are exemplary only. They will vary from embodiment to embodiment as a function of both design choice and the process technology used.

A write logic-1 operation can be performed on memory cell 250 through impact ionization as described for example with reference to Lin above.

Figure 45:
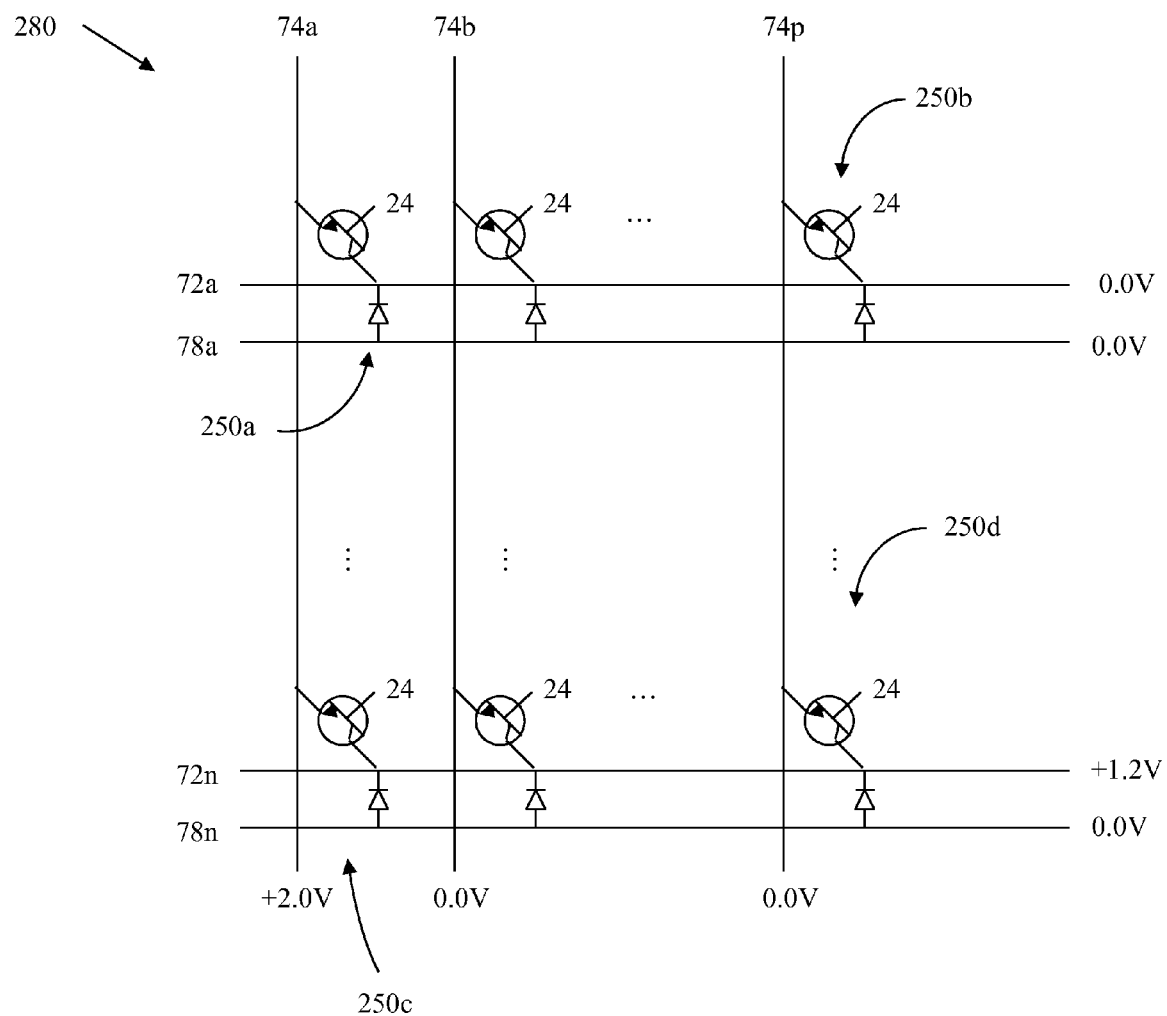
FIG. 45 illustrates a single memory cell write logic-0 operation on the memory array of FIG. 25A.
Figure 46A:
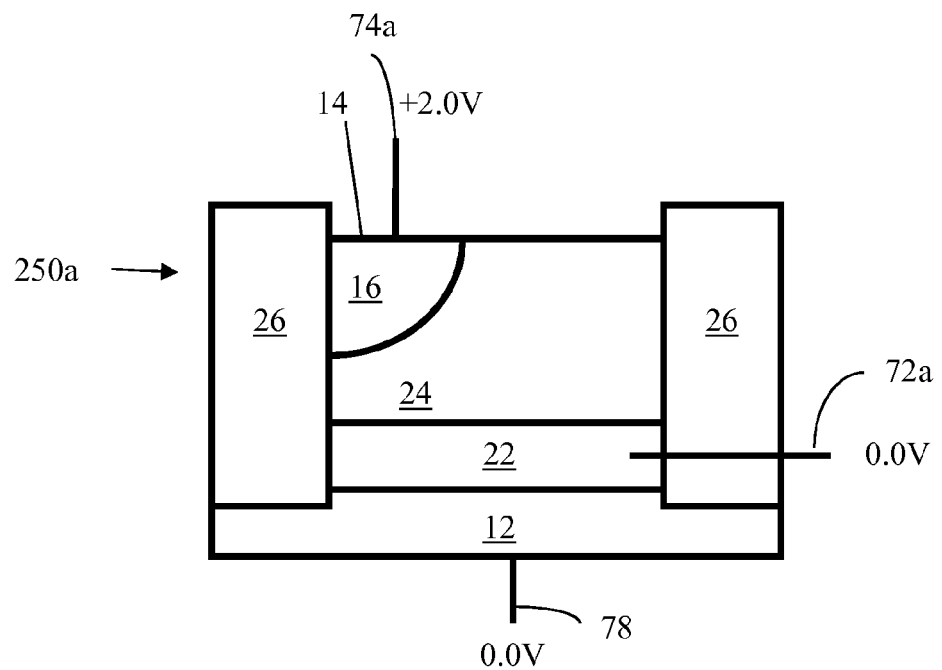
FIGS. 46A through 46H illustrate the operation of four representative memory cells of the array of FIG. 45.
Figure 46B:
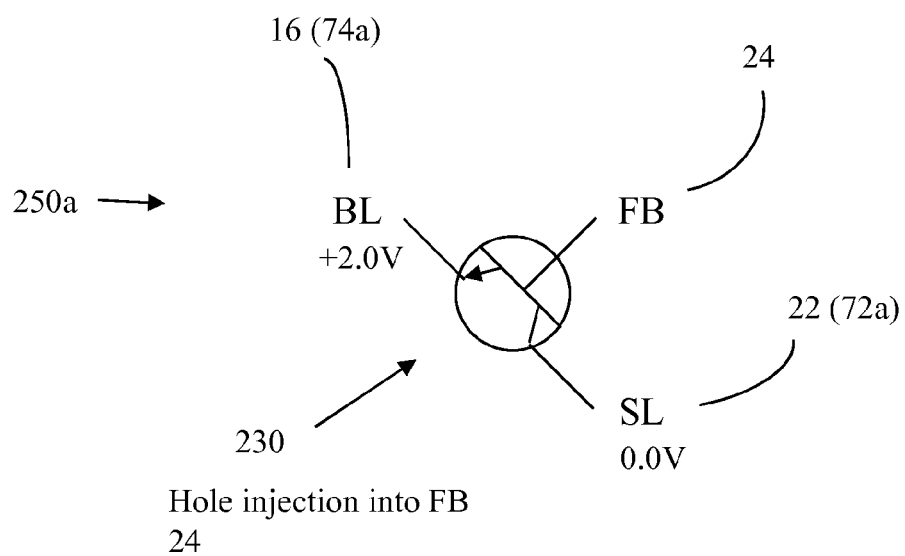

An example of the bias condition of the selected memory cell 250a under impact ionization write logic-1 operation is illustrated in FIG. 45 and FIGS. 46A through 46B. A positive bias is applied to the BL terminal 74, while zero voltage is applied to the selected SL terminal 72 and substrate terminal 78. The positive bias applied to the BL terminal 74 is greater than the positive voltage applied to the SL terminal 72 during holding operation. The positive bias applied to the BL terminal is large enough to turn on bipolar device 230 regardless of the initial state of the data in selected memory cell 250a. This results in a base hole current to the floating body 24 of the selected memory cell 250a charging it up to a logic-1 state.

In one particular non-limiting embodiment, the following bias conditions are applied to the selected memory cell 250a: a potential of about 0.0 volts is applied to selected SL terminal 72a, a potential of about +2.0 volts is applied to selected BL terminal 74a, and about 0.0 volts is applied to substrate terminals 78a through 78n. The following bias conditions are applied to the unselected terminals: about +1.2 volts is applied to SL terminals 72b (not shown) through 72n, and about 0.0 volts is applied to BL terminals 74b through 74p. FIG. 45 shows the bias condition for the selected and unselected memory cells in memory array 280. The various voltage bias levels above are exemplary only. They will vary from embodiment to embodiment as a function of both design choice and the process technology used.

Figure 46C:
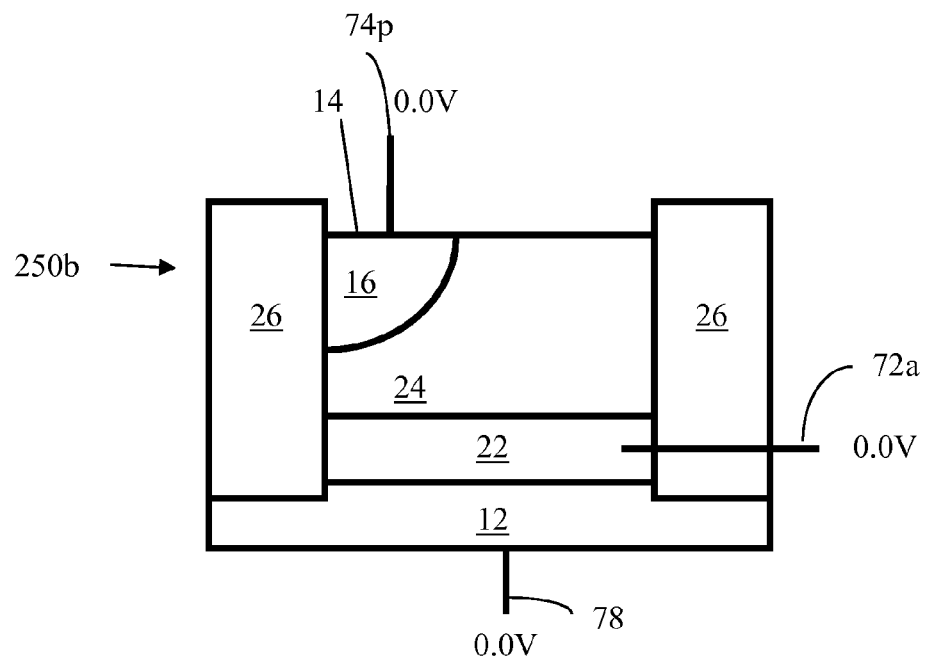
Figure 46D:
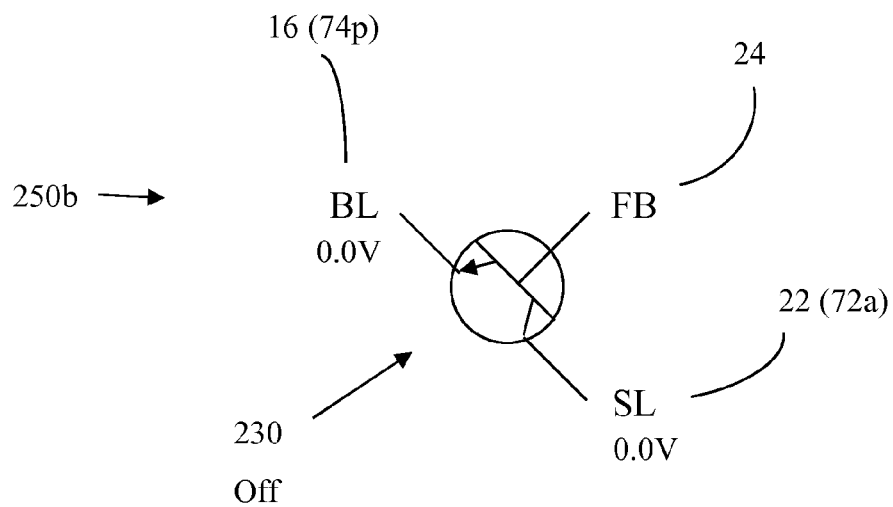
Figure 46E:
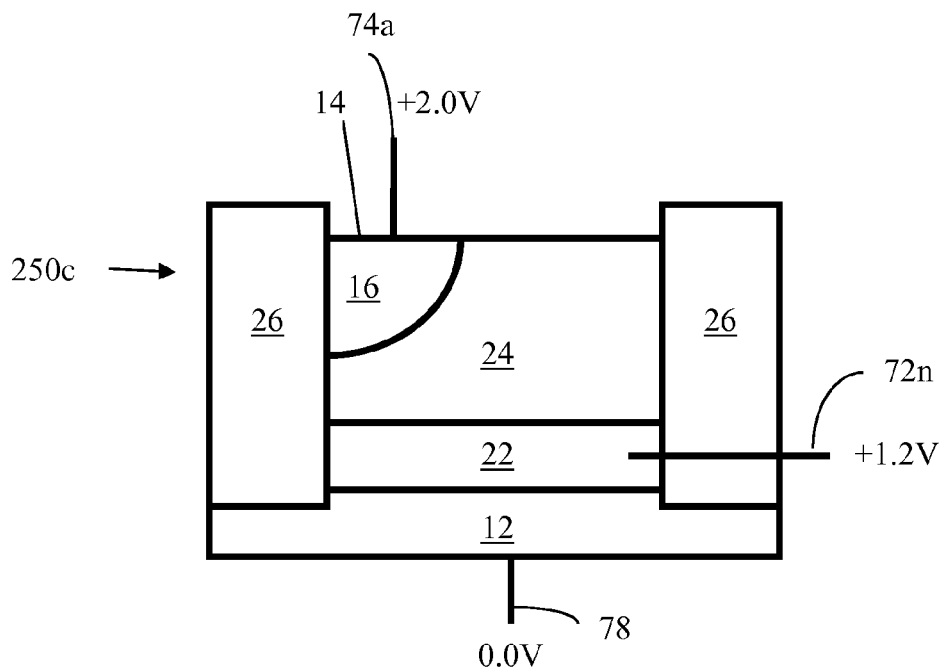
Figure 46F:
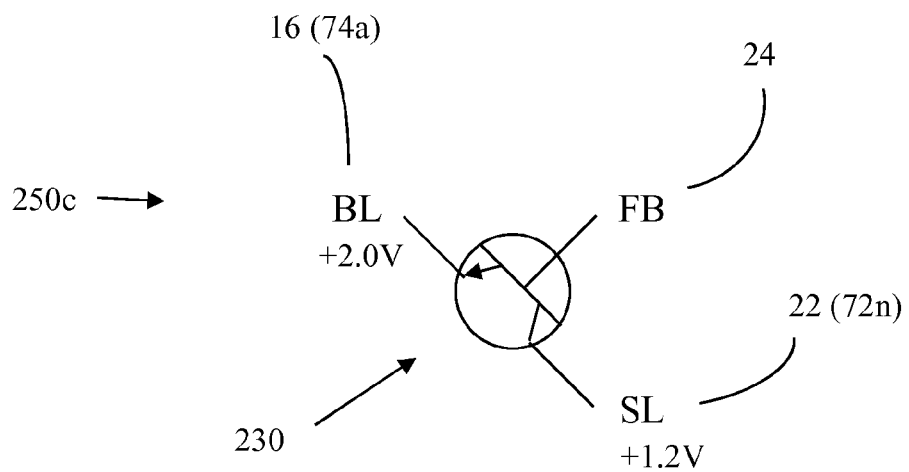
Figure 46G:
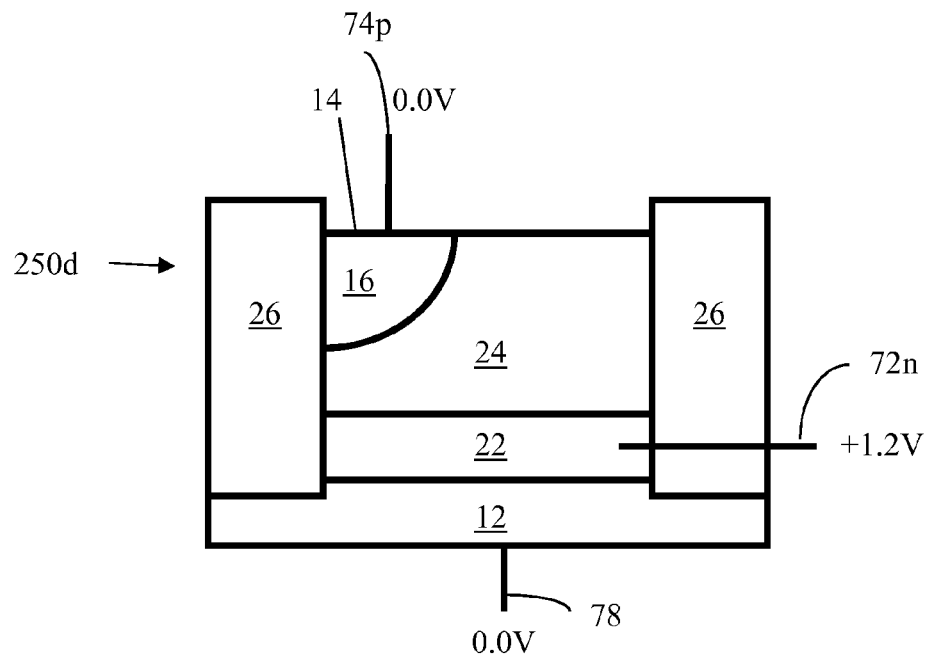
Figure 46H:
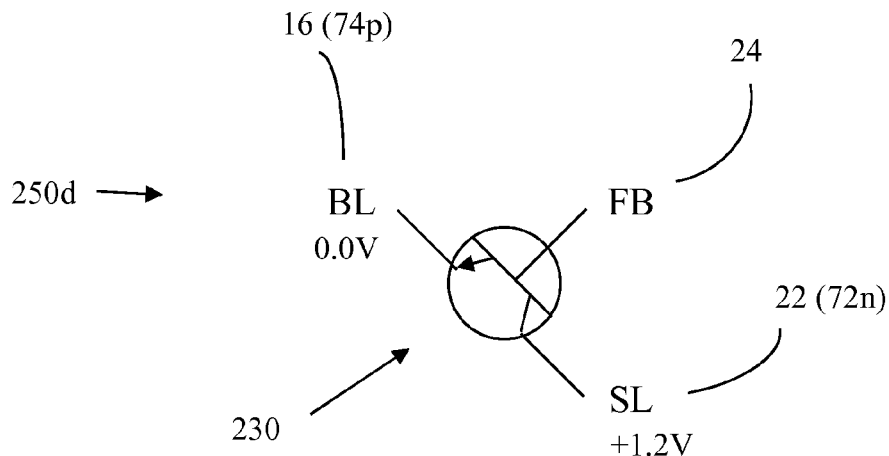

The unselected memory cells during write logic-1 operations are shown in FIGS. 46C through 46H. The bias conditions for memory cells sharing the same row (e.g. memory cell 250b) are shown in FIGS. 46C through 46D, the bias conditions for memory cells sharing the same column as the selected memory cell 250a (e.g. memory cell 250c) are shown in FIGS. 46E through 46F, and the bias conditions for memory cells 250 not sharing the same row nor the same column as the selected memory cell 250a (e.g. memory cell 250d) are shown in FIGS. 46G through 46H.

As shown in FIGS. 46C and 46D, for representative memory cell 250b sharing the same row as the selected memory cell 250a, SL terminal 72a and BL terminal 74p are be grounded. Bipolar device 230 will be off and the memory cell 250b will not be at the holding mode. However, because write operation is accomplished much faster (in the order of nanoseconds) compared to the lifetime of the charge in the floating body 24 (in the order of milliseconds), it should cause little disruption to the charge stored in the floating body.

As shown in FIGS. 46E and 46F, for representative memory cell 250c sharing the same column as the selected memory cell 250a, a greater positive voltage is applied to the BL terminal 74a and a lesser positive voltage is applied to SL terminal 72n. Less base current will flow into the floating body 24 than in selected memory cell 250a because of the lower potential difference between SL terminal 72 and BL terminal 74 (i.e. the emitter and collector terminals of the n-p-n bipolar device 230). However, because write operation is accomplished much faster (in the order of nanoseconds) compared to the lifetime of the charge in the floating body 24 (in the order of milliseconds), it should cause little disruption to the charge stored in the floating body.

As shown in FIGS. 46G and 46H, for representative memory cell 250d sharing neither the same column nor the same row as the selected memory cell 250a, the SL terminal 72 is positively charged and the BL terminal is grounded. Representative memory cell 250d will be at holding mode, where memory cells in state logic-1 will maintain the charge in floating body 24 because the intrinsic bipolar device 230 will generate hole current to replenish the charge in floating body 24 and where memory cells in state logic-0 will remain in neutral state.

The various voltage bias levels above are exemplary only. They will vary from embodiment to embodiment as a function of both design choice and the process technology used. Also, the first conductivity type may be changed from p-type to n-type and the second conductivity type may be changed from n-type to p-type, and the polarities of the applied biases may be reversed. Thus the invention is not to be limited in any way except by the appended claims.

A vertical stack of alternating conductive regions of first conductivity type and second conductivity type has been described in J_Kim discussed above, where a gate is overlaid surrounding the body region 24 on two sides. By removing the gates, a more compact memory cell than that reported in J_Kim can be obtained as in memory cell 350 discussed below.

Figure 47A:
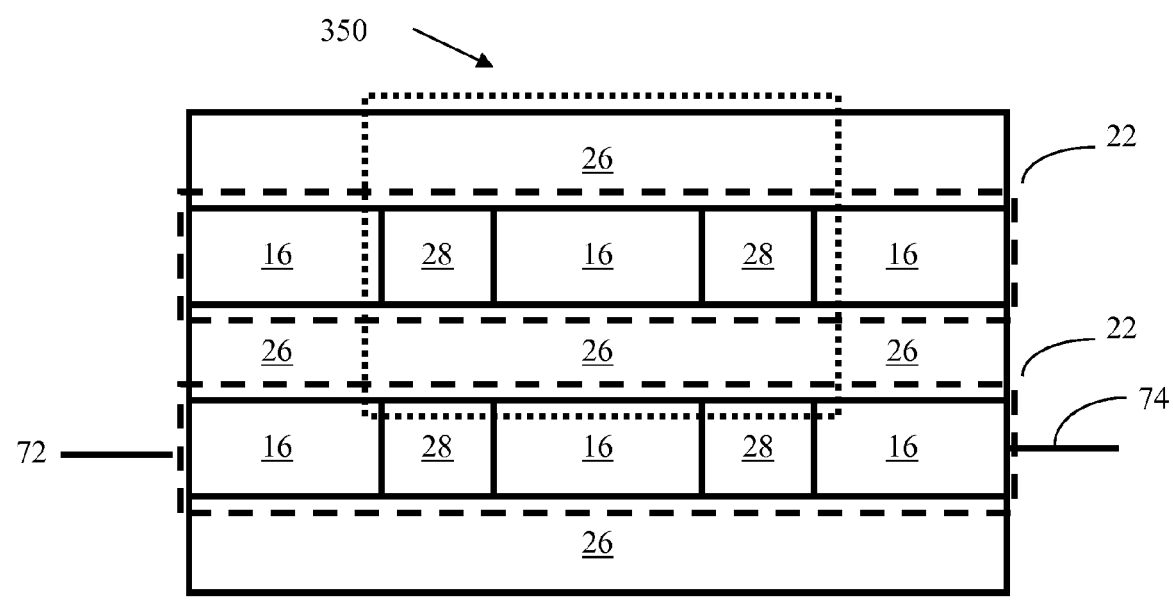
FIGS. 47A through 47F illustrate a fifth exemplary memory cell according to the present invention.
Figure 47B:
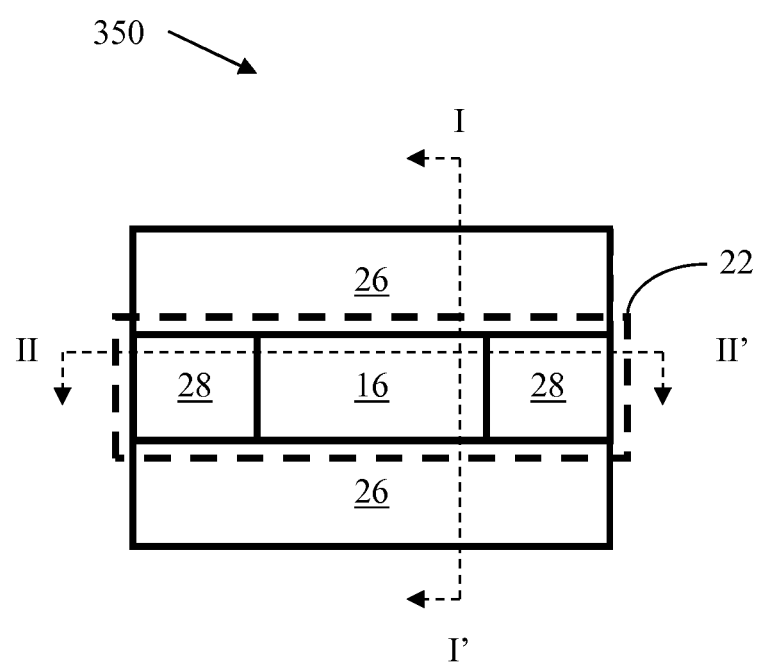
Figure 47C:
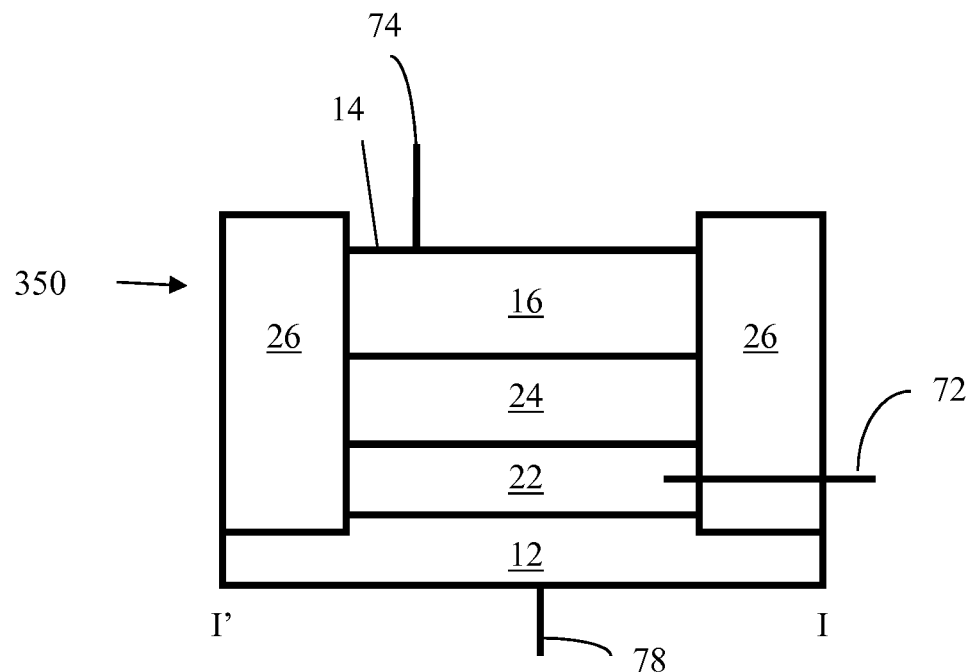

FIGS. 47A through 47F illustrate another embodiment of a Gateless Half Transistor memory cell. By allowing the bit line region 16 to completely cover the floating body region 24 in memory cell 350, some design rules like minimum-diffusion-to-insulator-spacing (the space from 16 to 26 in memory cell 250) no longer affects the cell size. Present in FIGS. 47A through 40F are substrate 12 of the first conductivity type, buried layer 22 of the second conductivity type, bit line region 16 of the second conductivity type, region of the second conductivity type 20, region of the first conductivity type 21, floating body 24 of the first conductivity type, buried layer region 22, insulating regions 26 and 28, source line terminal 72, and substrate terminal 78 all of which perform substantially similar functions in memory cell 350 as in previously discussed embodiment memory cell 250. The primary difference between memory cell 350 and memory cell 250 previously discussed is that bit line region 16 completely covers a (now smaller) floating body region 24 allowing for a more compact memory cell. As in other embodiments, there is no contact to the buried layer 22 at the semiconductor surface 14 inside the boundary of memory cell 350.

The manufacturing of memory cell 350 is substantially similar to the manufacturing of memory cell 50 described in conjunction with FIGS. 2A through 2U and memory cell 250 described in conjunction with FIGS. 40A through 40F above, except that bit line region 16 may be formed by an implantation process formed on the material making up substrate 12 according to any of implantation processes known and typically used in the art. Alternatively, solid state diffusion or epitaxial growth process may also be used to form bit line region 16.

FIG. 47A illustrates a top view of memory cell 350 with several near neighbors.

Figure 47D:
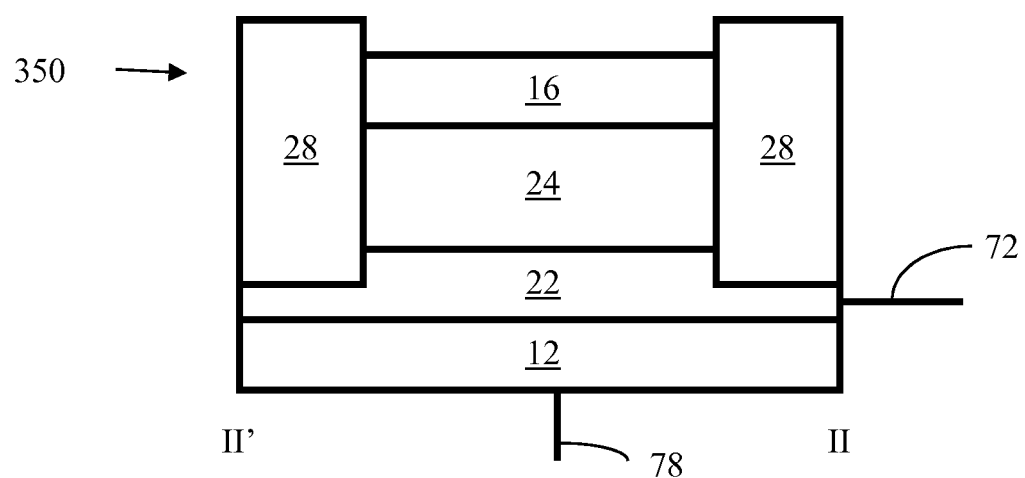
Figure 47E:
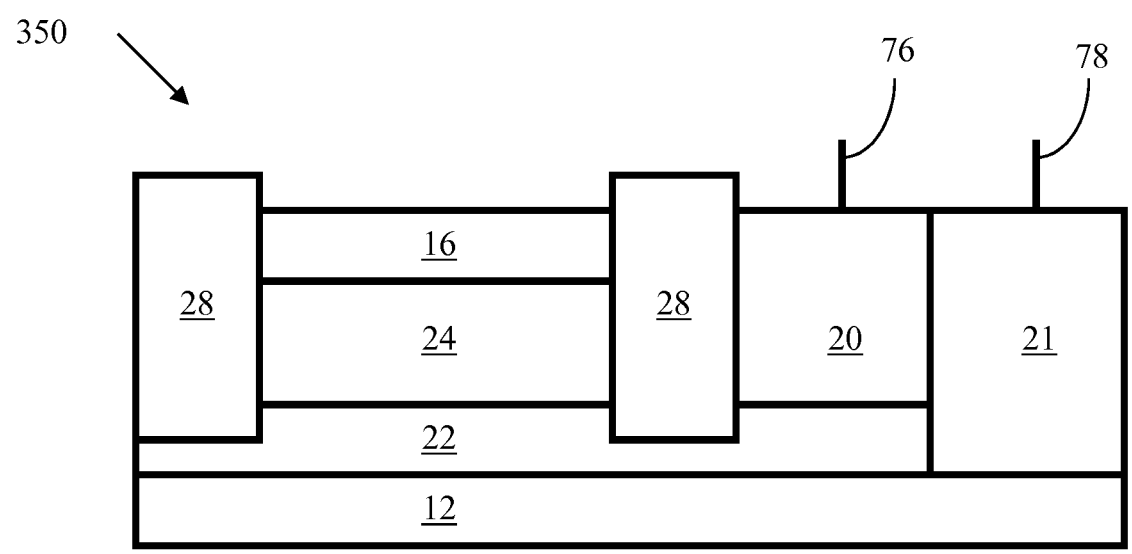

FIG. 47B illustrates a top view a single memory cell 350 with vertical cut line I-I' and horizontal cut line II-II' for the cross sections illustrated in FIGS. 47C and 47D respectively.

FIG. 40E shows how memory cell 350 may have its buried layer 22 coupled to source line terminal 72 through region 20 of the second conductivity type and its substrate 12 coupled to substrate terminal 78 through region 21 of the first conductivity type.

Figure 47F:
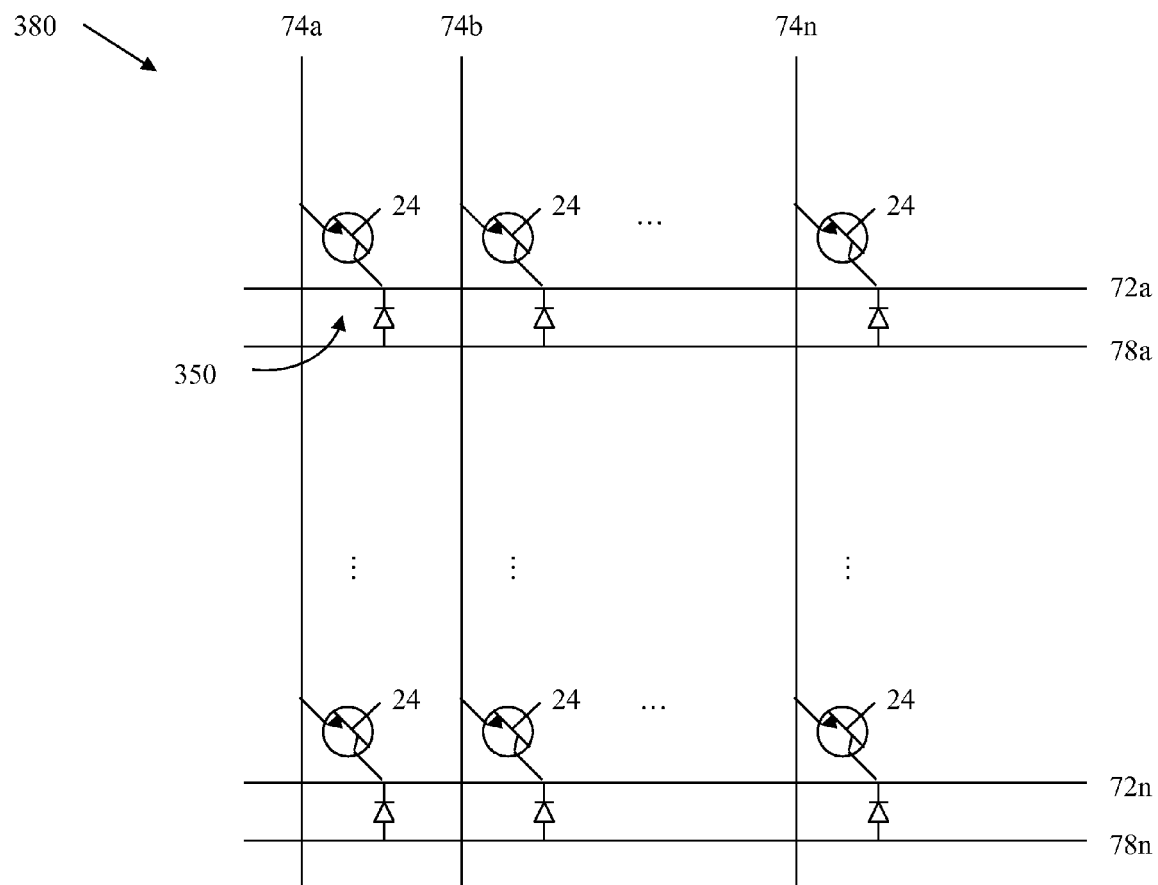

FIG. 47F shows exemplary memory array 380 comprising multiple memory cells 350 when arranged in an array to create a memory device. The circuit operation of memory cell 350 is substantially identical to that of memory cell 250 and will not be discussed further.

While the drawing figures show the first conductivity type as p-type and the second conductivity type as n-type, as with previous embodiments the conductivity types may be reversed with the first conductivity type becoming n-type and the second conductivity type becoming p-type as a matter of design choice in any particular embodiment.

An alternate method of operating memory cells 50, 150, and 450, which utilizes the silicon controlled rectifier (SCR) principle discussed above with reference to Widjaja, is now described.

Figure 48:
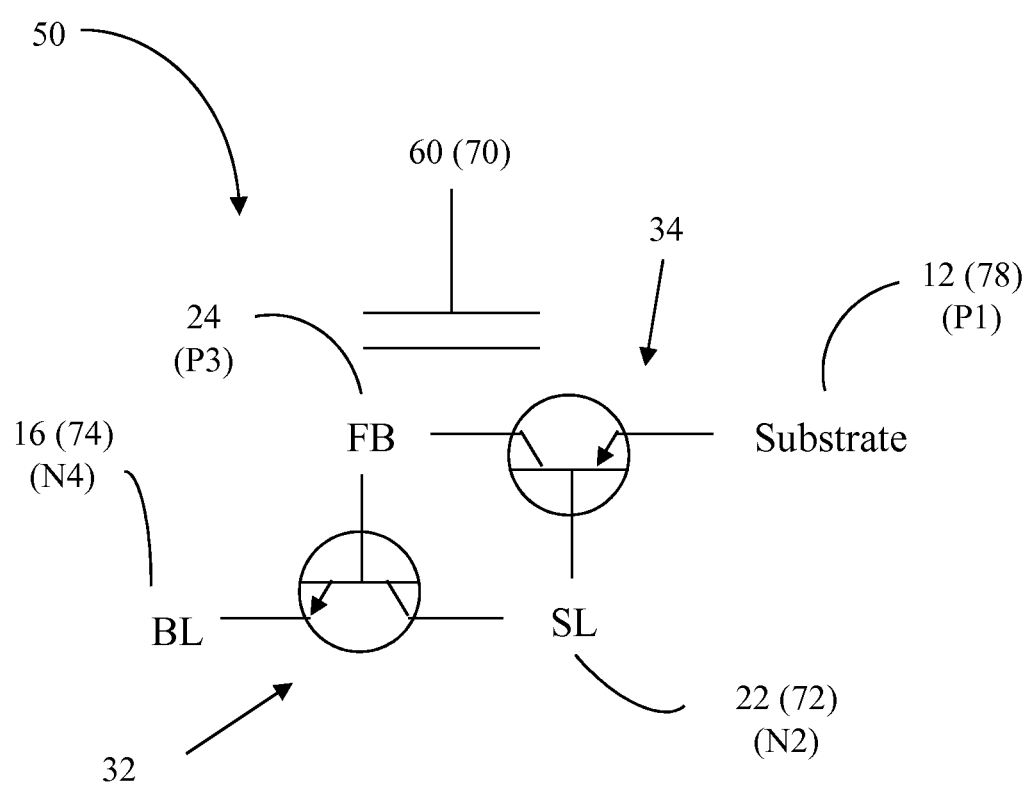
FIG. 48 illustrates the hold operation when using memory cells of the present invention in SCR mode.

As shown in FIG. 48, inherent in memory cells 50, 150 and 450 is a P1-N2-P3-N4 silicon controlled rectifier (SCR) device formed by two interconnected bipolar devices 32 and 34, with substrate 78 functioning as the P1 region, buried layer 22 functioning as the N2 region, body region 24 functioning as the P3 region and bit line region 16 functioning as the N4 region. In this example, the substrate terminal 78 functions as the anode and terminal 74 functions as the cathode, while body region 24 functions as a p-base to turn on the SCR device. If body region 24 is positively charged, the silicon controlled rectifier (SCR) device formed by the substrate, buried well, floating body, and the BL junction will be turned on and if body region 24 is neutral, the SCR device will be turned off.

The holding operation can be performed by applying the following bias: zero voltage is applied to BL terminal 74, zero or negative voltage is applied to WL terminal 70, and a positive voltage is applied to the substrate terminal 78, while leaving SL terminal 72 floating. Under these conditions, if memory cell 50 is in memory/data state logic-1 with positive voltage in floating body 24, the SCR device of memory cell 50 is turned on, thereby maintaining the state logic-1 data. Memory cells in state logic-0 will remain in blocking mode, since the voltage in floating body 24 is not substantially positive and therefore floating body 24 does not turn on the SCR device. Accordingly, current does not flow through the SCR device and these cells maintain the state logic-0 data. Those memory cells 50 that are commonly connected to substrate terminal 78 and which have a positive voltage in body region 24 will be refreshed with a logic-1 data state, while those memory cells 50 that are commonly connected to the substrate terminal 78 and which do not have a positive voltage in body region 24 will remain in blocking mode, since their SCR device will not be turned on, and therefore memory state logic-0 will be maintained in those cells. In this way, all memory cells 50 commonly connected to the substrate terminal will be maintained/refreshed to accurately hold their data states. This process occurs automatically, upon application of voltage to the substrate terminal 78, in a parallel, non-algorithmic, efficient process. In one particular non-limiting embodiment, a voltage of about 0.0 volts is applied to terminal 74, a voltage of about −1.0 volts is applied to terminal 70, and about +0.8 volts is applied to terminal 78. However, these voltage levels may vary, while maintaining the relative relationships there between.

Figure 49:
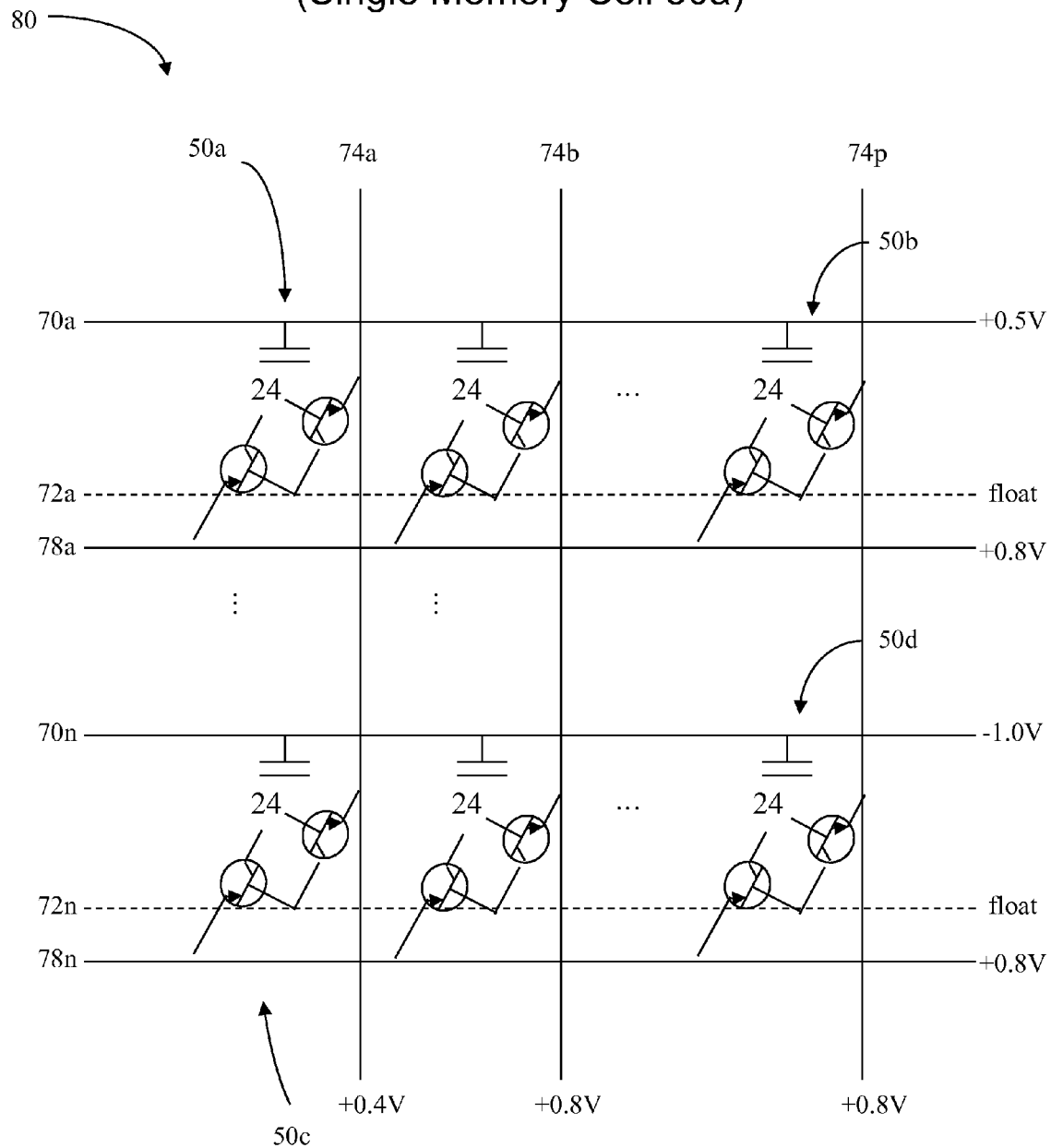
FIG. 49 illustrates the single cell read operation when using memory cells of the present invention in SCR mode.

As illustrated in FIG. 49, a read operation can be performed by applying a positive voltage to the substrate terminal 78, a positive voltage (lower than the positive voltage applied to the substrate terminal 78) to BL terminal 74, a positive voltage to WL terminal 70, while leaving SL terminal 72 floating. If cell 50a is in a state logic-1 having holes in the body region 24, the silicon controlled rectifier (SCR) device formed by the substrate, buried well, floating body, and the BL junction will be turned on and a higher cell current (flowing from the substrate terminal 78 to the BL terminal 74) is observed compared to when cell 50 is in a state logic-0 having no holes in body region 24. A positive voltage is applied to WL terminal 70a to select a row in the memory cell array 80 (e.g., see FIG. 49), while negative voltage is applied to WL terminals 70b (not shown) through 70n for any unselected rows. The negative voltage applied reduces the potential of floating body 24 through capacitive coupling in the unselected rows and turns off the SCR device of each cell 50 in each unselected row. In one particular non-limiting embodiment, about +0.8 volts is applied to substrate terminals 78a through 78n, about +0.5 volts is applied to terminal 70a (for the selected row), and about +0.4 volts is applied to selected bit line terminal 74a, about −1.0 volts is applied to unselected word line terminals 70b (not shown) through 70n, and about +0.8 volts is applied to unselected bit line terminals 74b through 74. However, these voltage levels may vary.

For memory cells sharing the same row as the selected memory cell (e.g. cell 50b), both the BL and substrate terminals are positively biased and the SCR is off. Consequently these cells will not be at the holding mode. However, because read operation is accomplished much faster (in the order of nanoseconds) compared to the lifetime of the charge in the floating body 24 (in the order of milliseconds), it should cause little disruption to the charge stored in the floating body.

For memory cells sharing the same column as the selected memory cell (e.g. cell 50c), the substrate terminal 78 remains positively biased while the BL terminal 74 is positively biased (at lower positive bias than that applied to the substrate terminal 78). As can be seen, these cells will be at holding mode, where memory cells in state logic-1 will maintain the charge in floating body 24 while memory cells in state logic-0 will remain in neutral state.

For memory cells sharing neither the same row nor the same column as the selected memory cell (e.g. cell 50d), both the BL and substrate terminals are positively biased and the SCR is off. Consequently these cells will not be at the holding mode. However, because read operation is accomplished much faster (in the order of nanoseconds) compared to the lifetime of the charge in the floating body 24 (in the order of milliseconds), it should cause little disruptions to the charge stored in the floating body.

Figure 50:
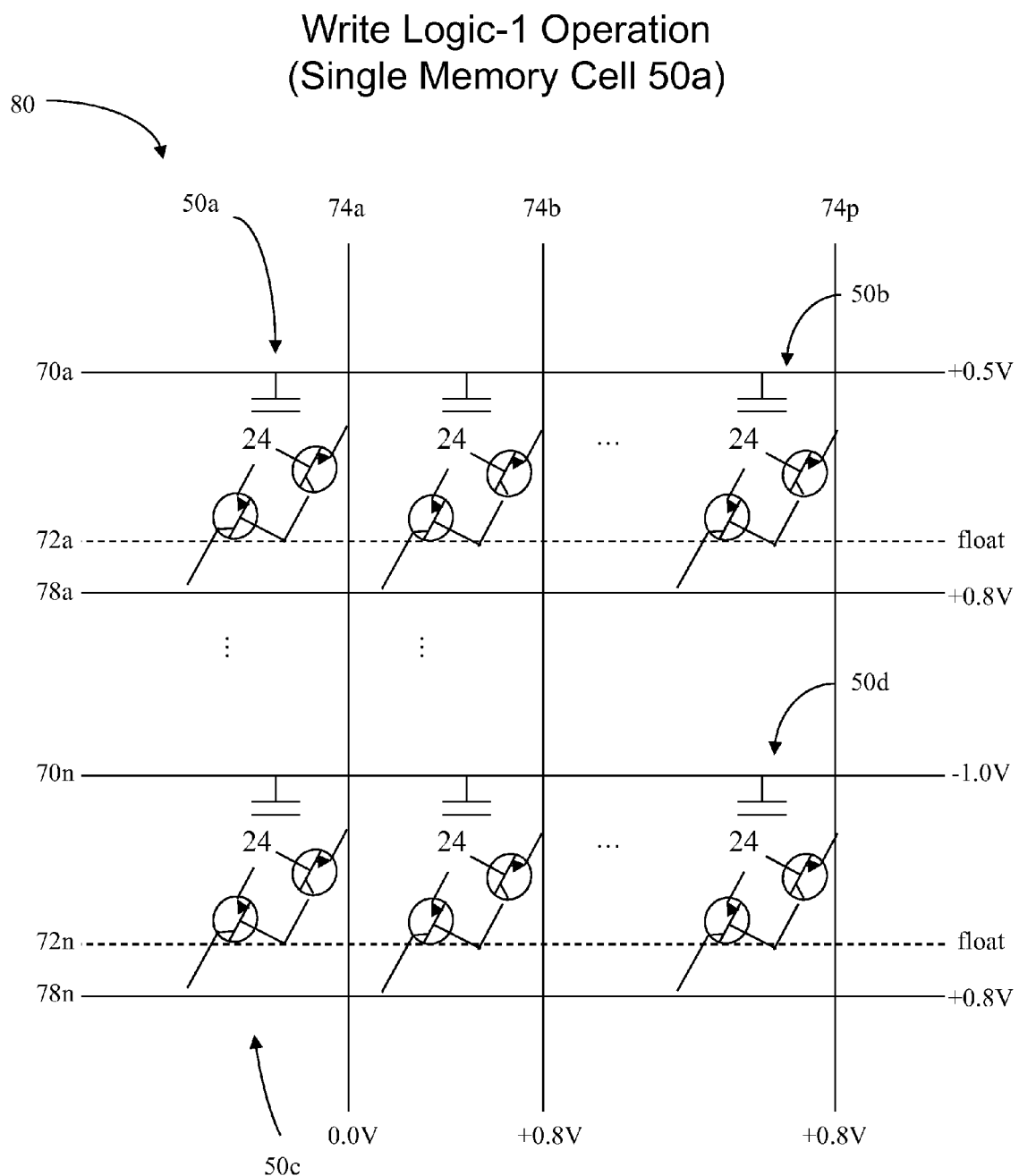
FIG. 50 illustrates the single cell write logic-1 operation when using memory cells of the present invention in SCR mode.

The silicon controlled rectifier device of selected memory cell 50a can be put into a state logic-1 (i.e., performing a write logic-1 operation) as described with reference to FIG. 50. The following bias is applied to the selected terminals:

zero voltage is applied to BL terminal 74, a positive voltage is applied to WL terminal 70, and a positive voltage is applied to the substrate terminal 78, while SL terminal 72 is left floating. The positive voltage applied to the WL terminal 70 will increase the potential of the floating body 24 through capacitive coupling and create a feedback process that turns the SCR device on. Once the SCR device of cell 50 is in conducting mode (i.e., has been "turned on") the SCR becomes "latched on" and the voltage applied to WL terminal 70 can be removed without affecting the "on" state of the SCR device. In one particular non-limiting embodiment, a voltage of about 0.0 volts is applied to terminal 74, a voltage of about +0.5 volts is applied to terminal 70, and about +0.8 volts is applied to terminal 78. However, these voltage levels may vary, while maintaining the relative relationships between the voltages applied, as described above, e.g., the voltage applied to terminal 78 remains greater than the voltage applied to terminal 74.

For memory cells sharing the same row as the selected memory cell (e.g. cell 50*b*), the substrate terminal 78 is positively biased. However, because the BL terminal 74 is also positively biased, there is no potential difference between the substrate and BL terminals and the SCR is off. Consequently these cells will not be at the holding mode. However, because the write logic-1 operation is accomplished much faster (in the order of nanoseconds) compared to the lifetime of the charge in the floating body 24 (in the order of milliseconds), it should cause little disruption to the charge stored in the floating body.

For memory cells sharing the same column as the selected memory cell (e.g. cell 50*c*), the substrate terminal 78 remains positively biased while the BL terminal 74 is now grounded. As can be seen, these cells will be at holding mode, where memory cells in state logic-1 will maintain the charge in floating body 24 while memory cells in state logic-0 will remain in neutral state.

For memory cells not sharing the same row nor the same column as the selected memory cell (e.g. cell 50*d*), both the BL and substrate terminals are positively biased and the SCR is off. Consequently these cells will not be at the holding mode. However, because the write logic-1 operation is accomplished much faster (in the order of nanoseconds) compared to the lifetime of the charge in the floating body 24 (in the order of milliseconds), it should cause little disruption to the charge stored in the floating body.

Figure 51:
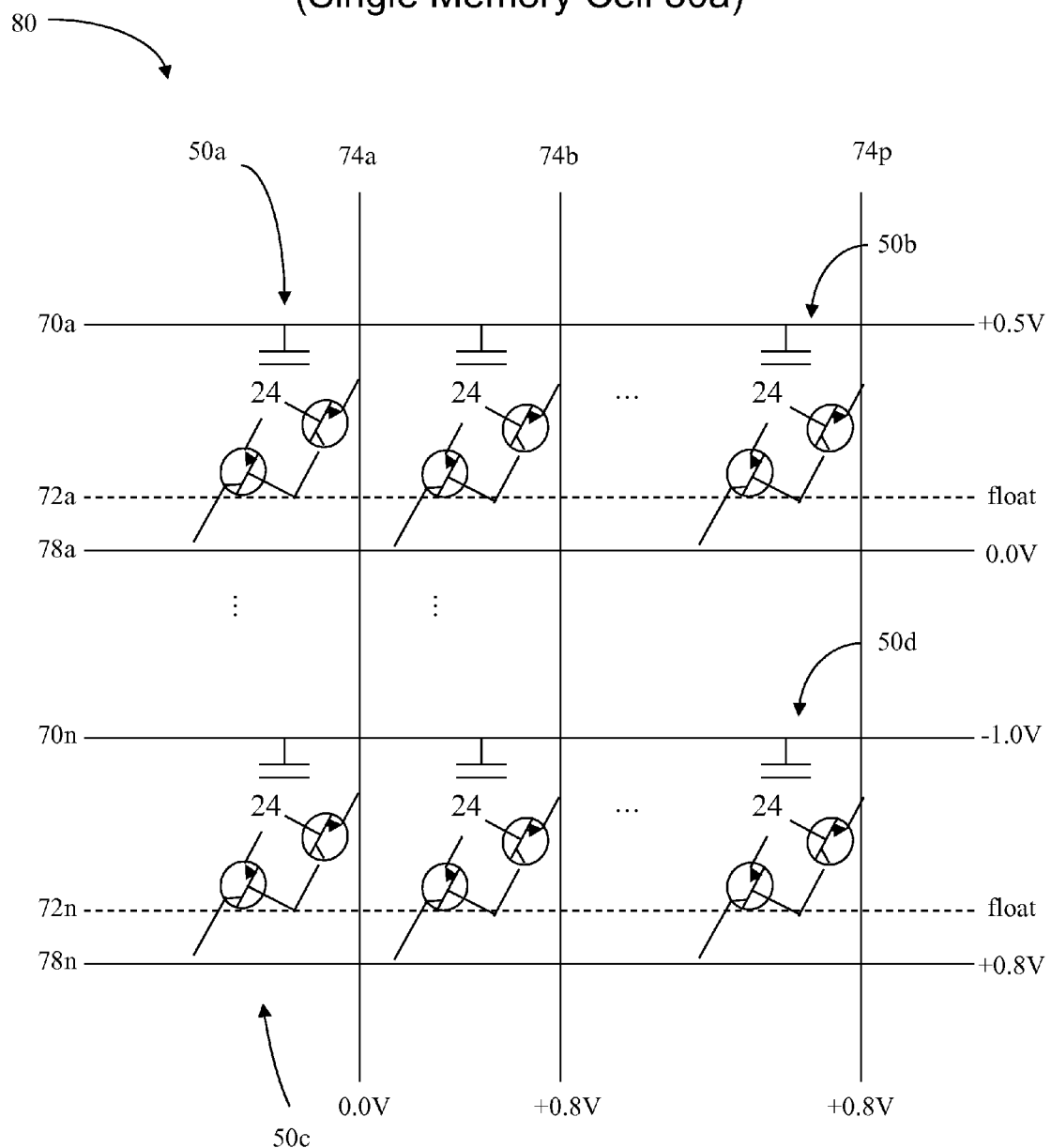
FIG. 51 illustrates the single cell write logic-0 operation when using memory cells of the present invention in SCR mode.

A write logic-0 operation to selected memory cell 50*a* is described with reference to FIG. 51. The silicon controlled rectifier device is set into the blocking (off) mode by applying the following bias: zero voltage is applied to BL terminal 74*a*, a positive voltage is applied to WL terminal 70*a*, and zero voltage is applied to the substrate terminal 78, while leaving SL terminal 72*a* floating. Under these conditions the voltage difference between anode and cathode, defined by the voltages at substrate terminal 78 and BL terminal 74, will become too small to maintain the SCR device in conducting mode. As a result, the SCR device of cell 50*a* will be turned off. In one particular non-limiting embodiment, a voltage of about 0.0 volts is applied to terminal 74, a voltage of about +0.5 volts is applied to terminal 70, and about 0.0 volts is applied to terminal 78. However, these voltage levels may vary, while maintaining the relative relationships between the charges applied, as described above.

For memory cells sharing the same row as the selected memory cell (e.g. cell 50*b*), the substrate terminal 78 is grounded and the SCR will be off. Consequently these cells will not be at the holding mode. However, because write operation is accomplished much faster (in the order of nanoseconds) compared to the lifetime of the charge in the floating body 24 (in the order of milliseconds), it should cause little disruption to the charge stored in the floating body.

For memory cells sharing the same column as the selected memory cell (e.g. cell 50*c*), the substrate terminal 78 is positively biased while the BL terminal 74*a* is now grounded. As can be seen, these cells will be at holding mode, where memory cells in state logic-1 will maintain the charge in floating body 24 while memory cells in state logic-0 will remain in neutral state.

For memory cells sharing neither the same row nor the same column as the selected memory cell (e.g. cell 50*d*), both the BL terminal 74*p* and substrate terminal 78 are positively biased and the SCR is off. Consequently these cells will not be at the holding mode. However, because the write logic-0 operation is accomplished much faster (in the order of nanoseconds) compared to the lifetime of the charge in the floating body 24 (in the order of milliseconds), it should cause little disruption to the charge stored in the floating body.

While one illustrative embodiment and method of use of the SCR operation of memory cell 50 has been described, other embodiments and methods are possible. For example, the first and second conductivity types may be reversed so that the first conductivity type is n-type and the second conductivity is p-type making the SCR a N1-P2-N3-P4 device and reversing the polarity of applied voltages. Voltages given in the various example operations are illustrative only and will vary from embodiment to embodiment as a matter of design choice. While substrate 12 is called a substrate for continuity of terminology and simplicity of presentation, substrate 12 may alternately be a well in either another well or a true substrate in a structure similar to that described in conjunction with FIG. 9B above. By substrate 12 being a well instead of a true substrate, manipulating the voltage level of substrate 12 as required in some SCR operations is facilitated. Many other alternative embodiments and methods are possible, thus the illustrative examples given are not limiting in any way.

A novel semiconductor memory with an electrically floating body memory cell is achieved. The present invention also provides the capability of maintaining memory states employing parallel non-algorithmic periodic refresh operation. As a result, memory operations can be performed in an uninterrupted manner. Many embodiments of the present invention have been described. Persons of ordinary skill in the art will appreciate that these embodiments are exemplary only to illustrate the principles of the present invention. Many other embodiments will suggest themselves to such skilled persons after reading this specification in conjunction with the attached drawing figures. For example:

The first and second conductivity types may be reversed and the applied voltage polarities inverted while staying within the scope of the present invention.

While many different exemplary voltage levels were given for various operations and embodiments, these may vary from embodiment to embodiment as a matter of design choice while staying within the scope of the present invention.

The invention may be manufactured using any process technology at any process geometry or technology node and be within the scope of the invention. Further, it should be understood that the drawing figures are not drawn to scale for ease of understanding and clarity of presentation, and any combination of layer composition, thickness, doping level, materials, etc. may be used within the scope of the invention.

While exemplary embodiments typically showed a single memory array for the purpose of simplicity in explaining the operation of the various memory cells presented herein, a memory device employing the memory cells of the presentation may vary in many particulars in terms of architecture and organization as a matter of design choice while staying within the scope of the invention. Such embodiments may, without limitation, include features like, for example, as multiple memory arrays, segmentation of the various control lines with or without multiple levels of decoding, simultaneously performing multiple operations in multiple memory arrays or in the same arrays, employ many different voltage or current sensing circuits to perform read operations, use a variety of decoding schemes, use more than one type of memory cell, employ any sort of interface to communicate with other circuitry, and employ many different analog circuits known in the art to generate voltage or currents for use in performing the various operations on the memory array or arrays. Such analog circuits may without limitation be, for example, digital-to-analog converters (DACs), analog-to-digital converters (ADCs), operational amplifiers (Op Amps), comparators, voltage reference circuits, current mirrors, analog buffers, etc.

Thus the invention should not be limited in any way except by the appended claims.

What is claimed is:

1. An integrated circuit comprising:
an array of memory cells formed in a semiconductor, the array comprising:
a plurality of memory cells arranged in a plurality of rows and a plurality of columns, each memory cell of the plurality of memory cells comprising:
a floating body region defining at least a portion of a surface of the memory cell, the floating body region having a first conductivity type;
a buried region located within the memory cell and located adjacent to the floating body region, wherein the buried region has a second conductivity type, wherein the floating body region is bounded on a first side by a first insulating region having a first thickness and on a second side by a second insulating region having a second thickness, wherein the second thickness is greater than the first thickness; and
a gate region above the floating body region and the second insulating region and is insulated from the floating body region by an insulating layer; and
control circuitry configured to provide electrical signals to said buried region.

2. The integrated circuit of claim 1, wherein said memory cell further comprises a bit line region on said surface, the bit line region having the second conductivity type.

3. The integrated circuit of claim 2, further comprising second control circuitry configured to provide electrical signals to said bit line region.

4. The integrated circuit of claim 1, wherein said electrical signals to said buried region have an amplitude or polarity dependent on an operation of said array of memory cells.

5. The integrated circuit of claim 1, wherein said control circuitry comprises a voltage generator circuit.

6. The integrated circuit of claim 5, further comprising a multiplexer electrically connected between said voltage generator circuit and said buried region, said multiplexer configured to apply periodic pulses of positive voltage to said buried region.

7. The integrated circuit of claim 1, wherein said control circuitry comprises a reference generator circuit configured to sense potential of said floating body region.

8. The integrated circuit of claim 3, wherein said second control circuitry comprises a read circuit connected to said bit line region and configured to read a state of said memory cell.

9. The integrated circuit of claim 8, further comprising a reference generator circuit connected to said read circuit.

10. An integrated circuit comprising:
an array of memory cells formed in a semiconductor, the array comprising:
a plurality of semiconductor memory cells arranged in a matrix of rows and a plurality of columns, wherein the rows of memory cells define a first direction and the columns of memory cells define a second direction, and each semiconductor memory cell of the plurality of semiconductor memory cells comprising:
a bipolar device having a floating base region, a first region, a second region, and a gate region wherein:
a state of said semiconductor memory cell is stored in said floating base region, said floating base region having a surface,
said first region is located at the surface of said floating base region,
said second region is located below said floating base region,
said second region is commonly connected to at least two of said semiconductor memory cells in said matrix, and
said gate region overlays two of said semiconductor memory cells along the column direction, and
control circuitry configured to provide electrical signals to said second region.

11. The integrated circuit of claim 10, further comprising a plurality of source lines crossing the array in the first direction beneath one or more surfaces of said plurality of semiconductor memory cells, wherein the plurality of source lines are coupled to one or more second regions of said plurality of semiconductor memory cells.

12. The integrated circuit of claim 11, further comprising a plurality of bit lines crossing the array in the second direction substantially orthogonal to the first direction, wherein the plurality of bit lines are coupled to one or more said first regions.

13. The integrated circuit of claim 10, further comprising a plurality of word lines crossing the array in the first direction above one or more surfaces, wherein the plurality of word lines are coupled to one or more gate regions.

14. The integrated circuit of claim 10, further comprising second control circuitry configured to provide electrical signals to said first region.

15. The integrated circuit of claim 10, wherein said electrical signals to said second region have an amplitude or polarity dependent on an operation of said array of memory cells.

16. The integrated circuit of claim 10, wherein said control circuitry comprises a voltage generator circuit.

17. The integrated circuit of claim 16, further comprising a multiplexer electrically connected between said voltage generator circuit and said second region, said multiplexer configured to apply periodic pulses of positive voltage to said second region.

18. The integrated circuit of claim 10, wherein said control circuitry comprises a reference generator circuit configured to sense potential of said floating base region.

19. The integrated circuit of claim 14, wherein said second control circuitry comprises a read circuit connected to said first region and configured to read a state of said semiconductor memory cell.

20. The integrated circuit of claim 19, further comprising a reference generator circuit connected to said read circuit.

* * * * *